(12) United States Patent
Yamazaki et al.

(10) Patent No.: US 11,387,343 B2
(45) Date of Patent: Jul. 12, 2022

(54) STACK AND SEMICONDUCTOR DEVICE

(71) Applicant: Semiconductor Energy Laboratory Co., Ltd., Atsugi (JP)

(72) Inventors: Shunpei Yamazaki, Setagaya (JP); Masahiro Takahashi, Atsugi (JP); Tomoki Hiramatsu, Koto (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 49 days.

(21) Appl. No.: 16/975,855

(22) PCT Filed: Feb. 26, 2019

(86) PCT No.: PCT/IB2019/051516
§ 371 (c)(1),
(2) Date: Aug. 26, 2020

(87) PCT Pub. No.: WO2019/171205
PCT Pub. Date: Sep. 12, 2019

(65) Prior Publication Data
US 2020/0411658 A1 Dec. 31, 2020

(30) Foreign Application Priority Data

Mar. 6, 2018 (JP) .............................. JP2018-040041
Mar. 6, 2018 (JP) .............................. JP2018-040042
Mar. 6, 2018 (JP) .............................. JP2018-040046

(51) Int. Cl.
*H01L 29/49* (2006.01)
*H01L 29/66* (2006.01)
(Continued)

(52) U.S. Cl.
CPC .... *H01L 29/4908* (2013.01); *H01L 21/02609* (2013.01); *H01L 29/045* (2013.01);
(Continued)

(58) Field of Classification Search
CPC . H01L 29/78; H01L 29/78648; H01L 29/788; H01L 29/792; H01L 29/24;
(Continued)

(56) References Cited

U.S. PATENT DOCUMENTS 9,263,531 B2 * 2/2016 Yamazaki ......... H01L 21/02565
9,653,613 B2 5/2017 Yamazaki et al.
(Continued)

FOREIGN PATENT DOCUMENTS

| JP | 2017-118106 A | 6/2017 |
| JP | 2017-139460 A | 8/2017 |
| WO | WO-2017/158465 | 9/2017 |

OTHER PUBLICATIONS

International Search Report (Application No. PCT/IB2019/051516) dated May 28, 2019.
(Continued)

*Primary Examiner* — Galina G Yushina
(74) *Attorney, Agent, or Firm* — Robinson Intellectual Property Law Office; Eric J. Robinson

(57) ABSTRACT

A stack with excellent electrical characteristics and reliability is provided. The stack includes an insulator, a conductor, and a first oxide between the insulator and the conductor; the first oxide includes a first c-axis-aligned crystal region; and a c-axis of the first crystal region is substantially perpendicular to a plane of the first oxide on the insulator side. Alternatively, the stack includes an insulator, a conductor, a first oxide between the insulator and the conductor, and a second oxide facing the first oxide with the insulator therebetween; the first oxide includes a first c-axis-aligned crystal region; a c-axis of the first crystal region is substantially perpendicular to a plane of the first oxide on the insulator side; the second oxide includes a second c-axis-aligned crystal region; and a c-axis of the second crystal
(Continued)

region is substantially perpendicular to a plane of the second oxide on the insulator side.

13 Claims, 66 Drawing Sheets

(51) Int. Cl.
 *H01L 29/786* (2006.01)
 *H01L 29/04* (2006.01)
 *H01L 21/02* (2006.01)
(52) U.S. Cl.
 CPC .... *H01L 29/66969* (2013.01); *H01L 29/7869* (2013.01); *H01L 29/78696* (2013.01)
(58) Field of Classification Search
 CPC ......... H01L 29/41733; H01L 29/42384; H01L 29/4908; H01L 29/045; H01L 29/66969; H01L 29/7869; H01L 29/78696; H01L 21/02609; H01L 21/8239; H01L 21/02565; H01L 27/105; H01L 27/108; H01L 27/1156
 See application file for complete search history.

(56) References Cited

U.S. PATENT DOCUMENTS

| | | | |
|---|---|---|---|
| 10,522,688 B2 | 12/2019 | Kato et al. | |
| 10,622,059 B2 | 4/2020 | Onuki | |
| 2011/0127523 A1* | 6/2011 | Yamazaki | H01L 29/04 257/E29.296 |
| 2017/0179294 A1* | 6/2017 | Kato | H01L 27/1225 |
| 2017/0221899 A1* | 8/2017 | Uesugi | H01L 28/00 |
| 2017/0256652 A1* | 9/2017 | Zhou | H01L 29/78606 |
| 2019/0057734 A1 | 2/2019 | Onuki | |

OTHER PUBLICATIONS

Written Opinion (Application No. PCT/IB2019/051516) dated May 28, 2019.
Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.
Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.
Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.
Yamazaki.S, "Crystalline Oxide Semiconductor Using CAAC-IGZO and its Application", ECS Transactions, Oct. 1, 2014, vol. 64, No. 10, pp. 155-164, The Electrochemical Society.
Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.
Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.
Amano.S et al., "Low Power LC Display Using In—Ga—Zn-Oxide TFTs Based on Variable Frame Frequency", SID DIGEST'10 : SID International Symposium Digest of Technical Papers, May 23, 2010, vol. 41, No. 1, pp. 626-629.

* cited by examiner

FIG. 13A
FIG. 13C
FIG. 13B
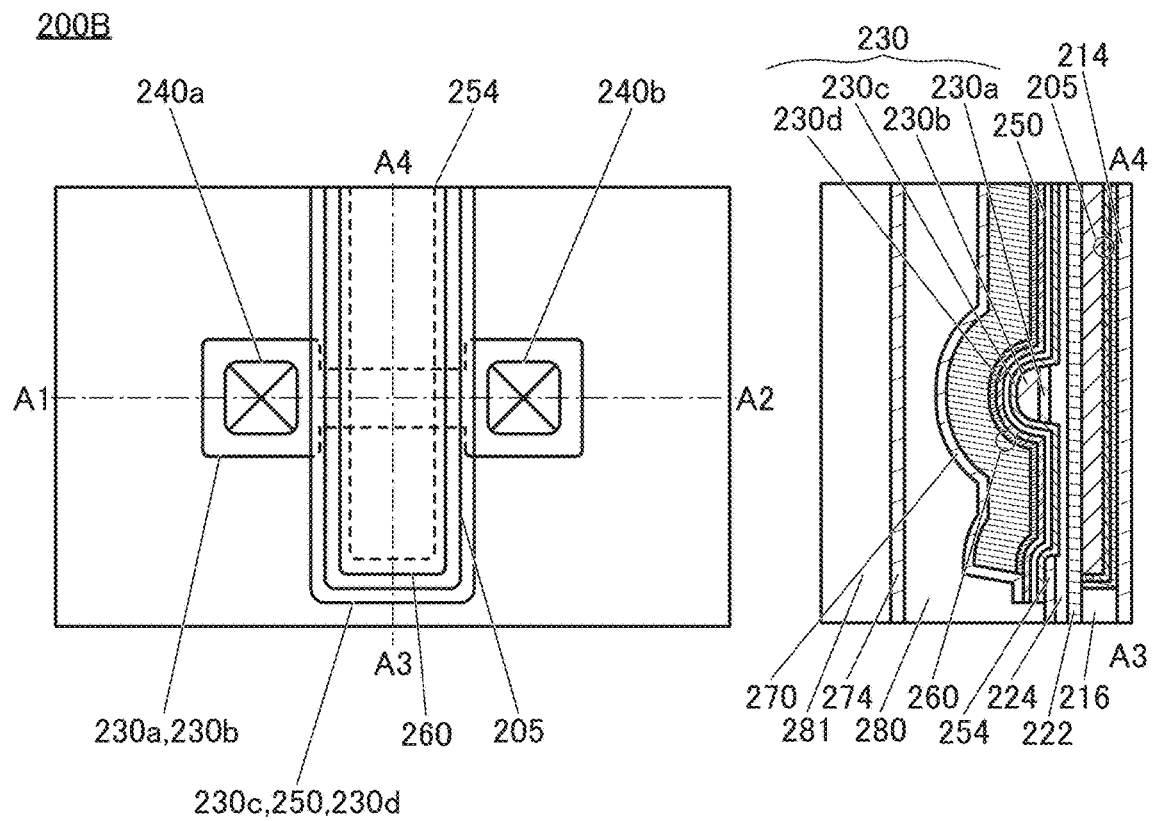
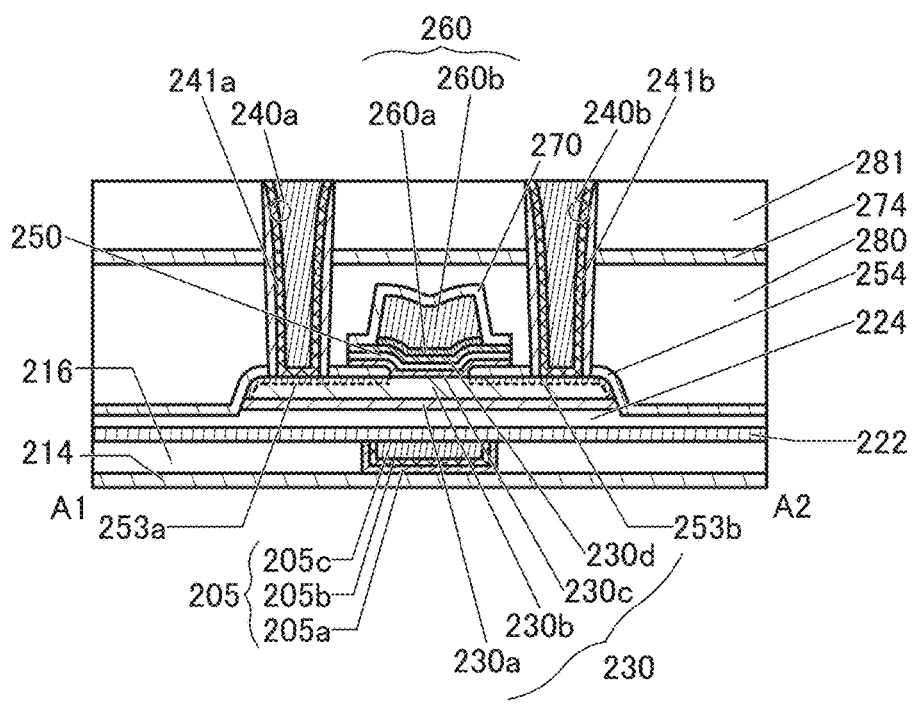

FIG. 17A
FIG. 17C
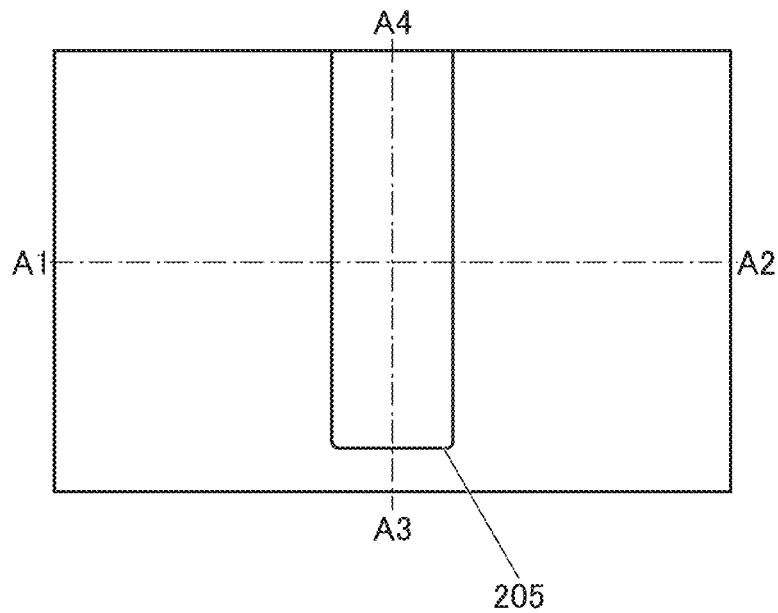
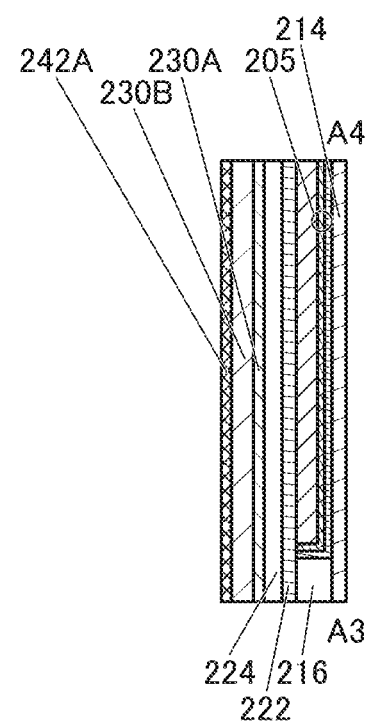
FIG. 17B
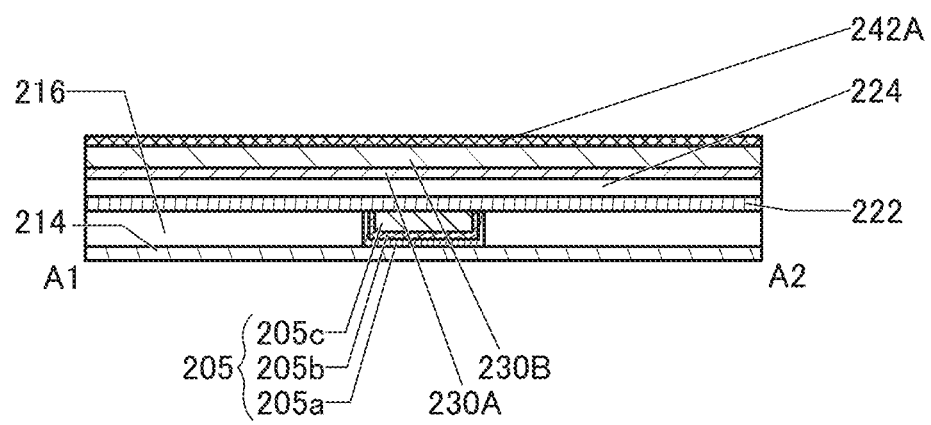

FIG. 39A
FIG. 39C
FIG. 39B
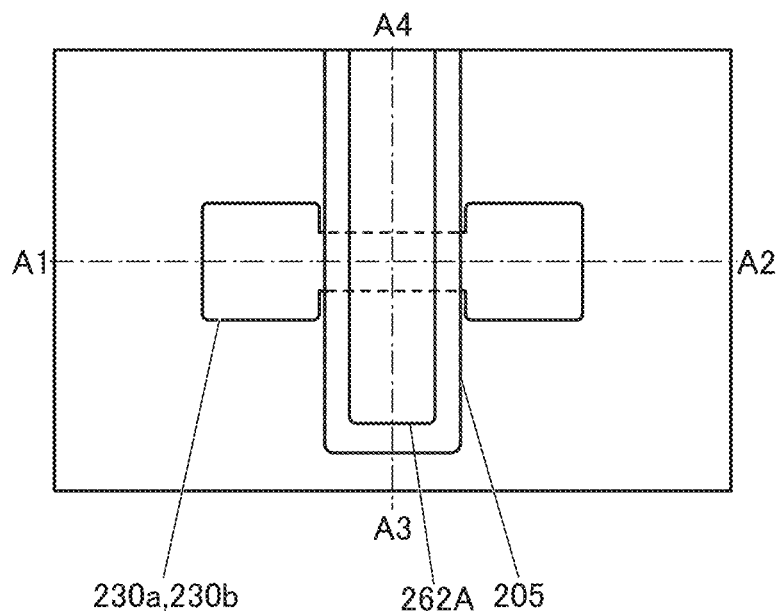
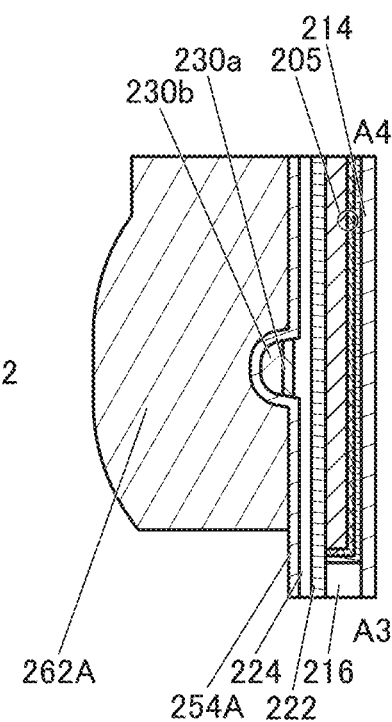
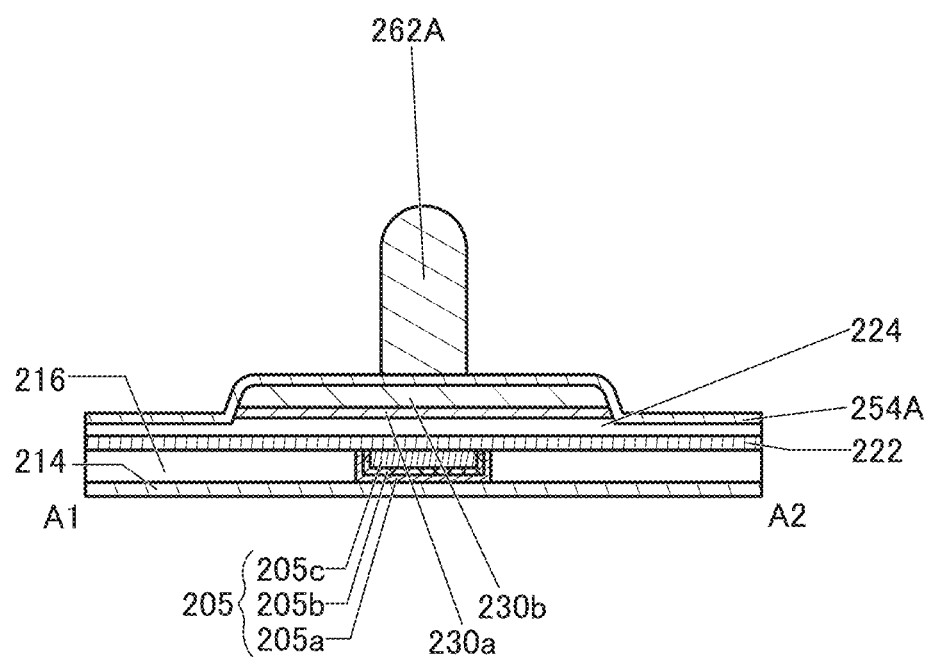

FIG. 41A
FIG. 41C
FIG. 41B
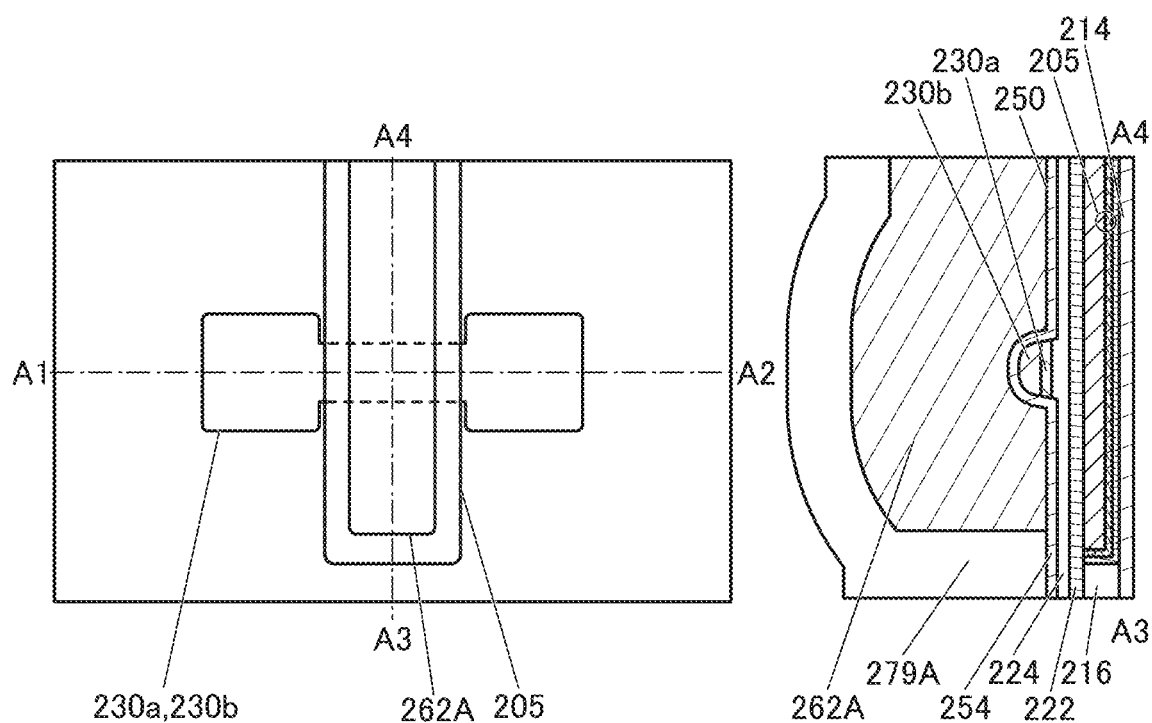
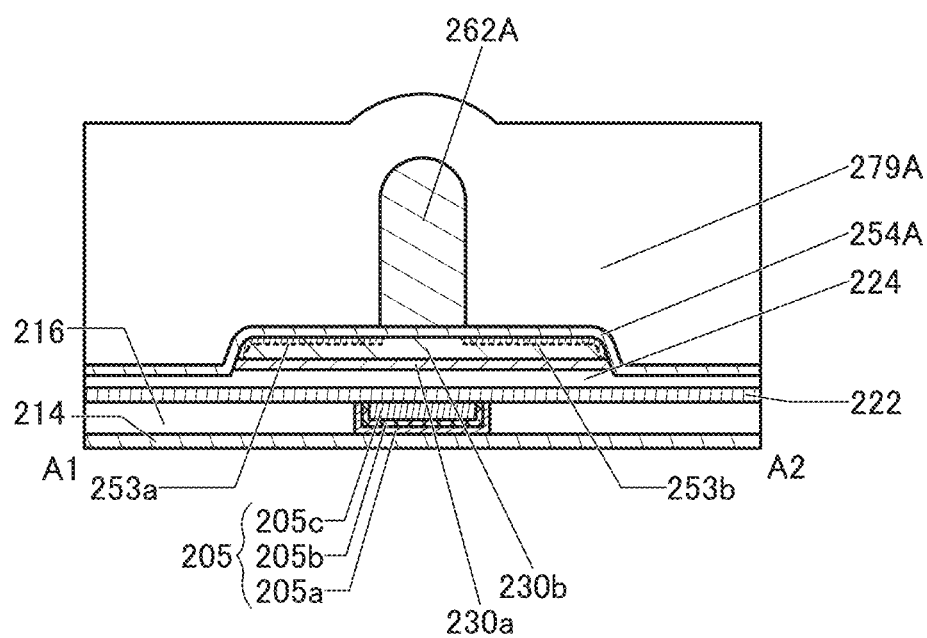

FIG. 44A
FIG. 44C
FIG. 44B
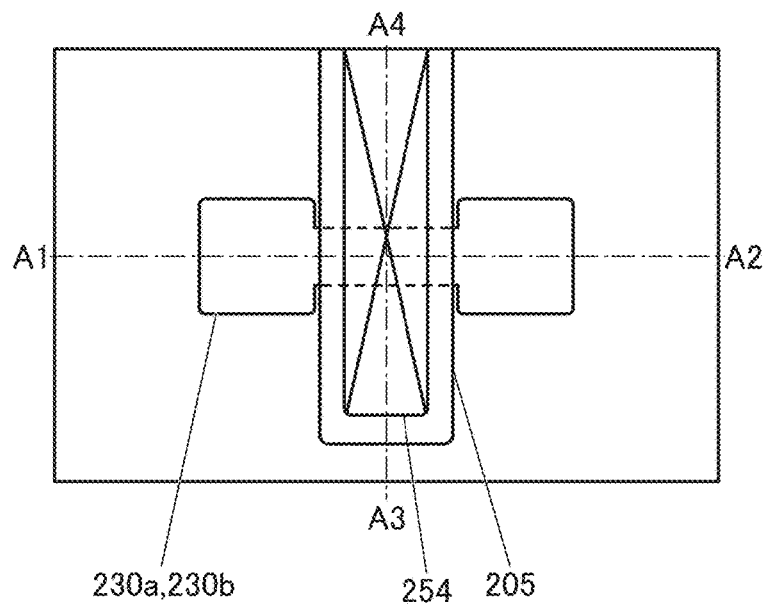
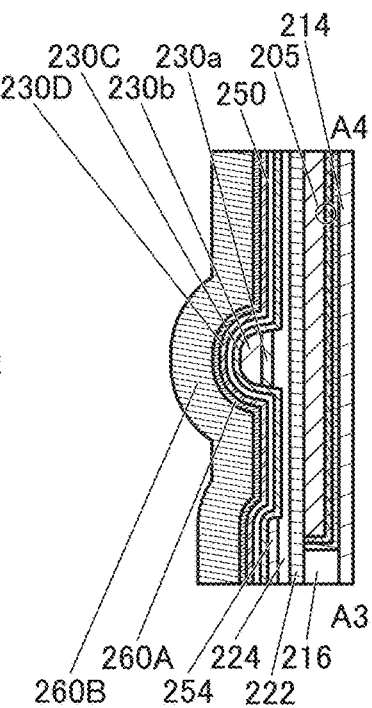
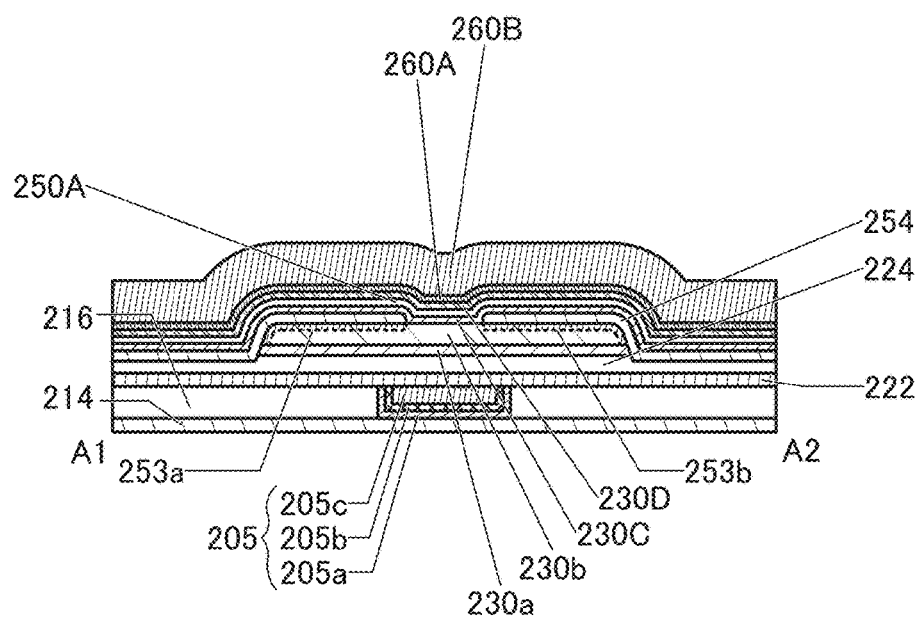

FIG. 50A
FIG. 50C
FIG. 50B
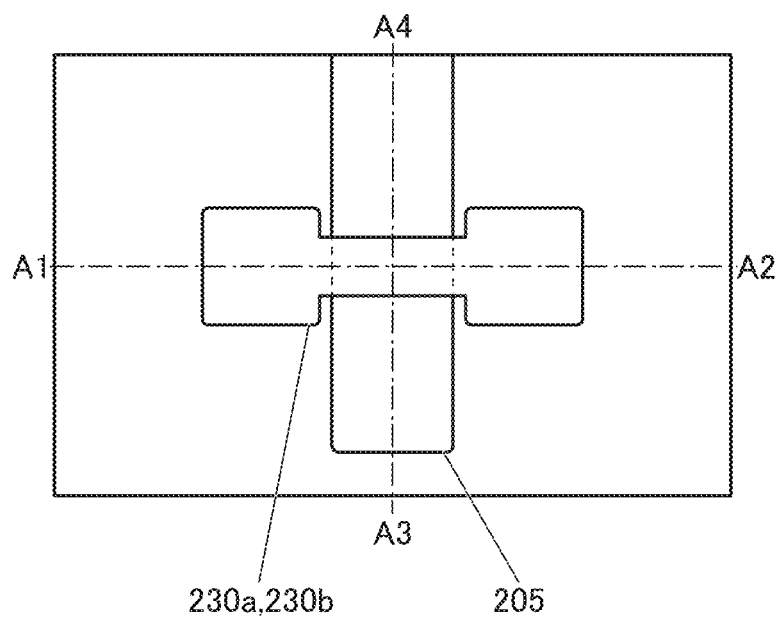
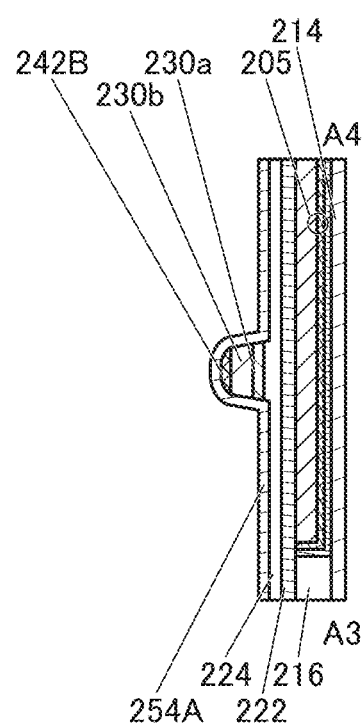
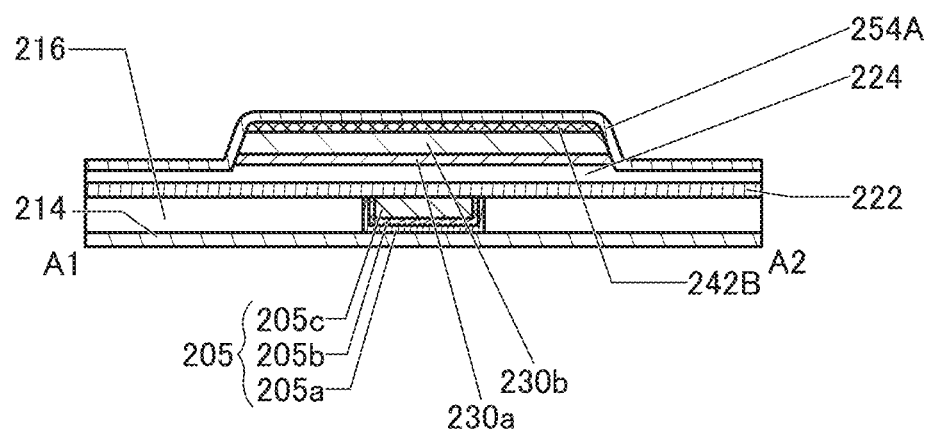

STACK AND SEMICONDUCTOR DEVICE

TECHNICAL FIELD

One embodiment of the present invention relates to a stack, a semiconductor device, and a manufacturing method thereof. Alternatively, one embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

Note that one embodiment of the present invention is not limited to the above technical field. One embodiment of the invention disclosed in this specification and the like relates to an object, a method, or a manufacturing method. Alternatively, one embodiment of the present invention relates to a process, a machine, manufacture, or a composition of matter.

BACKGROUND ART

A silicon-based semiconductor material is widely known as a material of a semiconductor thin film that can be used in a transistor, and as another material, an oxide semiconductor has attracted attention. Examples of oxide semiconductors include not only single-component metal oxides, such as indium oxide and zinc oxide, but also multi-component metal oxides. Among the multi-component metal oxides, in particular, an In—Ga—Zn oxide (hereinafter, also referred to as IGZO) has been actively studied.

From the studies on IGZO, in an oxide semiconductor, a CAAC (c-axis aligned crystalline) structure and an nc (nanocrystalline) structure, which are neither single crystal nor amorphous, have been found (see Non-Patent Document 1 to Non-Patent Document 3). In Non-Patent Document 1 and Non-Patent Document 2, a technique for forming a transistor using an oxide semiconductor having the CAAC structure is also disclosed. Moreover, Non-Patent Document 4 and Non-Patent Document 5 disclose that a fine crystal is included even in an oxide semiconductor which has lower crystallinity than an oxide semiconductor having the CAAC structure or the nc structure.

In addition, a transistor using IGZO as an active layer has an extremely low off-state current (see Non-Patent Document 6), and an LSI and a display utilizing the characteristics have been reported (see Non-Patent Document 7 and Non-Patent Document 8).

REFERENCES

Non-Patent Documents

[Non-Patent Document 1] S. Yamazaki et al., "SID Symposium Digest of Technical Papers", 2012, volume 43, issue 1, pp. 183-186.
[Non-Patent Document 2] S. Yamazaki et al., "Japanese Journal of Applied Physics", 2014, volume 53, Number 4S, pp. 04ED18-1-04ED18-10.
[Non-Patent Document 3] S. Ito et al., "The Proceedings of AM-FPD'13 Digest of Technical Papers", 2013, pp. 151-154.
[Non-Patent Document 4] S. Yamazaki et al., "ECS Journal of Solid State Science and Technology", 2014, volume 3, issue 9, pp. Q3012-Q3022.
[Non-Patent Document 5] S. Yamazaki, "ECS Transactions", 2014, volume 64, issue 10, pp. 155-164.
[Non-Patent Document 6] K. Kato et al., "Japanese Journal of Applied Physics", 2012, volume 51, pp. 021201-1-021201-7.
[Non-Patent Document 7] S. Matsuda et al., "2015 Symposium on VLSI Technology Digest of Technical Papers", 2015, pp. T216-T217.
[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

An object of one embodiment of the present invention is to provide a stack with excellent electrical characteristics. Another object of one embodiment of the present invention is to provide a stack with high reliability. Another object of one embodiment of the present invention is to provide a semiconductor device with high on-state current. Another object of one embodiment of the present invention is to provide a semiconductor device with excellent frequency characteristics. Another object of one embodiment of the present invention is to provide a highly reliable semiconductor device. Another object of one embodiment of the present invention is to provide a semiconductor device that can be scaled down or highly integrated. Another object of one embodiment of the present invention is to provide a semiconductor device with excellent electrical characteristics. Another object of one embodiment of the present invention is to provide a semiconductor device with high productivity.

An object of one embodiment of the present invention is to provide a semiconductor device capable of retaining data for a long time. An object of one embodiment of the present invention is to provide a semiconductor device capable of high-speed data writing. An object of one embodiment of the present invention is to provide a semiconductor device with high design flexibility. An object of one embodiment of the present invention is to provide a semiconductor device capable of reducing power consumption. An object of one embodiment of the present invention is to provide a novel semiconductor device.

Note that the description of these objects does not disturb the existence of other objects. One embodiment of the present invention does not have to achieve all the objects. Other objects will be apparent from the description of the specification, the drawings, the claims, and the like, and other objects can be derived from the description of the specification, the drawings, the claims, and the like.

Means for Solving the Problems

One embodiment of the present invention is a stack including an insulator, a conductor, and a first oxide between the insulator and the conductor; the first oxide includes a first c-axis-aligned crystal region; and a c-axis of the first crystal region is substantially perpendicular to a plane of the first oxide on the insulator side.

Another embodiment of the present invention is a stack including an insulator, a conductor, a first oxide between the insulator and the conductor, and a second oxide facing the first oxide with the insulator therebetween; the first oxide includes a first c-axis-aligned crystal region; a c-axis of the first crystal region is substantially perpendicular to a plane of the first oxide on the insulator side; the second oxide includes a second c-axis-aligned crystal region; and a c-axis of the second crystal region is substantially perpendicular to a plane of the second oxide on the insulator side.

Another embodiment of the present invention is a semiconductor device including a first oxide, a second oxide, a third oxide, a first insulator, a first conductor, a second conductor, and a third conductor; the first oxide covers a side surface and a bottom surface of the first conductor; the first insulator covers a side surface and a bottom surface of the first oxide; the second oxide covers a side surface and a bottom surface of the first insulator; the third oxide is in contact with a bottom surface of the second oxide; the first oxide includes a first c-axis-aligned crystal region; a c-axis of the first crystal region is substantially perpendicular to a plane of the first oxide on the first insulator side; and the second conductor and the third conductor are positioned over the third oxide to face each other with the second oxide therebetween.

In the semiconductor device, it is preferable that the second oxide include a second c-axis-aligned crystal region, and a c-axis of the second crystal region be substantially perpendicular to a plane of the second oxide on the first insulator side.

In the semiconductor device, it is preferable that the third oxide include a third c-axis-aligned crystal region, and a direction of the c-axis of the second crystal region be different from a direction of a c-axis of the third crystal region.

In the semiconductor device, a direction of the c-axis of the first crystal region is preferably different from the direction of the c-axis of the third crystal region.

In the semiconductor device, it is preferable that a top surface of the conductor be substantially level with a top surface of the first oxide, a top surface of the second oxide, and a top surface of the first insulator.

In the semiconductor device, it is preferable that a second insulator in contact with a side surface of the second oxide be further included, the second insulator include an opening, the first oxide, the second oxide, and the first insulator be provided in the opening, and a top surface of the second insulator be substantially level with the top surface of the conductor.

One embodiment of the present invention is a semiconductor device including a first oxide, a second oxide, a third oxide, a first insulator, and a conductor; the first oxide covers a side surface and a bottom surface of the conductor; the first insulator covers a side surface and a bottom surface of the first oxide; the second oxide covers a side surface and a bottom surface of the first insulator; the third oxide is in contact with a bottom surface of the second oxide; the first oxide includes a first c-axis-aligned crystal region; and a c-axis of the first crystal region is substantially perpendicular to a plane of the first oxide on the first insulator side.

In the semiconductor device, it is preferable that the second oxide include a second c-axis-aligned crystal region, and a c-axis of the second crystal region be substantially perpendicular to a plane of the second oxide on the first insulator side.

In the semiconductor device, it is preferable that the third oxide include a third c-axis-aligned crystal region, and a direction of the c-axis of the second crystal region be different from a direction of a c-axis of the third crystal region.

In the semiconductor device, a direction of the c-axis of the first crystal region is preferably different from the direction of the c-axis of the third crystal region.

In the semiconductor device, it is preferable that the third oxide include a first region, and a second region and a third region between which the first region is sandwiched, the first region include a region overlapping with the conductor, and the second region and the third region include one or more elements selected from phosphorus, boron, aluminum, and magnesium.

In the semiconductor device, it is preferable that a top surface of the conductor be substantially level with a top surface of the first oxide, a top surface of the second oxide, and a top surface of the first insulator.

In the semiconductor device, it is preferable that a second insulator in contact with a side surface of the second oxide be further included, the second insulator include an opening, the first oxide, the second oxide, and the first insulator be provided in the opening, and a top surface of the second insulator be substantially level with the top surface of the conductor.

In the semiconductor device, the second oxide preferably overlaps with part of the second region and part of the third region.

One embodiment of the present invention is a semiconductor device including a first oxide, a second oxide, a third oxide, a first insulator, a second insulator, and a first conductor; the first oxide is in contact with a bottom surface of the first conductor; the first insulator is in contact with a bottom surface of the first oxide; the second oxide is in contact with a bottom surface of the first insulator; the third oxide is in contact with a bottom surface of the second oxide; the first oxide includes a first c-axis-aligned crystal region; a c-axis of the first crystal region is substantially perpendicular to a plane of the first oxide on the first insulator side; the second oxide includes a second c-axis-aligned crystal region; a c-axis of the second crystal region is substantially perpendicular to a plane of the second oxide on the first insulator side; the second insulator is positioned above the third oxide; the second insulator is in contact with an end portion of the second oxide; the third oxide includes a first region, and a second region and a third region between which the first region is sandwiched; the first region includes a region overlapping with the first conductor; and the second region and the third region include one or more elements selected from phosphorus, boron, aluminum, and magnesium.

It is preferable that the semiconductor device further include a third insulator including an opening; the third insulator be in contact with part of the bottom surface of the second oxide and a side surface and part of a top surface of the third oxide; and the second oxide be in contact with the third oxide through the opening.

One embodiment of the present invention is a semiconductor device including a first oxide, a second oxide, a third oxide, a first insulator, a second insulator, a first conductor, a second conductor, and a third conductor; the first oxide is in contact with a bottom surface of the first conductor; the first insulator is in contact with a bottom surface of the first oxide; the second oxide is in contact with a bottom surface of the first insulator; the third oxide is in contact with a bottom surface of the second oxide; the first oxide includes a first c-axis-aligned crystal region; a c-axis of the first crystal region is substantially perpendicular to a plane of the first oxide on the first insulator side; the second oxide includes a second c-axis-aligned crystal region; a c-axis of the second crystal region is substantially perpendicular to a plane of the second oxide on the first insulator side; the second insulator is positioned above the third oxide; the second insulator is in contact with an end portion of the second oxide; and the second conductor and the third conductor are positioned over the third oxide to face each other with the second oxide therebetween.

It is preferable that the semiconductor device further include a third insulator including an opening; the third insulator be in contact with part of the bottom surface of the second oxide, a side surface and part of a top surface of the second conductor, a side surface and part of a top surface of the third conductor, and a side surface of the third oxide; and the second oxide be in contact with the third oxide through the opening.

In the semiconductor device, it is preferable that the third oxide include a third c-axis-aligned crystal region, and a direction of the c-axis of the second crystal region be different from a direction of a c-axis of the third crystal region.

In the semiconductor device, a direction of the c-axis of the first crystal region is preferably different from the direction of the c-axis of the third crystal region.

Effect of the Invention

According to one embodiment of the present invention, a stack with excellent electrical characteristics can be provided. Alternatively, according to one embodiment of the present invention, a stack with high reliability can be provided. Alternatively, according to one embodiment of the present invention, a semiconductor device with high on-state current can be provided. Alternatively, according to one embodiment of the present invention, a semiconductor device with excellent frequency characteristics can be provided. Alternatively, according to one embodiment of the present invention, a highly reliable semiconductor device can be provided. Alternatively, according to one embodiment of the present invention, a semiconductor device that can be scaled down or highly integrated can be provided. Alternatively, according to one embodiment of the present invention, a semiconductor device with excellent electrical characteristics can be provided. Alternatively, according to one embodiment of the present invention, a semiconductor device with high productivity can be provided.

Alternatively, a semiconductor device capable of retaining data for a long time can be provided. Alternatively, a semiconductor device capable of high-speed data writing can be provided. Alternatively, a semiconductor device with high design flexibility can be provided. Alternatively, a semiconductor device capable of reducing power consumption can be provided. Alternatively, a novel semiconductor device can be provided.

Note that the description of these effects does not disturb the existence of other effects. One embodiment of the present invention does not have to have all of these effects. Other effects will be apparent from the description of the specification, the drawings, the claims, and the like, and other effects can be derived from the description of the specification, the drawings, the claims, and the like.

BRIEF DESCRIPTION OF THE DRAWINGS

FIGS. 13A-13C A top view and cross-sectional views of a semiconductor device of one embodiment of the present invention.

FIGS. 17A-17C A top view and cross-sectional views illustrating a method for manufacturing a semiconductor device of one embodiment of the present invention.

FIGS. 39A-39C A top view and cross-sectional views illustrating a method for manufacturing a semiconductor device of one embodiment of the present invention.

FIGS. 41A-41C A top view and cross-sectional views illustrating a method for manufacturing a semiconductor device of one embodiment of the present invention.

FIGS. 44A-44C A top view and cross-sectional views illustrating a method for manufacturing a semiconductor device of one embodiment of the present invention.

FIGS. 50A-50C A top view and cross-sectional views illustrating a method for manufacturing a semiconductor device of one embodiment of the present invention.

FIGS. 65A-65F Diagrams illustrating electronic devices of one embodiment of the present invention.

MODE FOR CARRYING OUT THE INVENTION

Figure 1A:
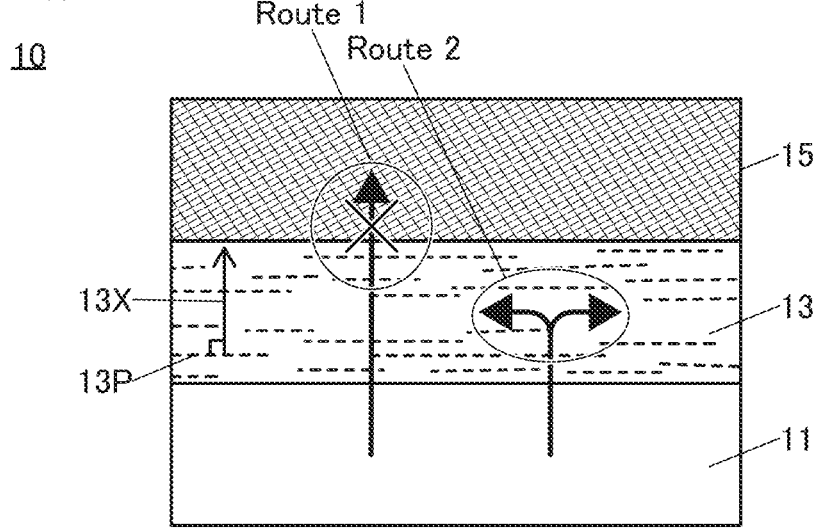
FIGS. 1A-1B Cross-sectional views of a stack of one embodiment of the present invention.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in an actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Moreover, the same hatching pattern is used for portions having similar functions, and the portions are not especially denoted by reference numerals in some cases.

Particularly in a top view (also referred to as a "plan view"), a perspective view, and the like, some components might not be illustrated for easy understanding of the invention. In addition, some hidden lines and the like might be omitted.

The ordinal numbers such as "first" and "second" in this specification and the like are used for convenience and do not denote the order of steps or the stacking order of layers. Therefore, for example, description can be made when "first" is replaced with "second", "third", or the like as appropriate. In addition, the ordinal numbers in this specification and the like are not necessarily the same as the ordinal numbers used to specify one embodiment of the present invention.

In this specification and the like, terms for describing arrangement, such as "over" and "below", are used for convenience to describe the positional relationship between components with reference to drawings. Furthermore, the positional relationship between components is changed as appropriate in accordance with a direction in which the components are described. Thus, terms for the description are not limited to terms used in this specification, and description can be made appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or text, a connection relationship other than a connection relationship shown in drawings or text is regarded as being disclosed in the drawings or the text.

Here, X and Y each denote an object (e.g., a device, an element, a circuit, a wiring, an electrode, a terminal, a conductive film, or a layer).

Furthermore, functions of a source and a drain might be interchanged with each other when a transistor of opposite polarity is employed or when the direction of current is changed in circuit operation, for example. Therefore, the terms "source" and "drain" can sometimes be interchanged with each other in this specification and the like.

Note that in this specification and the like, depending on the transistor structure, a channel width in a region where a channel is actually formed (hereinafter, also referred to as an "effective channel width") is different from a channel width shown in a top view of a transistor (hereinafter, also referred to as an "apparent channel width") in some cases. For example, when a gate electrode covers a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, an effective channel width is greater than an apparent channel width.

In such a case, an effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure an effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, DOS (Density of States) in a semiconductor might be increased or crystallinity might be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also serves as an impurity in some cases. Also in the case of an oxide semiconductor, oxygen vacancies are formed by entry of impurities, for example. Furthermore, when the semiconductor is silicon, examples of the impurity that changes characteristics of the semiconductor include oxygen, Group 1 elements except hydrogen, Group 2 elements, Group 13 elements, and Group 15 elements.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

Note that in this specification, a barrier film means a film having a function of inhibiting the passage of oxygen and impurities such as water and hydrogen, and the barrier film having conductivity is referred to as a conductive barrier film in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, in the case where an OS FET or an OS transistor is stated, the OS FET or the OS transistor can also be referred to as a transistor including an oxide or an oxide semiconductor.

In this specification and the like, "normally off" means that current per micrometer of channel width flowing through a transistor when a potential is not applied to a gate or a ground potential is applied to the gate is lower than or equal to $1\times10^{-20}$ A at room temperature, lower than or equal to $1\times10^{-18}$ A at 85° C., or lower than or equal to $1\times10^{-16}$ A at 125° C.

Embodiment 1

In this embodiment, a stack of one embodiment of the present invention will be described.

<Structure Example of Stack>

FIG. 1(A) is a cross-sectional view of a stack 10 of one embodiment of the present invention. As illustrated in FIG. 1(A), the stack 10 includes an insulator 11, a conductor 15, and an oxide 13 between the insulator 11 and the conductor 15.

For example, as the oxide 13, a metal oxide such as an In-M-Zn oxide (an element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Furthermore, as the oxide 13, an In—Ga oxide or an In—Zn oxide may be used.

The oxide 13 preferably has crystallinity. It is particularly preferable to use a CAAC-OS (c-axis aligned crystalline oxide semiconductor) for the oxide 13.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can also be referred to as an (In,M) layer.

The CAAC-OS is a metal oxide with high crystallinity. By contrast, in the CAAC-OS, a reduction in electron mobility due to a crystal grain boundary is less likely to occur because it is difficult to observe a clear crystal grain boundary. Entry of impurities, formation of defects, or the like might decrease the crystallinity of a metal oxide; thus, the CAAC-OS can be regarded as a metal oxide that has small amounts of impurities and defects (e.g., oxygen vacancies (also referred to as Vo)). Thus, a metal oxide including a CAAC-OS is physically stable. Therefore, the metal oxide including a CAAC-OS is resistant to heat and has high reliability.

Here, an example of a CAAC-OS analyzed by X-ray diffraction (XRD) will be described.

For example, when a CAAC-OS including an $InGaZnO_4$ crystal is subjected to structural analysis by an out-of-plane method, a peak appears at a diffraction angle (2θ) in the neighborhood of 31° in some cases. This peak is assigned to the (009) plane of the $InGaZnO_4$ crystal, which indicates that crystals in the CAAC-OS have c-axis alignment, and that the c-axes face a direction substantially perpendicular to the formation surface or the top surface.

Furthermore, an example of a CAAC-OS analyzed by electron diffraction will be described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) can be obtained. This diffraction pattern includes spots derived from the (009) plane of the $InGaZnO_4$ crystal. Thus, the electron diffraction also indicates that crystals included in the CAAC-OS have c-axis alignment, and that the c-axes face a direction substantially perpendicular to the formation surface or the top surface. Meanwhile, a ring-like diffraction pattern is shown when an electron beam with a probe diameter of 300 nm is incident on the same sample in a direction perpendicular to the sample surface. Thus, the electron diffraction also indicates that the a-axes and b-axes of the crystals included in the CAAC-OS do not have regular alignment.

Here, in crystallography, in a unit cell formed with three axes (crystal axes) of the a-axis, the b-axis, and the c-axis, a specific axis is generally taken as the c-axis in the unit cell. In particular, in the case of a crystal having a layered structure, two axes parallel to the plane direction of a layer are regarded as the a-axis and the b-axis and an axis intersecting with the layer is regarded as the c-axis in general. A typical example of such a crystal having a layered structure is graphite, which is classified as a hexagonal system. In a unit cell of graphite, the a-axis and the b-axis are parallel to the cleavage plane and the c-axis is orthogonal to the cleavage plane. For example, an $InGaZnO_4$ crystal having a $YbFe_2O_4$ type crystal structure which is a layered structure can be classified as a hexagonal system, and in a unit cell thereof, the a-axis and the b-axis are parallel to the plane direction of the layer and the c-axis is orthogonal to the layer (i.e., the a-axis and the b-axis).

The oxide 13 includes a c-axis-aligned crystal region. As illustrated in FIG. 1(A), the oxide 13 includes a layer 13P of crystals that extend in the a-b plane direction and a c-axis 13X perpendicular to the a-b plane. The oxide 13 includes a plurality of layers 13P and a plurality of c-axes 13X. In the oxide 13, the c-axes 13X of the crystal region are substantially perpendicular to the plane of the oxide 13 on the insulator 11 side. The expression "substantially perpendicular to a plane" is synonymous with the expression "substantially parallel to the normal to a plane". That is, in the oxide 13, the c-axes 13X of the crystal region can be regarded as being substantially parallel to the normal to the plane of the oxide 13 on the insulator 11 side. The insulator 11 is preferably provided in contact with the oxide 13. When the insulator 11 is provided in contact with the oxide 13, a region including the c-axes 13X substantially perpendicular to the plane of the oxide 13 on the insulator 11 side is easily formed.

The a-b plane of the oxide 13 can be confirmed by observation of a crystal lattice image of atoms arranged in a layered manner in the cross-sectional observation with the use of, for example, transmission electron microscopy (TEM).

In this specification and the like, the expression "a plane A and a straight line B are substantially perpendicular to each other" refers to a state where the angle formed by the plane A and the straight line B is greater than or equal to 60° and less than or equal to 90°. In this specification and the like, the expression "a plane A and a straight line B are substantially parallel to each other" refers to a state where the angle formed by the normal to the plane A and the straight line B is greater than or equal to 60° and less than or equal to 90°. In this specification and the like, the expression "a straight line C and a straight line D are substantially perpendicular to each other" refers to a state where the angle formed by the straight line C and the straight line D is greater than or equal to 60° and less than or equal to 90°. In this specification and the like, the expression "a straight line C and a straight line D are substantially parallel to each other" refers to a state where the angle formed by the straight line C and the straight line D is greater than or equal to 0° and less than or equal to 30°.

The thickness of the oxide 13 is preferably 2 nm or more, further preferably 3 nm or more, still further preferably 5 nm or more, for example. An increase in the thickness of the oxide 13 enables a region where the c-axes 13X are aligned substantially perpendicular to the plane of the oxide 13 on the insulator 11 side to be formed.

The CAAC-OS has such a property that oxygen is less likely to diffuse in the c-axis direction than in the a-b plane direction. Thus, when the oxide 13 includes a c-axis-aligned crystal region substantially perpendicular to the plane of the oxide 13 on the insulator 11 side, diffusion of oxygen to the conductor 15 from the insulator 11 or an insulator that is provided under the insulator 11 and contains oxygen can be inhibited. This can inhibit oxidation of the conductor 15 and thus can inhibit an increase in resistance of the conductor 15.

It is preferable to make the planarity of the insulator 11 favorable in order to provide such an oxide 13. For example, the average surface roughness (Ra) of the surface where the insulator 11 is formed is less than or equal to 1 nm, preferably less than or equal to 0.5 nm, further preferably less than or equal to 0.3 nm.

In this specification and the like, the average surface roughness (Ra) is obtained by three-dimensional expansion of arithmetic mean roughness that is defined by JIS B 0601:2001 (ISO4287:1997) so as to be applied to a curved surface, and is represented by an average value of the absolute values of deviations from a reference surface to a specific surface. The average surface roughness (Ra) can be measured with an atomic force microscope (AFM).

An insulating oxide, an insulating nitride, an insulating oxynitride, an insulating nitride oxide, an insulating metal oxide, an insulating metal oxynitride, an insulating metal nitride oxide, an insulating resin, or the like can be used as the insulator 11. For example, silicon oxide, silicon oxynitride, silicon nitride oxide, silicon nitride, gallium oxide, hafnium oxide, zirconium oxide, an oxide containing aluminum and hafnium, an oxynitride containing aluminum and hafnium, an oxide containing silicon and hafnium, an oxynitride containing silicon and hafnium, or a nitride containing silicon and hafnium can be used. A stack including a plurality of insulating layers formed of the above materials may be used.

When the insulator 11 contains oxygen, especially when the insulator 11 contains excess oxygen, oxygen is sometimes released from the insulator 11. When released oxygen reaches the conductor 15, the conductor 15 is oxidized, thereby increasing the resistance of the conductor 15 in some cases. In the case where the oxide 13 includes the region where the c-axes 13X are aligned substantially perpendicular to the plane of the oxide 13 on the insulator 11 side in the stack 10 of one embodiment of the present invention, oxygen diffused to the oxide 13 from the insulator 11 or the insulator that is provided under the insulator 11 and contains oxygen easily diffuses in the a-b plane direction in the oxide 13 (a diffusion path Route 2 in FIG. 1(A)). By contrast, oxygen diffused to the oxide 13 is less likely to diffuse in the c-axis direction in the oxide 13. Since oxygen is less likely to diffuse in the c-axis direction, oxygen can be inhibited from diffusing to the conductor 15 from the insulator 11 or the insulator that is provided under the insulator 11 and contains oxygen (a diffusion path Route 1 in FIG. 1(A)). This can inhibit oxidation of the conductor 15 and thus can inhibit an increase in the resistance of the conductor 15.

Figure 1B:
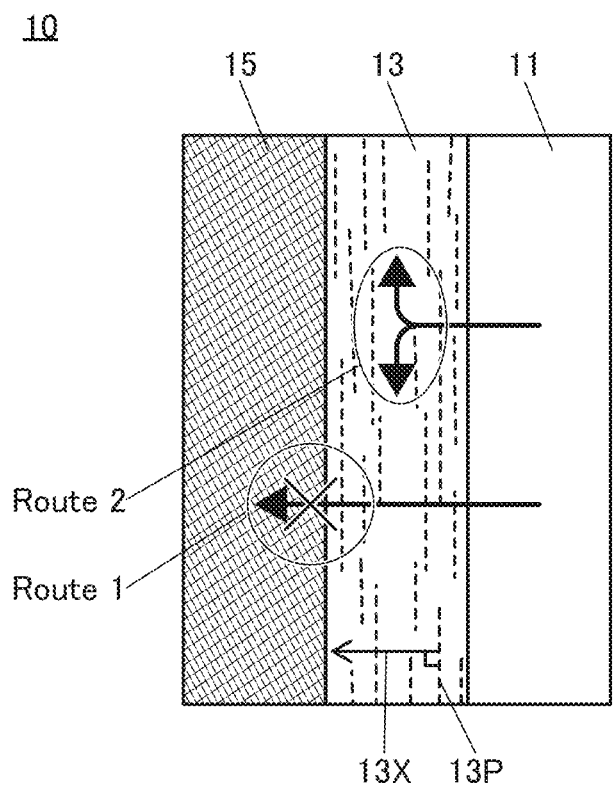

Although FIG. 1(A) illustrates an example where the c-axes 13X are in the vertical direction of the drawing, one embodiment of the present invention is not limited thereto. As illustrated in FIG. 1(B), the c-axes 13X may be in the horizontal direction of the drawing, for example. The c-axes 13X can be at a given angle in the drawing.

Next, a structure different from the structure of the stack 10 illustrated in FIG. 1(A) and FIG. 1(B) is described.

Figure 2A:
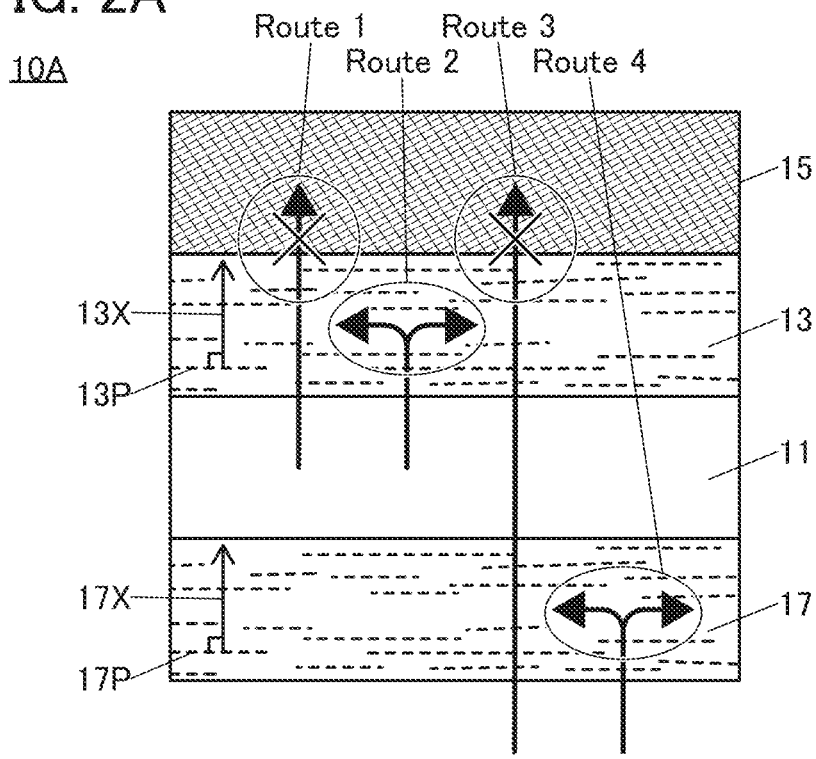
FIGS. 2A-2B Cross-sectional views of a stack of one embodiment of the present invention.

FIG. 2(A) is a cross-sectional view of a stack 10A of one embodiment of the present invention. As illustrated in FIG. 2(A), the stack 10A includes the insulator 11, the conductor 15, the oxide 13 between the insulator 11 and the conductor 15, and an oxide 17 that faces the oxide 13 with the insulator 11 positioned therebetween. The stack 10A is different from the stack 10 in including the oxide 17.

A metal oxide is preferably used as the oxide 17. The description of the oxide 13 can be referred to for the metal oxide to be the oxide 17; thus, the detailed description is omitted. The oxide 17 preferably has crystallinity. In particular, the CAAC-OS is preferably used as the oxide 17.

The oxide 17 has crystallinity and includes a layer 17P of crystals that extend in the a-b plane direction and a c-axis 17X perpendicular to the a-b plane direction. The oxide 17 includes a region including the c-axis 17X substantially perpendicular to the plane of the oxide 17 on the insulator 11 side. The oxide 17 can be regarded as including a region that includes the c-axis 17X substantially parallel to the normal to the plane of the oxide 17 on the insulator 11 side.

The thickness of the oxide 17 is preferably 2 nm or more, further preferably 3 nm or more, still further preferably 5 nm or more, for example. An increase in the thickness of the oxide 17 enables a region where the c-axes 17X are aligned substantially perpendicular to the plane of the oxide 17 on the insulator 11 side to be formed.

When the oxide 17 includes a region where the c-axes 17X are aligned substantially perpendicular to the plane of the oxide 17 on the insulator 11 side, diffusion of oxygen to the conductor 15 from an insulator that is provided under the oxide 17 and contains oxygen can be inhibited. This can inhibit oxidation of the conductor 15 and thus can inhibit an increase in the resistance of the conductor 15.

Oxygen is sometimes released from the insulator that is provided under the oxide 17 and contains oxygen. When the oxide 13 includes the region where the c-axes 13X are aligned substantially perpendicular to the plane of the oxide 13 on the insulator 11 side in the stack 10A of one embodiment of the present invention, oxygen diffused to the oxide 17 from the insulator that is provided under the oxide 17 and contains oxygen easily diffuses in the a-b plane direction in the oxide 17 (a diffusion path Route 4 in FIG. 2(A)). By contrast, oxygen diffused to the oxide 17 is less likely to diffuse in the c-axis direction in the oxide 17. Since oxygen is less likely to diffuse in the c-axis direction, oxygen can be inhibited from diffusing to the conductor 15 from the insulator that is provided under the oxide 17 and contains oxygen (a diffusion path Route 3 in FIG. 2(A)). This can inhibit oxidation of the conductor 15 and thus can inhibit an increase in the resistance of the conductor 15.

Figure 2B:
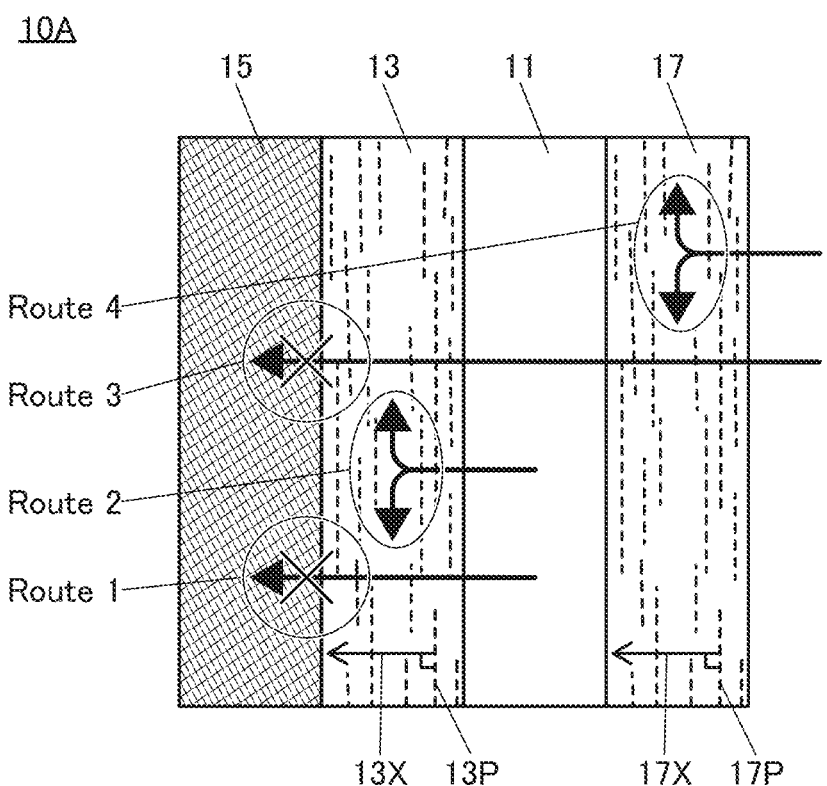

Although FIG. 2(A) illustrates an example where the c-axes 13X and the c-axes 17X are in the vertical direction of the drawing, one embodiment of the present invention is not limited thereto. As illustrated in FIG. 2(B), the c-axes 13X and the c-axes 17X may be in the horizontal direction of the drawing, for example. The c-axes 17X can be at a given angle in the drawing. The direction of the c-axes 13X may be different from that of the c-axes 17X.

According to one embodiment of the present invention, a stack with excellent electrical characteristics can be provided. Alternatively, according to one embodiment of the present invention, a stack with high reliability can be provided.

<Oxygen Transfer in In—Ga—Zn Oxide>

The mobility of an oxygen atom in an InGaZnO$_4$ crystal is described in terms of an activation barrier along an oxygen transfer path.

Figure 3A:
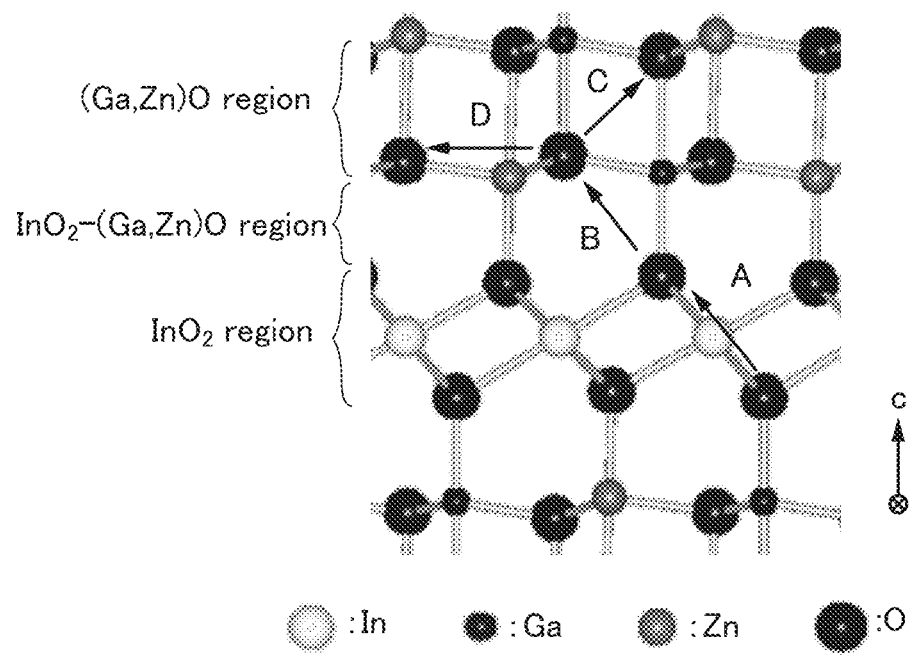
FIGS. 3A-3B Diagrams illustrating a transfer path of oxygen in an In—Ga—Zn oxide.
Figure 3B:
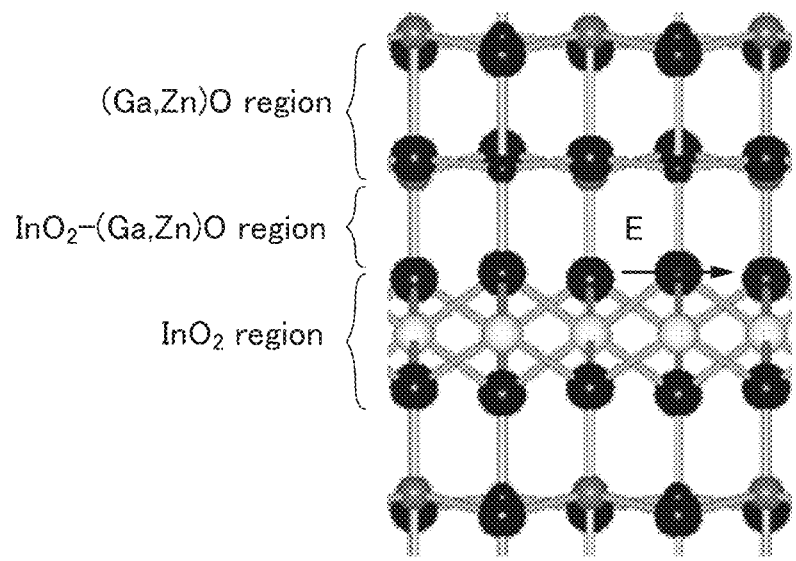

FIG. 3(A) and FIG. 3(B) are schematic views of different regions in a single crystal InGaZnO$_4$ (c-InGaZnO$_4$), in which transfer paths of oxygen atoms are analyzed. Note that FIG. 3(B) is a schematic view obtained by rotating the schematic view in FIG. 3(A) around the c-axis as a rotation axis by 90°. Here, transfer of an oxygen atom through a transfer path A in an InO$_2$ region, a transfer path B in an InO$_2$—(Ga, Zn)O region, and a transfer path C and a transfer path D in a (Ga, Zn)O region in FIG. 3(A) and a transfer path E in the InO$_2$ region in FIG. 3(B) is analyzed.

The activation barrier is evaluated by the first-principles electron state calculation package VASP (Vienna ab initio simulation package), and the NEB (Nudged Elastic Band) method for finding a chemical reaction transfer path is used for the atomic relaxation calculation. The NEB method is a technique for finding a state in which required energy is the lowest between the initial state and the final state.

Table 1 shows the calculation results of the activation barriers along the transfer paths.

TABLE 1

| Transfer path | Activation barrier (eV) |
| --- | --- |
| A | 1.85 |
| B | 0.98 |
| C | 0.69 |
| D | 1.52 |
| E | 1.39 |

The above calculation reveals that, owing to a high activation barrier along the transfer path A, oxygen in the InGaZnO$_4$ layer is unlikely to move in the c-axis direction and oxygen is likely to move in a direction parallel to the layer. That is, the CAAC-OS has such a property that oxygen is less likely to diffuse in the c-axis direction than in the a-b plane direction. Thus, when the oxide 13 includes the region where the c-axes 13X are aligned substantially perpendicular to the plane of the oxide 13 on the insulator 11 side, diffusion of oxygen to the conductor 15 from the insulator 11 or the insulator that is provided under the insulator 11 and contains oxygen can be inhibited (the diffusion path Route 1 in FIG. 1(A)). This can inhibit oxidation of the conductor 15 and thus can inhibit an increase in the resistance of the conductor 15. With such a structure, a stack with excellent electrical characteristics can be obtained. Alternatively, one embodiment of the present invention enables a stack to have high reliability.

<Method for Fabricating Stack>

A method for fabricating the stack 10 and the stack 10A of one embodiment of the present invention will be described.

First, a substrate is prepared, and the oxide 17 is formed over the substrate. The oxide 17 can be formed by a sputtering method, a CVD method, an MBE method, a PLD method, an ALD method, or the like. Note that in the case where the stack 10 is fabricated, the oxide 17 is not formed.

In the case where the oxide 17 is formed by a sputtering method, oxygen or a mixed gas of oxygen and a rare gas is used as a sputtering gas. Increasing the proportion of oxygen contained in the sputtering gas can increase the amount of excess oxygen in the formed oxide. In the case where the oxide is formed by a sputtering method, the above In-M-Zn oxide target and the like can be used. Furthermore, a direct current (DC) power source or an alternating current (AC) power source such as a radio frequency (RF) power source is connected to a target, and required power can be applied depending on the electric conductivity of the target.

In the case where the oxide 17 is formed by a sputtering method, the crystallinity of the oxide 17 can be improved by forming the oxide while the substrate is heated. The substrate temperature is preferably higher than or equal to room temperature and lower than or equal to 250° C., further preferably higher than or equal to room temperature and lower than or equal to 200° C., still further preferably higher than or equal to room temperature and lower than or equal to 150° C. Note that one embodiment of the present invention is not limited thereto. In the case where the oxide 17 is formed by a sputtering method and the proportion of oxygen contained in the sputtering gas for film formation is higher than 30% and lower than or equal to 100%, preferably higher than or equal to 70% and lower than or equal to 100%, the crystallinity of the oxide 17 can be improved.

The oxide 17 can be formed using a target with In:Ga:Zn=1:1:0.5 [atomic ratio] (2:2:1 [atomic ratio]), 1:3:4 [atomic ratio], or In:Ga:Zn=4:2:4.1 [atomic ratio], for example. The deposition conditions and the atomic ratio are preferably selected as appropriate depending on characteristics required for the oxide 17.

Next, heat treatment is preferably performed before the formation of the insulator 11. The heat treatment is performed at higher than or equal to 100° C. and lower than or equal to 400° C., and is performed at 200° C., for example. Alternatively, the heat treatment is preferably performed at the same temperature as the deposition temperature of the insulator 11. Here, the deposition temperature is not limited to the substrate temperature during the deposition, and includes the set temperature of the deposition apparatus. For example, in the case where the insulator 11 is formed at 350° C., the heat treatment is preferably performed at 350° C. The heat treatment is preferably performed under reduced pressure, and for example, may be performed in a vacuum atmosphere. A vacuum atmosphere is kept by evacuation with a turbomolecular pump or the like. The pressure in a vacuum atmosphere of the treatment chamber is lower than or equal to $1\times10^{-2}$ Pa, preferably lower than or equal to $1 \times 10^{-3}$ Pa. Through the heat treatment, impurities such as water and hydrogen in the oxide 17 can be removed, for example.

Next, the insulator 11 is formed. The insulator 11 can be formed by a sputtering method, a CVD method, an MBE method, a PLD method, an ALD method, or the like. As the insulator 11, silicon oxide, hafnium oxide, gallium oxide, or the like is preferably formed by an ALD method. For example, a stacked-layer film of silicon oxide and gallium oxide over the silicon oxide is used as the insulator 11. Note that the deposition temperature at the time of forming the insulator 11 is preferably higher than or equal to 300° C. and lower than 450° C., further preferably higher than or equal to 300° C. and lower than 400° C., particularly preferably approximately 350° C. For example, when the insulator 11 is formed at 350° C., an insulator having few impurities can be formed.

Next, the oxide 13 is formed. The description of the oxide 17 can be referred to for the formation of the oxide 13; thus, the detailed description is omitted. The oxide 13 may be formed using a target similar to the target used for forming the oxide 17.

The oxide 13 is preferably formed while the substrate is heated. In that case, the substrate temperature is set to higher than or equal to 300° C., so that oxygen vacancies in the oxide 13 and the oxide 17 can be reduced. When the film formation is performed while the substrate is heated, the crystallinity of the oxide 13 and the oxide 17 can be improved.

In particular, at the time of the formation of the oxide 13, part of oxygen contained in the sputtering gas is supplied to the oxide 17 through the insulator 11 in some cases. Thus, the proportion of oxygen contained in the sputtering gas for the oxide 13 is higher than or equal to 70%, preferably higher than or equal to 80%, further preferably 100%. When the oxide is formed while the substrate is heated, the crystallinity of the oxide can be improved.

Next, the conductor 15 is formed. The conductor 15 can be formed by a sputtering method, a CVD method, an MBE method, a PLD method, an ALD method, or the like. As the ALD method, a thermal ALD method, a plasma ALD method, a PEALD method, or the like can be used.

For the conductor 15, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing the above metal element as its component; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electric conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

According to one embodiment of the present invention, a stack with excellent electrical characteristics can be provided. Alternatively, according to one embodiment of the present invention, a stack with high reliability can be provided. Alternatively, a novel semiconductor device using a stack of one embodiment of the present invention can be provided.

The structure, method, and the like described above in this embodiment can be used in combination as appropriate with the structures, methods, and the like described in the other embodiments.

Embodiment 2

Specific structure examples of a semiconductor device including a transistor in which the stack described in the above embodiment is used will be described below.

<Structure Example 1 of Semiconductor Device>

Figure 4A:
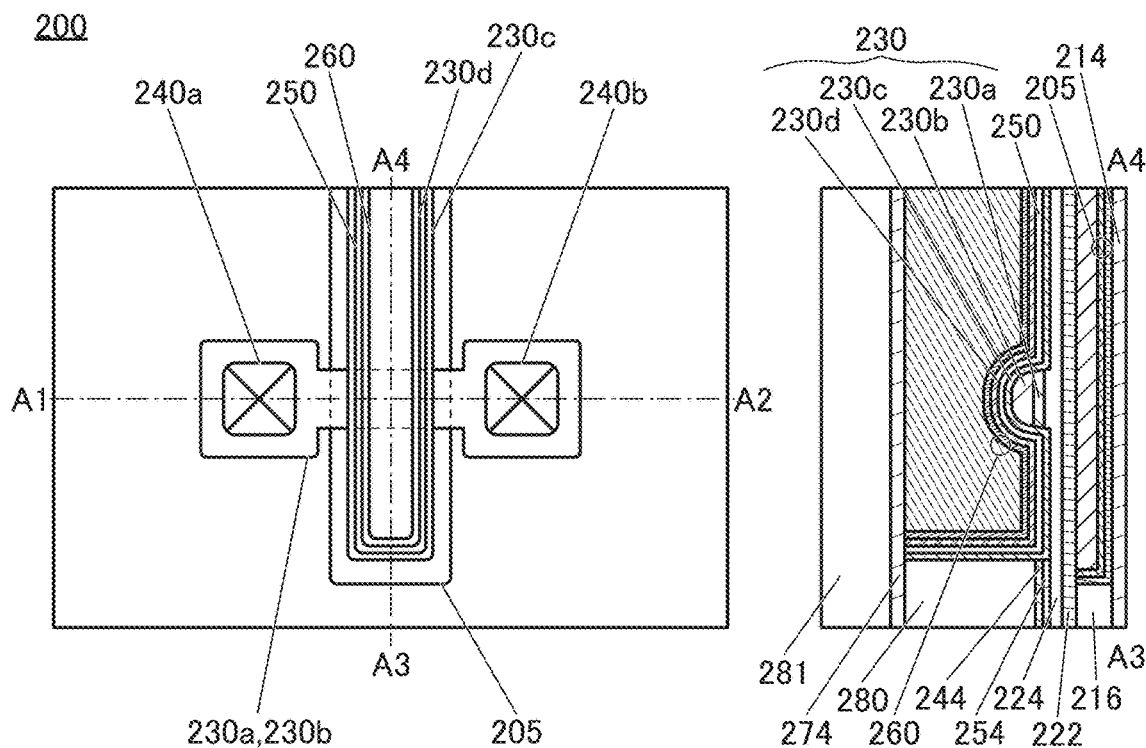
FIGS. 4A-4C A top view and cross-sectional views of a semiconductor device of one embodiment of the present invention.
Figure 4C:
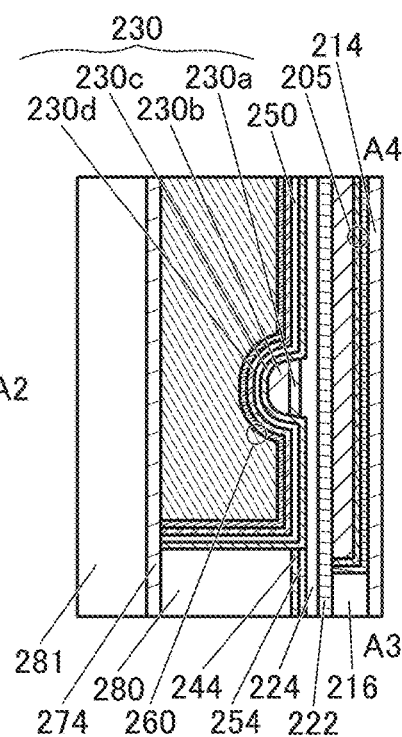
Figure 4B:
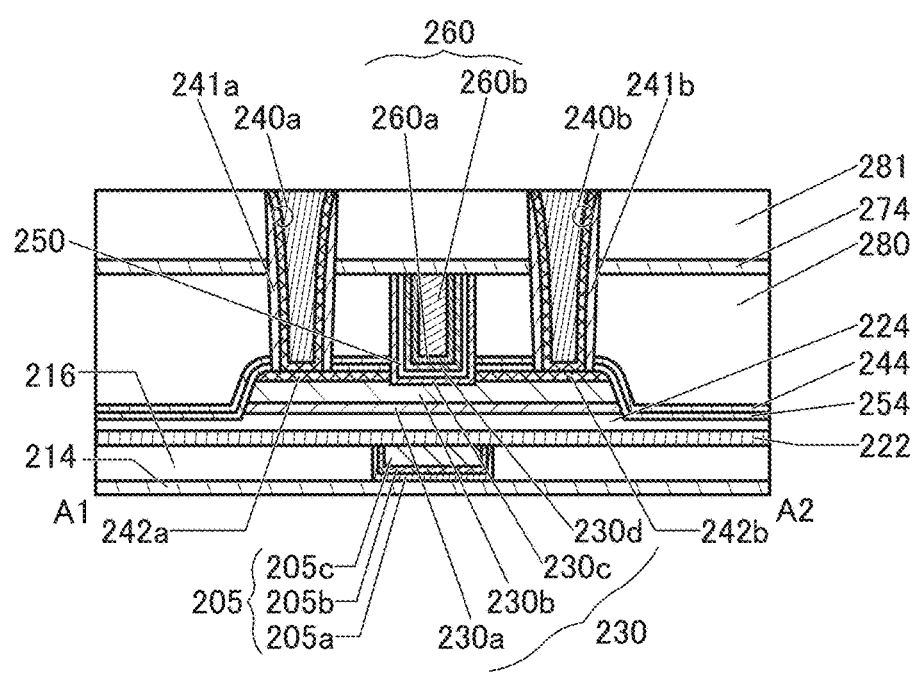

FIG. 4(A), FIG. 4(B), and FIG. 4(C) are a top view and cross-sectional views of a transistor 200 of one embodiment of the present invention and the periphery of the transistor 200.

FIG. 4(A) is a top view of a semiconductor device including the transistor 200. FIG. 4(B) and FIG. 4(C) are cross-sectional views of the semiconductor device. Here, FIG. 4(B) is a cross-sectional view of a portion indicated by the dashed-dotted line A1-A2 in FIG. 4(A), and is a cross-sectional view in the channel length direction of the transistor 200. FIG. 4(C) is a cross-sectional view of a portion indicated by the dashed-dotted line A3-A4 in FIG. 4(A), and is a cross-sectional view in the channel width direction of the transistor 200. Note that for simplification of the drawing, some components are not illustrated in the top view in FIG. 4(A).

As illustrated in FIG. 4, the transistor 200 includes an oxide 230a provided over a substrate (not illustrated); an oxide 230b provided over the oxide 230a; a conductor 242a and a conductor 242b provided on the top surface of the oxide 230b to be apart from each other; an insulator 280 that is provided over the conductor 242a and the conductor 242b and has an opening formed to overlap with a portion between the conductor 242a and the conductor 242b; an oxide 230c provided in the opening; an insulator 250 over the oxide 230c; an oxide 230d over the insulator 250; and a conductor 260 over the oxide 230d. Here, as illustrated in FIG. 4(B) and FIG. 4(C), the top surface of the conductor 260 is preferably substantially aligned with the top surfaces of the insulator 250, the oxide 230c, the oxide 230d, and the insulator 280.

Hereinafter, the oxide 230a, the oxide 230b, the oxide 230c, and the oxide 230d are collectively referred to as an oxide 230 in some cases. The conductor 242a and the conductor 242b are collectively referred to as a conductor 242 in some cases.

As illustrated in FIG. 4, an insulator 254 and an insulator 244 are preferably provided between the insulator 280, and an insulator 224, the oxide 230a, the oxide 230b, and the conductor 242. Here, as illustrated in FIG. 4(B) and FIG. 4(C), the insulator 254 is preferably in contact with the top surface and the side surface of the conductor 242a, the top surface and the side surface of the conductor 242b, the side surfaces of the oxide 230a and the oxide 230b, and the top surface of the insulator 224.

Note that although a structure of the transistor 200 in which three layers of the oxide 230a, the oxide 230b, and the oxide 230c are stacked in a region where a channel is formed (hereinafter, also referred to as a channel formation region) and in its vicinity is illustrated, the present invention is not limited thereto. For example, a two-layer structure of the oxide 230b and the oxide 230c or a stacked-layer structure of four or more layers may be employed. Alternatively, each of the oxide 230a, the oxide 230b, and the oxide 230c may have a stacked-layer structure of two or more layers. Although the transistor 200 with a structure in which the conductor 260 has a stacked-layer structure of two layers is described, the present invention is not limited thereto. For example, the conductor 260 may have a single-layer structure or a stacked-layer structure of three or more layers.

For example, when the oxide 230c has a stacked-layer structure including a first oxide and a second oxide over the first oxide, it is preferable that the first oxide have a composition similar to that of the oxide 230b and the second oxide have a composition similar to that of the oxide 230a. The oxide 230d preferably has a composition similar to that of the second oxide. The oxide 230d may have a stacked-layer structure of two or more layers.

Here, the conductor 260 functions as a gate electrode of the transistor, and the conductor 242a and the conductor 242b function as a source electrode and a drain electrode. As described above, the conductor 260 is formed to be embedded in the opening of the insulator 280 and the region between the conductor 242a and the conductor 242b. Here, the positions of the conductor 260, the conductor 242a, and the conductor 242b with respect to the opening of the insulator 280 are selected in a self-aligned manner. That is, in the transistor 200, the gate electrode can be positioned between the source electrode and the drain electrode in a self-aligned manner. Therefore, the conductor 260 can be formed without an alignment margin, resulting in a reduction in the area occupied by the transistor 200. Accordingly, miniaturization and high integration of the semiconductor device can be achieved.

The insulator 250 functions as a gate insulator of the transistor. The oxide 230d may also have a function of a gate insulating layer of the transistor. When having a sufficiently large band gap, the oxide 230d is not a semiconductor but an insulator or has properties close to those of an insulator, and thus can function as a gate insulating layer. When having a sufficiently high carrier density, the oxide 230d is a conductor or has properties close to those of a conductor, and thus can function as a gate electrode.

As illustrated in FIG. 4, the conductor 260 preferably includes a conductor 260a provided inside the insulator 250 and a conductor 260b provided to be embedded inside the conductor 260a.

Here, the conductor 260 corresponds to the conductor 15 in each of the stack 10 and the stack 10A described in the above embodiment. The oxide 230d corresponds to the oxide 13 in each of the stack 10 and the stack 10A described in the above embodiment. The insulator 250 corresponds to the insulator 11 in each of the stack 10 and the stack 10A described in the above embodiment. The oxide 230c corresponds to the oxide 17 in the stack 10A described in the above embodiment.

Figure 5:
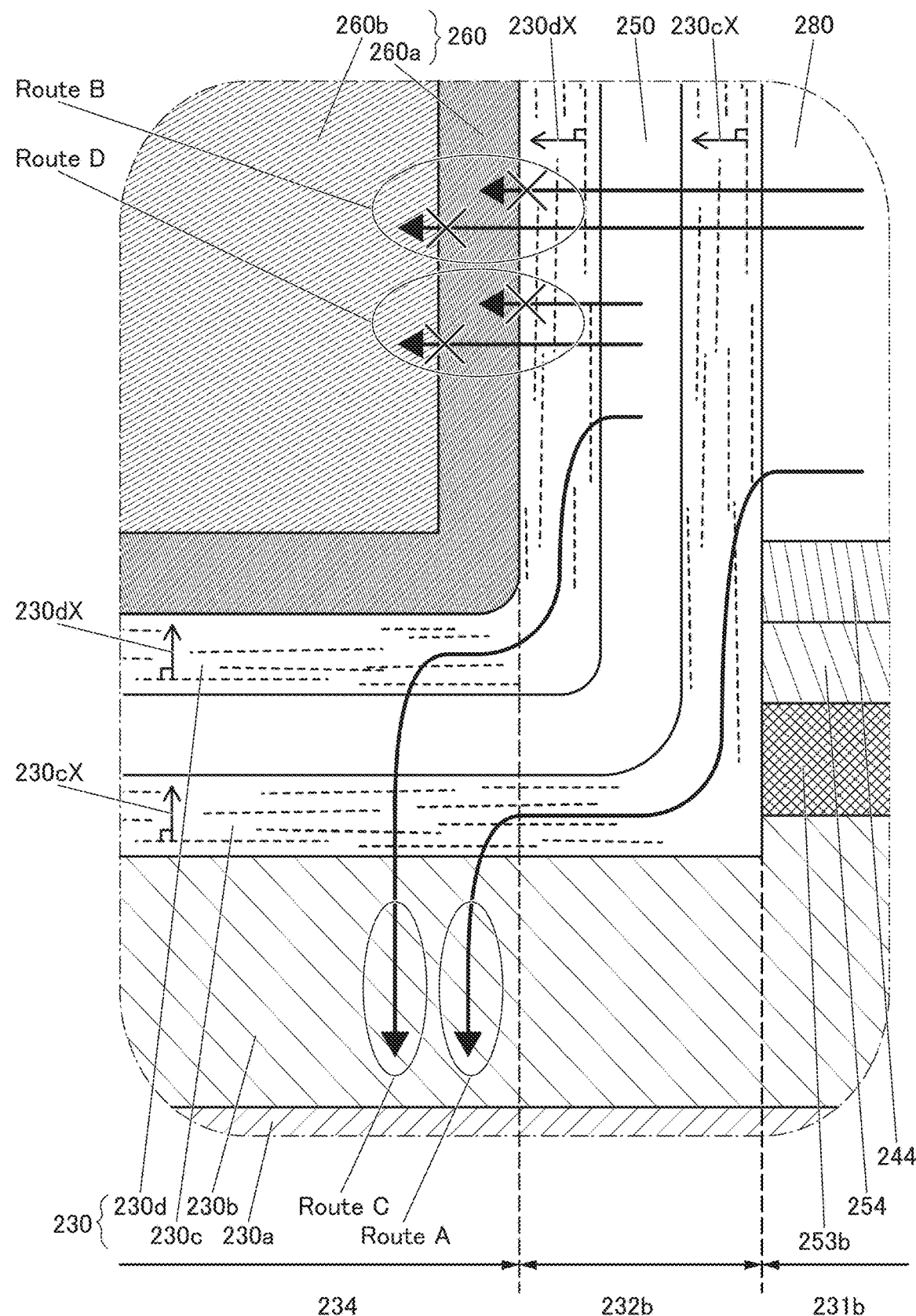
FIG. 5 A cross-sectional view of a semiconductor device of one embodiment of the present invention.
Figure 6:
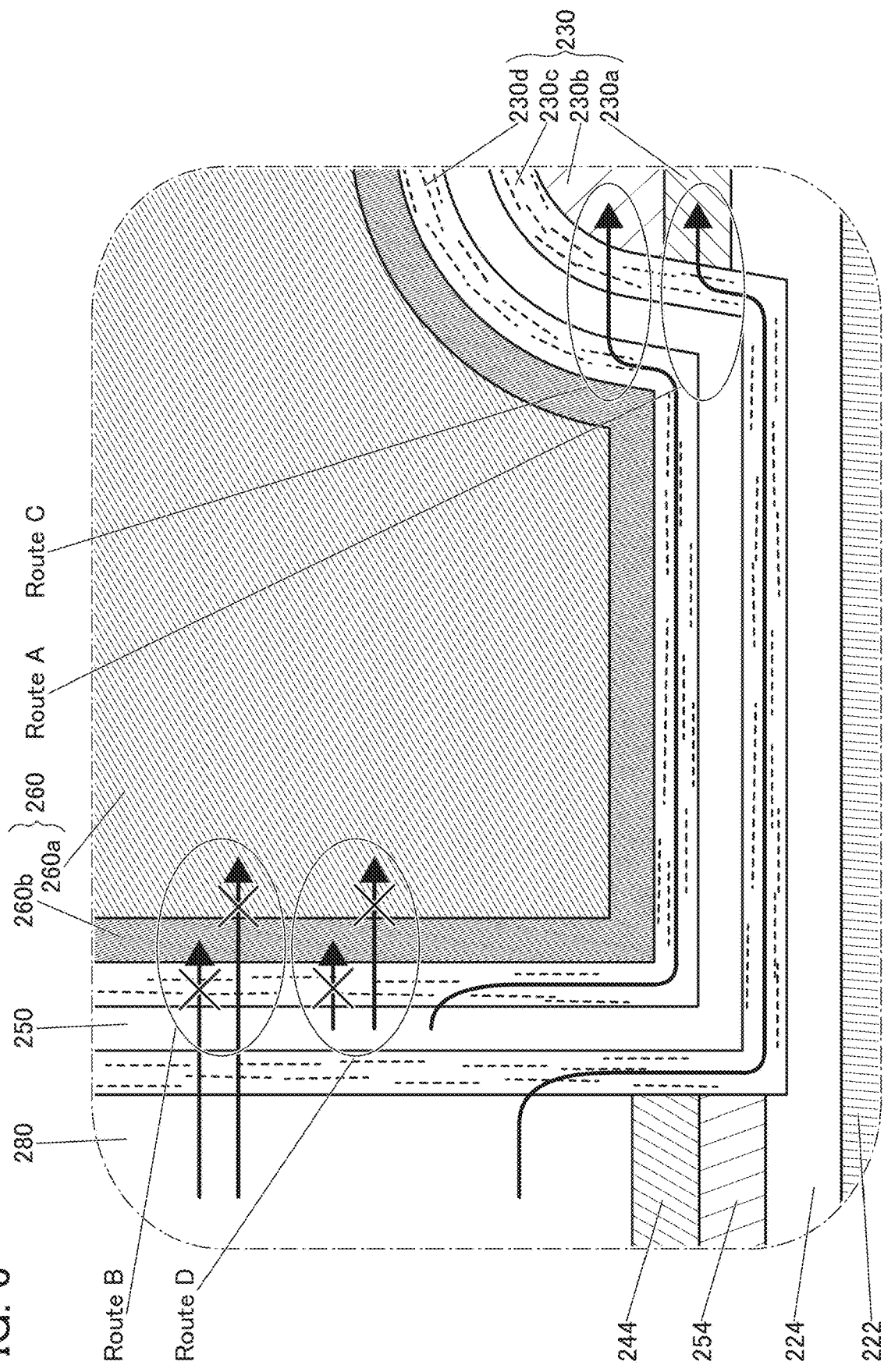
FIG. 6 A cross-sectional view of a semiconductor device of one embodiment of the present invention.

The path of oxygen diffused from the insulator 280 into the oxide 230b is described. FIG. 5 is an enlarged view of the oxide 230 in FIG. 4(B) and its vicinity. FIG. 6 is an enlarged view of the oxide 230 in FIG. 4(C) and its vicinity. In FIG. 5 and FIG. 6, layers of crystals that extend in the a-b plane direction in each of the oxide 230c and the oxide 230d are shown by dashed lines.

Oxygen contained in the insulator 280 diffuses to the oxide 230c and then diffuses in the a-b plane direction of the oxide 230c. Here, oxygen diffusing in the a-b plane direction of the oxide 230c and reaching the oxide 230b is bonded to oxygen vacancies in the oxide 230b, thereby reducing the oxygen vacancies (Route A in FIG. 5 and FIG. 6). Oxygen bonded to the oxygen vacancies in the oxide 230b moves to other oxygen vacancies to be bonded to the oxygen vacancies. Oxygen vacancies generated by the movement of oxygen are bonded to oxygen diffused from the insulator 280 to the oxide 230b through the oxide 230c. With repetition of this, oxygen contained in the insulator 280 diffuses to the oxide 230b through the oxide 230c one after another and is bonded to the oxygen vacancies in the oxide 230b. Accordingly, the oxygen vacancies in the oxide 230b can be reduced, so that the transistor can be inhibited from becoming normally on.

For example, as the insulator 280 in contact with the oxide 230c, an insulator containing oxygen more than oxygen in the stoichiometric composition may be used. That is, an excess-oxygen region is preferably formed in the insulator 280. When such an insulator containing excess oxygen is provided in contact with the oxide 230c, oxygen vacancies in the oxide 230 can be reduced and the reliability of the transistor 200 can be improved. The insulator 280 containing oxygen more than oxygen in the stoichiometric composition can be referred to as OST (Oxygen Storage Tank or Oxygen Stock Tank).

Oxygen contained in the insulator 280 is unlikely to diffuse in the direction of a c-axis 230cX in the oxide 230c and the direction of a c-axis 230dX in the oxide 230d; thus, diffusion of oxygen into the conductor 260 can be inhibited (Route B in FIG. 5 and FIG. 6). This can inhibit oxidation of the conductor 260 and thus can inhibit deterioration of the electrical characteristics of the transistor. Thus, the transistor can have stable electrical characteristics and increased reliability.

Oxygen contained in the insulator 250 diffuses to the oxide 230d and then diffuses in the a-b plane direction of the oxide 230d. The oxygen diffuses to the oxide 230b through the insulator 250 and the oxide 230c (Route C in FIG. 5 and FIG. 6). Accordingly, the oxygen vacancies in the oxide 230b can be reduced, so that the transistor can be inhibited from becoming normally on. Oxygen contained in the insulator 250 is unlikely to diffuse in the direction of the c-axis 230cX in the oxide 230c and the direction of the c-axis 230dX in the oxide 230d; thus, diffusion of oxygen into the conductor 260 can be inhibited (Route D in FIG. 5 and FIG. 6). Accordingly, oxidation of the conductor 260 can be inhibited, and deterioration of the electrical characteristics of the transistor can be inhibited. Thus, the transistor can have stable electrical characteristics and increased reliability. Note that oxygen contained in the insulator 250 diffuses to the insulator 250 and then diffuses to the oxide 230b through the oxide 230c in some cases.

Figure 7:
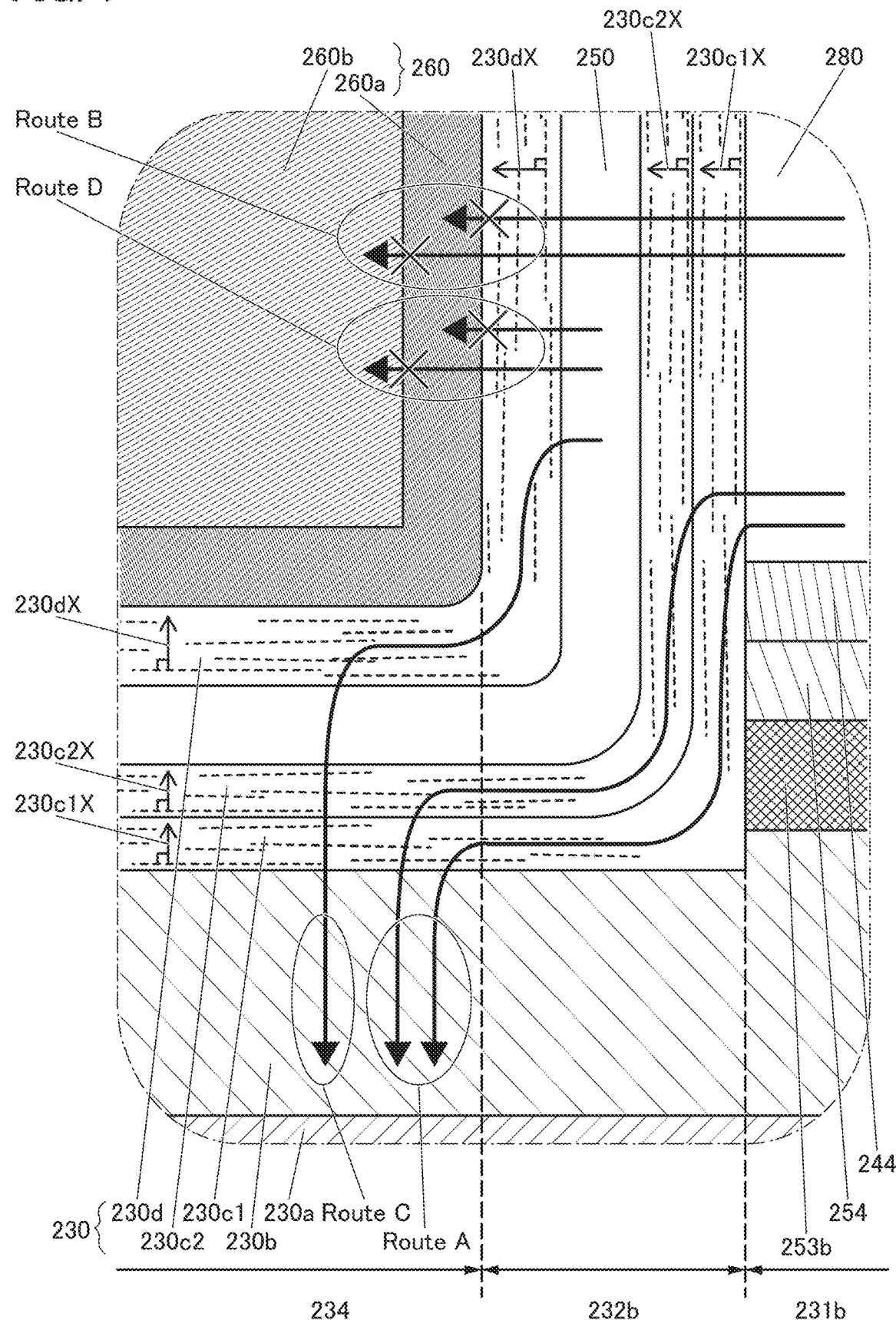
FIG. 7 A cross-sectional view of a semiconductor device of one embodiment of the present invention.

FIG. 7 is an enlarged view of the oxide 230 and its vicinity in the case where the oxide 230c has a stacked-layer structure including a first oxide 230c1 and a second oxide 230c2 over the first oxide. FIG. 7 is an enlarged view of the oxide 230 in FIG. 4(B) and its vicinity. In FIG. 7, layers of crystals that extend in the a-b plane direction in each of the first oxide 230c1, the second oxide 230c2, and the oxide 230d are shown by dashed lines. The first oxide 230c1 and the second oxide 230c2 each preferably include a c-axis-aligned crystal region. FIG. 7 illustrates a c-axis 230c1X of the first oxide 230c1 and a c-axis 230c2X of the second oxide 230c2. It is preferable that the c-axis 230c1X and the c-axis 230c2X be substantially perpendicular to the interface between the oxide 230c and the insulator 250.

Figure 8:
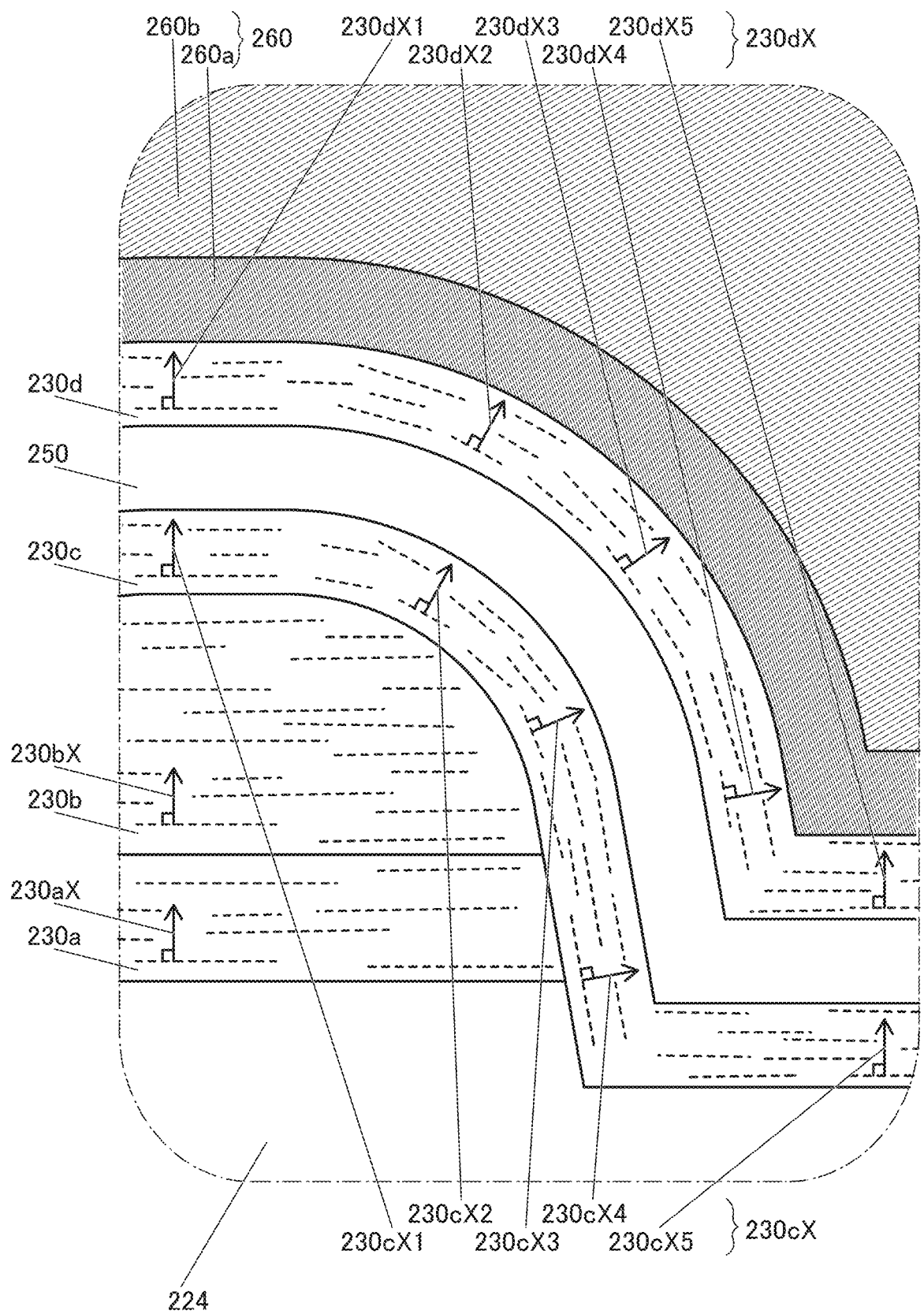
FIG. 8 A cross-sectional view of a semiconductor device of one embodiment of the present invention.

The direction of the c-axis of each of the oxide 230a to the oxide 230d is described. FIG. 8 is an enlarged view of the oxide 230 in FIG. 4(C) and its vicinity. In FIG. 8, layers of crystals that extend in the a-b plane direction in each of the oxide 230a, the oxide 230b, the oxide 230c, and the oxide 230d are shown by dashed lines. A c-axis 230aX of the oxide 230a is substantially perpendicular to the interface between the oxide 230a and the insulator 224 on which the oxide 230a is formed. The oxide 230a has a plurality of c-axes 230aX, and the c-axes 230aX are substantially parallel to each other. A c-axis 230bX of the oxide 230b is substantially perpendicular to the interface between the oxide 230b and the oxide 230a on which the oxide 230b is formed. The oxide 230b has a plurality of c-axes 230bX, and the c-axes 230bX are substantially parallel to each other.

The c-axis 230cX of the oxide 230c is substantially perpendicular to the interface between the oxide 230c and the oxide 230b on which the oxide 230c is formed. FIG. 8 illustrates a c-axis 230cX1 to a c-axis 230cX5 as an example of the c-axis 230cX. The c-axis 230cX1 to the c-axis 230cX5 are each substantially perpendicular to the nearest interface between the oxide 230b and the oxide 230c. The oxide 230c includes a region having the c-axis 230cX that is not parallel to either the c-axis 230aX or the c-axis 230bX. The oxide 230c can be regarded as including a region having the c-axis 230cX in a direction different from the direction of the c-axis 230aX and the c-axis 230bX. Such a structure can inhibit oxygen released from the oxide 230a or the oxide 230b from diffusing in the a-b plane direction of the oxide 230a or the oxide 230b and to the outside of the oxide 230a or the oxide 230b. Thus, the formation of oxygen vacancies in the oxide 230a and the oxide 230b can be inhibited.

FIG. 8 illustrates an example where the c-axis 230cX1 and the c-axis 230cX5 of the oxide 230c are substantially parallel to the c-axis 230aX and the c-axis 230bX, whereas the c-axis 230cX2 to the c-axis 230cX4 of the oxide 230c are not parallel to either the c-axis 230aX or the c-axis 230bX. The angle formed by the c-axis 230cX of the oxide 230c and the c-axis 230bX is preferably greater than 30° and less than or equal to 90°. The angle formed by the c-axis 230cX of the oxide 230c and the c-axis 230bX is further preferably greater than or equal to 40° and less than or equal to 90°. The angle formed by the c-axis 230cX of the oxide 230c and c-axis 230bX is further preferably greater than or equal to 45° and less than or equal to 90°.

Note that in this specification and the like, the expression "a straight line E is not parallel to a straight line F" refers to a state where the angle formed by the straight line E and the straight line F is greater than 30°. In this specification and the like, the expression "the direction of a straight line E is different from that of a straight line F" refers to a state where the straight line E is not parallel to the straight line F.

The c-axis 230dX of the oxide 230d is substantially perpendicular to the interface between the oxide 230d and the insulator 250 on which the oxide 230d is formed. FIG. 8 illustrates a c-axis 230dX1 to a c-axis 230dX5 as an example of the c-axis 230dX. The c-axis 230dX1 to the c-axis 230dX5 are each substantially perpendicular to the nearest interface between the insulator 250 and the oxide 230c. The oxide 230d includes a region having the c-axis 230dX that is not parallel to either the c-axis 230aX or the c-axis 230bX. The oxide 230d can be regarded as including a region having the c-axis 230dX in a direction different from the direction of the c-axis 230aX and the c-axis 230bX. Such a structure can inhibit oxygen released from the oxide 230a or the oxide 230b from diffusing in the a-b plane direction of the oxide 230a or the oxide 230b and to the outside of the oxide 230a or the oxide 230b. Thus, the formation of oxygen vacancies in the oxide 230a and the oxide 230b can be inhibited.

FIG. 8 illustrates an example where the c-axis 230dX1 and the c-axis 230dX5 of the oxide 230d are substantially parallel to the c-axis 230aX and the c-axis 230bX, whereas the c-axis 230dX2 to the c-axis 230dX4 of the oxide 230d are not parallel to either the c-axis 230aX or the c-axis 230bX. The angle formed by the c-axis 230dX of the oxide 230d and the c-axis 230bX is preferably greater than 30° and less than or equal to 90°. The angle formed by the c-axis 230dX of the oxide 230d and the c-axis 230bX is further preferably greater than or equal to 40° and less than or equal to 90°. The angle formed by the c-axis 230dX of the oxide 230d and the c-axis 230bX is further preferably greater than or equal to 45° and less than or equal to 90°.

The transistor 200 preferably includes an insulator 214 provided over the substrate (not illustrated); an insulator 216 provided over the insulator 214; a conductor 205 provided to be embedded in the insulator 216; an insulator 222 provided over the insulator 216 and the conductor 205; and the insulator 224 provided over the insulator 222. The oxide 230a is preferably provided over the insulator 224.

An insulator 274 and an insulator 281 functioning as interlayer films are preferably provided over the transistor 200. Here, the insulator 274 is preferably provided in contact with the top surfaces of the conductor 260, the insulator 250, the oxide 230c, and the insulator 280.

The insulator 222, the insulator 254, and the insulator 274 preferably have a function of inhibiting diffusion of hydrogen (e.g., a hydrogen atom and a hydrogen molecule). For example, the insulator 222, the insulator 254, and the insulator 274 preferably have lower hydrogen permeability than the insulator 224, the insulator 250, and the insulator 280. In addition, the insulator 222 and the insulator 254 preferably have a function of inhibiting diffusion of oxygen (e.g., an oxygen atom and an oxygen molecule). For example, the insulator 222 and the insulator 254 preferably have lower oxygen permeability than the insulator 224, the insulator 250, and the insulator 280.

Here, the insulator 224, the oxide 230a, the oxide 230b, and the insulator 250 are separated from the insulator 280 and the insulator 281 by the insulator 254, the oxide 230c, and the insulator 274. Thus, entry of impurities such as hydrogen contained in the insulator 280 and the insulator 281 and excess oxygen into the insulator 224, the oxide 230a, the oxide 230b, and the insulator 250 can be inhibited.

In addition, a conductor 240 (a conductor 240a and a conductor 240b) that is electrically connected to the transistor 200 and functions as a plug is preferably provided. Note that an insulator 241 (an insulator 241a and an insulator 241b) is provided in contact with a side surface of the conductor 240 functioning as a plug. In other words, the insulator 241 is provided in contact with an inner wall of the opening in the insulator 254, the insulator 280, the insulator 274, and the insulator 281. Alternatively, a structure may be employed in which a first conductor of the conductor 240 is provided in contact with a side surface of the insulator 241 and a second conductor of the conductor 240 is further provided on the inner side. Here, a top surface of the conductor 240 and a top surface of the insulator 281 can be substantially level with each other. Note that although the transistor 200 having a structure in which the first conductor of the conductor 240 and the second conductor of the conductor 240 are stacked is illustrated, the present invention is not limited thereto. For example, the conductor 240 may be provided as a single layer or to have a stacked-layer structure of three or more layers. When a component has a stacked-layer structure, layers may be distinguished by ordinal numbers corresponding to the formation order.

In the transistor 200, as the oxide 230a, the oxide 230b, and the oxide 230c that include the channel formation region, a metal oxide functioning as an oxide semiconductor (hereinafter, also referred to as an oxide semiconductor) is preferably used. For example, it is preferable to use a metal oxide having a band gap of 2 eV or more, preferably 2.5 eV or more as the metal oxide to be the channel formation region of the oxide 230. With the use of a metal oxide having such a wide band gap, the leakage current in a non-conduction state (off-state current) of the transistor can be extremely low. With the use of such a transistor, a semiconductor device with low power consumption can be provided.

For example, as the oxide 230, a metal oxide such as an In-M-Zn oxide (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Furthermore, indium oxide, zinc oxide, an In—Ga oxide, an In—Zn oxide, a Ga—Zn oxide, or gallium oxide may be used as the oxide 230.

As illustrated in FIG. 4(B), the oxide 230b in a region that does not overlap with the conductor 242 sometimes has smaller thickness than the oxide 230b in a region overlapping with the conductor 242. The thin region is formed when part of a top surface of the oxide 230b is removed at the time of forming the conductor 242a and the conductor 242b. When a conductive film to be the conductor 242 is formed, a low-resistance region is sometimes formed on the top surface of the oxide 230b in the vicinity of an interface with the conductive film. Removal of the low-resistance region positioned between the conductor 242a and the conductor 242b on the top surface of the oxide 230b in the above manner can prevent formation of the channel in the region.

Accordingly, a semiconductor device including a transistor with high on-state current can be provided. Alternatively, a semiconductor device including a transistor with excellent frequency characteristics can be provided. Alternatively, a semiconductor device that has stable electrical characteristics with reduced variations in electrical characteristics and higher reliability can be provided. Alternatively, a semiconductor device including a transistor with low off-state current can be provided.

The detailed structure of the semiconductor device including the transistor 200 of one embodiment of the present invention is described below.

The conductor 205 is provided to overlap with the oxide 230 and the conductor 260. Furthermore, the conductor 205 is preferably provided to be embedded in the insulator 216. Here, the top surface of the conductor 205 preferably has favorable planarity. For example, the average surface roughness (Ra) of the top surface of the conductor 205 is less than or equal to 1 nm, preferably less than or equal to 0.5 nm, further preferably less than or equal to 0.3 nm. This allows the improvement in planarity of the insulator 224 formed over the conductor 205 and the increase in crystallinity of the oxide 230a, the oxide 230b, and the oxide 230c.

Here, the conductor 260 sometimes functions as a first gate (also referred to as top gate) electrode. The conductor 205 sometimes functions as a second gate (also referred to as bottom gate) electrode. In such cases, Vth of the transistor 200 can be controlled by changing a potential applied to the conductor 205 independently of a potential applied to the conductor 260. In particular, Vth of the transistor 200 can be higher than 0 V and the off-state current can be reduced by application of a negative potential to the conductor 205. Thus, drain current when a potential applied to the conductor 260 is 0 V can be lower in the case where a negative potential is applied to the conductor 205 than in the case where the negative potential is not applied.

In addition, the conductor 205 is preferably larger than the channel formation region of the oxide 230. As illustrated in FIG. 4(C), it is particularly preferable that the conductor 205 also extend to a region outside an end portion of the oxide 230 that intersects with the channel width direction. That is, the conductor 205 and the conductor 260 preferably overlap with each other with the insulators therebetween outside the side surface of the oxide 230 in the channel width direction.

Since the above-described structure is included, the channel formation region of the oxide 230 can be electrically surrounded by the electric field of the conductor 260 functioning as the first gate electrode and the electric field of the conductor 205 functioning as the second gate electrode.

Furthermore, as illustrated in FIG. 4(C), the conductor 205 is extended to function as a wiring as well. However, without limitation to this structure, a structure where a conductor functioning as a wiring is provided below the conductor 205 may be employed. In addition, the conductor 205 is not necessarily provided in each transistor. For example, the conductor 205 may be shared by a plurality of transistors.

A conductive material containing tungsten, copper, or aluminum as its main component is preferably used for the conductor 205. Although an example where the conductor 205 has a stacked-layer structure including three layers of a conductor 205a, a conductor 205b, and a conductor 205c is described, this embodiment is not limited thereto. The conductor 205 may be a single layer or have a stacked-layer structure including two layers or four or more layers. In the case where the conductor 205 has a stacked-layer structure including three layers, it is preferable that the conductor 205a and the conductor 205b have a function of inhibiting diffusion of at least one of oxygen (e.g., an oxygen atom and an oxygen molecule) and impurities such as a hydrogen atom, a hydrogen molecule, a water molecule, a nitrogen atom, a nitrogen molecule, a nitrogen oxide molecule ($N_2O$, NO, $NO_2$, or the like), and a copper atom (or that at least one of the above impurities and oxygen be less likely to be transmitted). For such conductors, a conductive material selected from titanium, titanium nitride, tantalum, and tantalum nitride can be used. A conductive material containing tungsten, copper, or aluminum as its main component can be used for the conductor 205c.

Note that in this specification, a function of inhibiting diffusion of impurities or oxygen means a function of inhibiting diffusion of any one or all of the above impurities and oxygen.

When a conductor having a function of inhibiting oxygen diffusion is used as the conductor 205a or the conductor 205b, the conductivity of the conductor 205c can be inhibited from being lowered because of oxidation. As the conductor having a function of inhibiting oxygen diffusion, for example, tantalum, tantalum nitride, ruthenium, ruthenium oxide, or the like is preferably used. Accordingly, the conductor 205a or the conductor 205b may be a single layer or stacked layers of the above conductive materials.

The insulator 214 preferably functions as a barrier insulating film that inhibits entry of impurities such as water and hydrogen into the transistor 200 from the substrate side. Accordingly, for the insulator 214, it is preferable to use an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom (an insulating material through which the above impurities are less likely to pass). Alternatively, it is preferable to use an insulating material that has a function of inhibiting diffusion of oxygen (e.g., at least one of oxygen atoms, oxygen molecules, and the like) (through which the above oxygen is less likely to pass).

For example, aluminum oxide, silicon nitride, or the like is preferably used for the insulator 214. Accordingly, impurities such as water and hydrogen can be inhibited from diffusing to the transistor 200 side from the substrate side through the insulator 214. Alternatively, oxygen contained in the insulator 224 and the like can be inhibited from diffusing to the substrate side through the insulator 214.

The dielectric constants of the insulator 216, the insulator 280, and the insulator 281 functioning as interlayer films are preferably lower than that of the insulator 214. When a material with a low dielectric constant is used for an interlayer film, the parasitic capacitance generated between wirings can be reduced. For each of the insulator 216, the insulator 280, and the insulator 281, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate, for example.

The insulator 216 may have a stacked-layer structure. For example, in the insulator 216, an insulator similar to the insulator 214 may be provided at least in a portion that is in contact with a side surface of the conductor 205. With such a structure, oxidation of the conductor 205 due to oxygen contained in the insulator 216 can be inhibited. Alternatively, absorption of oxygen contained in the insulator 216 by the conductor 205 can be inhibited.

The insulator 222 and the insulator 224 each have a function of a gate insulator.

Here, it is preferable that oxygen be released from the insulator 224 in contact with the oxide 230 by heating. In this specification, oxygen that is released by heating is referred to as excess oxygen in some cases. For example, for the insulator 224, silicon oxide, silicon oxynitride, or the like is used as appropriate. When an insulator containing oxygen is provided in contact with the oxide 230, oxygen vacancies in the oxide 230 can be reduced and the reliability of the transistor 200 can be improved.

As the insulator 224, specifically, an oxide material from which part of oxygen is released by heating is preferably used. An oxide that releases oxygen by heating is an oxide film in which the amount of released oxygen converted into oxygen atoms is greater than or equal to $1.0 \times 10^{18}$ atoms/$cm^3$, preferably greater than or equal to $1.0 \times 10^{19}$ atoms/$cm^3$, further preferably greater than or equal to $2.0 \times 10^{19}$ atoms/$cm^3$ or greater than or equal to $3.0 \times 10^{20}$ atoms/$cm^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

As illustrated in FIG. 4(C), the insulator 224 in a region that does not overlap with the oxide 230b preferably has smaller thickness than the insulator 224 in the other regions. With such a structure, the lower end portion of the conductor 260 can be positioned lower; thus, the electric field of the conductor 260 functioning as the first gate electrode is easily applied to the side surface of the oxide 230. Thus, the on-state current of the transistor 200 can be increased and the frequency characteristics can be improved. Alternatively, the insulator 224 may have an island shape to overlap with the oxide 230b and the oxide 230a.

Like the insulator 214 and the like, the insulator 222 preferably functions as a barrier insulating film that inhibits entry of impurities such as water and hydrogen into the transistor 200 from the substrate side. For example, the insulator 222 preferably has lower hydrogen permeability than the insulator 224. When the insulator 224, the oxide 230, the insulator 250, and the like are surrounded by the insulator 222, the insulator 254, and the insulator 274, impurities such as water and hydrogen can be inhibited from entering the transistor 200 from the outside.

It is preferable that the insulator 222 have a function of inhibiting diffusion of oxygen (e.g., at least one of oxygen atoms, oxygen molecules, and the like) (or be less likely to transmit the above oxygen). For example, the insulator 222 preferably has lower oxygen permeability than the insulator 224. The insulator 222 preferably has a function of inhibiting diffusion of oxygen or impurities, in which case oxygen contained in the oxide 230 can be inhibited from diffusing to the substrate side. Furthermore, the conductor 205 can be inhibited from reacting with oxygen contained in the insulator 224 or the oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer that inhibits release of oxygen from the oxide 230 and entry of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

Alternatively, for example, a single layer or stacked layers of an insulator containing what is called a high-k material such as aluminum oxide, hafnium oxide, tantalum oxide, zirconium oxide, lead zirconate titanate (PZT), strontium titanate ($SrTiO_3$), or (Ba,Sr)$TiO_3$ (BST) may be used for the insulator 222. As miniaturization and high integration of transistors progress, a problem such as leakage current may arise because of a thinner gate insulator. When a high-k material is used for an insulator functioning as a gate insulator, a gate potential during operation of the transistor can be reduced while the physical thickness of the gate insulator is maintained. Note that among the above-described materials, hafnium oxide is particularly suitably used as the insulator 222. For example, when the insulator 222 is used as a gate insulator, the use of hafnium oxide as the insulator 222 can sometimes reduce the interface state density, as compared to the case of using aluminum oxide.

Note that the insulator 222 and the insulator 224 may each have a stacked-layer structure of two or more layers. In that case, without limitation to a stacked-layer structure formed of the same material, a stacked-layer structure formed of different materials may be employed. For example, an insulator similar to the insulator 224 may be provided below the insulator 222.

The transistor 200 includes the oxide 230a, the oxide 230b over the oxide 230a, the oxide 230c over the oxide 230b, and the oxide 230d over the oxide 230c. Including the oxide 230a below the oxide 230b makes it possible to inhibit diffusion of impurities into the oxide 230b from the components formed below the oxide 230a. Moreover, including the oxide 230c over the oxide 230b makes it possible to inhibit diffusion of impurities into the oxide 230b from the components formed above the oxide 230c.

Note that the oxide 230 preferably has a stacked-layer structure of oxides that differ in the atomic ratio of metal atoms. Specifically, the atomic ratio of the element M to the constituent elements in the metal oxide used as the oxide 230a is preferably higher than the atomic ratio of the element M to the constituent elements in the metal oxide used as the oxide 230b. In addition, the atomic ratio of the element M to In in the metal oxide used as the oxide 230a is preferably higher than the atomic ratio of the element M to In in the metal oxide used as the oxide 230b. Furthermore, the atomic ratio of In to the element M in the metal oxide used as the oxide 230b is preferably higher than the atomic ratio of In to the element M in the metal oxide used as the oxide 230a. A metal oxide that can be used as the oxide 230a or the oxide 230b can be used as the oxide 230c. A metal oxide that can be used as the oxide 230a or the oxide 230b can be used as the oxide 230d.

The oxide 230a, the oxide 230b, the oxide 230c, and the oxide 230d preferably have crystallinity, and in particular, a CAAC-OS is preferably used. An oxide having crystallinity, such as a CAAC-OS, has a dense structure with small amounts of impurities and defects (e.g., oxygen vacancies) and high crystallinity. The transistor 200 including such an oxide 230 has stability with respect to high temperatures in a manufacturing process (what is called thermal budget).

The energy of the conduction band minimum of each of the oxide 230a and the oxide 230c is preferably higher than the energy of the conduction band minimum of the oxide 230b. In other words, the electron affinity of each of the oxide 230a and the oxide 230c is preferably smaller than the electron affinity of the oxide 230b. In that case, a metal oxide that can be used as the oxide 230a is preferably used as the oxide 230c. Specifically, the atomic ratio of the element M to the constituent elements in the metal oxide used as the oxide 230c is preferably higher than the atomic ratio of the element M to the constituent elements in the metal oxide used as the oxide 230b. Moreover, the atomic ratio of the element M to In in the metal oxide used as the oxide 230c is preferably higher than the atomic ratio of the element M to In in the metal oxide used as the oxide 230b. Furthermore, the atomic ratio of In to the element M in the metal oxide used as the oxide 230b is preferably higher than the atomic ratio of In to the element M in the metal oxide used as the oxide 230c.

Here, the energy level of the conduction band minimum gradually changes at junction portions of the oxide 230a, the oxide 230b, and the oxide 230c. In other words, the energy level of the conduction band minimum at the junction portions of the oxide 230a, the oxide 230b, and the oxide 230c continuously changes or is continuously connected. To obtain this, the density of defect states in a mixed layer formed at an interface between the oxide 230a and the oxide 230b and an interface between the oxide 230b and the oxide 230c is preferably made low.

Specifically, when the oxide 230a and the oxide 230b or the oxide 230b and the oxide 230c contain the same element (as a main component) in addition to oxygen, a mixed layer with a low density of defect states can be formed. For example, in the case where the oxide 230b is an In—Ga—Zn oxide, an In—Ga—Zn oxide, a Ga—Zn oxide, gallium oxide, or the like may be used as the oxide 230a and the oxide 230c. The oxide 230c may have a stacked-layer structure. For example, it is possible to employ a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide. In other words, a stacked-layer structure of an In—Ga—Zn oxide and an oxide that does not contain In may be used for the oxide 230c.

Specifically, as the oxide 230a, a metal oxide with In:Ga:Zn=1:3:4 [atomic ratio] or 1:1:0.5 [atomic ratio] is used. As the oxide 230b, a metal oxide with In:Ga:Zn=4:2:3 [atomic ratio] or 3:1:2 [atomic ratio] is used. As the oxide 230c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Specific examples of the oxide 230c having a stacked-layer structure include a stacked-layer structure of a metal oxide with In:Ga:Zn=4:2:3 [atomic ratio] and a metal oxide with Ga:Zn=2:1 [atomic ratio], a stacked-layer structure of a metal oxide with In:Ga:Zn=4:2:3 [atomic ratio] and a metal oxide with Ga:Zn=2:5 [atomic ratio], and a stacked-layer structure of a metal oxide with In:Ga:Zn=4:2:3 [atomic ratio] and gallium oxide.

At this time, the oxide 230b serves as a main carrier path. When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have high on-state current and excellent frequency characteristics. Note that in the case where the oxide 230c has a stacked-layer structure, in addition to the effect of reducing the density of defect states at the interface between the oxide 230b and the oxide 230c, the effect of inhibiting diffusion of the constituent element of the oxide 230c to the insulator 250 side is expected. More specifically, since the oxide 230c has a stacked-layer structure in which an oxide that does not contain In is positioned in the upper layer, the diffusion of In to the insulator 250 side can be inhibited. Since the insulator 250 functions as a gate insulator, the transistor exhibits poor characteristics when In diffuses. Thus, when the oxide 230c has a stacked-layer structure, a highly reliable semiconductor device can be provided.

As the oxide 230d, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used.

The conductor 242 (the conductor 242a and the conductor 242b) functioning as the source electrode and the drain electrode is provided over the oxide 230b. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

When the conductor 242 is provided to be in contact with the oxide 230, the oxygen concentration of the oxide 230 in the vicinity of the conductor 242 sometimes decreases. In addition, a metal compound layer that contains the metal contained in the conductor 242 and the component of the oxide 230 is sometimes formed in the oxide 230 in the vicinity of the conductor 242. In such cases, the carrier density of a region in the oxide 230 in the vicinity of the conductor 242 increases, and the region becomes a low-resistance region.

Here, the region between the conductor 242a and the conductor 242b is formed to overlap with the opening of the insulator 280. Accordingly, the conductor 260 can be positioned between the conductor 242a and the conductor 242b in a self-aligned manner.

The insulator 250 functions as a gate insulator. The insulator 250 is preferably provided in contact with the top surface of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because of their thermal stability.

As in the insulator 224, the concentration of impurities such as water and hydrogen in the insulator 250 is preferably lowered. The thickness of the insulator 250 is preferably greater than or equal to 1 nm and less than or equal to 20 nm.

Furthermore, a metal oxide may be provided between the insulator 250 and the conductor 260. The metal oxide preferably inhibits oxygen diffusion from the insulator 250 to the conductor 260. Accordingly, oxidation of the conductor 260 due to oxygen in the insulator 250 can be inhibited.

In addition, the metal oxide has a function of part of the gate insulator in some cases. Therefore, when silicon oxide, silicon oxynitride, or the like is used for the insulator 250, a metal oxide that is a high-k material with a high dielectric constant is preferably used as the metal oxide. When the gate insulator has a stacked-layer structure of the insulator 250 and the metal oxide, the stacked-layer structure can be thermally stable and have a high dielectric constant. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, such as aluminum oxide, hafnium oxide, or an oxide containing aluminum and hafnium (hafnium aluminate).

Although FIG. 4 illustrates the conductor 260 having a two-layer structure, the conductor 260 may have a single-layer structure or a stacked-layer structure of three or more layers.

For the conductor 260a, it is preferable to use the above conductor having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of oxygen atoms, oxygen molecules, and the like).

When the conductor 260a has a function of inhibiting oxygen diffusion, the conductivity of the conductor 260b can be inhibited from being lowered because of oxidation due to oxygen contained in the insulator 250. As a conductive material having a function of inhibiting oxygen diffusion, for example, tantalum, tantalum nitride, ruthenium, ruthenium oxide, or the like is preferably used.

A conductive material containing tungsten, copper, or aluminum as its main component is preferably used for the conductor 260b. The conductor 260 also functions as a wiring and thus is preferably formed using a conductor having high conductivity. For example, a conductive material containing tungsten, copper, or aluminum as its main component can be used. The conductor 260b may have a stacked-layer structure, for example, a stacked-layer structure of the conductive material and titanium or titanium nitride.

A metal oxide that can be used as the oxide 230 may be provided between the insulator 250 and the conductor 260a. At this time, the metal oxide functions as a gate electrode like the conductor 260. It is preferable to provide the metal oxide because oxygen can be supplied to at least one of the insulator 250 and the oxide 230. Furthermore, when a metal oxide having a function of inhibiting the passage of oxygen is used as the metal oxide, the conductor 260 can be prevented from being oxidized by oxygen contained in the insulator 250 or the insulator 280. Alternatively, oxygen contained in the insulator 250 can be prevented from being absorbed by the conductor 260.

As illustrated in FIG. 4(A) and FIG. 4(C), the oxide 230 is provided such that its side surface is covered with the conductor 260 in a region of the oxide 230b that does not overlap with the conductor 242, that is, the channel formation region of the oxide 230. Accordingly, the electric field of the conductor 260 functioning as the first gate electrode is easily applied to the side surface of the oxide 230. Thus, the on-state current of the transistor 200 can be increased, and the frequency characteristics can be improved.

Like the insulator 214 and the like, the insulator 254 preferably functions as a barrier insulating film that inhibits entry of impurities such as water and hydrogen into the transistor 200 from the insulator 280 side. For example, the insulator 254 preferably has lower hydrogen permeability than the insulator 224. Furthermore, as illustrated in FIG. 4(B) and FIG. 4(C), the insulator 254 is preferably in contact with part of the side surface of the oxide 230c, the top surface and the side surface of the conductor 242a, and the top surface and the side surface of the conductor 242b, that is, part of the top surface and part of the side surface of the oxide 230b, the side surface of the oxide 230a, and the top surface of the insulator 224. Such a structure can inhibit entry of hydrogen contained in the insulator 280 into the oxide 230 through the top surfaces or the side surfaces of the oxide 230a, the oxide 230b, and the insulator 224.

It is also preferable that the insulator 254 have a function of inhibiting diffusion of oxygen (e.g., at least one of oxygen atoms, oxygen molecules, and the like) (or be less likely to transmit the above oxygen). For example, the insulator 254 preferably has lower oxygen permeability than the insulator 280 or the insulator 224.

The insulator 254 is preferably formed by a sputtering method. When the insulator 254 is formed by a sputtering method in an oxygen-containing atmosphere, oxygen can be added to the vicinity of a region of the insulator 224 that is in contact with the insulator 254. Accordingly, oxygen can be supplied from the region to the oxide 230 through the insulator 224. Here, with the insulator 254 having a function of inhibiting upward oxygen diffusion, oxygen can be prevented from diffusing from the oxide 230 into the insulator 280. Moreover, with the insulator 222 having a function of inhibiting downward oxygen diffusion, oxygen can be prevented from diffusing from the oxide 230 to the substrate side. In this manner, oxygen is supplied to the channel formation region of the oxide 230. Accordingly, oxygen vacancies in the oxide 230 can be reduced, so that the transistor can be inhibited from becoming normally on.

An insulator containing an oxide of one or both of aluminum and hafnium is preferably formed as the insulator 254, for example. Note that as the insulator containing an oxide of one or both of aluminum and hafnium, aluminum oxide, hafnium oxide, an oxide containing aluminum and hafnium (hafnium aluminate), or the like is preferably used.

The insulator 254 may have a stacked-layer structure. In the case where the insulator 254 has a stacked-layer structure, a second insulator may be formed by an ALD method over a first insulator formed by a sputtering method. In that case, for the first insulator and the second insulator, the same material selected from the above materials may be used or different materials may be used. For example, aluminum oxide formed by a sputtering method may be used for the first insulator, and aluminum oxide formed by an ALD method may be used for the second insulator. A film formed by an ALD method has high coverage, and it is possible to form a film with high uniformity even in a step portion formed by a component such as the oxide 230. Furthermore, such a film is preferable because a deposition defect in a first insulating film formed by a sputtering method can be compensated for.

As described above, the insulator 224 and the oxide 230 are covered with the insulator 254 having a barrier property against hydrogen, whereby the insulator 280 is isolated from the insulator 224 and the oxide 230. This can inhibit entry of impurities such as hydrogen from the outside of the transistor 200, resulting in excellent electrical characteristics and high reliability of the transistor 200.

An insulator containing aluminum nitride is used as the insulator 254, for example. It is preferable to use a nitride insulator that satisfies the composition formula $AlN_x$ (x is a real number greater than 0 and less than or equal to 2, preferably x is a real number greater than 0.5 and less than or equal to 1.5) as the insulator 254. Accordingly, a film having an excellent insulating property and high thermal conductivity can be obtained; thus, dissipation of heat generated in driving the transistor 200 can be increased. Alternatively, aluminum titanium nitride, titanium nitride, or the like can be used as the insulator 254. In that case, deposition by a sputtering method is preferable because deposition can be performed without using a highly oxidizing gas such as oxygen or ozone as a deposition gas. Alternatively, silicon nitride, silicon nitride oxide, or the like can be used.

An insulator containing an oxide of one or both of aluminum and hafnium is preferably formed as the insulator 254, for example. Note that as the insulator containing an oxide of one or both of aluminum and hafnium, aluminum oxide, hafnium oxide, an oxide containing aluminum and hafnium (hafnium aluminate), or the like is preferably used.

Like the insulator 214 and the like, the insulator 244 preferably functions as a barrier insulating film that inhibits entry of impurities such as water and hydrogen into the transistor 200 from the insulator 280 side. For example, the insulator 244 preferably has lower hydrogen permeability than the insulator 224. In addition, the insulator 244 is preferably provided to be in contact with the insulator 254 as illustrated in FIG. 4(B) and FIG. 4(C). Such a structure can inhibit entry of hydrogen contained in the insulator 280 into the oxide 230 through the side surfaces of the conductor 260, the oxide 230c, and the insulator 250.

Thus, the insulator 224, the insulator 250, and the oxide 230 are covered with the insulator 254 and the insulator 244 having a barrier property against hydrogen, whereby the insulator 280 is separated from the insulator 224, the oxide 230, and the insulator 250 by the insulator 254 and the insulator 244. This can inhibit entry of impurities such as hydrogen from the outside of the transistor 200, resulting in excellent electrical characteristics and high reliability of the transistor 200.

In addition, it is preferable that the insulator 244 have a function of inhibiting diffusion of oxygen (e.g., at least one of oxygen atoms, oxygen molecules, and the like) (or be less likely to transmit the above oxygen). For example, the insulator 244 preferably has lower oxygen permeability than the insulator 224. When the insulator 244 has a function of inhibiting oxygen diffusion, the conductor 260 can be inhibited from reacting with oxygen contained in the insulator 280.

An insulator containing aluminum nitride is used as the insulator 244, for example. It is preferable to use a nitride insulator that satisfies the composition formula $AlN_x$ (x is a real number greater than 0 and less than or equal to 2, preferably x is a real number greater than 0.5 and less than or equal to 1.5) as the insulator 244. Accordingly, a film having an excellent insulating property and high thermal conductivity can be obtained; thus, dissipation of heat generated in driving the transistor 200 can be increased. Alternatively, aluminum titanium nitride, titanium nitride, or the like can be used for the insulator 244. In that case, deposition by a sputtering method is preferable because deposition can be performed without using a highly oxidizing gas such as oxygen or ozone as a deposition gas. Alternatively, silicon nitride, silicon nitride oxide, or the like can be used.

An insulator containing an oxide of one or both of aluminum and hafnium is preferably formed as the insulator 244, for example. Note that as the insulator containing an oxide of one or both of aluminum and hafnium, aluminum oxide, hafnium oxide, an oxide containing aluminum and hafnium (hafnium aluminate), or the like is preferably used. In that case, the insulator 244 is preferably formed by an ALD method. An ALD method is a deposition method that provides good coverage, and thus can prevent formation of disconnection or the like due to unevenness of the insulator 244.

The insulator 280 is provided over the insulator 224 and the oxide 230 with the insulator 244 and the insulator 254 therebetween. For example, for the insulator 280, silicon oxide, silicon oxynitride, silicon nitride oxide, silicon oxide to which fluorine is added, silicon oxide to which carbon is added, silicon oxide to which carbon and nitrogen are added, porous silicon oxide, or the like is preferably included. In particular, silicon oxide and silicon oxynitride are preferable because of their thermal stability. Materials such as silicon oxide, silicon oxynitride, and porous silicon oxide, in each of which a region containing oxygen released by heating can be easily formed, are particularly preferable.

The concentration of impurities such as water and hydrogen in the insulator 280 is preferably lowered. In addition, the top surface of the insulator 280 may be planarized.

Like the insulator 214 and the like, the insulator 274 preferably functions as a barrier insulating film that inhibits entry of impurities such as water and hydrogen into the insulator 280 from the above. As the insulator 274, for example, an insulator that can be used as the insulator 214, the insulator 254, or the like is used.

The insulator 281 functioning as an interlayer film is preferably provided over the insulator 274. As in the insulator 224 and the like, the concentration of impurities such as water and hydrogen in the insulator 281 is preferably lowered.

The conductor 240a and the conductor 240b are provided in openings formed in the insulator 281, the insulator 274, the insulator 280, the insulator 244, and the insulator 254. The conductor 240a and the conductor 240b are provided to face each other with the conductor 260 therebetween. Note that the top surfaces of the conductor 240a and the conductor 240b may be on the same plane as the top surface of the insulator 281.

Note that the insulator 241a is provided in contact with the inner wall of the opening in the insulator 281, the insulator 274, the insulator 280, the insulator 244, and the insulator 254, and a first conductor of the conductor 240a is formed in contact with a side surface of the insulator 241a. The conductor 242a is located on at least part of the bottom portion of the opening, and the conductor 242a is in contact with the conductor 240a. Similarly, the insulator 241b is provided in contact with the inner wall of the opening in the insulator 281, the insulator 274, the insulator 280, the insulator 244, and the insulator 254, and a first conductor of the conductor 240b is formed in contact with a side surface of the insulator 241b. The conductor 242b is located on at least part of the bottom portion of the opening, and the conductor 242b is in contact with the conductor 240b.

For the conductor 240a and the conductor 240b, a conductive material containing tungsten, copper, or aluminum as its main component is preferably used. In addition, the conductor 240a and the conductor 240b may have a stacked-layer structure.

In the case where the conductor 240 has a stacked-layer structure, the conductor having a function of inhibiting diffusion of impurities such as water and hydrogen is preferably used as a conductor in contact with the oxide 230a, the oxide 230b, the insulator 254, the insulator 280, the insulator 274, and the insulator 281. For example, tantalum, tantalum nitride, titanium, titanium nitride, ruthenium, ruthenium oxide, or the like is preferably used. Alternatively, a single layer or a stacked layer of the conductive material having a function of inhibiting diffusion of impurities such as water and hydrogen may be used. The use of the conductive material can prevent oxygen added to the insulator 280 from being absorbed by the conductor 240a and the conductor 240b. Moreover, entry of impurities such as water and hydrogen into the oxide 230 through the conductor 240a and the conductor 240b from a layer above the insulator 281 can be inhibited.

For the insulator 241a and the insulator 241b, an insulator that can be used as the insulator 214 or the like, for example, aluminum oxide or silicon nitride is used. Since the insulator 241a and the insulator 241b are provided in contact with the insulator 254, entry of impurities such as water and hydrogen into the oxide 230 through the conductor 240a and the conductor 240b from the insulator 280 or the like can be inhibited. In addition, oxygen contained in the insulator 280 can be prevented from being absorbed by the conductor 240a and the conductor 240b.

An ALD method or a CVD method can be used for formation of the insulator 241a and the insulator 241b.

Although not illustrated, a conductor functioning as a wiring may be provided in contact with the top surface of the conductor 240a and the top surface of the conductor 240b. For the conductor functioning as a wiring, a conductive material containing tungsten, copper, or aluminum as its main component is preferably used. Furthermore, the conductor may have a stacked-layer structure, for example, stacked layers of the above conductive material and titanium or titanium nitride. The conductor may be formed to be embedded in an opening provided in an insulator.

In addition, although not illustrated, an insulator having resistivity higher than or equal to $1.0 \times 10^{13}$ Ωcm and lower than or equal to $1.0 \times 10^{15}$ Ωcm, preferably higher than or equal to $5.0 \times 10^{13}$ Ωcm and lower than or equal to $5.0 \times 10^{14}$ Ωcm is preferably provided to cover the conductor. It is preferable that an insulator having resistivity in the above range be provided over the conductor, in which case the insulator can disperse electric charge accumulated in the transistor 200 or between wirings of the conductor or the like and can inhibit defects in characteristics and electrostatic breakdown of the transistor and an electronic device including the transistor due to the electric charge, while maintaining the insulating property.

<Structure Example 2 of Semiconductor Device>

Figure 9A:
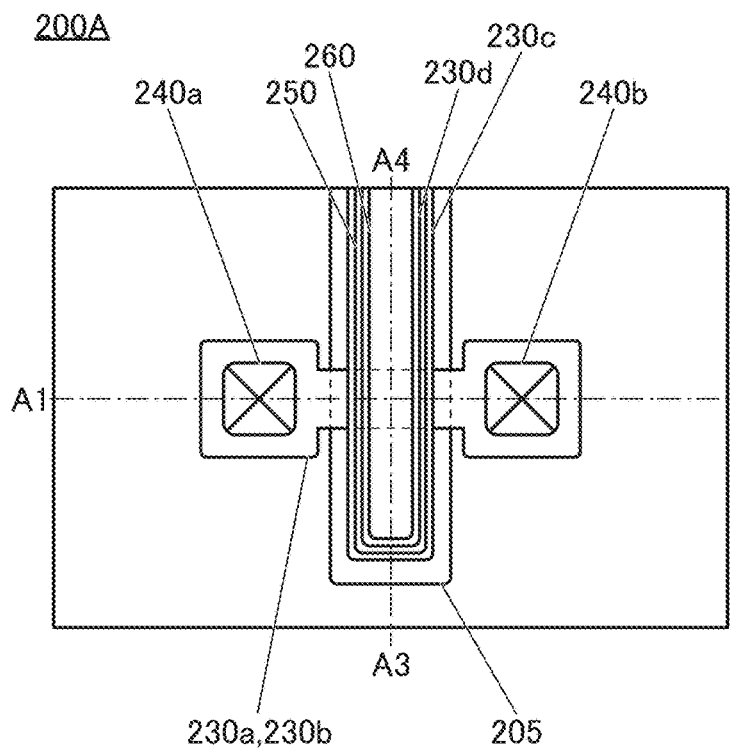
FIGS. 9A-9C A top view and cross-sectional views of a semiconductor device of one embodiment of the present invention.
Figure 9C:
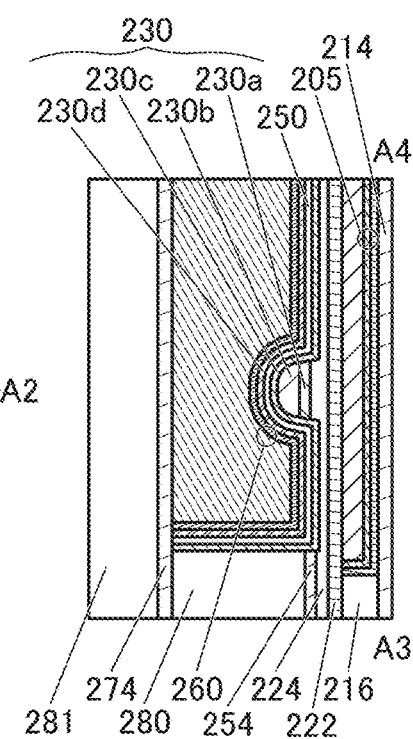
Figure 9B:
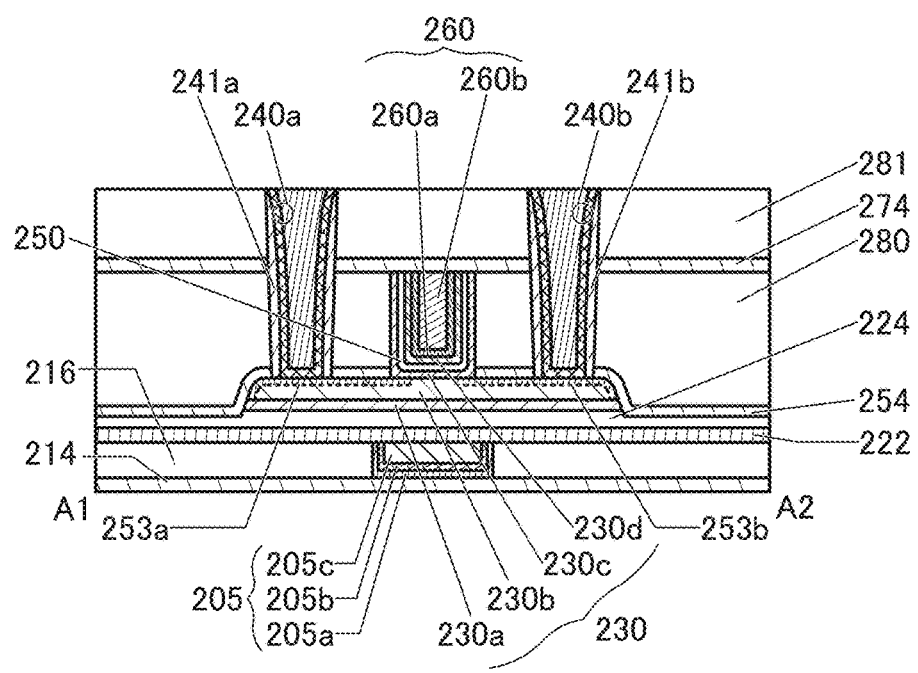

FIG. 9(A), FIG. 9(B), and FIG. 9(C) are a top view and cross-sectional views of a transistor 200A of one embodiment of the present invention and the periphery of the transistor 200A.

FIG. 9(A) is a top view of a semiconductor device including the transistor 200A. FIG. 9(B) and FIG. 9(C) are cross-sectional views of the semiconductor device. Here, FIG. 9(B) is a cross-sectional view of a portion indicated by the dashed-dotted line A1-A2 in FIG. 9(A), and is a cross-sectional view in the channel length direction of the transistor 200A. FIG. 9(C) is a cross-sectional view of a portion indicated by the dashed-dotted line A3-A4 in FIG. 9(A), and is a cross-sectional view in the channel width direction of the transistor 200A. Note that for simplification of the drawing, some components are not illustrated in the top view in FIG. 9(A).

The transistor 200A illustrated in FIG. 9(A), FIG. 9(B), and FIG. 9(C) is different from the transistor 200 (see FIG. 4) described in the above <Structure example 1 of semiconductor device> mainly in that the conductor 242a and the conductor 242b are not included and a layer 253a and a layer 253b are included. Note that components that are the same as those of the transistor 200 are denoted by the same reference numerals, and the detailed description is omitted in some cases.

As illustrated in FIG. 9, the transistor 200A includes the oxide 230a provided over a substrate (not illustrated); the oxide 230b provided over the oxide 230a; a layer 253a and a layer 253b formed on the oxide 230b to be apart from each other; the insulator 280 that is provided over the oxide 230b and has an opening formed to overlap with a portion between the layer 253a and the layer 253b; the oxide 230c provided in the opening; the insulator 250 over the oxide 230c; the oxide 230d over the insulator 250; and the conductor 260 over the oxide 230d.

Hereinafter, the layer 253a and the layer 253b are collectively referred to as a layer 253 in some cases.

As illustrated in FIG. 9, the insulator 254 is preferably provided between the insulator 280, and the insulator 224, the oxide 230a, and the oxide 230b. Here, as illustrated in FIG. 9(B) and FIG. 9(C), the insulator 254 is preferably in contact with a top surface and a side surface of the layer 253a, a top surface and a side surface of the layer 253b, the side surfaces of the oxide 230a and the oxide 230b, and the top surface of the insulator 224.

Here, the conductor 260 functions as a gate electrode of the transistor, and the layer 253a and the layer 253b function as a source region and a drain region. As described above, the conductor 260 is formed to be embedded in the opening of the insulator 280 and the insulator 254 and a region between the layer 253a and the layer 253b. Here, the positions of the conductor 260, the layer 253a, and the layer 253b with respect to the opening of the insulator 280 and the insulator 254 are selected in a self-aligned manner. That is, in the transistor 200A, the gate electrode can be positioned between the source region and the drain region in a self-aligned manner. Thus, the conductor 260 can be formed without an alignment margin, resulting in a reduction in the area occupied by the transistor 200A. Accordingly, miniaturization and high integration of the semiconductor device can be achieved.

Figure 10:
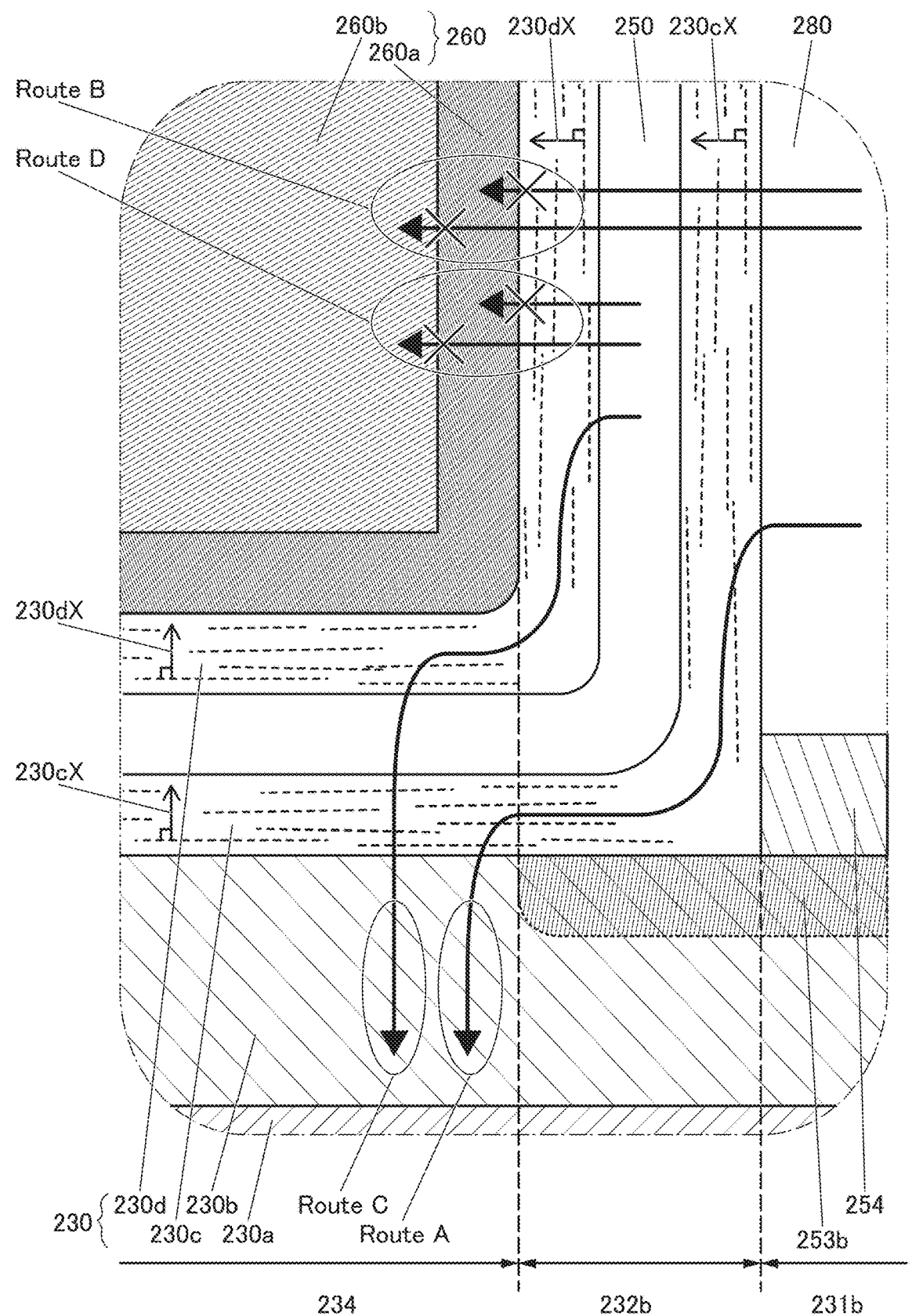
FIG. 10 A cross-sectional view of a semiconductor device of one embodiment of the present invention.
Figure 11:
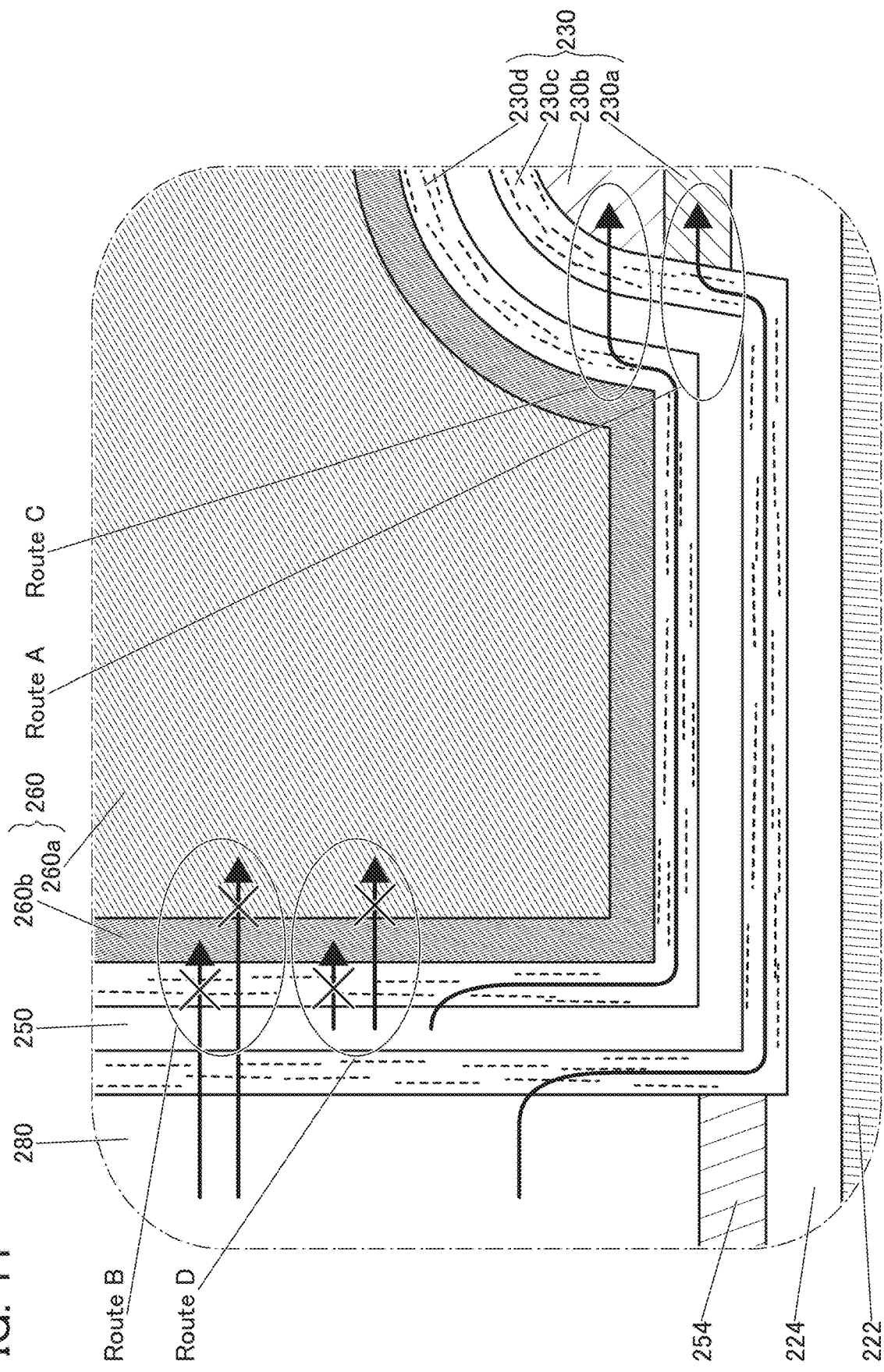
FIG. 11 A cross-sectional view of a semiconductor device of one embodiment of the present invention.

FIG. 10 is an enlarged view of the oxide 230 in FIG. 9(B) and its vicinity. FIG. 11 is an enlarged view of the oxide 230 in FIG. 9(C) and its vicinity. In FIG. 10 and FIG. 11, layers of crystals that extend in the a-b plane direction in each of the oxide 230c and the oxide 230d are shown by dashed lines. The above description of the transistor 200 can be referred to for the path of oxygen diffused from the insulator 280 into the oxide 230b; thus, the detailed description is omitted.

Figure 12:
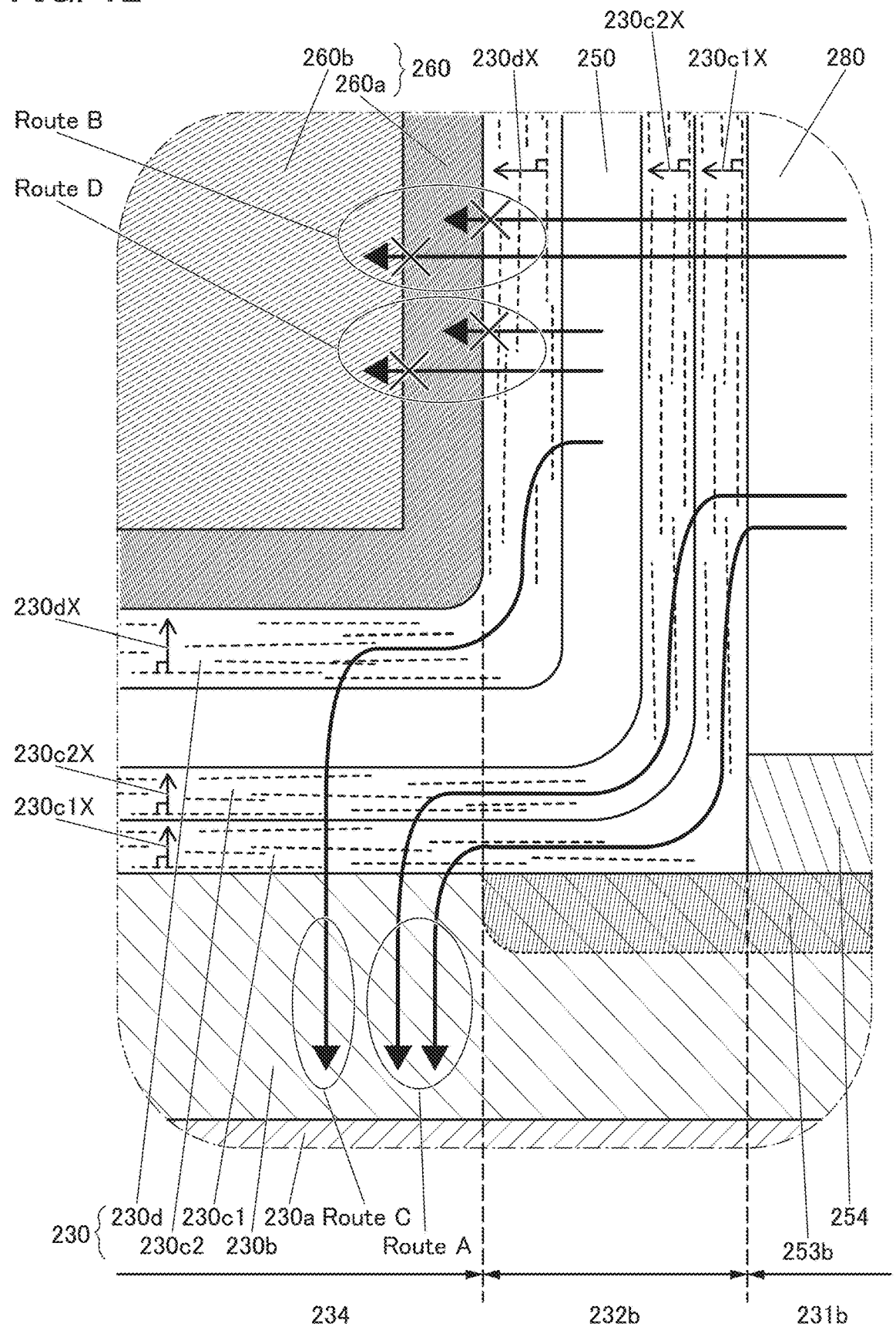
FIG. 12 A cross-sectional view of a semiconductor device of one embodiment of the present invention.

FIG. 12 is an enlarged view of the oxide 230 and its vicinity in the case where the oxide 230c has a stacked-layer structure including the first oxide 230c1 and the second oxide 230c2 over the first oxide. FIG. 12 is an enlarged view of the oxide 230 in FIG. 9(B) and its vicinity. In FIG. 12, layers of crystals that extend in the a-b plane direction in each of the first oxide 230c1, the second oxide 230c2, and the oxide 230d are shown by dashed lines. The above description of the transistor 200 can be referred to for the direction of the c-axes of the oxide 230a to the oxide 230d; thus, the detailed description is omitted (see FIG. 8).

The oxide 230 is described.

When an element that forms an oxygen vacancy or an element that is bonded to an oxygen vacancy is added to the oxide 230 in the transistor 200A, the carrier density is increased and the resistance is lowered in some cases. Typical examples of the element include boron and phosphorus. Hydrogen, carbon, nitrogen, fluorine, sulfur, chlorine, titanium, a rare gas, and the like as well as boron and phosphorus can be used. Typical examples of the rare gas include helium, neon, argon, krypton, and xenon. Furthermore, any one or more metal elements selected from metal elements such as aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum may be added to the oxide 230. Among the above-described elements, boron or phosphorus is preferable as the element to be added. Since an apparatus in a manufacturing line for amorphous silicon or low-temperature polysilicon can be used for the addition of boron or phosphorus, capital investment can be reduced. The concentration of the above element is measured by secondary ion mass spectrometry (SIMS) or the like.

The layer 253 is a layer that is formed by addition of the above element to the oxide 230. As illustrated in FIG. 9(B), the layer 253a and the layer 253b are formed to face each other with the conductor 260 therebetween, and the top surfaces are preferably in contact with the insulator 254 and the oxide 230c. In a top view, it is preferable that the side surfaces of the layer 253a and the layer 253b on the conductor 260 side be aligned with the side surfaces of the conductor 260, or that the layer 253a and the layer 253b partly overlap with the conductor 260. Here, it is preferable that the concentration of the above element in the layer 253 be equal to or higher than the concentration of the above element in a portion of the oxide 230 where the layer 253 is not formed. In addition, it is preferable that the amount of oxygen vacancies in the layer 253 be equal to or larger than the amount of oxygen vacancies in the portion of the oxide 230 where the layer 253 is not formed. Accordingly, the layer 253 has a higher carrier density and a lower resistance than the portion of the oxide 230 where the layer 253 is not formed.

The oxide 230 includes a first region overlapping with the conductor 260, a pair of second regions overlapping with neither the conductor 260 nor the insulator 254, and a pair of third regions overlapping with the insulating layer 254. The first region is positioned between the pair of second regions, and the first region and the pair of second regions are positioned between the pair of third regions. Here, the third region (e.g., a region 231b in FIG. 10) has a higher carrier density and a lower resistance than the first region (a region 234 in FIG. 10). The second region (e.g., a region 232b in FIG. 10) has a higher carrier density and a lower resistance than the first region, and has a lower carrier density and a higher resistance than the third region. Alternatively, the second region may have a carrier density and a resistance equivalent to those of the third region. Accordingly, the first region functions as a channel formation region of the transistor 200A, the third region functions as a source region or a drain region, and the second region functions as a junction region.

With such a structure, an offset region is prevented from being formed between the channel formation region and the source region or the drain region in the oxide 230, so that an effective channel length can be inhibited from being longer than the width of the conductor 260. Accordingly, the transistor 200A can have a higher on-state current, a favorable S-value, and improved frequency characteristics.

The formation of the region 231 functioning as the source region or the drain region in the oxide 230 enables the conductor 240 functioning as a plug to be connected to the region 231 without providing a source electrode and a drain electrode that are formed using metal. When the source electrode and the drain electrode formed using metal are provided in contact with the oxide 230, the source electrode and the drain electrode formed using metal may be oxidized by high-temperature heat treatment performed in a manufacturing process of the transistor 200A or the subsequent process, resulting in degradation of on-state current, S-value, and frequency characteristics of the transistor 200A in some cases. However, in the semiconductor device in this embodiment, it is not necessary to provide the source electrode and the drain electrode formed using metal. Thus, a semiconductor device with favorable on-state current, S-value, and frequency characteristics can be provided even when high-temperature heat treatment is performed in a manufacturing process of the transistor 200A or the subsequent process. For example, on the semiconductor device described in this embodiment, a process where a high temperature of approximately 750° C. or higher and 800° C. or lower is applied can be performed after the transistor 200A is manufactured.

By adding an element that forms an oxygen vacancy to the layer 253 as described above and performing heat treatment, hydrogen contained in the region 234 functioning as a channel formation region can be trapped by an oxygen vacancy in the layer 253 in some cases. Thus, the transistor 200A can have stable electrical characteristics and increased reliability.

Note that one embodiment of the present invention is not limited thereto. For example, the region 232 does not necessarily function as a junction region. For example, in the case where the region 232 does not function as a junction region, the region 232 has a carrier density, a resistance value, or a property equivalent to that of the region 234. In the case where the region 232 has a property equivalent to that of the region 234, the region 232 functions as what is called an offset region. In the case where the channel length is reduced (e.g., in the case where the channel length is 60 nm or less or the channel length is 30 nm or less), the influence of the offset region can be ignored in some cases.

Note that although the layer 253 is formed in the vicinity of the interface between the oxide 230b and each of the insulator 254 and the oxide 230c in the thickness direction of the oxide 230b in FIG. 10, the present invention is not limited thereto. For example, the layer 253 may have substantially the same thickness as the oxide 230b or may also be formed in the oxide 230a. In addition, although the layer 253 is formed in the region 231 and the region 232 in FIG. 10, the present invention is not limited thereto. For example, the layer 253 may be formed in only the region 231, in the region 231 and part of the region 232, or in the region 231, the region 232, and part of the region 234.

In the oxide 230, the boundaries between the regions are difficult to detect clearly in some cases. The concentration of a metal element and an impurity element such as hydrogen or nitrogen, which are detected in each region, may be not only gradually changed between the regions, but also continuously changed (also referred to as gradation) in each region. That is, the region closer to the channel formation region has a lower concentration of a metal element and an impurity element such as hydrogen or nitrogen.

Accordingly, a semiconductor device including a transistor with high on-state current can be provided. Alternatively, a semiconductor device including a transistor with excellent frequency characteristics can be provided. Alternatively, a semiconductor device that has stable electrical characteristics with reduced variations in electrical characteristics and higher reliability can be provided. Alternatively, a semiconductor device including a transistor with low off-state current can be provided.

The structure of the semiconductor device including the transistor 200A of one embodiment of the present invention will be described in detail below. Note that the detailed description of portions common to the transistor 200 is omitted.

As illustrated in FIG. 9(A) and FIG. 9(B), the region between the layer 253a and the layer 253b is formed to overlap with the opening of the insulator 280. Accordingly, the conductor 260 can be positioned between the layer 253a and the layer 253b in a self-aligned manner.

The oxide 230 is provided such that its side surface is covered with the conductor 260 in a region of the oxide 230b that does not overlap with the layer 253, that is, the channel formation region of the oxide 230. Accordingly, the electric field of the conductor 260 functioning as the first gate electrode is easily applied to the side surface of the oxide 230. Thus, the on-state current of the transistor 200A can be increased and the frequency characteristics can be improved.

The insulator 254 functioning as a barrier insulating film is preferably in contact with part of the side surface of the oxide 230c, the top surface and the side surface of the layer 253a, and the top surface and the side surface of the layer 253b, that is, part of the top surface and part of the side surface of the oxide 230b, the side surface of the oxide 230a, and the top surface of the insulator 224. Such a structure can inhibit entry of hydrogen contained in the insulator 280 into the oxide 230 through the top surfaces or the side surfaces of the oxide 230a, the oxide 230b, and the insulator 224.

Although described later, the insulator 254 may have a function of a protective film at the time of forming the layer 253a and the layer 253b. In the case where ion implantation or ion doping is used for formation of the layer 253a and the layer 253b, it is preferable to provide the insulator 254 as the protective film because a surface of the oxide 230 is not directly exposed to an ion or plasma and damage to the oxide 230 at the time of forming the layer 253a and the layer 253b can be reduced. Here, damage to the oxide 230 refers to, for example, formation of an excessive amount of oxygen vacancies in the oxide 230 and an excessive reduction in crystallinity of the oxide 230. For example, for the insulator 254, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used.

The insulator 280 is provided over the insulator 224 and the oxide 230 with the insulator 254 therebetween.

The conductor 240a and the conductor 240b are provided in openings formed in the insulator 281, the insulator 274, the insulator 280, and the insulator 254. The conductor 240a and the conductor 240b are provided to face each other with the conductor 260 therebetween. Note that the top surfaces of the conductor 240a and the conductor 240b may be on the same plane as the top surface of the insulator 281.

The insulator 241a is provided in contact with the inner wall of the opening in the insulator 281, the insulator 274, the insulator 280, and the insulator 254, and the first conductor of the conductor 240a is formed in contact with the side surface. The layer 253a is located on at least part of the bottom portion of the opening, and the conductor 240a is in contact with the layer 253a. Similarly, the insulator 241b is provided in contact with the inner wall of the opening in the insulator 281, the insulator 274, the insulator 280, and the insulator 254, and the first conductor of the conductor 240b is formed in contact with the side surface. The layer 253b is located on at least part of the bottom portion of the opening, and the conductor 240b is in contact with the layer 253b.

<Structure Example 3 of Semiconductor Device>

FIG. 13(A), FIG. 13(B), and FIG. 13(C) are a top view and cross-sectional views of a transistor 200B of one embodiment of the present invention and the periphery of the transistor 200B.

FIG. 13(A) is a top view of a semiconductor device including the transistor 200B. FIG. 13(B) and FIG. 13(C) are cross-sectional views of the semiconductor device. Here, FIG. 13(B) is a cross-sectional view of a portion indicated by the dashed-dotted line A1-A2 in FIG. 13(A), and is a cross-sectional view in the channel length direction of the transistor 200B. FIG. 13(C) is a cross-sectional view of a portion indicated by the dashed-dotted line A3-A4 in FIG. 13(A), and is a cross-sectional view in the channel width direction of the transistor 200B. Note that for simplification of the drawing, some components are not illustrated in the top view in FIG. 13(A). Note that components that are the same as those of the transistor 200 and the transistor 200A are denoted by the same reference numerals, and the detailed description is omitted in some cases.

As illustrated in FIG. 13, the transistor 200B includes the oxide 230a provided over a substrate provided with the insulator 224 (the substrate is not illustrated), the oxide 230b provided over the oxide 230a, the layer 253a and the layer 253b that are formed on the top surface of the oxide 230b to be apart from each other, the insulator 254 that is provided over the insulator 224 and the oxide 230b and has an opening formed to overlap with a portion between the layer 253a and the layer 253b, the oxide 230c provided over the oxide 230b and the insulator 254, the insulator 250 provided over the oxide 230c, the oxide 230d provided over the insulator 250, the conductor 260 provided over the oxide 230d, and an insulator 270 provided to cover the conductor 260. Note that the insulator 254 sometimes has a stacked-layer structure of two or more layers.

In addition, as illustrated in FIG. 13, the insulator 254 is preferably provided between the insulator 280, and the insulator 224, the oxide 230a, and the oxide 230b. Here, as illustrated in FIG. 13(B) and FIG. 13(C), the insulator 254 is preferably in contact with the top surface and the side surface of the layer 253a, the top surface and the side surface of the layer 253b, the side surfaces of the oxide 230a and the oxide 230b, and the top surface of the insulator 224.

Moreover, as illustrated in FIG. 13, the insulator 270 is preferably provided between the conductor 260 and the insulator 280. Here, as illustrated in FIG. 13(B) and FIG. 13(C), the insulator 270 is preferably in contact with the side surface of the conductor 260a, the top surface and the side surface of the conductor 260b, and part of the top surface of the oxide 230d.

The conductor 260 functions as a gate electrode of the transistor, and the layer 253a and the layer 253b function as a source region and a drain region. The layer 253a and the layer 253b are regions whose resistance is reduced by addition of a dopant to at least part of the oxide 230b out of the oxide 230a and the oxide 230b. In the top view, the layer 253a and the layer 253b preferably overlap with the insulator 254.

Figure 14:
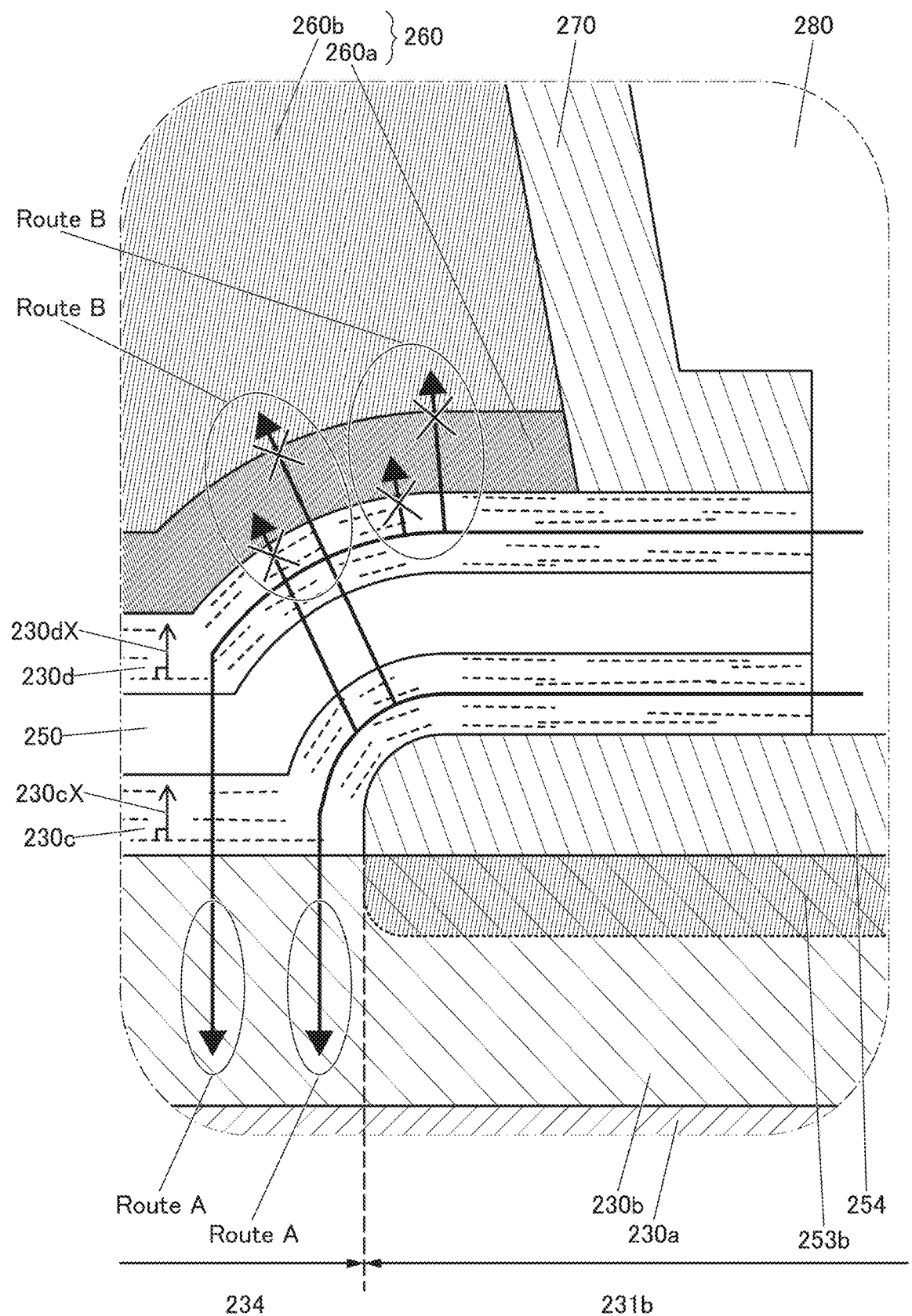
FIG. 14 A cross-sectional view of a semiconductor device of one embodiment of the present invention.

FIG. 14 is an enlarged view of the oxide 230 in FIG. 13(B) and its vicinity. The above description of the transistor 200 can be referred to for the path of oxygen diffused from the insulator 280 into the oxide 230b; thus, the detailed description is omitted. In FIG. 14, Route C and Route D are omitted.

Figure 15:
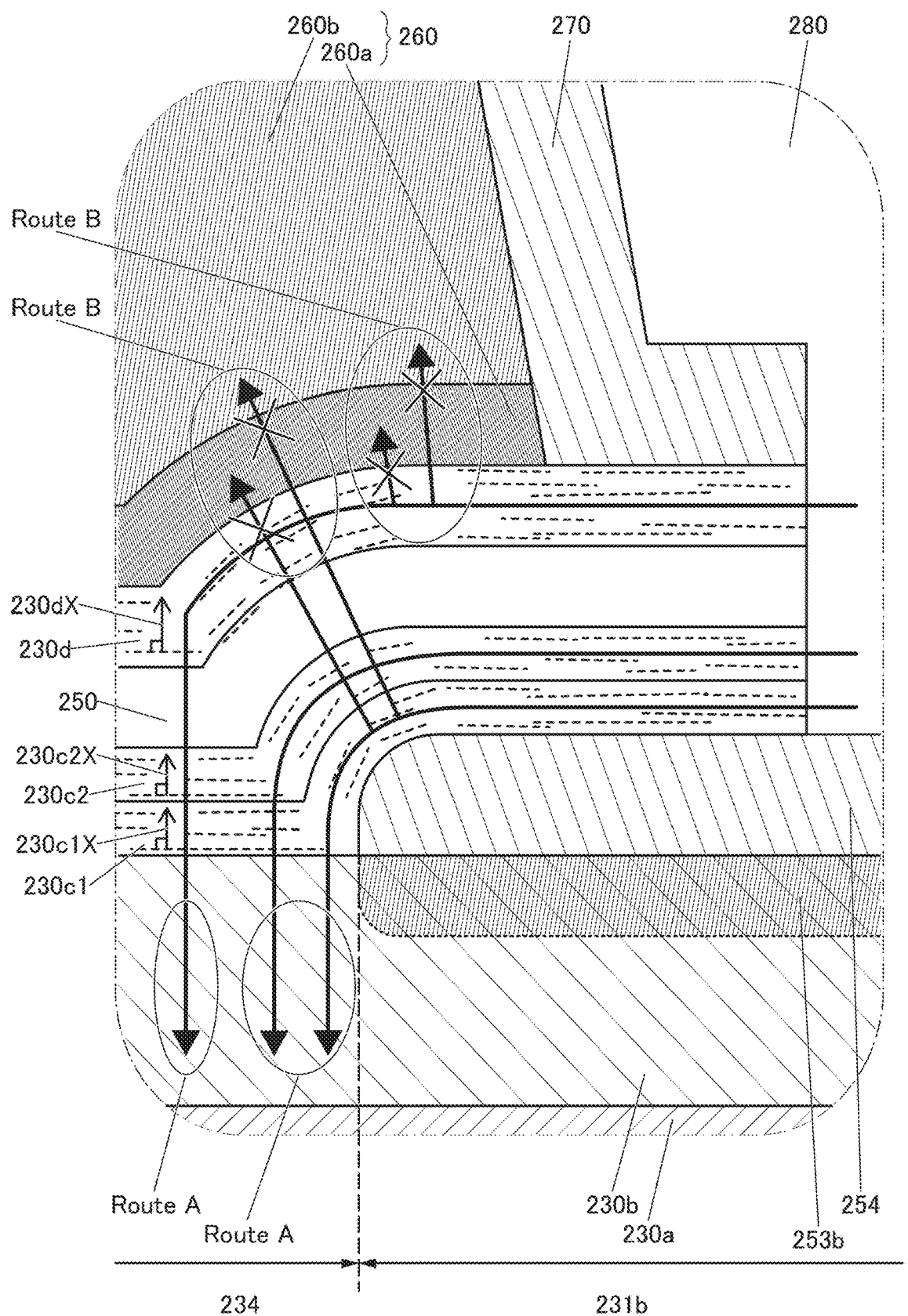
FIG. 15 A cross-sectional view of a semiconductor device of one embodiment of the present invention.

FIG. 15 is an enlarged view of the oxide 230 and its vicinity in the case where the oxide 230c has a stacked-layer structure including the first oxide 230c1 and the second oxide 230c2 over the first oxide. FIG. 15 is an enlarged view of the oxide 230 in FIG. 13(B) and its vicinity. In FIG. 15, Route C and Route D are omitted. The above description of the transistor 200 can be referred to for the direction of the c-axes of the oxide 230a to the oxide 230d; thus, the detailed description is omitted (see FIG. 8).

As the insulator 280 in contact with the oxide 230c, an insulator containing oxygen more than oxygen in the stoichiometric composition is preferably used. Furthermore, the insulator 280 is preferably in contact with an end surface of the oxide 230c. The insulator 280 is preferably also in contact with an end surface of the oxide 230d. The insulator 280 is preferably also in contact with an end surface of the insulator 250. Such a structure allows oxygen to be supplied from the insulator 280 to the oxide 230 efficiently, thereby reducing oxygen vacancies.

The insulator 274 and the insulator 281 functioning as interlayer films are preferably provided over the transistor 200B. Here, the insulator 274 is preferably provided in contact with the top surface of the insulator 280.

<Structure Example 4 of Semiconductor Device>

Figure 16A:
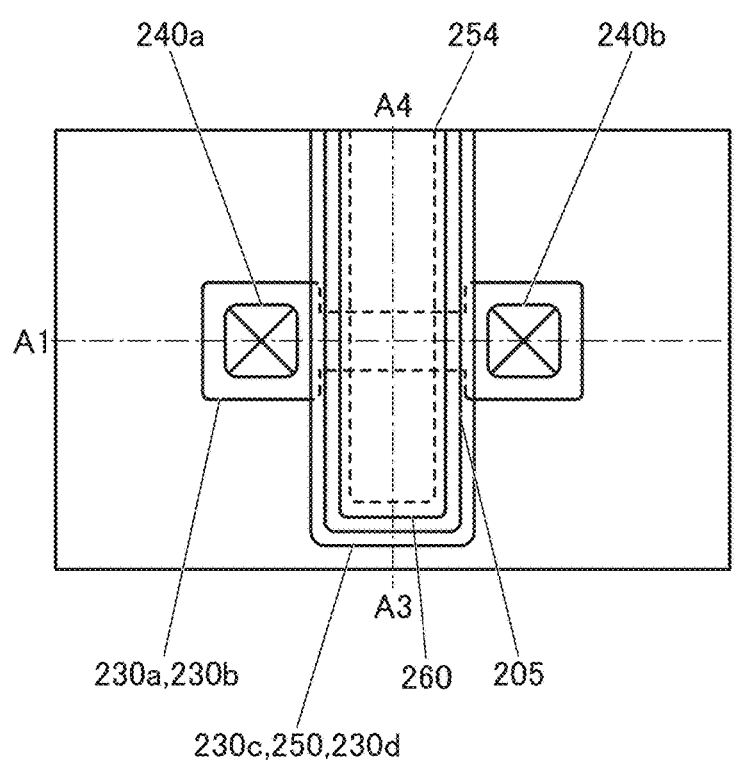
FIGS. 16A-16C A top view and cross-sectional views of a semiconductor device of one embodiment of the present invention.
Figure 16C:
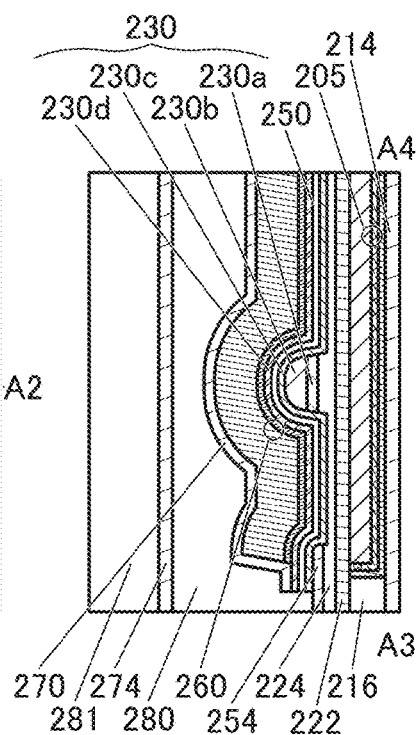
Figure 16B:
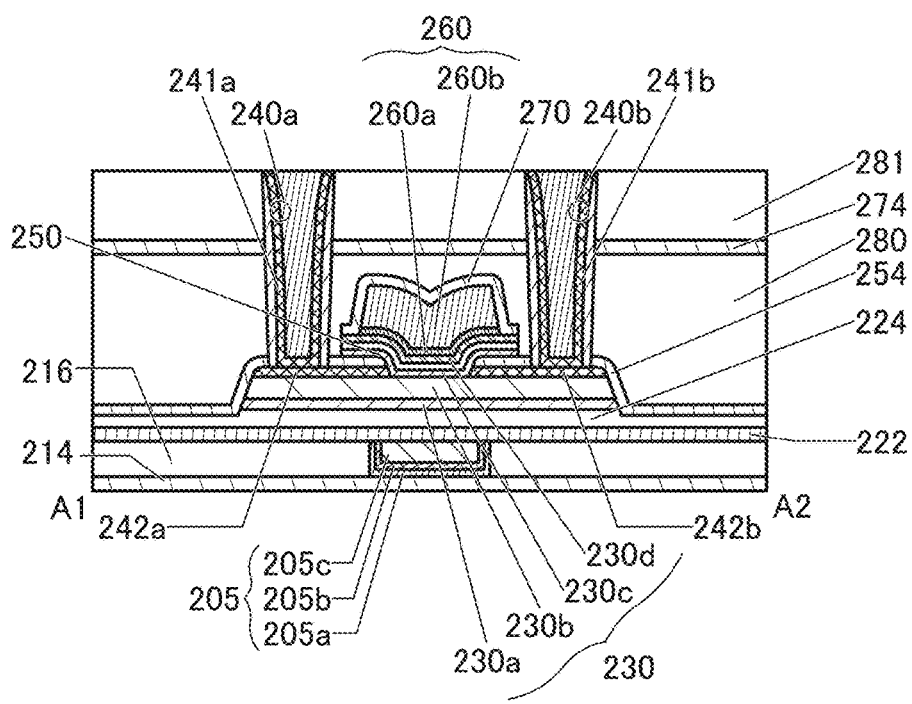
Figure 18A:
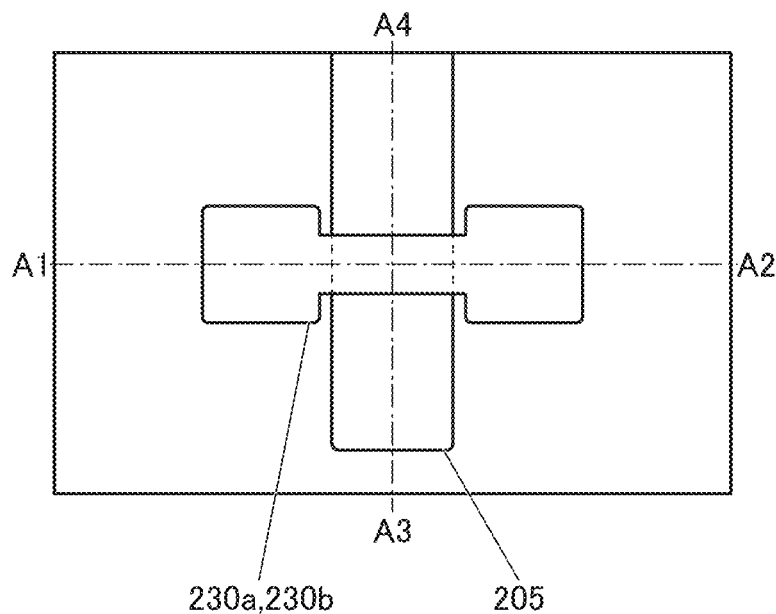
FIGS. 18A-18C A top view and cross-sectional views illustrating a method for manufacturing a semiconductor device of one embodiment of the present invention.
Figure 18C:
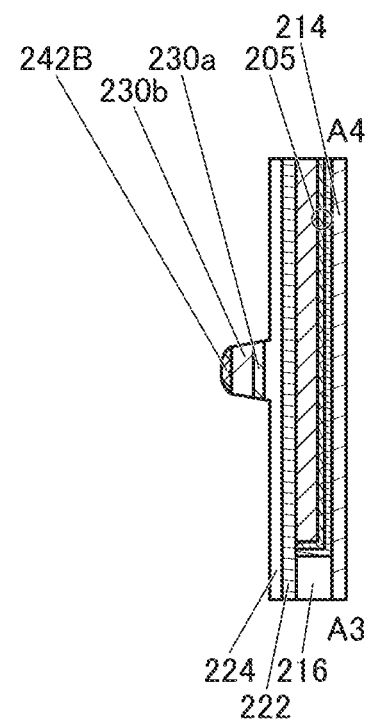
Figure 18B:
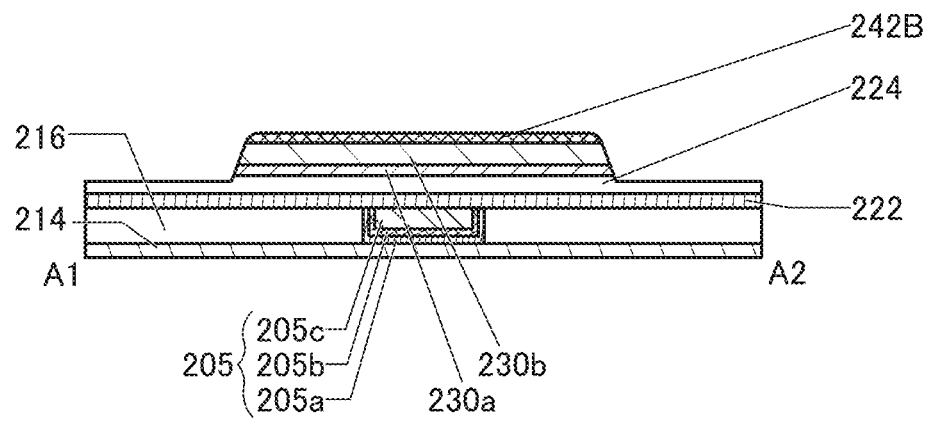

FIG. 16(A), FIG. 16(B), and FIG. 16(C) are a top view and cross-sectional views of a transistor 200C of one embodiment of the present invention and the periphery of the transistor 200C.

FIG. 16(A) is a top view of the transistor 200C. FIG. 16(B) is a cross-sectional view of a portion indicated by the dashed-dotted line A1-A2 in FIG. 16(A), and is a cross-sectional view in the channel length direction of the transistor 200C. FIG. 16(C) is a cross-sectional view of a portion indicated by the dashed-dotted line A3-A4 in FIG. 16(A), and is a cross-sectional view in the channel width direction of the transistor 200C. For simplification of the drawing, some components are not illustrated in the top view in FIG. 16(A).

The transistor 200C illustrated in FIG. 16(A), FIG. 16(B), and FIG. 16(C) is different from the transistor 200B illustrated in FIG. 13 in that the layer 253a and the layer 253b are not included and the conductor 242a and the conductor 242b are provided over the oxide 230b to be apart from each other. Note that components that are the same as those of the transistor 200B are denoted by the same reference numerals, and the detailed description is omitted in some cases.

The transistor 200C includes the insulator 254 that is provided over the conductor 242a and the conductor 242b and has an opening formed to overlap with a portion between the conductor 242a and the conductor 242b, and the oxide 230c, the insulator 250, the oxide 230d, and the conductor 260 provided in the opening.

<Constituent Material of Semiconductor Device>

Constituent materials that can be used for a semiconductor device are described below.

<<Substrate>>

As a substrate over which the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate containing silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

<<Insulator>>

Examples of an insulator include an oxide, a nitride, an oxynitride, a nitride oxide, a metal oxide, a metal oxynitride, and a metal nitride oxide, each of which has an insulating property.

As miniaturization and high integration of transistors progress, for example, a problem such as leakage current may arise because of a thinner gate insulator. When a high-k material is used for the insulator functioning as a gate insulator, voltage during operation of the transistor can be reduced while the physical thickness of the gate insulator is maintained. By contrast, when a material with a low dielectric constant is used for the insulator functioning as an interlayer film, parasitic capacitance generated between wirings can be reduced. Thus, a material is preferably selected depending on the function of an insulator.

Examples of the insulator with a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using an oxide semiconductor is surrounded by an insulator having a function of inhibiting the passage of oxygen and impurities such as hydrogen (the insulator 214, the insulator 222, the insulator 254, the insulator 274, or the like), the electrical characteristics of the transistor can be stable. For the insulator having a function of inhibiting the passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; a metal nitride such as aluminum nitride, aluminum titanium nitride, titanium nitride, silicon nitride oxide, or silicon nitride; or the like can be used.

In addition, the insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies in the oxide 230 can be compensated for.

<<Conductor>>

For the conductor, a material that can be used for the conductor 15 described in the above embodiment can be used.

Note that when an oxide is used for the channel formation region of the transistor, a stacked-layer structure in which a material containing the above metal element and a conductive material containing oxygen are combined is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

<<Metal Oxide>>

As the oxide 230, a metal oxide functioning as an oxide semiconductor (hereinafter, also referred to as an oxide semiconductor) is preferably used. A metal oxide that can be used as the oxide 230 of the present invention is described below.

The oxide semiconductor preferably contains at least indium or zinc. In particular, indium and zinc are preferably contained. Aluminum, gallium, yttrium, tin, or the like is preferably contained in addition to them. Furthermore, one or more kinds selected from boron, silicon, titanium, iron, nickel, germanium, zirconium, molybdenum, lanthanum, cerium, neodymium, hafnium, tantalum, tungsten, magnesium, and the like may be contained.

Here, the case where the oxide semiconductor is an In-M-Zn oxide that contains indium, the element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, magnesium, and the like. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

Oxide semiconductors are classified into a single crystal oxide semiconductor and a non-single-crystal oxide semiconductor. A polycrystalline oxide semiconductor, an amorphous oxide semiconductor, and the like are known as non-single-crystal oxide semiconductors, for example.

For an oxide semiconductor used for a semiconductor of the transistor, a thin film having high crystallinity is preferably used. With the use of the thin film, the stability or reliability of the transistor can be improved. Examples of the thin film include a thin film of a single crystal oxide semiconductor and a thin film of a polycrystalline oxide semiconductor. However, to form the thin film of a single crystal oxide semiconductor or the thin film of a polycrystalline oxide semiconductor over a substrate, a high-temperature process or a laser heating process is needed. Thus, manufacturing cost is increased, and throughput is decreased.

Non-Patent Document 1 and Non-Patent Document 2 have reported that an In—Ga—Zn oxide having a CAAC structure (referred to as CAAC-IGZO) was found in 2009. Here, it has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, an In—Ga—Zn oxide having an nc structure (referred to as nc-IGZO) was found in 2013 (see Non-Patent Document 3). Here, it has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Document 4 and Non-Patent Document 5 have shown changes in average crystal size due to electron beam irradiation to thin films of CAAC-IGZO, nc-IGZO, and IGZO having low crystallinity. In the thin film of IGZO having low crystallinity, crystalline IGZO with a size of approximately 1 nm was observed even before electron beam irradiation. Thus, here, it has been reported that the existence of a completely amorphous structure could not be observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used for the semiconductor of the transistor.

Non-Patent Document 6 has shown that a transistor using an oxide semiconductor has extremely low leakage current in a non-conduction state; specifically, off-state current per micrometer in the channel width of the transistor is on the order of yA/μm ($10^{-24}$ A/μm). For example, a low-power-consumption CPU utilizing the property of low leakage current of the transistor using an oxide semiconductor has been disclosed (see Non-Patent Document 7).

Furthermore, application of a transistor using an oxide semiconductor to a display device utilizing the property of low leakage current of the transistor has been reported (see Non-Patent Document 8). In the display device, a displayed image is changed several tens of times per second. The number of times an image is changed per second is referred to as a refresh rate. The refresh rate is also referred to as drive frequency. Such high-speed screen change that is hard for human eyes to recognize is considered as a cause of eyestrain. Thus, it is proposed that the refresh rate of the display device is lowered to reduce the number of times of image rewriting. Moreover, driving with a lowered refresh rate can reduce the power consumption of the display device. Such a driving method is referred to as idling stop (IDS) driving.

The finding of the CAAC structure and the nc structure has contributed to improvements in electrical characteristics and reliability of a transistor using an oxide semiconductor having the CAAC structure or the nc structure, a reduction in manufacturing cost, and an improvement in throughput. Furthermore, applications of the transistor to a display device and an LSI utilizing the property of low leakage current of the transistor have been studied.

[Composition of Metal Oxide]

The composition of a CAC (Cloud-Aligned Composite)-OS that can be used in a transistor disclosed in one embodiment of the present invention will be described below.

Note that in this specification and the like, "CAAC (c-axis aligned crystal)" or "CAC (Cloud-Aligned Composite)" might be stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. In some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different band gaps. For example, the CAC-OS or the CAC-metal oxide includes a component having a wide gap due to the insulating region and a component having a narrow gap due to the conductive region. When carriers flow in this structure, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, high on-state current and high field-effect mobility can be obtained.

In other words, the CAC-OS or the CAC-metal oxide can also be referred to as a matrix composite or a metal matrix composite.

[Structure of Metal Oxide]

Oxide semiconductors are classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (InN,Zn) layer. Furthermore, when indium in the In layer is replaced with the element M, the layer can also be referred to as an (In,M) layer.

The CAAC-OS is an oxide semiconductor with high crystallinity. Meanwhile, in the CAAC-OS, a reduction in electron mobility due to a crystal grain boundary is less likely to occur because a clear crystal grain boundary cannot be observed. Entry of impurities, formation of defects, or the like might decrease the crystallinity of the oxide semiconductor; thus, the CAAC-OS can be regarded as an oxide semiconductor that has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor depending on the analysis method.

The a-like OS is an oxide semiconductor that has a structure between those of the nc-OS and the amorphous oxide semiconductor. The a-like OS contains a void or a low-density region. That is, the a-like OS has lower crystallinity than the nc-OS and the CAAC-OS.

An oxide semiconductor has various structures with different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Transistor Including Oxide Semiconductor]

Next, the case where the above oxide semiconductor is used for a transistor is described.

Note that when the above oxide semiconductor is used for a transistor, a transistor with high field-effect mobility can be achieved. In addition, a transistor having high reliability can be achieved.

In addition, an oxide semiconductor with a low carrier density is preferably used for a transistor. In the case where the carrier density of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state. For example, the carrier density of the oxide semiconductor is set lower than $8 \times 10^{11}/cm^3$, preferably lower than $1 \times 10^{11}/cm^3$, further preferably lower than $1 \times 10^{10}/cm^3$, and greater than or equal to $1 \times 10^{-9}/cm^3$.

In addition, a highly purified intrinsic or substantially highly purified intrinsic oxide semiconductor film has a low density of defect states and thus has a low density of trap states in some cases.

Furthermore, electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Thus, in order to stabilize the electrical characteristics of the transistor, reducing the impurity concentration in the oxide semiconductor is effective. Furthermore, in order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

[Impurity]

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2 \times 10^{18}$ atoms/$cm^3$, preferably lower than or equal to $2 \times 10^{17}$ atoms/$cm^3$.

Furthermore, when the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferable to reduce the concentration of an alkali metal or an alkaline earth metal in the oxide semiconductor. Specifically, the concentration of an alkali metal or an alkaline earth metal in the oxide semiconductor that is obtained by SIMS is set lower than or equal to $1 \times 10^{18}$ atoms/$cm^3$, preferably lower than or equal to $2 \times 10^{16}$ atoms/$cm^3$.

Furthermore, when the oxide semiconductor contains nitrogen, the oxide semiconductor easily becomes n-type by generation of electrons serving as carriers and an increase of carrier density. As a result, a transistor using an oxide semiconductor containing nitrogen as a semiconductor is likely to have normally-on characteristics. Thus, nitrogen in the oxide semiconductor is preferably reduced as much as possible; the nitrogen concentration in the oxide semiconductor that is obtained by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In addition, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor that is obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

[Effect of Vacuum Baking]

Here, a weak Zn—O bond included in a metal oxide is described, and an example of a method for reducing the numbers of oxygen atoms and zinc atoms that form the bond is described.

In a transistor using a metal oxide, an oxygen vacancy is given as an example of a defect that leads to poor electrical characteristics of the transistor. For example, the threshold voltage of a transistor using a metal oxide including oxygen vacancies in the film tends to shift in the negative direction, and thus the transistor is likely to have normally-on characteristics. This is because a donor caused by oxygen vacancies in the metal oxide is generated and the carrier concentration is increased. The transistor having normally-on characteristics causes various problems in that a malfunction is likely to occur at the time of operation and power consumption is increased at the time of non-operation, for example.

Furthermore, heat treatment in a step of forming a connection wiring for manufacturing a module causes problems such as degradation of the electrical characteristics of the transistor, such as variations in threshold voltage and an increase in parasitic resistance, and increased variations in electrical characteristics due to the degradation of the electrical characteristics. Since such problems lead directly to a decrease in manufacturing yield, it is important to consider countermeasures. Moreover, the electrical characteristics degrade through a stress test, which can evaluate changes in transistor characteristics due to long-term use (changes over time) in a short time. The degradation of the electrical characteristics is presumably caused by oxygen vacancies in the metal oxide due to high-temperature treatment performed in the manufacturing process or electrical stress applied during the stress test.

In the metal oxide, there is an oxygen atom that has a weak bond to a metal atom and is likely to form an oxygen vacancy. In particular, in the case where the metal oxide is an In—Ga—Zn oxide, a zinc atom and an oxygen atom are likely to form a weak bond (also referred to as a weak Zn—O bond). Here, the weak Zn—O bond means a bond generated between a zinc atom and an oxygen atom, which is weak enough to be broken by high-temperature treatment performed in the manufacturing process or electrical stress applied during the stress test. When a weak Zn—O bond exists in the metal oxide, the bond is broken by heat treatment or current stress, so that an oxygen vacancy is formed. The formation of an oxygen vacancy decreases the stability of the transistor, such as resistance to the heat treatment and resistance to the stress test.

A bond generated between an oxygen atom bonded to many zinc atoms and the zinc atoms is a weak Zn—O bond in some cases. A zinc atom is bonded to an oxygen atom more weakly than a gallium atom is. Thus, an oxygen atom bonded to many zinc atoms is likely to form a vacancy. That is, a bond generated between a zinc atom and an oxygen atom is probably weaker than a bond between an oxygen atom and another metal.

In addition, it is probable that a weak Zn—O bond is likely to be formed when impurities exist in the metal oxide. Examples of impurities in the metal oxide include a water molecule and hydrogen. When a water molecule or hydrogen exists in the metal oxide, a hydrogen atom is sometimes bonded to an oxygen atom forming the metal oxide (which is also referred to as an OH bond). In the case where the In—Ga—Zn oxide is single crystal, an oxygen atom forming the metal oxide is bonded to four metal atoms forming the metal oxide. However, an oxygen atom bonded to a hydrogen atom is bonded to two or three metal atoms in some cases. When the number of metal atoms bonded to an oxygen atom decreases, the oxygen atom is likely to form an oxygen vacancy. Note that when a zinc atom is bonded to an oxygen atom that forms an OH bond, the bond between the oxygen atom and the zinc atom is probably weak.

In addition, a weak Zn—O bond is sometimes formed in distortion in a region where a plurality of nanocrystals are connected. Although the shape of nanocrystals is basically a hexagon, they have pentagonal lattice arrangement, heptagonal lattice arrangement, or the like in the distortion. A weak Zn—O bond is formed in the distortion presumably because the bond distances between atoms are not uniform in the distortion.

In addition, it is probable that a weak Zn—O bond is likely to be formed when the crystallinity of the metal oxide is low. When the crystallinity of the metal oxide is high, a zinc atom forming the metal oxide is bonded to four or five oxygen atoms. However, when the crystallinity of the metal oxide becomes lower, the number of oxygen atoms bonded to a zinc atom tends to decrease. When the number of oxygen atoms bonded to a zinc atom decreases, the zinc atom is likely to form a vacancy. That is, a bond generated between a zinc atom and an oxygen atom is presumably weaker than a bond generated in single crystal.

Reducing the numbers of oxygen atoms and zinc atoms that form the above-described weak Zn—O bonds inhibits formation of oxygen vacancies due to heat treatment or current stress and can improve the stability of a transistor. Note that in the case where only the number of oxygen atoms that form the weak Zn—O bonds is reduced and the number of zinc atoms that form the weak Zn—O bonds is not reduced, a weak Zn—O bond is sometimes formed again when an oxygen atom is supplied to the vicinity of the zinc atoms. Therefore, it is preferable to reduce the numbers of zinc atoms and oxygen atoms that form the weak Zn—O bonds.

As a method for reducing the numbers of oxygen atoms and zinc atoms that form the weak Zn—O bonds, a method in which vacuum baking is performed after a metal oxide is formed can be given. Vacuum baking is heat treatment performed in a vacuum atmosphere. A vacuum atmosphere is kept by evacuation with a turbomolecular pump or the like. Note that pressure in a treatment chamber is lower than or equal to $1\times10^{-2}$ Pa, preferably lower than or equal to $1\times10^{-3}$ Pa. In addition, the substrate temperature in the heat treatment is higher than or equal to 300° C., preferably higher than or equal to 400° C.

Performing the vacuum baking can reduce the numbers of oxygen atoms and zinc atoms that form the weak Zn—O bonds. Furthermore, since the metal oxide is heated by the vacuum baking, atoms included in the metal oxide are rearranged after the numbers of oxygen atoms and zinc atoms that form the weak Zn—O bonds are reduced, so that the number of oxygen atoms each bonded to four metal atoms is increased. Consequently, the numbers of oxygen atoms and zinc atoms that form the weak Zn—O bonds can be reduced, and a weak Zn—O bond can be inhibited from being formed again.

In addition, when impurities exist in the metal oxide, performing the vacuum baking can release water molecules or hydrogen in the metal oxide and reduce the number of OH bonds. When the number of OH bonds in the metal oxide decreases, the proportion of the oxygen atoms each bonded to four metal atoms increases. Furthermore, the atoms forming the metal oxide are rearranged when water molecules or hydrogen is released, so that the number of oxygen atoms each bonded to four metal atoms increases. Thus, a weak Zn—O bond can be inhibited from being formed again.

As described above, when vacuum baking is performed after the metal oxide is formed, the numbers of oxygen atoms and zinc atoms that form weak Zn—O bonds can be reduced. Thus, the stability of the transistor can be improved through the step. Furthermore, an improvement in stability of the transistor increases the degree of freedom in selecting materials and formation methods.

<Method 1-1 for Manufacturing Semiconductor Device>

A method for manufacturing a semiconductor device including the transistor 200 of one embodiment of the present invention, which is illustrated in FIG. 4, will be described with reference to FIG. 17 to FIG. 23.

In FIG. 17 to FIG. 23, (A) in each drawing is a top view. Furthermore, (B) in each drawing is a cross-sectional view of a portion indicated by the dashed-dotted line A1-A2 in (A), and is a cross-sectional view in the channel length direction of the transistor 200. Moreover, (C) in each drawing is a cross-sectional view of a portion indicated by the dashed-dotted line A3-A4 in (A), and is a cross-sectional view in the channel width direction of the transistor 200. Note that for simplification of the drawing, some components are not illustrated in the top view of (A) in each drawing.

First, a substrate (not illustrated) is prepared, and the insulator 214 is formed over the substrate. The insulator 214 can be formed by a sputtering method, a chemical vapor deposition (CVD) method, a molecular beam epitaxy (MBE) method, a pulsed laser deposition (PLD) method, an ALD (Atomic Layer Deposition) method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus causes less plasma damage to an object. For example, a wiring, an electrode, an element (e.g., a transistor and a capacitor), and the like included in a semiconductor device might be charged up by receiving electric charge from plasma. In that case, accumulated electric charge might break the wiring, the electrode, the element, and the like included in the semiconductor device. By contrast, such plasma damage does not occur in the case of a thermal CVD method that does not use plasma, and thus the yield of the semiconductor device can be increased. In addition, the thermal CVD method does not cause plasma damage during deposition, so that a film with few defects can be obtained.

In an ALD method, one atomic layer can be deposited at a time using self-regulating characteristics of atoms. Thus, the ALD method has advantages such as deposition of an extremely thin film, deposition on a component with a high aspect ratio, deposition of a film with a small number of defects such as pinholes, deposition with good coverage, and low-temperature deposition. Furthermore, the ALD method includes a PEALD (Plasma Enhanced ALD) method that is a deposition method using plasma. The use of plasma is sometimes preferable because deposition at lower temperature is possible. Note that a precursor used in the ALD method sometimes contains impurities such as carbon. Thus, in some cases, a film provided by the ALD method contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object. Thus, a CVD method and an ALD method are deposition methods that enable good step coverage almost regardless of the shape of an object. In particular, an ALD method enables excellent step coverage and excellent thickness uniformity and can be suitably used to cover a surface of an opening portion with a high aspect ratio, for example. On the other hand, an ALD method has a relatively low deposition rate, and thus is preferably used in combination with another deposition method with a high deposition rate, such as a CVD method, in some cases.

A CVD method and an ALD method enable control of the composition of a film to be obtained with a flow rate ratio of source gases. For example, by a CVD method or an ALD method, a film with a certain composition can be formed depending on the flow rate ratio of the source gases. Moreover, with a CVD method or an ALD method, by changing the flow rate ratio of the source gases while forming a film, a film whose composition is continuously changed can be formed. In the case of depositing a film while changing the flow rate ratio of source gases, as compared with the case of depositing a film with the use of a plurality of deposition chambers, time taken for the deposition can be shortened because time taken for transfer and pressure adjustment is not required. Thus, the productivity of the semiconductor device can be increased in some cases.

In this embodiment, for the insulator 214, aluminum oxide is formed by a sputtering method. In addition, the insulator 214 may have a multilayer structure. For example, a structure may be employed in which aluminum oxide is formed by a sputtering method and aluminum oxide is formed by an ALD method over the aluminum oxide. Alternatively, a structure may be employed in which aluminum oxide is formed by an ALD method and aluminum oxide is formed by a sputtering method over the aluminum oxide. Alternatively, for the insulator 214, silicon nitride or silicon nitride oxide may be formed by a plasma CVD method.

Next, the insulator 216 is formed over the insulator 214. The insulator 216 can be formed by a sputtering method, a CVD method, an MBE method, a PLD method, an ALD method, or the like. In this embodiment, for the insulator 216, silicon oxide is formed by a CVD method.

Next, an opening reaching the insulator 214 is formed in the insulator 216 by a lithography method. Examples of the opening include a groove and a slit. A region where the opening is formed may be referred to as an opening portion. A wet etching method may be used for the formation of the opening; however, a dry etching method is preferable for microfabrication. As the insulator 214, it is preferable to select an insulator that functions as an etching stopper used in forming the opening by etching the insulator 216. For example, in the case where silicon oxide is used for the insulator 216 in which the opening is to be formed, silicon nitride, aluminum oxide, or hafnium oxide is preferably used for the insulator 214 functioning as an etching stopper.

Note that in the lithography method, first, a resist is exposed to light through a mask. Next, a region exposed to light is removed or left using a developer, so that a resist mask is formed. Then, etching treatment through the resist mask is performed, so that a conductor, a semiconductor, an insulator, or the like can be processed into a desired shape. The resist mask is formed by, for example, exposure of the resist to light such as KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that for removal of the resist mask, dry etching treatment such as ashing can be performed, wet etching treatment can be performed, wet etching treatment can be performed after dry etching treatment, or dry etching treatment can be performed after wet etching treatment.

In addition, a hard mask formed of an insulator or a conductor may be used instead of the resist mask. In the case where a hard mask is used, a hard mask with a desired shape can be formed in the following manner: an insulating film or a conductive film to be a hard mask material is formed over an insulating film to be the insulator 216, a resist mask is formed thereover, and the hard mask material is etched. The etching of the insulating film to be the insulator 216 may be performed after removal of the resist mask or with the resist mask remaining. In the latter case, the resist mask sometimes disappears during the etching. The hard mask may be removed by etching after the etching of the insulating film to be the insulator 216. Meanwhile, the hard mask is not necessarily removed when the hard mask material does not affect the following process or can be utilized in the following process.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may be employed in which different high-frequency powers are applied to one of the parallel plate electrodes. Alternatively, a structure may be employed in which high-frequency powers with the same frequency are applied to the parallel plate electrodes. Alternatively, high-frequency powers with different frequencies may be applied to the parallel plate electrodes. Alternatively, a dry etching apparatus including a high-density plasma source can be used. As the dry etching apparatus including a high-density plasma source, an inductively coupled plasma (ICP) etching apparatus can be used, for example.

After the formation of the opening, a conductive film to be the conductor 205a is formed. A conductive barrier film having a function of inhibiting the passage of impurities and oxygen is preferably used as the conductive film. For example, tantalum nitride, tungsten nitride, or titanium nitride can be used. Alternatively, a stacked-layer film with tantalum, tungsten, titanium, molybdenum, aluminum, copper, or a molybdenum-tungsten alloy can be used. The conductive film to be the conductor 205a can be formed by a sputtering method, a CVD method, an MBE method, a PLD method, an ALD method, or the like.

In this embodiment, tantalum nitride or a film of tantalum nitride and titanium nitride stacked thereover is formed by a sputtering method as the conductive film to be the conductor 205a. Even when a metal that easily diffuses, such as copper, is used for the conductor 205c described later, the use of such a metal nitride as the conductor 205a can inhibit outward diffusion of the metal from the conductor 205a.

Next, a conductive film to be the conductor 205b is formed over the conductive film to be the conductor 205a. The conductive film can be formed by a sputtering method, a CVD method, an MBE method, a PLD method, an ALD method, or the like. A conductive barrier film having a function of inhibiting the passage of impurities and oxygen is preferably used as the conductor 205b, as in the conductor 205a. In this embodiment, titanium nitride is formed by an ALD method as the conductive film to be the conductor 205b.

Next, a conductive film to be the conductor 205c is formed over the conductive film to be the conductor 205b. The conductive film can be formed by a sputtering method, a CVD method, an MBE method, a PLD method, an ALD method, or the like. In this embodiment, a low-resistance conductive material such as tungsten, copper, or aluminum is deposited for the conductive film to be the conductor 205c.

Next, CMP (Chemical Mechanical Polishing) treatment is performed to partly remove the conductive film to be the conductor 205a, the conductive film to be the conductor 205b, and the conductive film to be the conductor 205c by polishing to expose the insulator 216. As a result, the conductive film to be the conductor 205a, the conductive film to be the conductor 205b, and the conductive film to be the conductor 205c remain only in the opening portion. Thus, the conductor 205 including the conductor 205a, the conductor 205b, and the conductor 205c, which has a flat top surface, can be formed (see FIG. 17). Note that the insulator 216 is partly removed by the CMP treatment in some cases.

Note that the method for forming the insulator 216 and the conductor 205 is not limited to the above. For example, a conductive film to be the conductor 205 is formed over the insulator 214, and the conductive film is processed by a lithography method to form the conductor 205. Next, the insulating film to be the insulator 216 may be provided to cover the conductor 205 and part of the insulating film may be removed by CMP treatment until part of the conductor 205 is exposed, so that the conductor 205 and the insulator 216 may be formed.

The formation of the conductor 205 and the insulator 216 by CMP treatment as described above can improve the planarity of the top surfaces of the conductor 205 and the insulator 216, which can improve the crystallinity of the CAAC-OS that forms one or both of the oxide 230b and the oxide 230c in a later step.

Next, the insulator 222 is formed over the insulator 216 and the conductor 205. An insulator containing an oxide of one or both of aluminum and hafnium is preferably formed as the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from diffusing into the transistor 200 through the insulator 222, and generation of oxygen vacancies in the oxide 230 can be inhibited.

The insulator 222 can be formed by a sputtering method, a CVD method, an MBE method, a PLD method, an ALD method, or the like.

Next, the insulator 224 is formed over the insulator 222. The insulator 224 can be formed by a sputtering method, a CVD method, an MBE method, a PLD method, an ALD method, or the like.

Subsequently, heat treatment is preferably performed. The heat treatment is performed at higher than or equal to 250° C. and lower than or equal to 650° C., preferably higher than or equal to 300° C. and lower than or equal to 500° C., further preferably higher than or equal to 320° C. and lower than or equal to 450° C. The heat treatment is performed in a nitrogen or inert gas atmosphere, or an atmosphere containing an oxidizing gas at 10 ppm or higher, 1% or higher, or 10% or higher. The heat treatment may be performed under reduced pressure. Alternatively, the heat treatment may be performed in such a manner that heat treatment is performed in a nitrogen or inert gas atmosphere, and then another heat treatment is performed in an atmosphere containing an oxidizing gas at 10 ppm or higher, 1% or higher, or 10% or higher in order to compensate for released oxygen.

In this embodiment, as the heat treatment, treatment is performed at 400° C. in a nitrogen atmosphere for 1 hour after the formation of the insulator 224. By the heat treatment, impurities such as water and hydrogen contained in the insulator 224 can be removed, for example. The heat treatment can also be performed after the formation of the insulator 222, for example.

Here, in order to form an excess-oxygen region in the insulator 224, plasma treatment with oxygen may be performed under reduced pressure. For the plasma treatment with oxygen, an apparatus including a power source for generating high-density plasma using microwaves is preferably used, for example. Alternatively, a power source for applying an RF (Radio Frequency) to a substrate side may be included. The use of high-density plasma enables high-density oxygen radicals to be produced, and RF application to the substrate side allows the oxygen radicals produced by the high-density plasma to be efficiently introduced into the insulator 224. Alternatively, after plasma treatment with an inert gas is performed with this apparatus, plasma treatment with oxygen may be performed to compensate for released oxygen. Note that impurities such as water and hydrogen contained in the insulator 224 can be removed by appropriate selection of the conditions of the plasma treatment. In that case, the heat treatment is not necessarily performed.

Next, an oxide film 230A to be the oxide 230a, an oxide film 230B to be the oxide 230b, and a conductive film 242A are formed in this order over the insulator 224 (see FIG. 17). Note that the oxide films are preferably formed successively without being exposed to an atmospheric environment. By the deposition without exposure to the air, impurities or moisture from the atmospheric environment can be prevented from being attached onto the oxide film 230A and the oxide film 230B, so that the vicinity of the interface between the oxide film 230A and the oxide film 230B can be kept clean.

The oxide film 230A, the oxide film 230B, and the conductive film 242A can be formed by a sputtering method, a CVD method, an MBE method, a PLD method, an ALD method, or the like.

In the case where the oxide film 230A and the oxide film 230B are formed by a sputtering method, for example, oxygen or a mixed gas of oxygen and a rare gas is used as a sputtering gas. Increasing the proportion of oxygen contained in the sputtering gas can increase the amount of excess oxygen in the formed oxide films. In the case where the above oxide films are formed by a sputtering method, the above In-M-Zn oxide target or the like can be used. Furthermore, a direct current (DC) power source or an alternating current (AC) power source such as a radio frequency (RF) power source is connected to a target, and required power can be applied depending on the electric conductivity of the target.

In particular, part of oxygen contained in the sputtering gas is supplied to the insulator 224 during the formation of the oxide film 230A in some cases. Therefore, the proportion of oxygen contained in the sputtering gas for the oxide film 230A is higher than or equal to 70%, preferably higher than or equal to 80%, further preferably 100%.

In the case where the oxide film 230B is formed by a sputtering method and the proportion of oxygen contained in the sputtering gas is higher than or equal to 1% and lower than or equal to 30%, preferably higher than or equal to 5% and lower than or equal to 20%, an oxygen-deficient oxide semiconductor is formed. In a transistor in which an oxygen-deficient oxide semiconductor is used for its channel formation region, comparatively high field-effect mobility can be obtained. In addition, when the oxide film is formed while the substrate is heated, the crystallinity of the oxide film can be improved. Note that one embodiment of the present invention is not limited thereto. In the case where the oxide film to be the oxide 230b is formed by a sputtering method and the proportion of oxygen contained in the sputtering gas is higher than 30% and lower than or equal to 100%, preferably higher than or equal to 70% and lower than or equal to 100%, an oxygen-excess oxide semiconductor is formed. In a transistor in which an oxygen-excess oxide semiconductor is used for its channel formation region, relatively high reliability can be obtained.

In this embodiment, the oxide film 230A is formed by a sputtering method using a target with In:Ga:Zn=1:1:0.5 [atomic ratio] (2:2:1 [atomic ratio]) or 1:3:4 [atomic ratio]. In addition, the oxide film 230B is formed by a sputtering method using a target with In:Ga:Zn=4:2:4.1 [atomic ratio]. Note that each of the oxide films is preferably formed to have characteristics required for the oxide 230 by selecting the deposition conditions and the atomic ratio as appropriate.

Here, the insulator 222, the insulator 224, the oxide film 230A, and the oxide film 230B are preferably formed without exposure to the air. For example, a multi-chamber deposition apparatus is used.

Next, heat treatment may be performed. For the heat treatment, the conditions for the above heat treatment can be used. Through the heat treatment, impurities such as water and hydrogen in the oxide film 230A and the oxide film 230B can be removed, for example. In this embodiment, treatment is performed at 400° C. in a nitrogen atmosphere for 1 hour, and treatment is successively performed at 400° C. in an oxygen atmosphere for 1 hour.

Next, the oxide film 230A, the oxide film 230B, and the conductive film 242A are processed into island shapes, so that the oxide 230a, the oxide 230b, and a conductive film 242B are formed. Note that in this step, the thickness of the insulator 224 in a region that does not overlap with the oxide 230a is reduced in some cases (see FIG. 18).

Here, the oxide 230a and the oxide 230b are formed to at least partly overlap with the conductor 205. Alternatively, a structure may be employed in which an angle formed by the side surfaces of the oxide 230a and the oxide 230b and the top surface of the insulator 222 is an acute angle. In that case, the angle formed by the side surfaces of the oxide 230a and the oxide 230b and the top surface of the insulator 222 is preferably greater than or equal to 60° and less than 70°. With such a shape, coverage with the insulator 254 and the like can be improved in a later step, so that defects such as voids can be reduced. The side surface of the oxide 230b may be substantially perpendicular to the top surface of the insulator 222. When the side surfaces of the oxide 230a and the oxide 230b are substantially perpendicular to the top surface of the insulator 222, a plurality of transistors 200 can be provided in a smaller area and at a higher density.

The oxide 230b has a curved surface between the side surface and the top surface of the oxide 230b. That is, an end portion of the side surface and an end portion of the top surface are preferably curved (hereinafter, also referred to as a rounded shape). The curvature radius of the curved surface at the end portion of the oxide 230b is greater than or equal to 3 nm and less than or equal to 10 nm, preferably greater than or equal to 5 nm and less than or equal to 6 nm, for example. When the end portions are not angular, coverage with films in a later deposition process can be improved.

Note that the oxide film 230A, the oxide film 230B, and a conductive film to be the conductive film 242A are processed by a lithography method. A dry etching method or a wet etching method can be used for the processing. Processing by a dry etching method is suitable for microfabrication.

In some cases, treatment such as dry etching causes the attachment or diffusion of impurities due to an etching gas or the like to a surface or an inside of the oxide 230a, the oxide 230b, or the like. Examples of the impurities include fluorine and chlorine.

In order to remove the impurities and the like, cleaning is performed. Examples of a cleaning method include wet cleaning using a cleaning solution or the like, plasma treatment using plasma, and cleaning by heat treatment, and these cleanings may be performed in appropriate combination.

As the wet cleaning, cleaning treatment may be performed using an aqueous solution in which oxalic acid, phosphoric acid, hydrofluoric acid, or the like is diluted with carbonated water or pure water. Alternatively, ultrasonic cleaning using pure water or carbonated water may be performed. In this embodiment, the ultrasonic cleaning using pure water or carbonated water is performed.

Then, heat treatment may be performed. As the conditions for the heat treatment, the conditions for the above heat treatment can be used. Alternatively, heat treatment is preferably performed before formation of an insulating film 254A. The heat treatment is performed at higher than or equal to 100° C. and lower than or equal to 400° C., and is performed at 200° C., for example. Alternatively, the heat treatment is preferably performed at the same temperature as the deposition temperature of the insulating film 254A. Here, the deposition temperature is not limited to the substrate temperature during the deposition, and includes the set temperature of the deposition apparatus. For example, in the case where the insulating film 254A is formed at 200° C., the heat treatment is preferably performed at 200° C. The heat treatment is preferably performed under reduced pressure, and for example, may be performed in a vacuum atmosphere. A vacuum atmosphere is kept by evacuation with a turbomolecular pump or the like. The pressure in a vacuum atmosphere of the treatment chamber is lower than or equal to $1\times10^{-2}$ Pa, preferably lower than or equal to $1\times10^{-3}$ Pa.

Next, the insulating film 254A is formed over the insulator 224, the oxide 230a, the oxide 230b, and the conductive film 242B. The insulating film 254A can be formed by a sputtering method, a CVD method, an MBE method, a PLD method, an ALD method, or the like.

As the insulating film 254A, an insulating film having a function of inhibiting diffusion of oxygen and impurities such as hydrogen is preferably used. For example, an aluminum oxide film is preferably formed by a sputtering method. When an aluminum oxide film is formed by a sputtering method using a gas containing oxygen, oxygen can be injected into the insulator 224. That is, the insulator 224 can contain excess oxygen. Alternatively, for the insulating film 254A, hafnium oxide, an oxide containing aluminum and hafnium (hafnium aluminate), an insulator containing aluminum nitride, aluminum titanium nitride, titanium nitride, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used.

Alternatively, aluminum oxide may be formed for the insulating film 254A while the substrate is heated at high temperatures. The substrate heating temperature during the formation of the insulating film 254A is higher than or equal to 200° C., preferably higher than or equal to 250° C., further preferably higher than or equal to 350° C.

The insulating film 254A may have a stacked-layer structure.

Figure 19A:
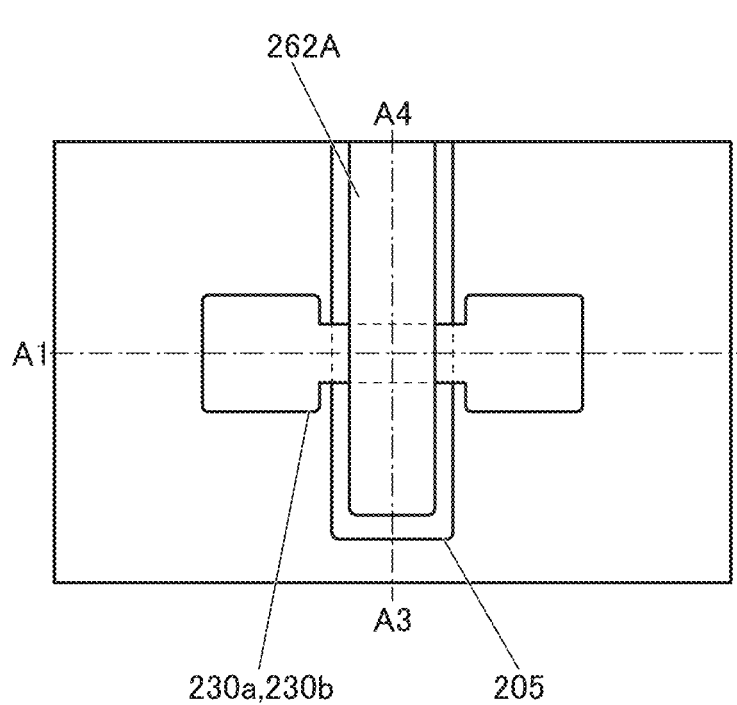
FIGS. 19A-19C A top view and cross-sectional views illustrating a method for manufacturing a semiconductor device of one embodiment of the present invention.
Figure 19C:
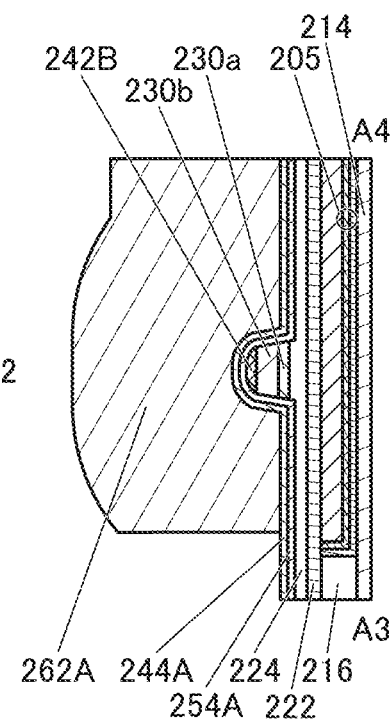
Figure 19B:
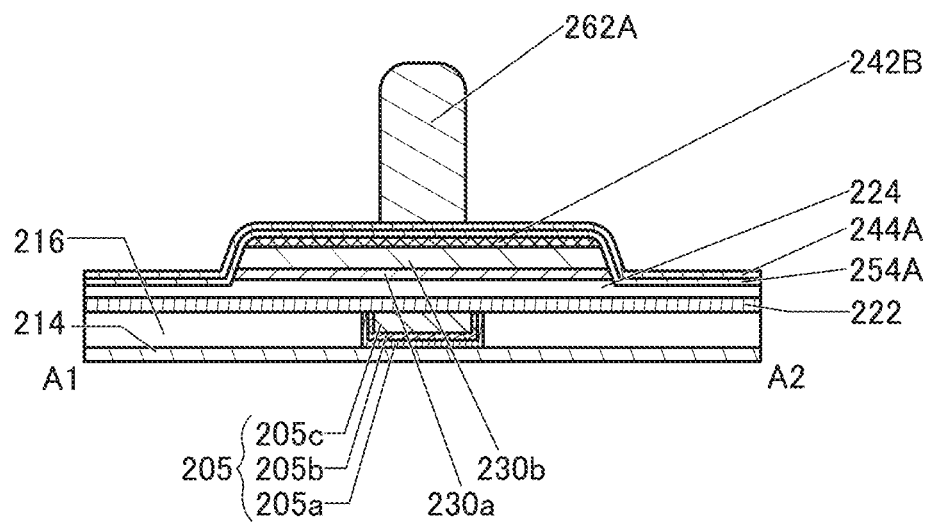

Then, an insulating film 244A may be formed over the insulating film 254A (see FIG. 19). The insulating film 244A can be formed by a sputtering method, a CVD method, an MBE method, a PLD method, an ALD method, or the like.

As the insulating film 244A, an insulating film having a function of inhibiting diffusion of oxygen and impurities such as hydrogen is preferably used. For example, an aluminum oxide film is preferably formed by an ALD method. By an ALD method which enables good coverage, the insulating film 244A having a uniform thickness can be formed even in a step portion formed by a dummy gate layer 262A and the like. With the use of an ALD method, a dense thin film can be formed. A dense thin film having good coverage can be formed in this manner, and thus even when defects such as voids or pinholes are generated in the insulating film 254A, for example, they can be covered with the insulating film 244A.

Aluminum nitride, silicon nitride, silicon nitride oxide, or the like may be formed for the insulating film 244A. For example, in the case where an aluminum nitride film is formed as the insulating film 244A by reactive sputtering using an aluminum target, the flow rate of a nitrogen gas to the total flow rate of a deposition gas is higher than or equal to 30% and lower than or equal to 100%, preferably higher than or equal to 40% and lower than or equal to 100%, further preferably higher than or equal to 50% and lower than or equal to 100%.

Alternatively, aluminum oxide may be formed for the insulating film 244A while the substrate is heated at high temperatures. The substrate heating temperature during the formation of the insulating film 244A is higher than or equal to 200° C., preferably higher than or equal to 250° C., further preferably higher than or equal to 350° C. In that case, the formation of aluminum oxide for the insulating film 254A by an ALD method can prevent the dummy gate layer 262A from being deformed when the insulating film 244A is formed at the above temperature.

Alternatively, fluorine may be added after the formation of one or both of the insulating film 244A and the insulating film 254A. Fluorine can be added to one or both of the insulating film 244A and the insulating film 254A in such a manner that plasma treatment is performed in an atmosphere containing a fluorine-based gas (e.g., $CF_4$) or doping of a gas containing fluorine is performed. When fluorine is added to one or both of the insulating film 244A and the insulating film 254A, hydrogen contained in the film is expected to be terminated or be subjected to gettering by fluorine.

Accordingly, it is possible to prevent outward diffusion of excess oxygen contained in the insulator 224 and entry of impurities such as water and hydrogen into the insulator 224 from the outside. Note that the formation of the insulating film 244A can be omitted.

Next, the dummy gate layer 262A is formed (see FIG. 19).

A dummy gate film to be the dummy gate layer 262A is processed to be used as a dummy gate. The dummy gate is an interim gate electrode. That is, the dummy gate film to be the dummy gate layer 262A is processed to form an interim gate electrode, the dummy gate is removed in a later step, and a gate electrode is formed using a conductive film or the like instead. Thus, a film that is easily processed minutely and easily removed is preferably used as the dummy gate film to be the dummy gate layer 262A.

The dummy gate film to be the dummy gate layer 262A can be formed by a sputtering method, a CVD method, an MBE method, a PLD method, an ALD method, or the like. For example, an insulator, a semiconductor, or a conductor can be used. Specifically, silicon such as polysilicon, microcrystalline silicon, or amorphous silicon, or a metal film of aluminum, titanium, tungsten, or the like is used, for example. Alternatively, a film containing carbon, SOG (Spin On Glass), a resin film, or the like may be formed by a coating method. Examples of a resin include a photoresist, polyester, polyolefin, polyamide (nylon, aramid, or the like), polyimide, polycarbonate, and acrylic. When SOG or the resin film is formed by a coating method, a surface of the dummy gate film can be made flat. When the surface of the dummy gate film is made flat in this manner, the dummy gate film can be easily processed minutely and easily removed.

In addition, the dummy gate film to be the dummy gate layer 262A can be a multilayer film using different kinds of films. For example, the dummy gate film to be the dummy gate layer 262A can have a two-layer structure of a conductive film and a resin film formed over the conductive film. When the dummy gate film has such a structure, the conductive film sometimes functions as a stopper film for CMP treatment in a later CMP process, for example. Alternatively, the end point of the CMP treatment can be detected in some cases, so that processing variations can be reduced in some cases.

Next, the dummy gate film to be the dummy gate layer 262A is etched by a lithography method, so that the dummy gate layer 262A is formed (see FIG. 19). The dummy gate layer 262A is formed to at least partly overlap with the conductor 205 and the oxide 230.

Next, an insulating film to be the insulator 280 is formed over the dummy gate layer 262A and the insulating film 244A.

Figure 20A:
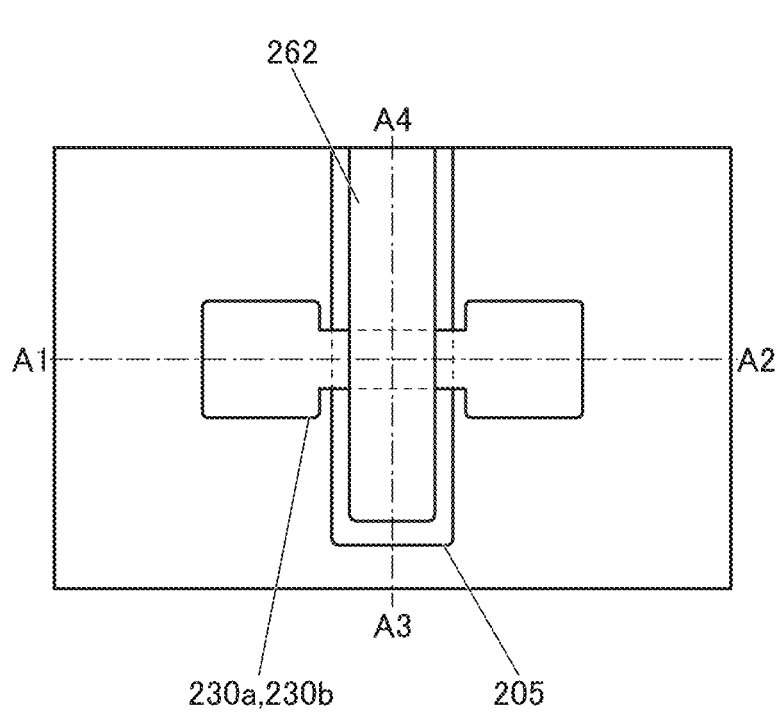
FIGS. 20A-20C A top view and cross-sectional views illustrating a method for manufacturing a semiconductor device of one embodiment of the present invention.
Figure 20C:
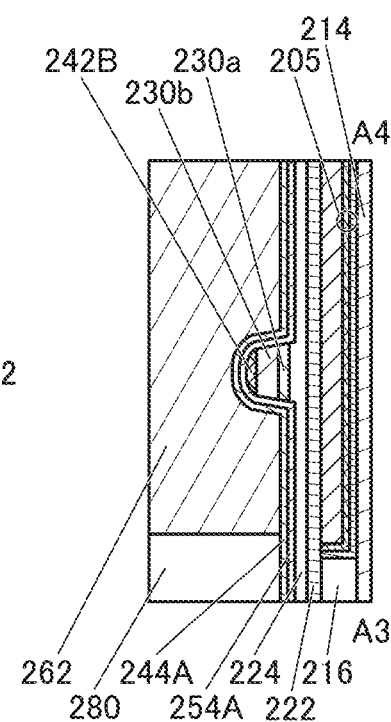
Figure 20B:
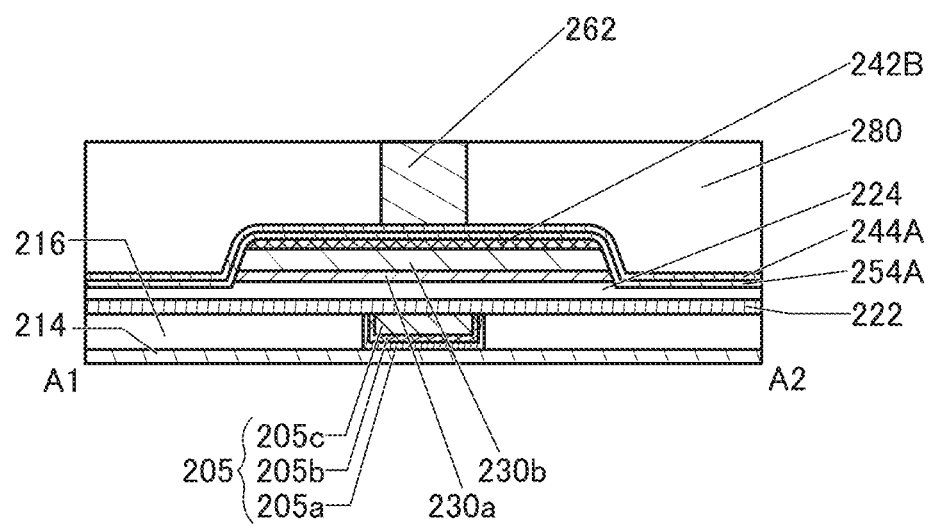

Next, the insulating film to be the insulator 280 and the dummy gate layer 262A are partly removed until part of the dummy gate layer 262A is exposed, so that the insulator 280 and a dummy gate 262 are formed (see FIG. 20). CMP treatment is preferably used to form the insulator 280 and the dummy gate 262. As illustrated in FIG. 20(B), the top surface of the dummy gate 262 is substantially aligned with the top surface of the insulator 280.

Figure 21A:
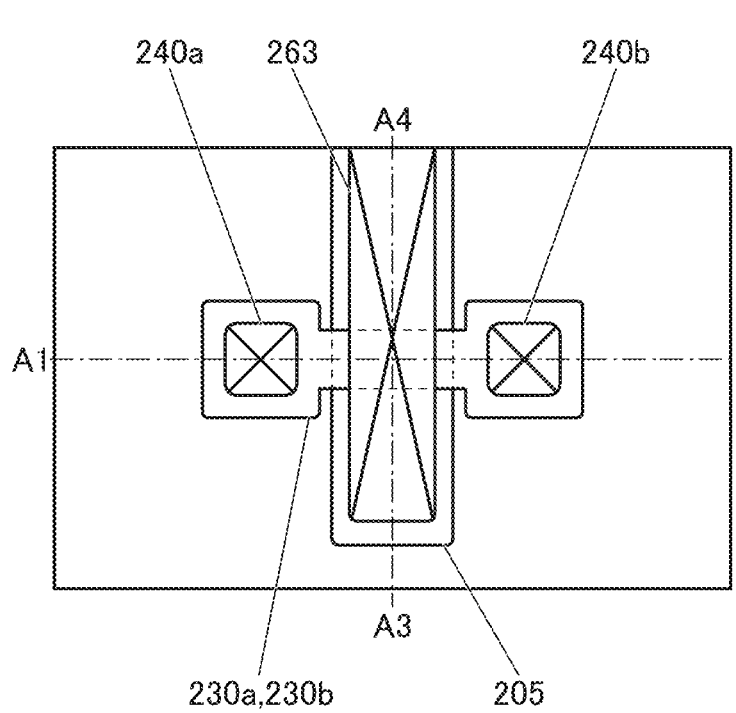
FIGS. 21A-21C A top view and cross-sectional views illustrating a method for manufacturing a semiconductor device of one embodiment of the present invention.
Figure 21C:
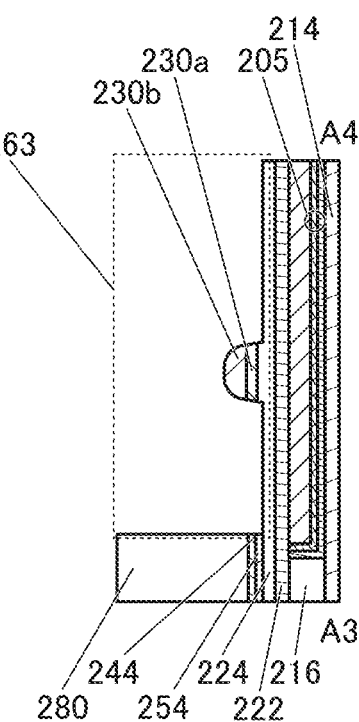
Figure 21B:
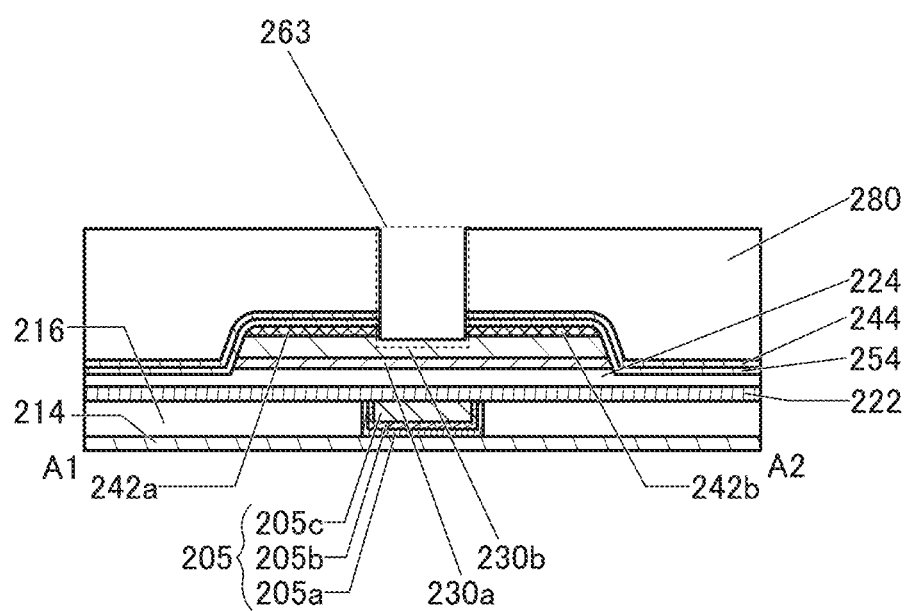
Figure 22A:
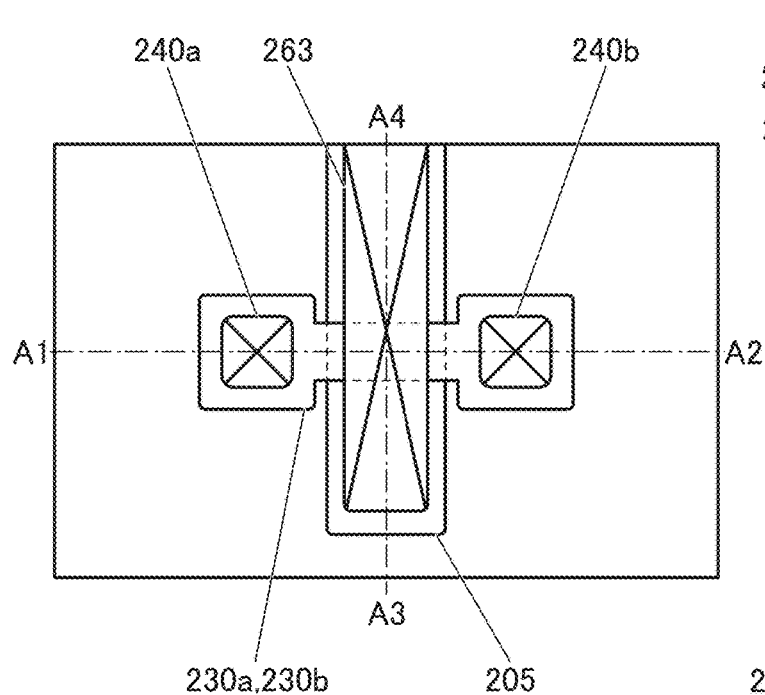
FIGS. 22A-22C A top view and cross-sectional views illustrating a method for manufacturing a semiconductor device of one embodiment of the present invention.
Figure 22C:
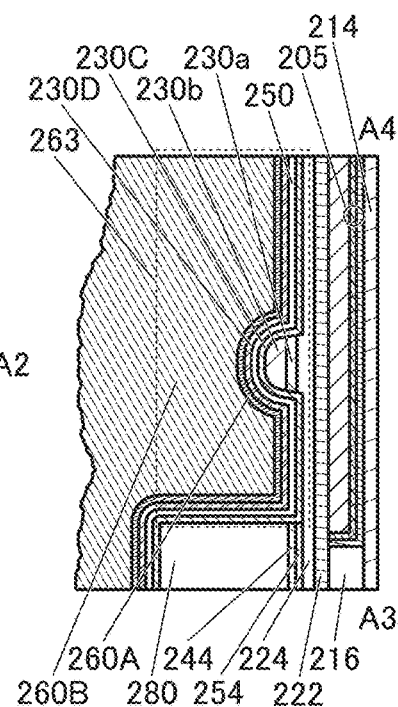
Figure 22B:
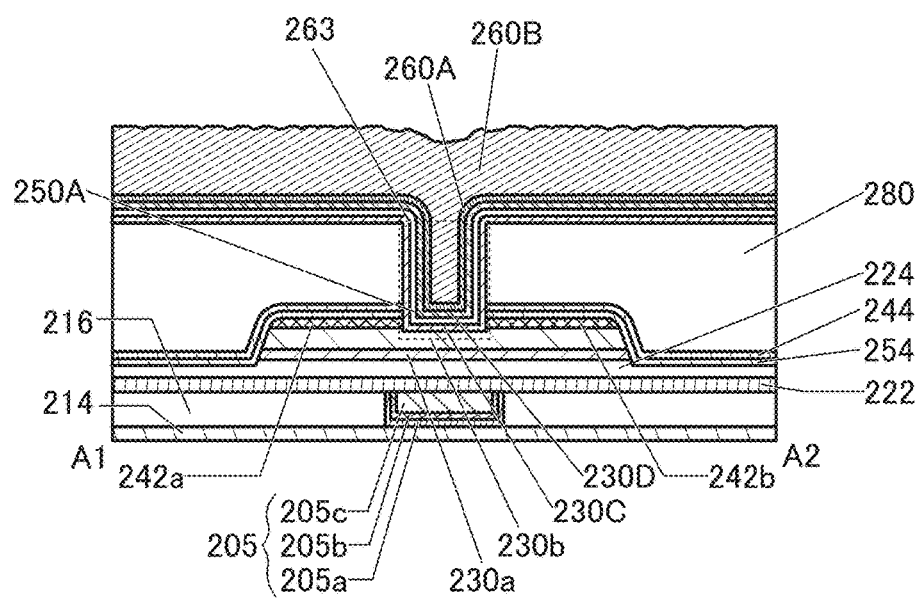

Next, the dummy gate 262 and parts of the insulating film 254A and the insulating film 244A that overlap with the dummy gate 262 are removed to form the opening 263 (see FIG. 21). The dummy gate 262 can be removed by wet etching, dry etching, ashing, or the like. Alternatively, a plurality of the above treatments may be performed in appropriate combination. For example, wet etching treatment is performed after ashing treatment. By removal of the dummy gate 262, part of a surface of the conductive film 242B is exposed through the opening 263.

Next, by removal of a portion of the conductive film 242B that is exposed through the opening 263, the surface of the oxide 230b is partly exposed, and thus the conductor 242a and the conductor 242b can be formed. The removal can be performed by wet etching or dry etching. In this embodiment, dry etching is used. Dry etching is preferably used because microfabrication is possible. Here, part of the top surface of the oxide 230b that is exposed through the region between the conductor 242a and the conductor 242b is removed in some cases.

At this time, the conductor 242a and the conductor 242b are formed using the insulator 280, the insulator 244, and the insulator 254 as masks. Thus, the opening 263 formed in the insulator 280, the insulator 244, and the insulator 254 overlaps with the region between the conductor 242a and the conductor 242b. In this manner, the conductor 260 can be positioned between the conductor 242a and the conductor 242b in a self-aligned manner in a later step.

Next, heat treatment is preferably performed before formation of an oxide film 230C. The heat treatment is performed at higher than or equal to 100° C. and lower than or equal to 400° C., and is performed at 200° C., for example. Alternatively, the heat treatment is preferably performed at the same temperature as the deposition temperature of the oxide film 230C. Here, the deposition temperature is not limited to the substrate temperature during the deposition, and includes the set temperature of the deposition apparatus. For example, in the case where the oxide film 230C is formed at 300° C., the heat treatment is preferably performed at 300° C. The heat treatment is preferably performed under reduced pressure, and for example, may be performed in a vacuum atmosphere. A vacuum atmosphere is kept by evacuation with a turbomolecular pump or the like. The pressure in a vacuum atmosphere of the treatment chamber is lower than or equal to $1\times10^{-2}$ Pa, preferably lower than or equal to $1\times10^{-3}$ Pa.

Next, the oxide film 230C is formed to fill the opening 263. In addition, after the above heat treatment, the formation of the oxide film 230C is preferably performed successively without exposure to the air. For example, it is preferable that the heat treatment and the deposition treatment be successively performed in different chambers by using a multi-chamber deposition apparatus or the like. The treatment can remove impurities such as moisture, hydrogen, and carbon adsorbed onto the surfaces or the like of the oxide 230a and the oxide 230b, and can reduce the moisture concentration and hydrogen concentration in the oxide 230a and the oxide 230b. Impurities that are removed by the heat treatment include an impurity having a bond of hydrogen and carbon, an impurity having a bond of hydrogen and oxygen, and the like. Furthermore, it is possible to prevent reentry of impurities such as hydrogen into the oxide 230 by performing the heat treatment and the deposition successively without exposure to the outside air.

The oxide film 230C can be formed by a sputtering method, a CVD method, an MBE method, a PLD method, an ALD method, or the like. The oxide film 230C to be the oxide 230c is formed by a deposition method similar to that for the oxide film 230A or the oxide film 230B in accordance with characteristics required for the oxide 230c. An In—Ga—Zn oxide or an oxide that does not contain In can be used for the oxide film 230C. As the oxide that does not contain In, a Ga—Zn oxide, gallium oxide, or the like can be used. For the oxide film 230C, a stacked-layer structure of an In—Ga—Zn oxide and an oxide that does not contain In may be used. The oxide film 230C is formed by a sputtering method using a target with In:Ga:Zn=1:3:4 [atomic ratio] or 4:2:4.1 [atomic ratio], Ga:Zn=2:1 [atomic ratio], or Ga:Zn=2:5 [atomic ratio]. In this embodiment, an oxide film to be the oxide 230c is formed as the oxide film 230C by a sputtering method using a target with In:Ga:Zn=1:3:4 [atomic ratio].

The oxide film 230C may have a stacked-layer structure of a first oxide film and a second oxide film over the first oxide film. The first oxide film may be formed using a target similar to the target used for forming the oxide film 230B, and the second oxide film may be formed using a target similar to the target used for forming the oxide film 230A.

The oxide film 230C is preferably formed while the substrate is heated. In that case, the substrate temperature is set to higher than or equal to 300° C., so that oxygen vacancies in the oxide 230a, the oxide 230b, and the oxide film 230C can be reduced. For example, the oxide film 230C may be formed at the same temperature as the deposition temperature of an insulating film 250A described later. Furthermore, the oxide film 230C is formed while the substrate is heated in this manner, whereby the crystallinity of the oxide 230a, the oxide 230b, and the oxide film 230C can be improved.

In particular, at the time of forming the oxide film 230C, part of oxygen contained in the sputtering gas is supplied to the oxide 230a and the oxide 230b in some cases. Therefore, the proportion of oxygen contained in the sputtering gas for the oxide film 230C is higher than or equal to 70%, preferably higher than or equal to 80%, further preferably 100%. In addition, when the oxide film is formed while the substrate is heated, the crystallinity of the oxide film can be improved.

Next, heat treatment is preferably performed before formation of the insulating film 250A. The heat treatment is performed at higher than or equal to 100° C. and lower than or equal to 400° C., and is performed at 200° C., for example. Alternatively, the heat treatment is preferably performed at the same temperature as the deposition temperature of the insulating film 250A. Here, the deposition temperature is not limited to the substrate temperature during the deposition, and includes the set temperature of the deposition apparatus. For example, in the case where the insulating film 250A is formed at 350° C., the heat treatment is preferably performed at 350° C. The heat treatment is preferably performed under reduced pressure, and for example, may be performed in a vacuum atmosphere. A vacuum atmosphere is kept by evacuation with a turbomolecular pump or the like. The pressure in a vacuum atmosphere of the treatment chamber is lower than or equal to $1\times10^{-2}$ Pa, preferably lower than or equal to $1\times10^{-3}$ Pa.

Next, the insulating film 250A is formed. The insulating film 250A can be formed by a sputtering method, a CVD method, an MBE method, a PLD method, an ALD method, or the like. For the insulating film 250A, silicon oxide, hafnium oxide, gallium oxide, or the like is preferably formed by an ALD method. For example, a stacked-layer film of silicon oxide and gallium oxide over the silicon oxide is used as the insulating film 250A. Note that the deposition temperature at the time of forming the insulating film 250A is preferably higher than or equal to 300° C. and lower than 450° C., further preferably higher than or equal to 300° C. and lower than 400° C., particularly preferably approximately 350° C. For example, when the insulating film 250A is formed at 350° C., an insulator having few impurities can be formed.

Note that oxygen is excited by microwaves to generate high-density oxygen plasma, and the insulating film 250A is exposed to the oxygen plasma, so that oxygen can be introduced into the insulating film 250A.

Furthermore, heat treatment may be performed. For the heat treatment, the conditions for the above heat treatment can be used. The heat treatment can reduce the moisture concentration and hydrogen concentration in the insulating film 250A.

Next, an oxide film 230D is formed. In addition, after the above heat treatment, formation of the oxide film 230D is preferably performed successively without exposure to the air. For example, it is preferable that the heat treatment and the deposition treatment be successively performed in different chambers by using a multi-chamber deposition apparatus or the like. The treatment can remove impurities such as moisture, hydrogen, and carbon adsorbed onto the surface or the like of the insulating film 250A, and can reduce the moisture concentration and hydrogen concentration in the insulating film 250A. Impurities that are removed by the heat treatment include an impurity having a bond of hydrogen and carbon, an impurity having a bond of hydrogen and oxygen, and the like. Furthermore, it is possible to prevent reentry of impurities such as hydrogen into the oxide 230 by performing the heat treatment and the deposition successively without exposure to the air.

The description of the oxide film 230C can be referred to for the formation of the oxide film 230D; thus, the detailed description is omitted. The oxide film 230D may be formed using a target similar to the target used for forming the oxide film 230C.

The oxide film 230D is preferably formed while the substrate is heated. In that case, the substrate temperature is set to higher than or equal to 300° C., so that oxygen vacancies in the oxide 230a, the oxide 230b, the oxide film 230C, and the oxide film 230D can be reduced. When the oxide film is formed while the substrate is heated, the crystallinity of the oxide 230a, the oxide 230b, the oxide film 230C, and the oxide film 230D can be improved.

In particular, at the time of forming the oxide film 230D, part of oxygen contained in the sputtering gas is supplied to the oxide 230a, the oxide 230b, and the oxide film 230C through the insulating film 250A in some cases. Therefore, the proportion of oxygen contained in the sputtering gas for the oxide film 230D is higher than or equal to 70%, preferably higher than or equal to 80%, further preferably 100%. In addition, when the oxide film is formed while the substrate is heated, the crystallinity of the oxide film can be improved.

Next, a conductive film 260A and a conductive film 260B are formed. The conductive film 260A and the conductive film 260B can be formed by a sputtering method, a CVD method, an MBE method, a PLD method, an ALD method, or the like. A CVD method is preferably used, for example. In this embodiment, the conductive film 260A is formed by an ALD method, and the conductive film 260B is formed by a CVD method (see FIG. 22).

Figure 23A:
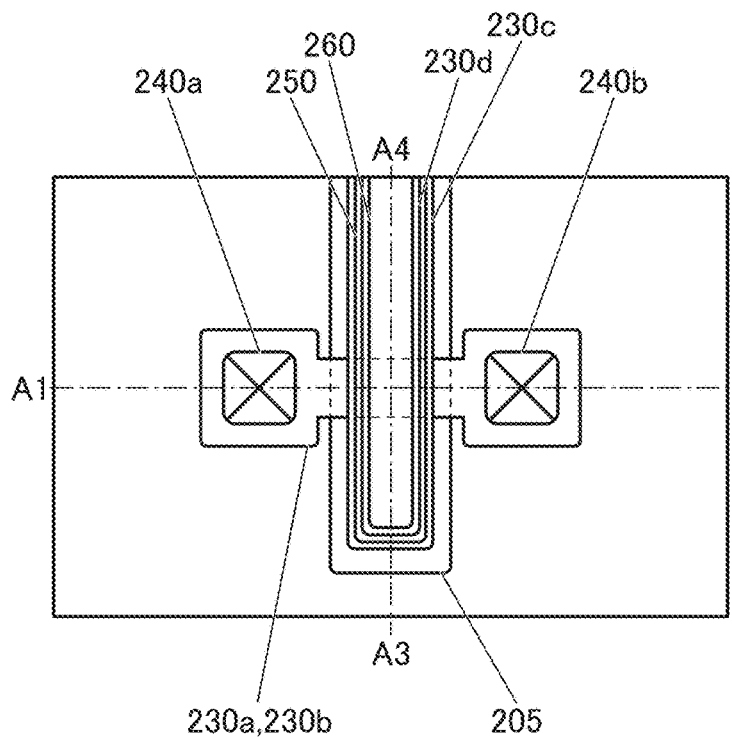
FIGS. 23A-23C A top view and cross-sectional views illustrating a method for manufacturing a semiconductor device of one embodiment of the present invention.
Figure 23C:
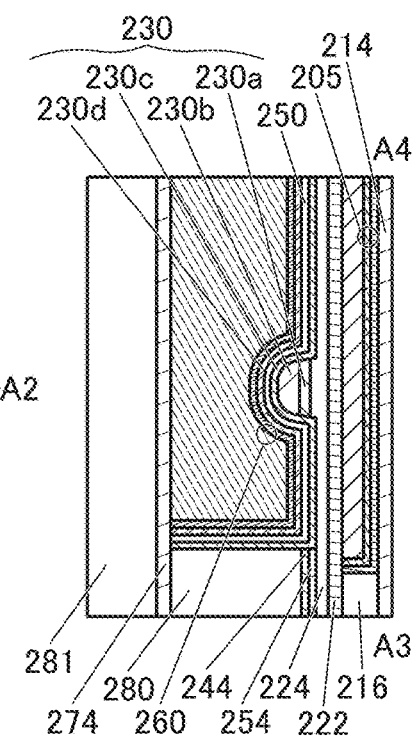
Figure 23B:
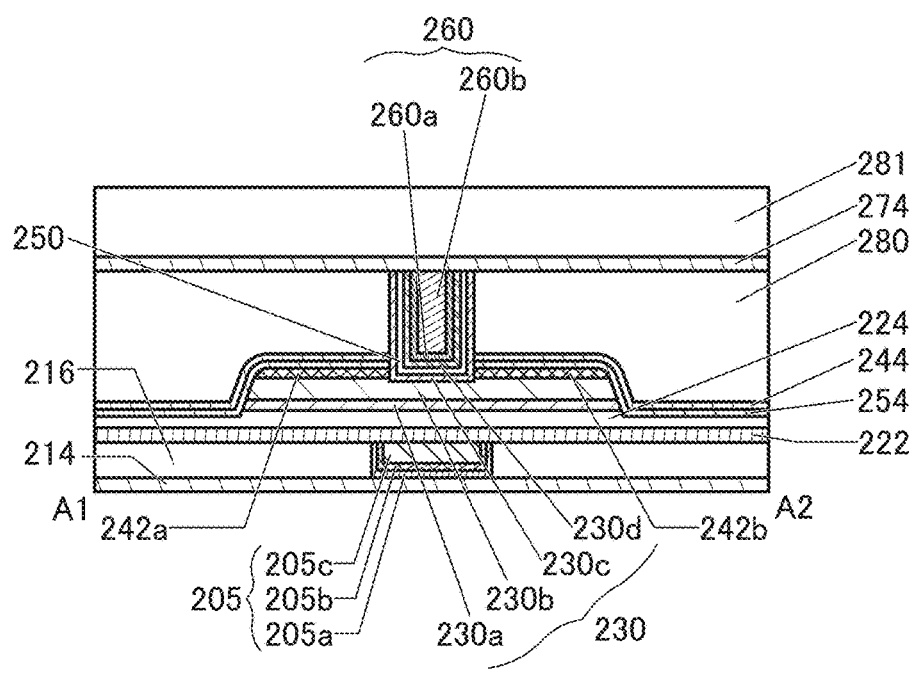

Next, the oxide film 230C, the insulating film 250A, the oxide film 230D, the conductive film 260A, and the conductive film 260B are polished by CMP treatment until the insulator 280 is exposed, so that the oxide 230c, the insulator 250, the oxide 230d, and the conductor 260 (the conductor 260a and the conductor 260b) are formed (see FIG. 23).

Next, heat treatment may be performed. For the heat treatment, the conditions for the above heat treatment can be used. The heat treatment can reduce the moisture concentration and hydrogen concentration in the insulator 280. Alternatively, heat treatment is preferably performed before formation of an insulating film to be the insulator 274. The heat treatment is performed at higher than or equal to 100° C. and lower than or equal to 400° C., and is performed at 200° C., for example. Alternatively, the heat treatment is preferably performed at the same temperature as the deposition temperature of the insulating film. Here, the deposition temperature is not limited to the substrate temperature during the deposition, and includes the set temperature of the deposition apparatus. For example, in the case where the insulating film is formed at 250° C., the heat treatment is preferably performed at 250° C. The heat treatment is preferably performed under reduced pressure, and for example, may be performed in a vacuum atmosphere. A vacuum atmosphere is kept by evacuation with a turbomolecular pump or the like. The pressure in a vacuum atmosphere of the treatment chamber is lower than or equal to $1 \times 10^{-2}$ Pa, preferably lower than or equal to $1 \times 10^{-3}$ Pa.

Next, the insulating film to be the insulator 274 is formed over the insulator 280. The insulating film to be the insulator 274 can be formed by a sputtering method, a CVD method, an MBE method, a PLD method, an ALD method, or the like. An aluminum oxide film is preferably formed as the insulating film to be the insulator 274 by a sputtering method, for example. When an aluminum oxide film is formed by a sputtering method, hydrogen contained in the insulator 280 can be inhibited from diffusing into the oxide 230 in some cases.

Next, heat treatment may be performed. For the heat treatment, the conditions for the above heat treatment can be used. The heat treatment can reduce the moisture concentration and hydrogen concentration in the insulator 280.

Next, an insulating film to be the insulator 281 may be formed over the insulator 274 (see FIG. 23). The insulating film to be the insulator 281 can be formed by a sputtering method, a CVD method, an MBE method, a PLD method, an ALD method, or the like.

Next, openings reaching the conductor 242a and the conductor 242b are formed in the insulator 254, the insulator 244, the insulator 280, the insulator 274, and the insulator 281. The openings are formed by a lithography method.

Next, an insulating film to be the insulator 241 is formed and the insulating film is subjected to anisotropic etching, so that the insulator 241 is formed. The insulating film can be formed by a sputtering method, a CVD method, an MBE method, a PLD method, an ALD method, or the like. As the insulating film to be the insulator 241, an insulating film having a function of inhibiting the passage of oxygen is preferably used. For example, an aluminum oxide film is preferably formed by an ALD method. Alternatively, a silicon nitride film may be formed by an ALD method or a CVD method. In the case where a silicon nitride film is formed by an ALD method, a precursor containing silicon and halogen or a precursor of aminosilanes can be used. As the precursor containing silicon and halogen, $SiCl_4$, $SiH_2Cl_2$, $Si_2Cl_6$, $Si_3Cl_8$, or the like can be used. As the precursor of aminosilanes, monovalent, divalent, or trivalent aminosilanes can be used. As a nitriding gas, ammonia or hydrazine can be used. For the anisotropic etching, a dry etching method or the like may be employed, for example. When sidewall portions of the openings have such a structure, the passage of oxygen from the outside can be inhibited and oxidation of the conductor 240a and the conductor 240b to be formed next can be prevented. Furthermore, impurities such as water and hydrogen can be prevented from diffusing from the conductor 240a and the conductor 240b to the outside.

Next, a conductive film to be the conductor 240a and the conductor 240b is formed. The conductive film to be the conductor 240a and the conductor 240b desirably has a stacked-layer structure including a conductor having a function of inhibiting diffusion of impurities such as water and hydrogen. For example, a stacked layer of tantalum nitride, titanium nitride, or the like and tungsten, molybdenum, copper, or the like can be employed. The conductive film to be the conductor 240 can be formed by a sputtering method, a CVD method, an MBE method, a PLD method, an ALD method, or the like.

Next, CMP treatment is performed to remove part of the conductive film to be the conductor 240a and the conductor 240b, so that the insulator 281 is exposed. As a result, the conductive film remains only in the openings, so that the conductor 240a and the conductor 240b having flat top surfaces can be formed (see FIG. 23). Note that the insulator 281 is partly removed by the CMP treatment in some cases.

Through the above process, the semiconductor device including the transistor 200 illustrated in FIG. 4 can be manufactured. As illustrated in FIG. 17 to FIG. 23, with the use of the method for manufacturing the semiconductor device described in this embodiment, the transistor 200 can be manufactured.

<Method 1-2 for Manufacturing Semiconductor Device>

A method for manufacturing the semiconductor device including the transistor 200 of one embodiment of the present invention, which is different from the method described in the above <Method 1-1 for manufacturing semiconductor device>, is described with reference to FIG. 24 to FIG. 26.

Figure 24A:
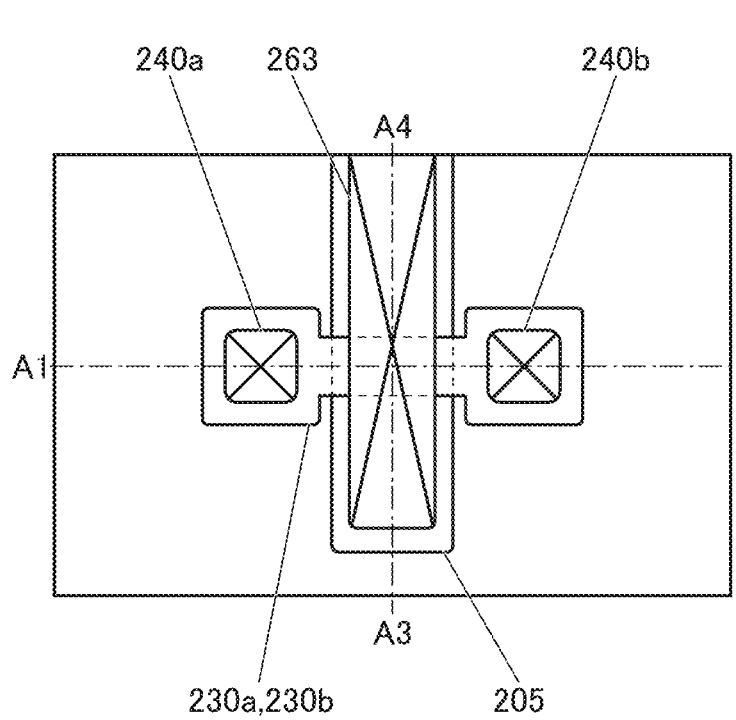
FIGS. 24A-24C A top view and cross-sectional views illustrating a method for manufacturing a semiconductor device of one embodiment of the present invention.
Figure 24C:
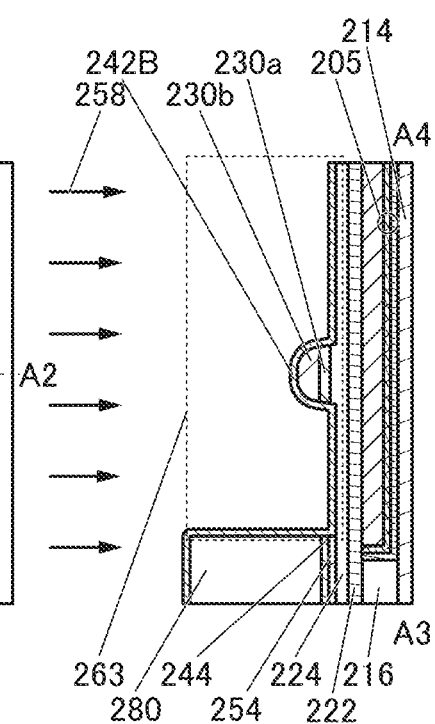
Figure 24B:
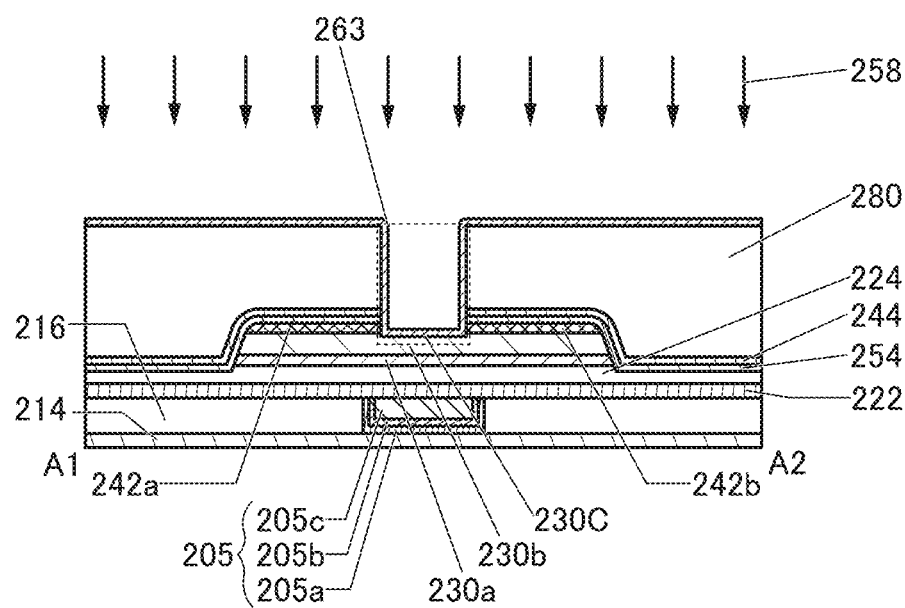
Figure 25A:
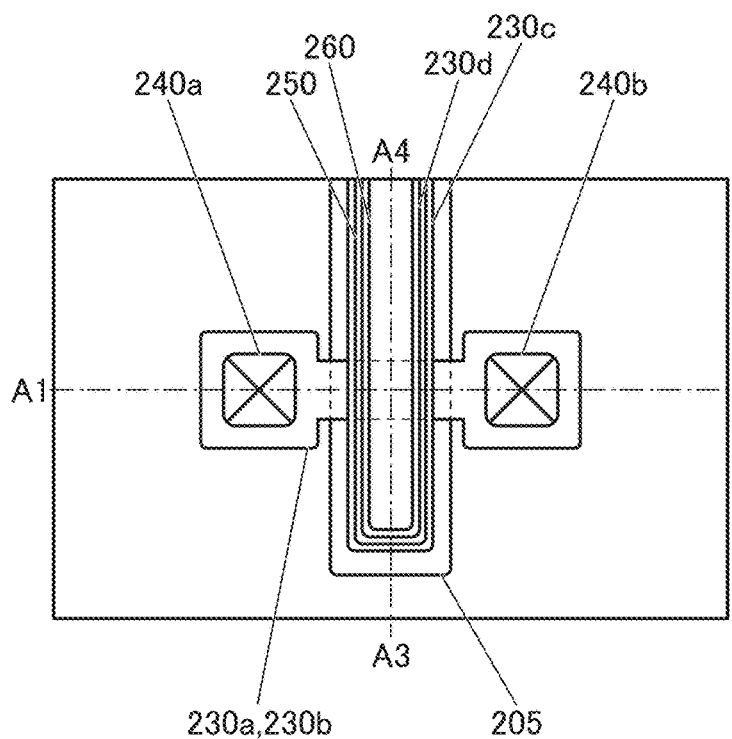
FIGS. 25A-25C A top view and cross-sectional views illustrating a method for manufacturing a semiconductor device of one embodiment of the present invention.
Figure 25C:
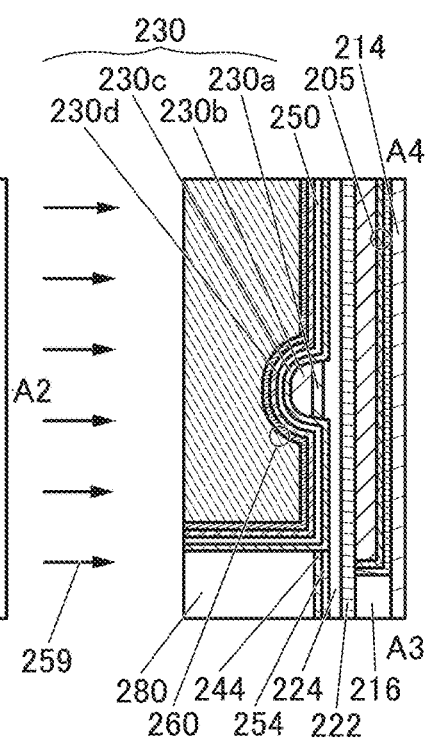
Figure 25B:
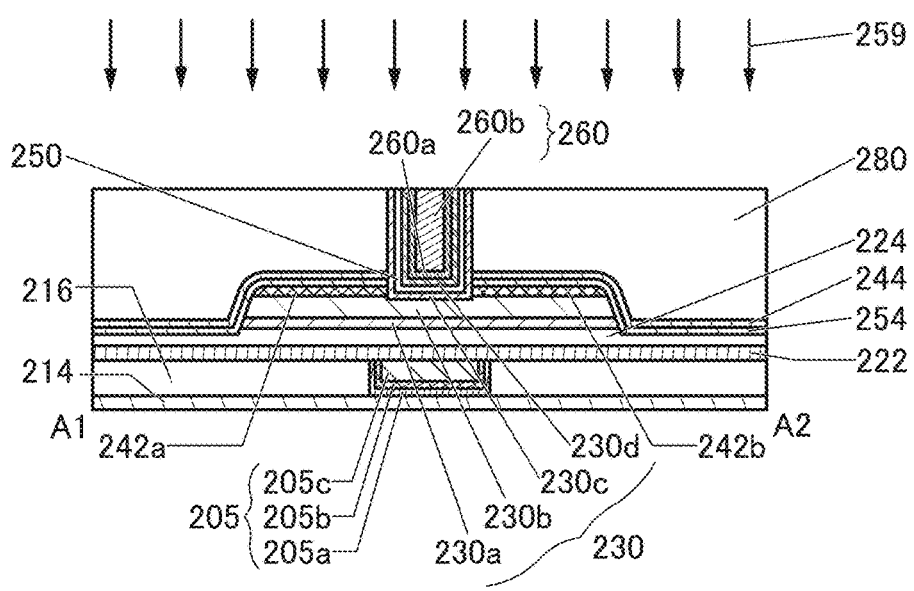
Figure 26A:
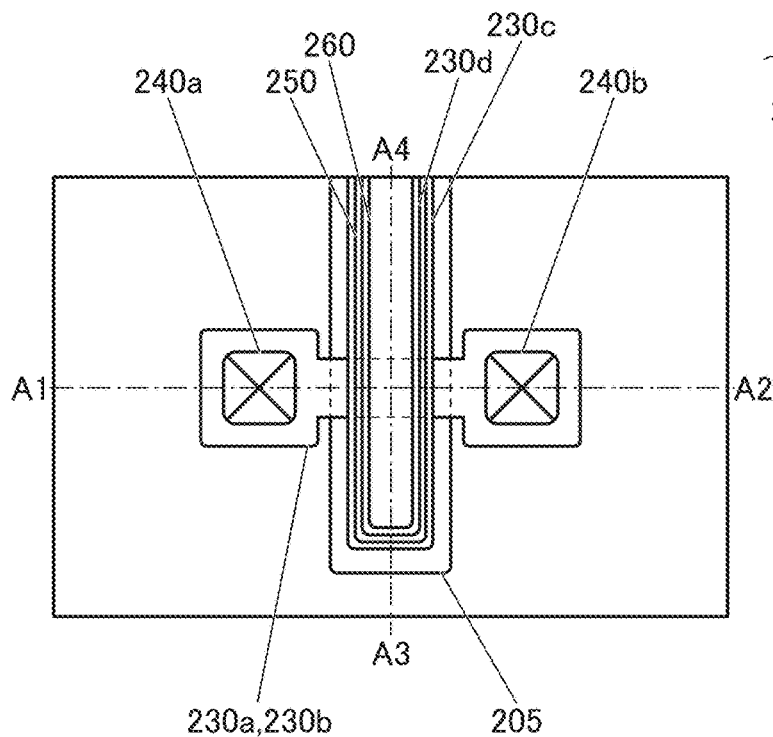
FIGS. 26A-26C A top view and cross-sectional views illustrating a method for manufacturing a semiconductor device of one embodiment of the present invention.
Figure 26C:
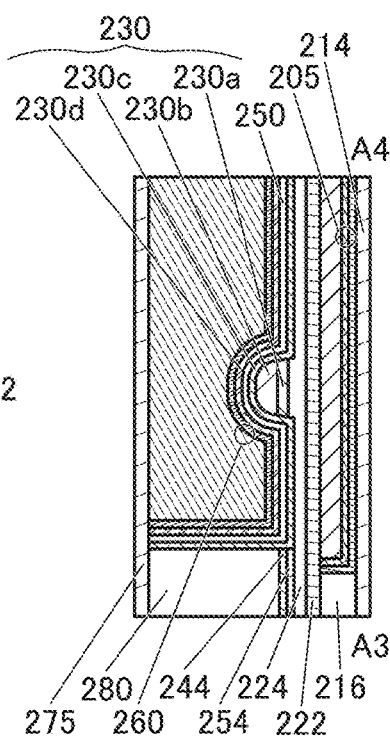
Figure 26B:
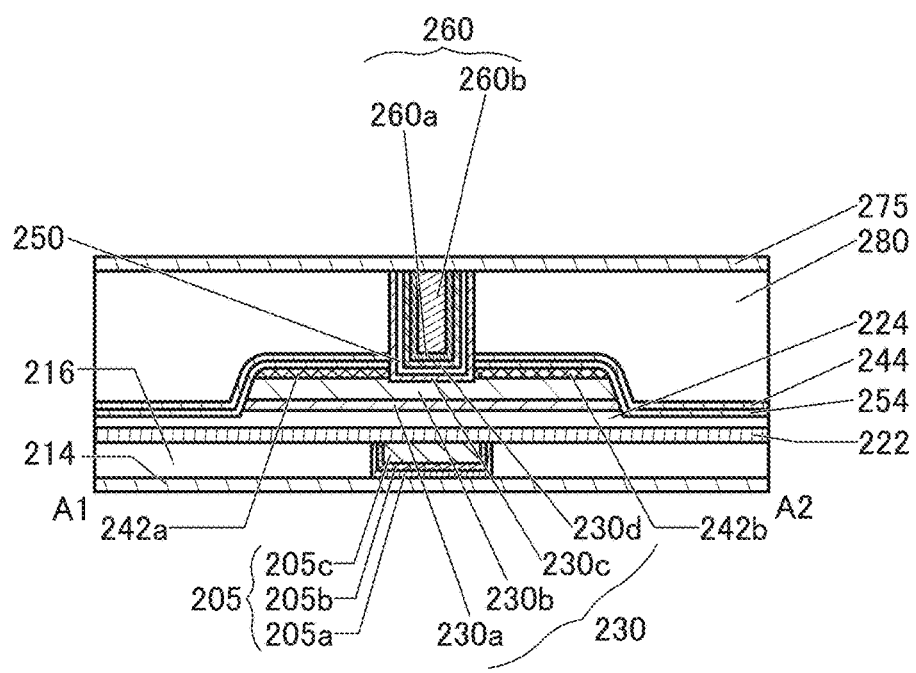

In FIG. 24 to FIG. 26, (A) in each drawing is a top view. Furthermore, (B) in each drawing is a cross-sectional view of a portion indicated by the dashed-dotted line A1-A2 in (A), and is a cross-sectional view in the channel length direction of the transistor 200. Moreover, (C) in each drawing is a cross-sectional view of a portion indicated by the dashed-dotted line A3-A4 in (A), and is a cross-sectional view in the channel width direction of the transistor 200.

Note that for simplification of the drawing, some components are not illustrated in the top view of (A) in each drawing.

The steps up to the formation of the opening 263 are similar to those in the manufacturing method described in <Method 1-1 for manufacturing semiconductor device>. Thus, the method for manufacturing the semiconductor device in FIG. 17 to FIG. 21 can be referred to.

Next, the oxide film 230C is formed to fill the opening 263. Then, a dopant 258 is added to the oxide film 230C (see FIG. 24). The dopant 258 is preferably oxygen. Addition of oxygen to the oxide film 230C can reduce oxygen vacancies in the oxide 230a, the oxide 230b, and the oxide 230c. As a method for adding the dopant 258, an ion implantation method in which an ionized source gas is subjected to mass separation and then added, an ion doping method in which an ionized source gas is added without mass separation, a plasma immersion ion implantation method, or the like can be used. In the case of performing mass separation, an ion species to be added and its concentration can be adjusted precisely. On the other hand, in the case of not performing mass separation, ions at a high concentration can be added in a short time. Alternatively, an ion doping method in which atomic or molecular clusters are generated and ionized may be used. Note that a dopant may be referred to as an ion, donor, acceptor, impurity, element, or the like.

Next, an insulating layer to be the insulator 250, an oxide film to be the oxide 230d, and a conductive film to be the conductor 260 (the conductor 260a and the conductor 260b) are formed over the oxide film 230C.

Next, the oxide film 230C, the insulating layer to be the insulator 250, the oxide film to be the oxide 230d, and the conductive film to be the conductor 260 are polished by CMP treatment until the insulator 280 is exposed, whereby the oxide 230c, the insulator 250, the oxide 230d, and the conductor 260 (the conductor 260a and the conductor 260b) are formed. Then, a dopant 259 is added to the insulator 280 (see FIG. 25). The dopant 259 is preferably oxygen. When oxygen is added to the insulator 280, oxygen can be supplied to the oxide 230a, the oxide 230b, and the oxide 230c through the insulator 280 and thus oxygen vacancies in the oxide 230a, the oxide 230b, and the oxide 230c can be reduced. The description of the dopant 258 can be referred to for a method for adding the dopant 259; thus, the detailed description is omitted.

Next, an insulating film 275 is formed over the insulator 280 (see FIG. 26). The insulating film 275 can be formed by a sputtering method, a CVD method, an MBE method, a PLD method, an ALD method, or the like. An aluminum oxide film is preferably formed as the insulating film 275 by a sputtering method, for example. When an aluminum oxide film is formed by a sputtering method, hydrogen contained in the insulator 280 can be inhibited from diffusing into the oxide 230 in some cases.

Next, heat treatment may be performed. The heat treatment is performed at 100° C. or higher and 400° C. or lower, and is performed at 350° C. for four hours, for example. Through the heat treatment, oxygen contained in the insulating film 275 is supplied to the insulator 280 and oxygen can be supplied to the oxide 230a, the oxide 230b, and the oxide 230c through the insulator 280, so that oxygen vacancies in the oxide 230a, the oxide 230b, and the oxide 230c can be reduced. In addition, the moisture concentration and hydrogen concentration in the insulator 280 can be reduced.

Next, the insulating film 275 is removed by CMP treatment to expose the insulator 280, the oxide 230c, the insulator 250, the oxide 230d, the conductor 260a, and the conductor 260b.

Next, the insulating film to be the insulator 274 is formed over the insulator 280. The insulating film to be the insulator 281 may be formed over the insulator 274 (see FIG. 23).

Next, openings reaching the conductor 242a and the conductor 242b are formed in the insulator 254, the insulator 244, the insulator 280, the insulator 274, and the insulator 281.

Next, the insulating film to be the insulator 241 is formed and the insulating film is subjected to anisotropic etching, so that the insulator 241 is formed.

Next, the conductive film to be the conductor 240a and the conductor 240b is formed. Then, CMP treatment is performed to remove part of the conductive film to be the conductor 240a and the conductor 240b, so that the insulator 281 is exposed. As a result, the conductive film remains only in the openings, so that the conductor 240a and the conductor 240b having flat top surfaces can be formed (see FIG. 4).

Through the above process, the semiconductor device including the transistor 200 illustrated in FIG. 4 can be manufactured. As illustrated in FIG. 24 to FIG. 26, with the use of the method for manufacturing the semiconductor device described in this embodiment, the transistor 200 can be manufactured.

<Method 2-1 for Manufacturing Semiconductor Device>

A method for manufacturing a semiconductor device including the transistor 200A of one embodiment of the present invention, which is illustrated in FIG. 9, will be described with reference to FIG. 27 to FIG. 34.

In FIG. 27 to FIG. 34, (A) in each drawing is a top view. Furthermore, (B) in each drawing is a cross-sectional view of a portion indicated by the dashed-dotted line A1-A2 in (A), and is a cross-sectional view in the channel length direction of the transistor 200A. Moreover, (C) in each drawing is a cross-sectional view of a portion indicated by the dashed-dotted line A3-A4 in (A), and is a cross-sectional view in the channel width direction of the transistor 200A. Note that for simplification of the drawing, some components are not illustrated in the top view of (A) in each drawing.

Figure 27A:
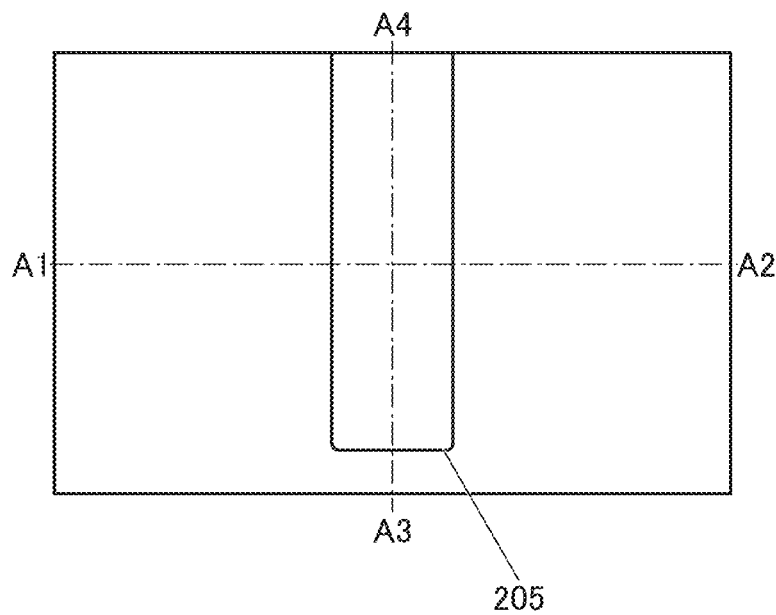
FIGS. 27A-27C A top view and cross-sectional views illustrating a method for manufacturing a semiconductor device of one embodiment of the present invention.
Figure 27C:
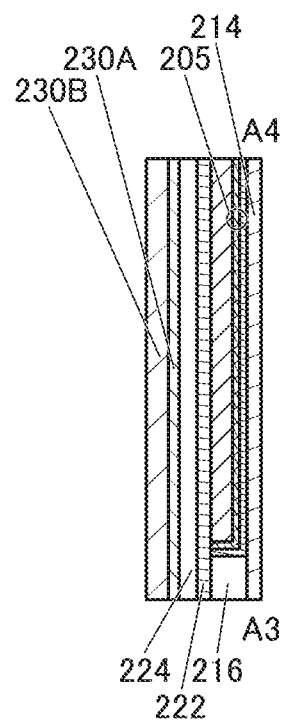
Figure 27B:
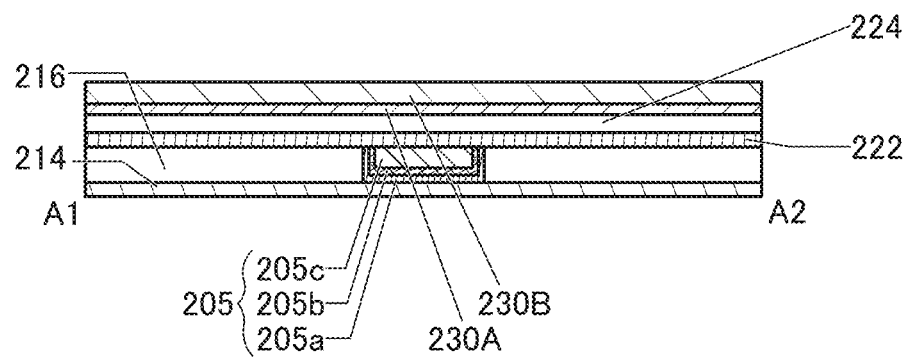

The steps up to the formation of the oxide film 230B are similar to those in the manufacturing method described in <Method 1-1 for manufacturing semiconductor device> (see FIG. 27). Thus, the description of <Method 1-1 for manufacturing semiconductor device> can be referred to, and the detailed description is omitted.

Next, heat treatment may be performed. Through the heat treatment, impurities such as water and hydrogen in the oxide film 230A and the oxide film 230B can be removed, for example.

Next, the oxide film 230A and the oxide film 230B are processed into island shapes to form the oxide 230a and the oxide 230b. Note that in this step, the thickness of the insulator 224 in a region that does not overlap with the oxide 230a is reduced in some cases (see FIG. 28).

Note that the oxide film 230A and the oxide film 230B are processed by a lithography method. In addition, a dry etching method or a wet etching method can be used for the processing. Processing by a dry etching method is suitable for microfabrication.

Cleaning is performed to remove impurities or the like in the processing of the oxide film 230A and the oxide film 230B. Examples of the cleaning method include wet cleaning using a cleaning solution or the like, plasma treatment using plasma, and cleaning by heat treatment, and any of these cleanings may be performed in appropriate combination.

Then, heat treatment may be performed. As the conditions for the heat treatment, the conditions for the above heat treatment can be used. Alternatively, heat treatment is preferably performed before the formation of the insulating film 254A. The heat treatment is performed at higher than or equal to 100° C. and lower than or equal to 400° C., and is performed at 200° C., for example. Alternatively, the heat treatment is preferably performed at the same temperature as the deposition temperature of the insulating film 254A.

Figure 28A:
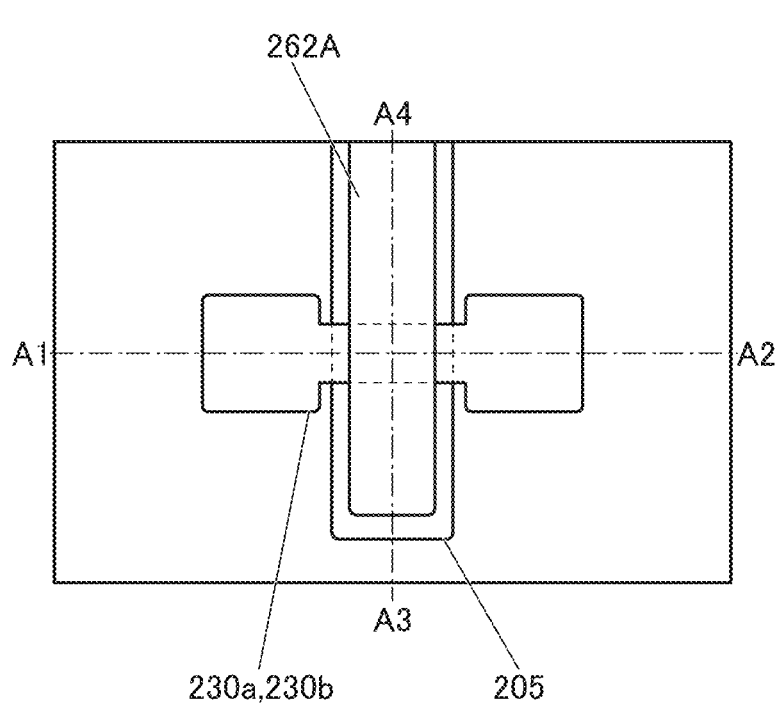
FIGS. 28A-28C A top view and cross-sectional views illustrating a method for manufacturing a semiconductor device of one embodiment of the present invention.
Figure 28C:
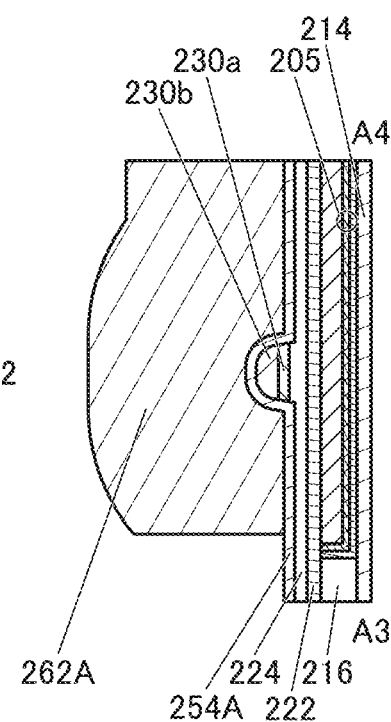
Figure 28B:
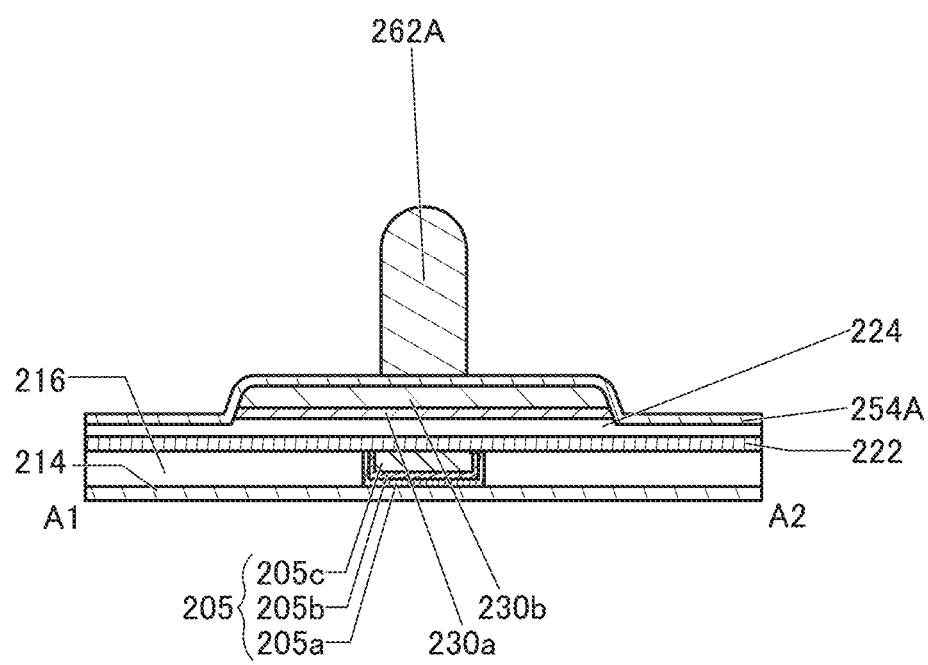

Next, the insulating film 254A is formed to cover the oxide 230a and the oxide 230b (see FIG. 28). The insulating film 254A can be formed by a sputtering method, a CVD method, an MBE method, a PLD method, an ALD method, or the like.

Next, the dummy gate film to be the dummy gate layer 262A is formed over the insulating film 254A.

The dummy gate film to be the dummy gate layer 262A is processed to be used as a dummy gate. The dummy gate is an interim gate electrode. That is, the dummy gate film to be the dummy gate layer 262A is processed to form an interim gate electrode, the dummy gate is removed in a later step, and a gate electrode is formed using a conductive film or the like instead. Thus, a film that is easily processed minutely and easily removed is preferably used as the dummy gate film to be the dummy gate layer 262A.

The dummy gate film to be the dummy gate layer 262A can be formed by a sputtering method, a CVD method, an MBE method, a PLD method, an ALD method, or the like. For example, an insulator, a semiconductor, or a conductor can be used. Specifically, silicon such as polysilicon, microcrystalline silicon, or amorphous silicon, or a metal film of aluminum, titanium, tungsten, or the like is used, for example. Alternatively, a film containing carbon, SOG (Spin On Glass), a resin film, or the like may be formed by a coating method. Examples of a resin include a photoresist, polyester, polyolefin, polyamide (nylon, aramid, or the like), polyimide, polycarbonate, and acrylic. When SOG or the resin film is formed by a coating method, a surface of the dummy gate film can be made flat. When the surface of the dummy gate film is made flat in this manner, the dummy gate film can be easily processed minutely and easily removed.

In addition, the dummy gate film to be the dummy gate layer 262A can be a multilayer film using different kinds of films. For example, the dummy gate film to be the dummy gate layer 262A can have a two-layer structure of a conductive film and a resin film formed over the conductive film. When the dummy gate film has such a structure, the conductive film sometimes functions as a stopper film for CMP treatment in a later CMP process, for example. Alternatively, the end point of the CMP treatment can be detected in some cases, so that processing variations can be reduced in some cases.

Next, the dummy gate film to be the dummy gate layer 262A is etched by a lithography method, so that the dummy gate layer 262A is formed (see FIG. 28). The dummy gate layer 262A is formed to at least partly overlap with the conductor 205 and the oxide 230.

Figure 29A:
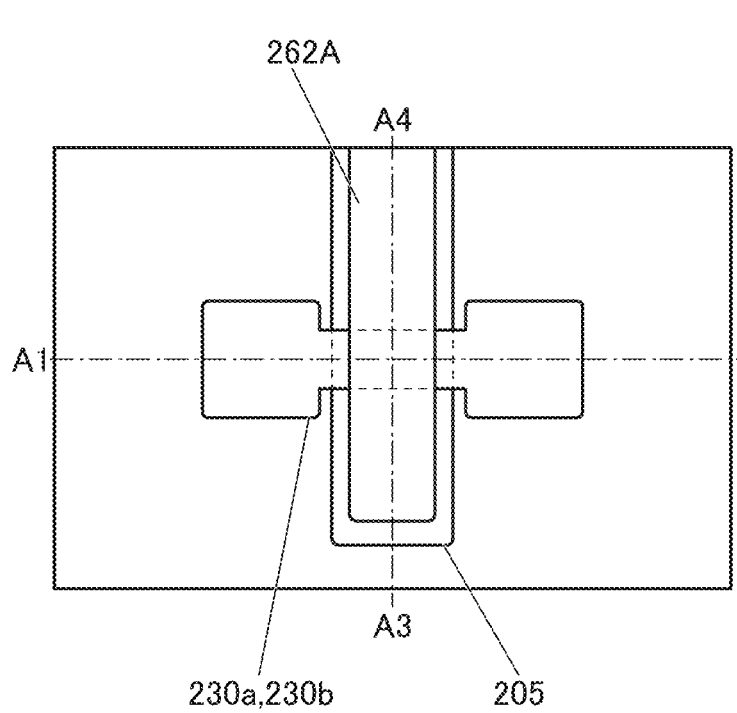
FIGS. 29A-29C A top view and cross-sectional views illustrating a method for manufacturing a semiconductor device of one embodiment of the present invention.
Figure 29C:
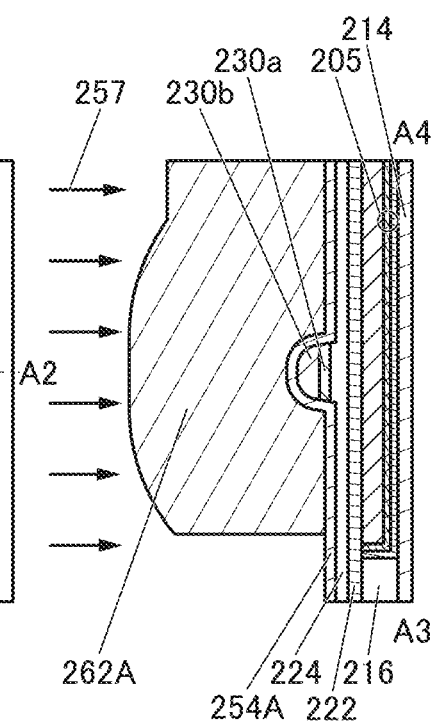
Figure 29B:
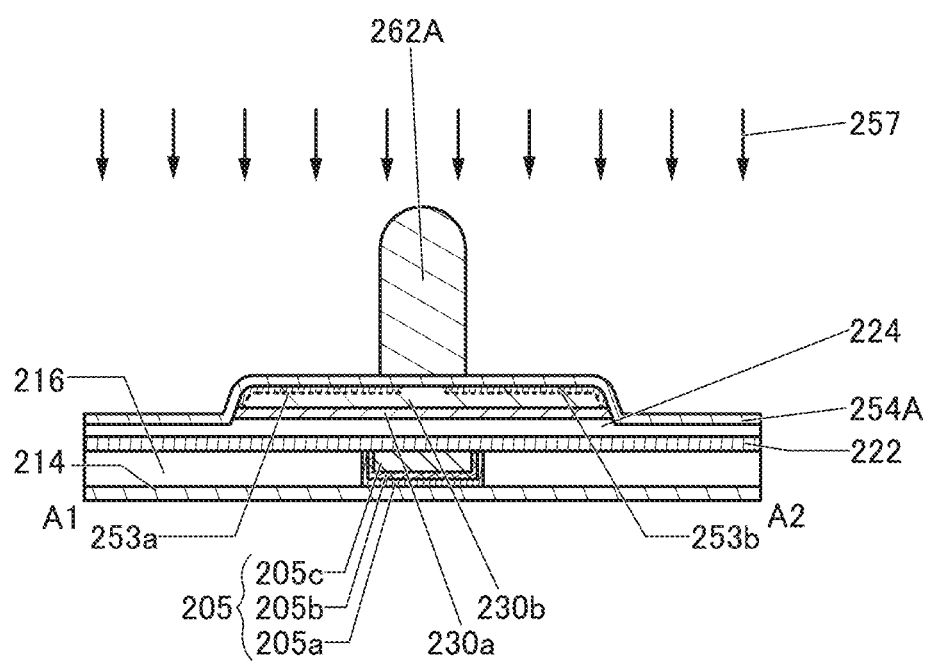

Next, a dopant 257 is added to the oxide 230b with the use of the dummy gate layer 262A as a mask (see FIG. 29). Accordingly, the layer 253a and the layer 253b including the dopant 257 are formed in regions of the oxide 230b that do not overlap with the dummy gate layer 262A. Note that FIG. 29 shows a situation where the dopant 257 is diffused into and added to a region of the oxide 230b that overlaps with the dummy gate layer 262A. Thus, parts of the layer 253a and the layer 253b are also formed in regions overlapping with the dummy gate layer 262A. In this manner, the distance between the layer 253a and the layer 253b, i.e., the channel length, can be controlled by the length of the dummy gate layer 262A in the channel length direction.

As a method for adding the dopant 257, an ion implantation method in which an ionized source gas is subjected to mass separation and then added, an ion doping method in which an ionized source gas is added without mass separation, a plasma immersion ion implantation method, or the like can be used. In the case of performing mass separation, an ion species to be added and its concentration can be adjusted precisely. On the other hand, in the case of not performing mass separation, ions at a high concentration can be added in a short time. Alternatively, an ion doping method in which atomic or molecular clusters are generated and ionized may be used. Note that a dopant may be referred to as an ion, donor, acceptor, impurity, element, or the like.

As the dopant 257, the element that forms an oxygen vacancy, the element that is bonded to an oxygen vacancy, or the like is used. Typical examples of such elements include boron and phosphorus. Hydrogen, carbon, nitrogen, fluorine, sulfur, chlorine, titanium, a rare gas, or the like can also be used. Typical examples of the rare gas include helium, neon, argon, krypton, and xenon. Furthermore, any one or more metal elements selected from metal elements such as aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum may be added. Among the above elements, boron or phosphorus is preferable as the dopant 257. In the case where boron or phosphorus is used as the dopant 257, manufacturing line apparatuses for amorphous silicon or low-temperature polysilicon can be used; thus, capital investment can be reduced.

Although the dopant 257 is added substantially perpendicular to the top surface of the insulator 214 in FIG. 29, one embodiment of the present invention is not limited thereto. The dopant 257 may be added obliquely to the top surface of the insulator 214. The addition of the dopant obliquely to the top surface of the insulator 214 facilitates the formation of the layer 253a and the layer 253b in part of a region overlapping with the dummy gate layer 262A.

In the manufacturing method in this embodiment, the dopant 257 is added to the oxide 230 through the insulating film 254A. With this manufacturing method, the dopant 257 is also added to the insulating film 254A. In other words, both the oxide 230 and the insulating film 254A include the element contained in the dopant 257. In the case where the insulating film 254A contains excess oxygen, the dopant 257 can inhibit diffusion of excess oxygen to the outside in some cases.

The layer 253 is formed as described above, so that the conductor 260 formed in a later step can be positioned between the layer 253a and the layer 253b in a self-aligned manner.

Figure 30A:
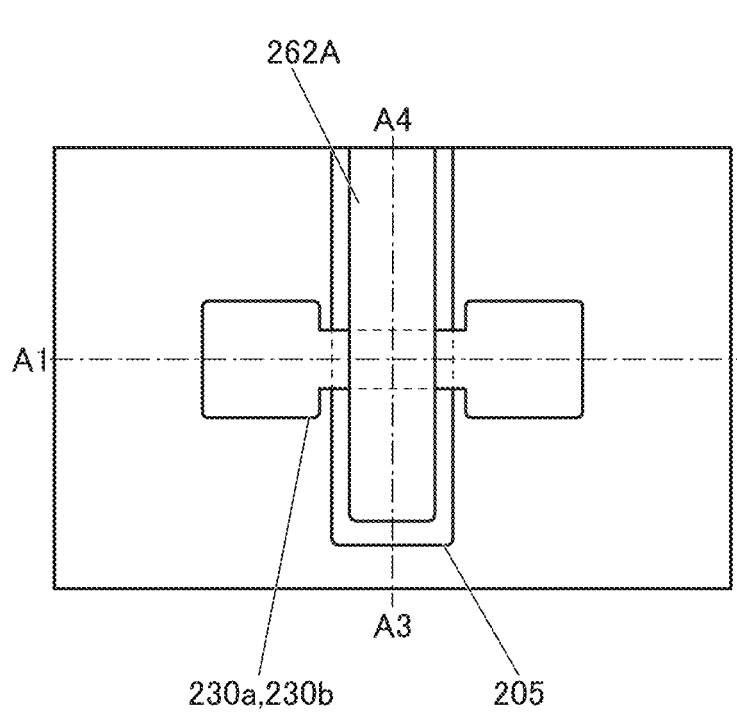
FIGS. 30A-30C A top view and cross-sectional views illustrating a method for manufacturing a semiconductor device of one embodiment of the present invention.
Figure 30C:
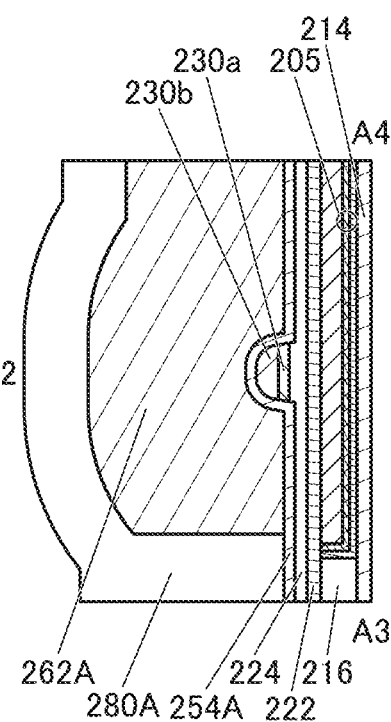
Figure 30B:
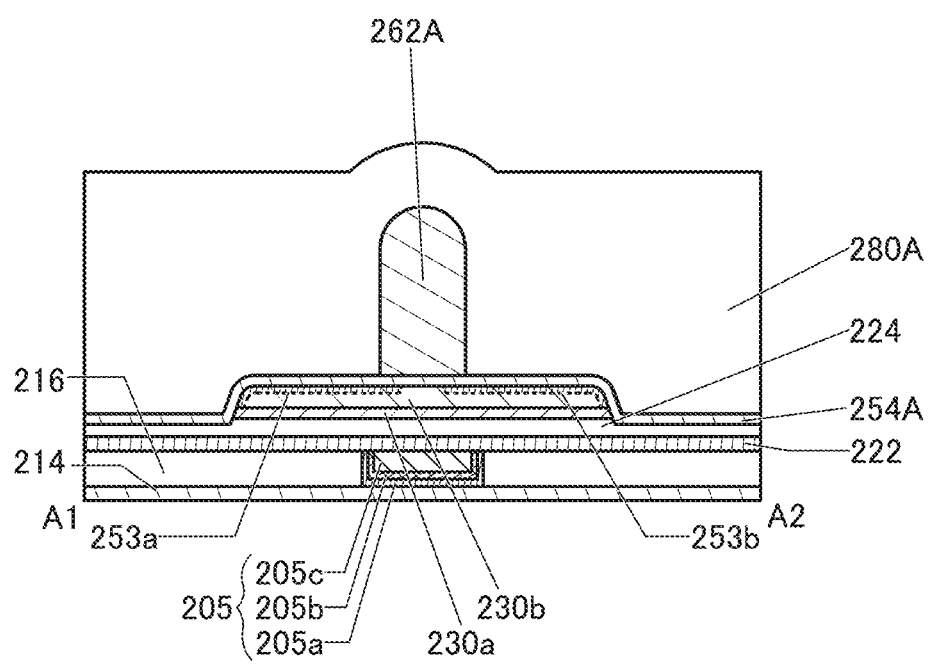

Next, an insulating film 280A is formed over the insulating film 254A and the dummy gate layer 262A (see FIG. 30). The insulating film 280A can be formed by a sputtering method, a CVD method, an MBE method, a PLD method, an ALD method, or the like.

Figure 31A:
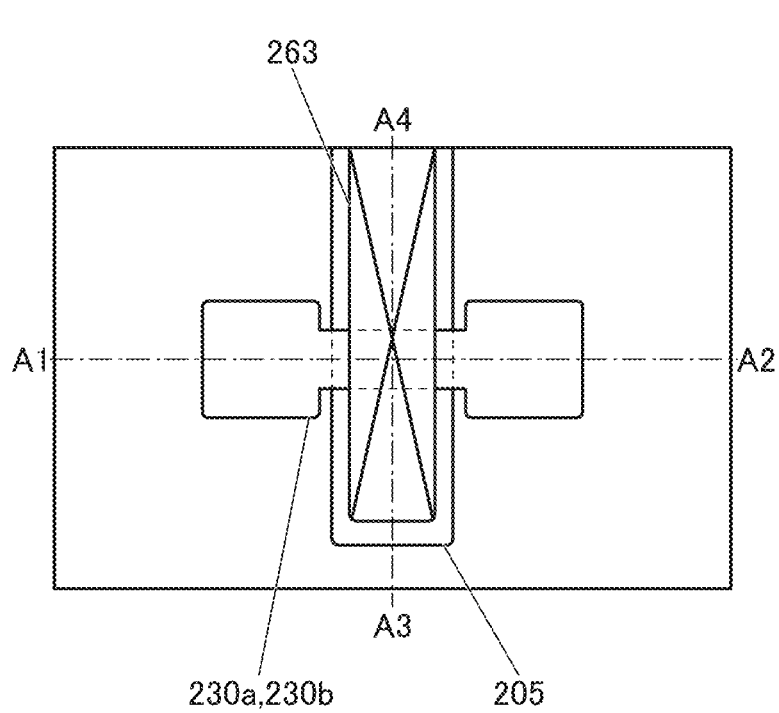
FIGS. 31A-31C A top view and cross-sectional views illustrating a method for manufacturing a semiconductor device of one embodiment of the present invention.
Figure 31C:
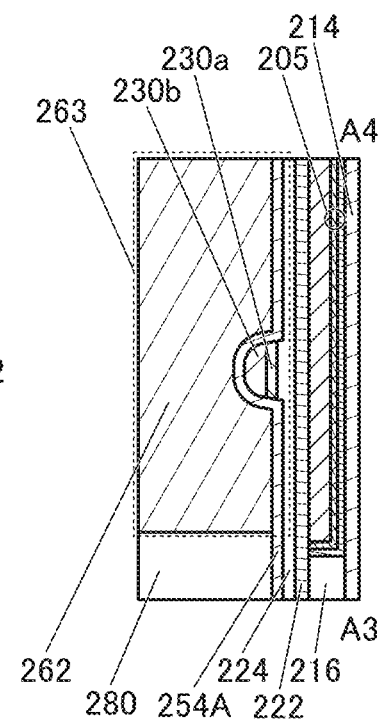

Next, the insulating film 280A and the dummy gate layer 262A are partly removed until part of the dummy gate layer 262A is exposed, so that the insulator 280 and the dummy gate 262 are formed (see FIG. 31). CMP treatment is preferably used to form the insulator 280 and the dummy gate 262.

Figure 31B:
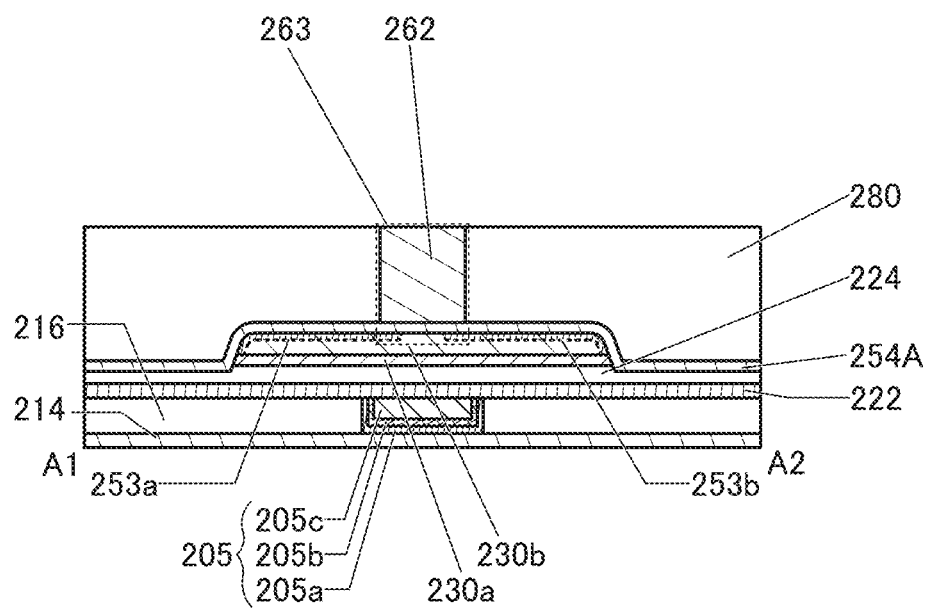

As described above, when the dummy gate layer 262A has a two-layer structure of a conductive film and a resin film formed over the conductive film, for example, the conductive film sometimes functions as a stopper film for CMP treatment in a CMP process. Alternatively, the end point of the CMP treatment can be detected with the conductive film in some cases, so that variations in the height of the dummy gate 262 can be reduced in some cases. As illustrated in FIG. 31(B), the top surface of the dummy gate 262 is substantially aligned with the top surface of the insulator 280.

Figure 32A:
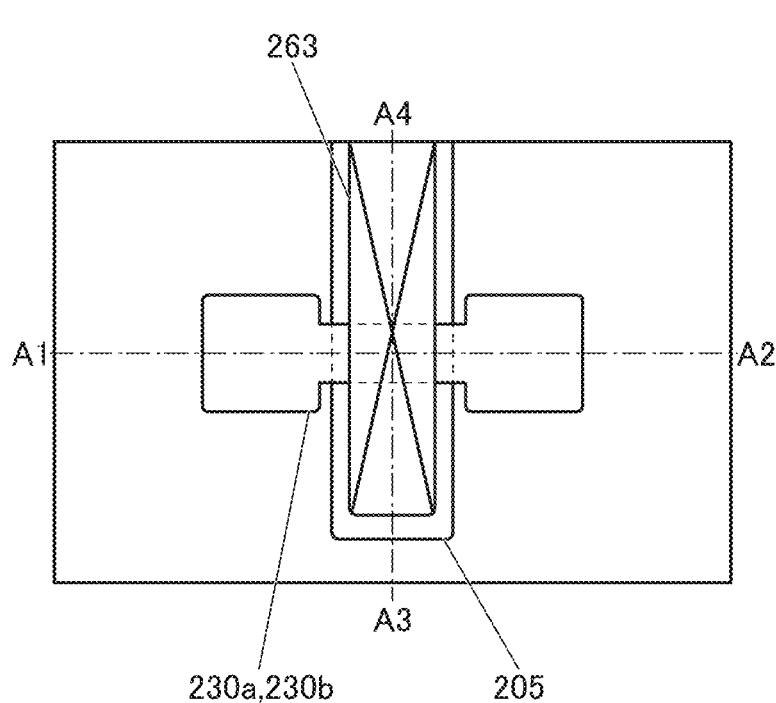
FIGS. 32A-32C A top view and cross-sectional views illustrating a method for manufacturing a semiconductor device of one embodiment of the present invention.
Figure 32C:
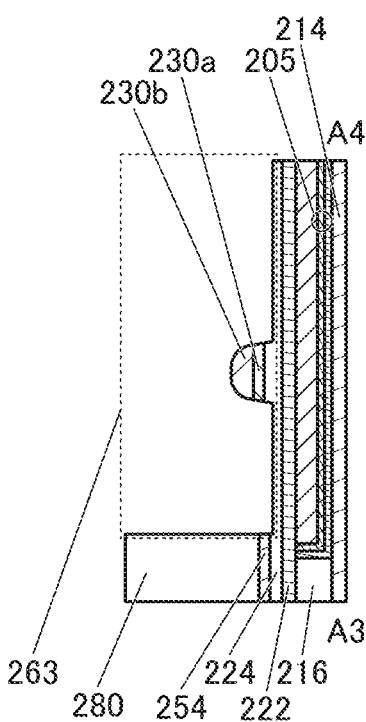
Figure 32B:
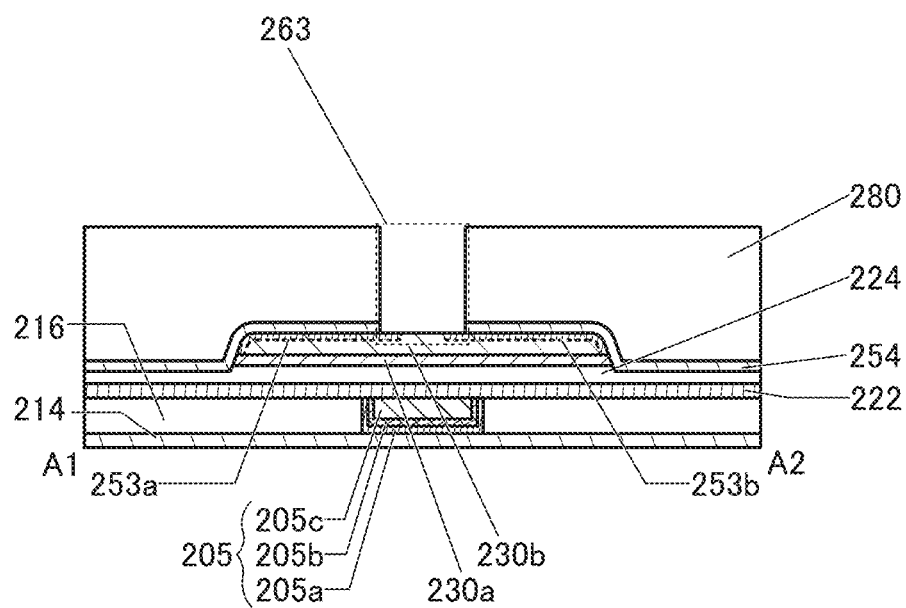
Figure 33A:
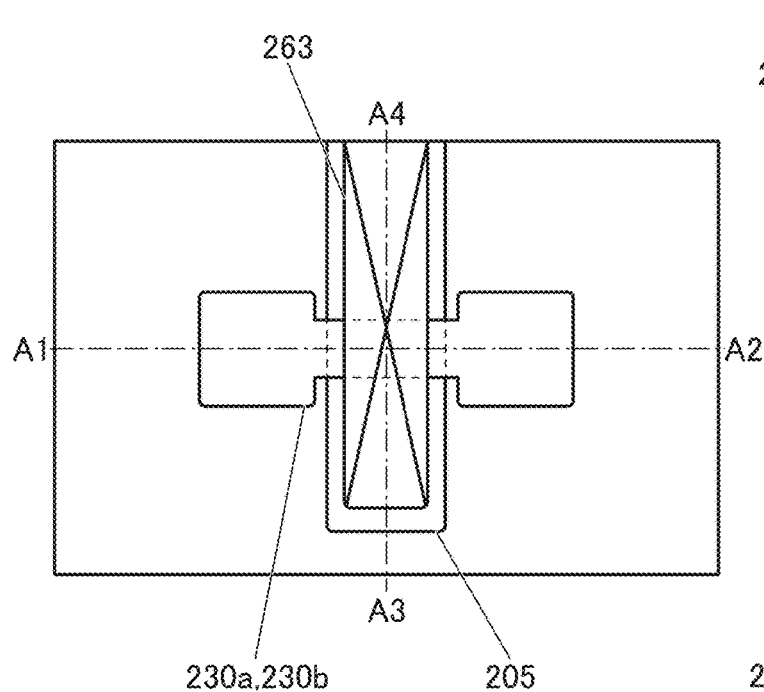
FIGS. 33A-33C A top view and cross-sectional views illustrating a method for manufacturing a semiconductor device of one embodiment of the present invention.
Figure 33C:
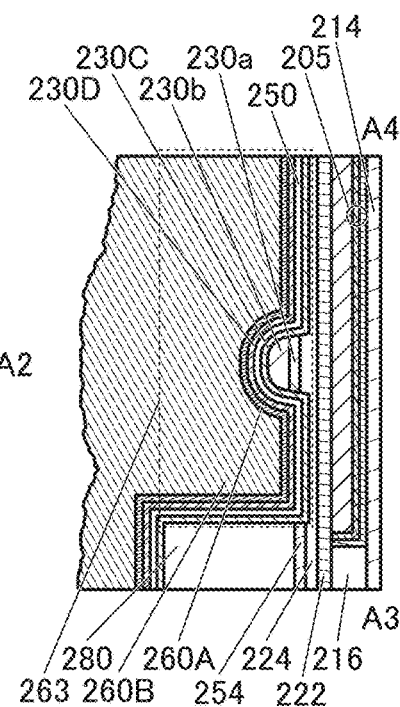
Figure 33B:
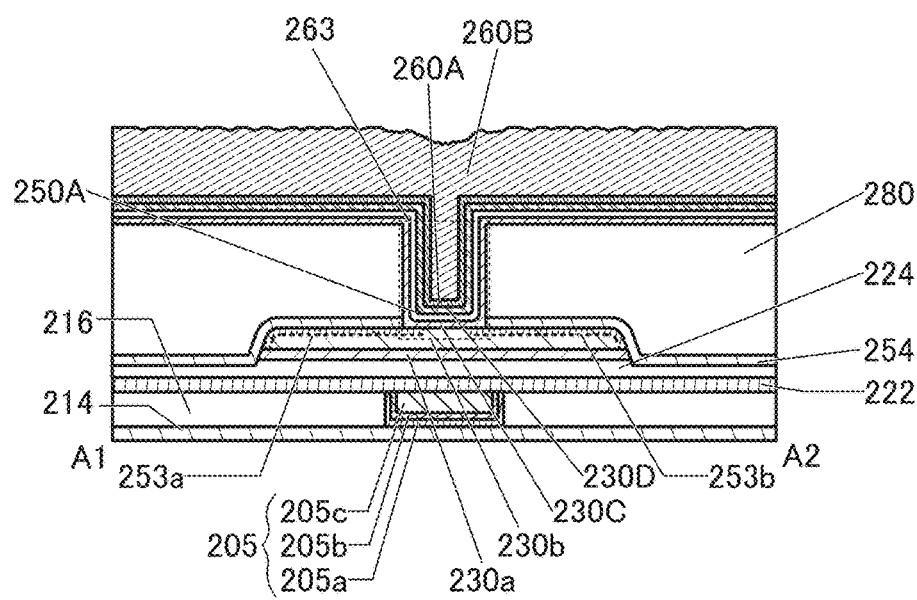

Next, the dummy gate 262 and part of the insulating film 254A overlapping with the dummy gate 262 are removed to form the opening 263 (see FIG. 32). The dummy gate 262 and the insulating film 254A can be removed by wet etching, dry etching, ashing, or the like. Alternatively, a plurality of the above treatments may be performed in appropriate combination. For example, wet etching treatment is performed after ashing treatment. By removal of part of the insulating film 254A, the insulator 254 is formed. By removal of the dummy gate 262 and the insulating film 254A, part of the surface of the oxide 230b is exposed through the opening 263. At this time, part of a surface of the layer 253 is exposed through the opening 263 in some cases.

Next, heat treatment is preferably performed before the formation of the oxide film 230C. The heat treatment is performed at higher than or equal to 100° C. and lower than or equal to 400° C., and is performed at 200° C., for example. Alternatively, the heat treatment is preferably performed at the same temperature as the deposition temperature of the oxide film 230C. Here, the deposition temperature is not limited to the substrate temperature during the deposition, and includes the set temperature of the deposition apparatus. For example, in the case where the oxide film 230C is formed at 300° C., the heat treatment is preferably performed at 300° C. The heat treatment is preferably performed under reduced pressure, and for example, may be performed in a vacuum atmosphere. A vacuum atmosphere is kept by evacuation with a turbomolecular pump or the like. The pressure in a vacuum atmosphere of the treatment chamber is lower than or equal to $1 \times 10^{-2}$ Pa, preferably lower than or equal to $1 \times 10^{-3}$ Pa.

Next, the oxide film 230C is formed to fill the opening 263. In addition, after the above heat treatment, the formation of the oxide film 230C is preferably performed successively without exposure to the air. For example, it is preferable that the heat treatment and the deposition treatment be successively performed in different chambers by using a multi-chamber deposition apparatus or the like.

The oxide film 230C can be formed by a sputtering method, a CVD method, an MBE method, a PLD method, an ALD method, or the like. The oxide film 230C to be the oxide 230c is formed by a deposition method similar to that for the oxide film 230A or the oxide film 230B in accordance with characteristics required for the oxide 230c. An In—Ga—Zn oxide or an oxide that does not contain In can be used for the oxide film 230C. As the oxide that does not contain In, a Ga—Zn oxide, gallium oxide, or the like can be used. For the oxide film 230C, a stacked-layer structure of an In—Ga—Zn oxide and an oxide that does not contain In may be used.

The oxide film 230C may have a stacked-layer structure of a first oxide film and a second oxide film over the first oxide film. The first oxide film may be formed using a target similar to the target used for forming the oxide film 230B, and the second oxide film may be formed using a target similar to the target used for forming the oxide film 230A.

The oxide film 230C is preferably formed while the substrate is heated. In that case, the substrate temperature is set to higher than or equal to 300° C., so that oxygen vacancies in the oxide 230a, the oxide 230b, and the oxide film 230C can be reduced. For example, the oxide film 230C may be formed at the same temperature as the deposition temperature of the insulating film 250A described later. Furthermore, the oxide film 230C is formed while the substrate is heated in this manner, whereby the crystallinity of the oxide 230a, the oxide 230b, and the oxide film 230C can be improved.

In particular, at the time of forming the oxide film 230C, part of oxygen contained in the sputtering gas is supplied to the oxide 230a and the oxide 230b in some cases. Therefore, the proportion of oxygen contained in the sputtering gas for the oxide film 230C is higher than or equal to 70%, preferably higher than or equal to 80%, further preferably 100%. In addition, when the oxide film is formed while the substrate is heated, the crystallinity of the oxide film can be improved.

Next, heat treatment is preferably performed before the formation of the insulating film 250A. The heat treatment is performed at higher than or equal to 100° C. and lower than or equal to 400° C., and is performed at 200° C., for example. Alternatively, the heat treatment is preferably performed at the same temperature as the deposition temperature of the insulating film 250A. Here, the deposition temperature is not limited to the substrate temperature during the deposition, and includes the set temperature of the deposition apparatus. For example, in the case where the insulating film 250A is formed at 350° C., the heat treatment is preferably performed at 350° C. The heat treatment is preferably performed under reduced pressure, and for example, may be performed in a vacuum atmosphere. A vacuum atmosphere is kept by evacuation with a turbomolecular pump or the like. The pressure in a vacuum atmosphere of the treatment chamber is lower than or equal to $1 \times 10^{-2}$ Pa, preferably lower than or equal to $1 \times 10^{-3}$ Pa.

Next, the insulating film 250A is formed. The insulating film 250A can be formed by a sputtering method, a CVD method, an MBE method, a PLD method, an ALD method, or the like. For the insulating film 250A, silicon oxide, hafnium oxide, gallium oxide, or the like is preferably formed by an ALD method. For example, a stacked-layer film of silicon oxide and gallium oxide over the silicon oxide is used as the insulating film 250A. Note that the deposition temperature at the time of forming the insulating film 250A is preferably higher than or equal to 300° C. and lower than 450° C., further preferably higher than or equal to 300° C. and lower than 400° C., particularly preferably approximately 350° C. For example, when the insulating film 250A is formed at 350° C., an insulator having few impurities can be formed.

Note that oxygen is excited by microwaves to generate high-density oxygen plasma, and the insulating film 250A is exposed to the oxygen plasma, so that oxygen can be introduced into the insulating film 250A.

Furthermore, heat treatment may be performed. For the heat treatment, the conditions for the above heat treatment can be used. The heat treatment can reduce the moisture concentration and hydrogen concentration in the insulating film 250A.

Next, the oxide film 230D is formed. In addition, after the above heat treatment, the formation of the oxide film 230D is preferably performed successively without exposure to the air. For example, it is preferable that the heat treatment and the deposition treatment be successively performed in different chambers by using a multi-chamber deposition apparatus or the like.

The description of the oxide film 230C can be referred to for the formation of the oxide film 230D; thus, the detailed description is omitted. The oxide film 230D may be formed using a target similar to the target used for forming the oxide film 230C.

The oxide film 230D is preferably formed while the substrate is heated. In that case, the substrate temperature is set to higher than or equal to 300° C., so that oxygen vacancies in the oxide 230a, the oxide 230b, the oxide film 230C, and the oxide film 230D can be reduced. When the oxide film is formed while the substrate is heated, the crystallinity of the oxide 230a, the oxide 230b, the oxide film 230C, and the oxide film 230D can be improved.

In particular, at the time of forming the oxide film 230D, part of oxygen contained in the sputtering gas is supplied to the oxide 230a, the oxide 230b, and the oxide film 230C through the insulating film 250A in some cases. Therefore, the proportion of oxygen contained in the sputtering gas for the oxide film 230D is higher than or equal to 70%, preferably higher than or equal to 80%, further preferably 100%. In addition, when the oxide film is formed while the substrate is heated, the crystallinity of the oxide film can be improved.

Next, the conductive film 260A and the conductive film 260B are formed. The conductive film 260A and the conductive film 260B can be formed by a sputtering method, a CVD method, an MBE method, a PLD method, an ALD method, or the like. A CVD method is preferably used, for example. In this embodiment, the conductive film 260A is formed by an ALD method, and the conductive film 260B is formed by a CVD method (see FIG. 33).

Figure 34A:
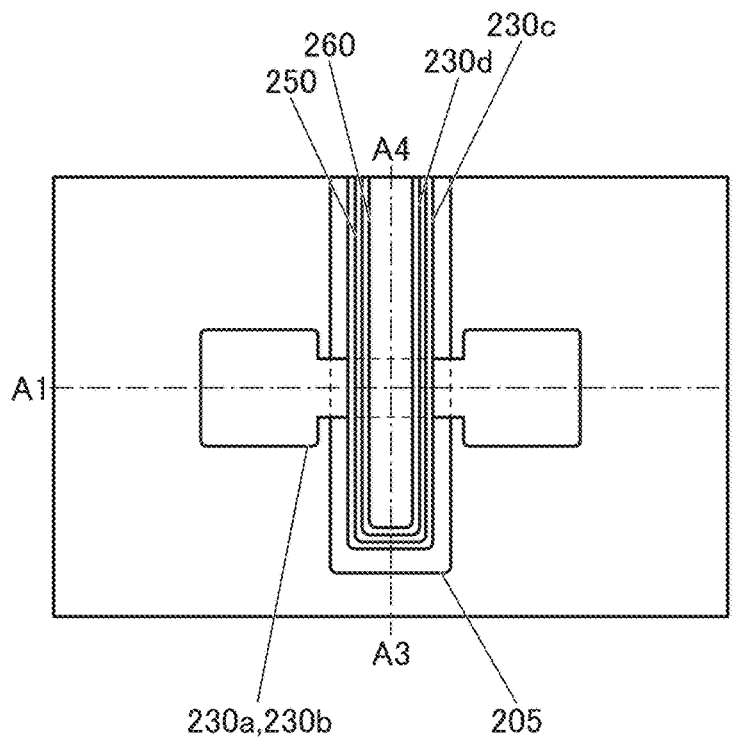
FIGS. 34A-34C A top view and cross-sectional views illustrating a method for manufacturing a semiconductor device of one embodiment of the present invention.
Figure 34C:
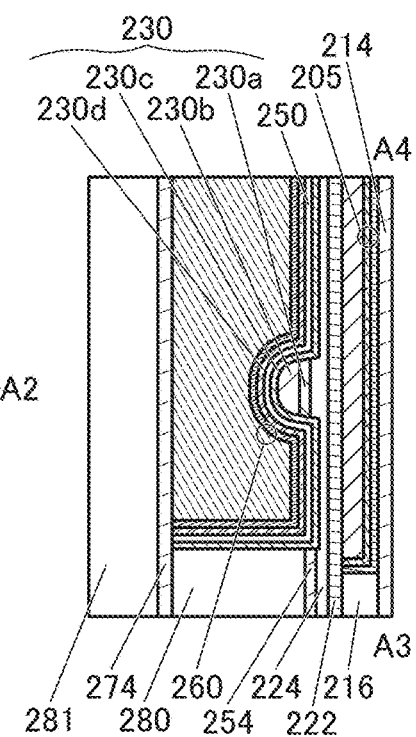
Figure 34B:
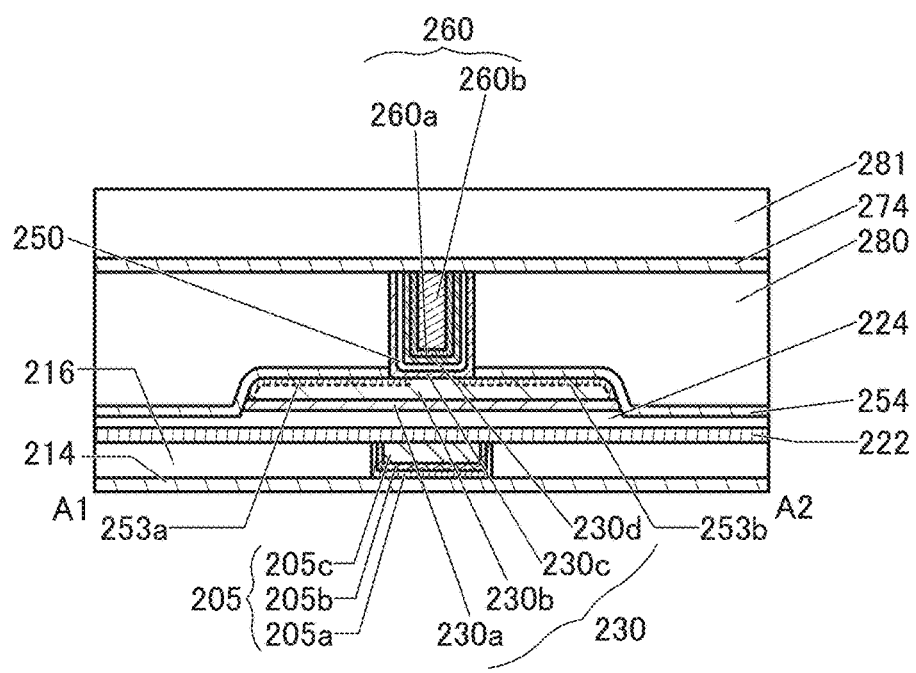

Next, the oxide film 230C, the insulating film 250A, the oxide film 230D, the conductive film 260A, and the conductive film 260B are polished by CMP treatment until the insulator 280 is exposed, so that the oxide 230c, the insulator 250, the oxide 230d, and the conductor 260 (the conductor 260a and the conductor 260b) are formed (see FIG. 34).

Next, heat treatment may be performed. For the heat treatment, the conditions for the above heat treatment can be used. The heat treatment can reduce the moisture concentration and hydrogen concentration in the insulator 280. Alternatively, heat treatment is preferably performed before the formation of the insulating film to be the insulator 274. The heat treatment is performed at higher than or equal to 100° C. and lower than or equal to 400° C., and is performed at 200° C., for example. Alternatively, the heat treatment is preferably performed at the same temperature as the deposition temperature of the insulating film. Here, the deposition temperature is not limited to the substrate temperature during the deposition, and includes the set temperature of the deposition apparatus. For example, in the case where the insulating film is formed at 250° C., the heat treatment is preferably performed at 250° C. The heat treatment is preferably performed under reduced pressure, and for example, may be performed in a vacuum atmosphere. A vacuum atmosphere is kept by evacuation with a turbomolecular pump or the like. The pressure in a vacuum atmosphere of the treatment chamber is lower than or equal to $1 \times 10^{-2}$ Pa, preferably lower than or equal to $1 \times 10^{-3}$ Pa.

Next, the insulating film to be the insulator 274 is formed over the insulator 280 (see FIG. 34). The insulating film to be the insulator 274 can be formed by a sputtering method, a CVD method, an MBE method, a PLD method, an ALD method, or the like. An aluminum oxide film is preferably formed as the insulating film to be the insulator 274 by a sputtering method, for example. When an aluminum oxide film is formed by a sputtering method, hydrogen contained in the insulator 280 can be inhibited from diffusing into the oxide 230 in some cases.

Next, heat treatment may be performed. For the heat treatment, the conditions for the above heat treatment can be used. The heat treatment can reduce the moisture concentration and hydrogen concentration in the insulator 280.

Next, the insulating film to be the insulator 281 may be formed over the insulator 274. The insulating film to be the insulator 281 can be formed by a sputtering method, a CVD method, an MBE method, a PLD method, an ALD method, or the like (see FIG. 34).

Next, openings reaching the layer 253a and the layer 253b are formed in the insulator 254, the insulator 280, the insulator 274, and the insulator 281. The openings are formed by a lithography method.

Next, the insulating film to be the insulator 241 is formed and the insulating film is subjected to anisotropic etching, so that the insulator 241 is formed. The insulating film can be formed by a sputtering method, a CVD method, an MBE method, a PLD method, an ALD method, or the like. As the insulating film to be the insulator 241, an insulating film having a function of inhibiting the passage of oxygen is preferably used. For example, an aluminum oxide film is preferably formed by an ALD method. Alternatively, a silicon nitride film may be formed by an ALD method or a CVD method. In the case where a silicon nitride film is formed by an ALD method, a precursor containing silicon and halogen or a precursor of aminosilanes can be used. As the precursor containing silicon and halogen, $SiCl_4$, $SiH_2Cl_2$, $Si_2Cl_6$, $Si_3Cl_8$, or the like can be used. As the precursor of aminosilanes, monovalent, divalent, or trivalent aminosilanes can be used. As a nitriding gas, ammonia or hydrazine can be used. For the anisotropic etching, a dry etching method or the like may be employed, for example. When the sidewall portions of the openings have such a structure, the passage of oxygen from the outside can be inhibited and oxidation of the conductor 240a and the conductor 240b to be formed next can be prevented. Furthermore, impurities such as water and hydrogen can be prevented from diffusing from the conductor 240a and the conductor 240b to the outside.

Next, the conductive film to be the conductor 240a and the conductor 240b is formed. The conductive film to be the conductor 240a and the conductor 240b desirably has a stacked-layer structure including a conductor having a function of inhibiting diffusion of impurities such as water and hydrogen. For example, a stacked layer of tantalum nitride, titanium nitride, or the like and tungsten, molybdenum, copper, or the like can be employed. The conductive film to be the conductor 240 can be formed by a sputtering method, a CVD method, an MBE method, a PLD method, an ALD method, or the like.

Next, CMP treatment is performed to remove part of the conductive film to be the conductor 240a and the conductor 240b, so that the insulator 281 is exposed. As a result, the conductive film remains only in the openings, so that the conductor 240a and the conductor 240b having flat top surfaces can be formed (see FIG. 9). Note that the insulator 281 is partly removed by the CMP treatment in some cases.

Through the above process, the semiconductor device including the transistor 200A illustrated in FIG. 9 can be manufactured. As illustrated in FIG. 27 to FIG. 34, with the use of the method for manufacturing the semiconductor device described in this embodiment, the transistor 200A can be manufactured.

<Method 2-2 for Manufacturing Semiconductor Device>

A method for manufacturing the semiconductor device including the transistor 200A of one embodiment of the present invention, which is different from the method described in the above <Method 2-1 for manufacturing semiconductor device>, is described with reference to FIG. 35 to FIG. 37.

Figure 35A:
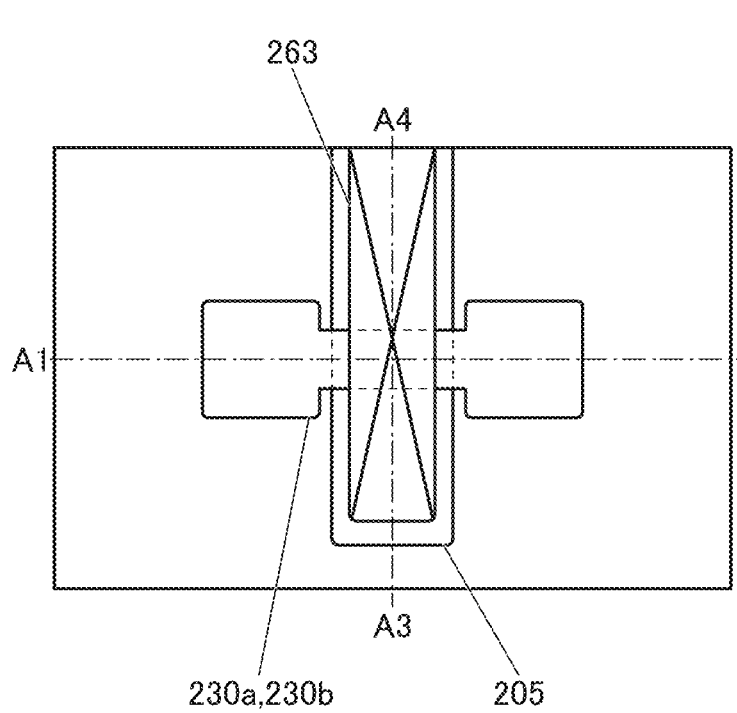
FIGS. 35A-35C A top view and cross-sectional views illustrating a method for manufacturing a semiconductor device of one embodiment of the present invention.
Figure 35C:
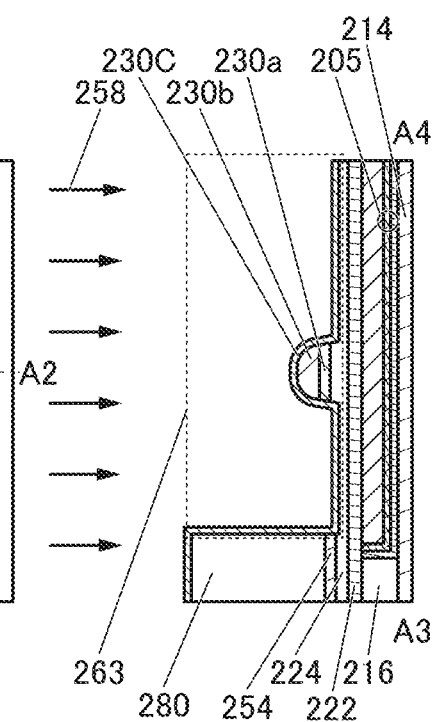
Figure 35B:
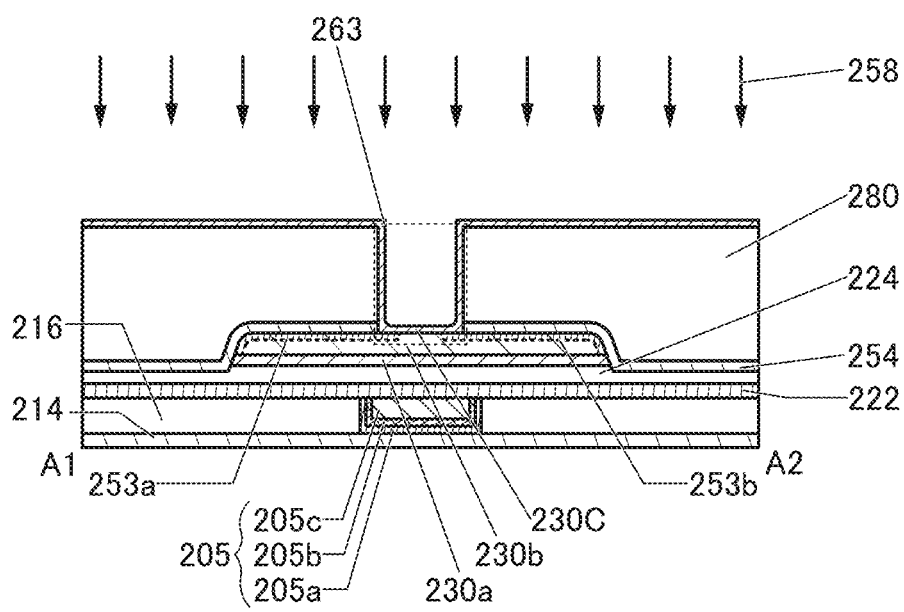
Figure 36A:
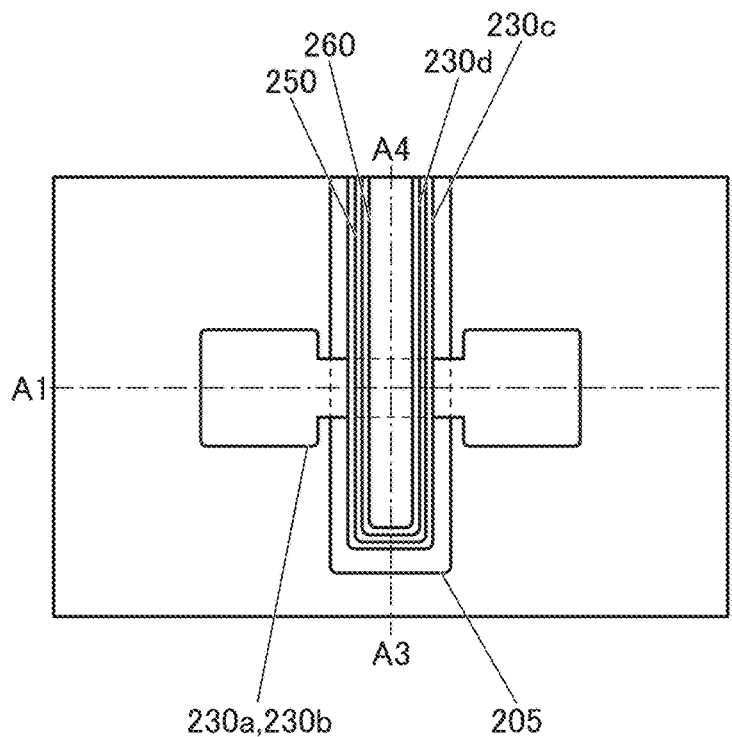
FIGS. 36A-36C A top view and cross-sectional views illustrating a method for manufacturing a semiconductor device of one embodiment of the present invention.
Figure 36C:
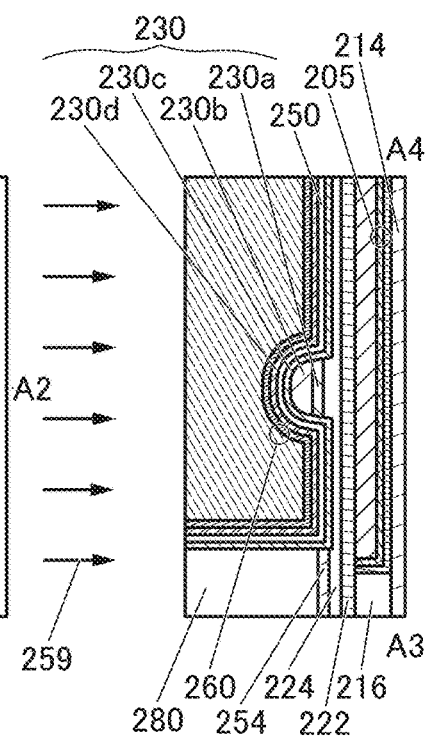
Figure 36B:
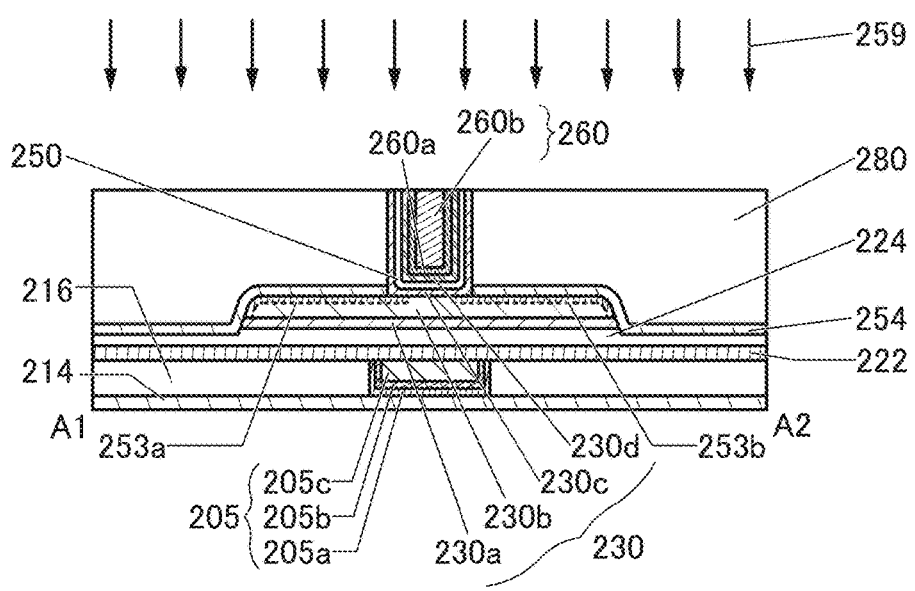
Figure 37A:
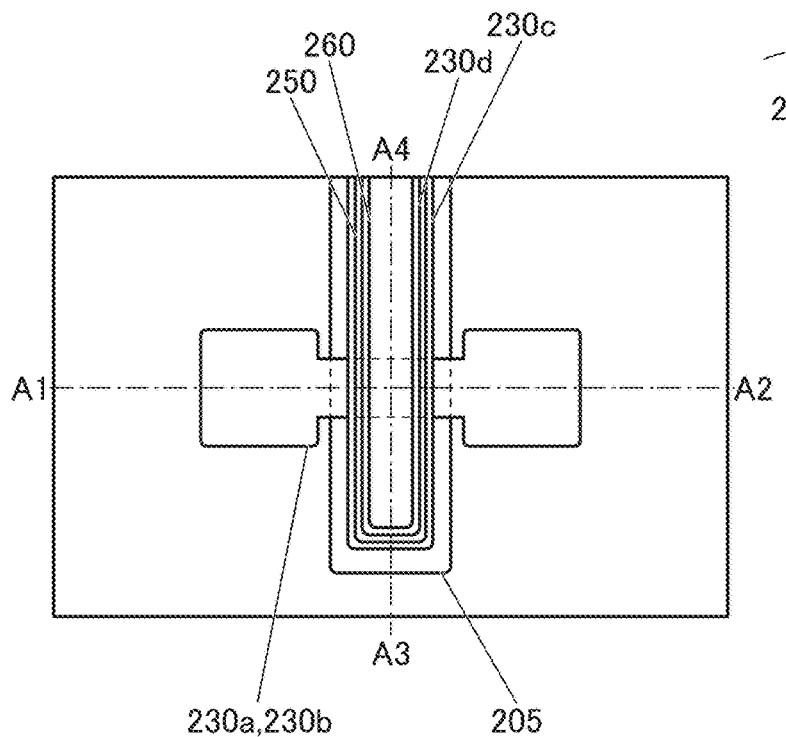
FIGS. 37A-37C A top view and cross-sectional views illustrating a method for manufacturing a semiconductor device of one embodiment of the present invention.
Figure 37C:
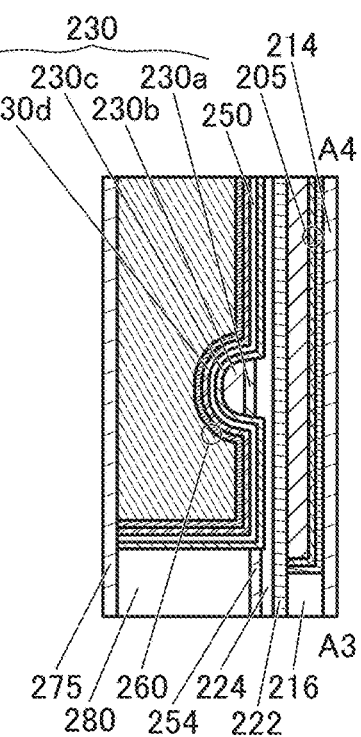
Figure 37B:
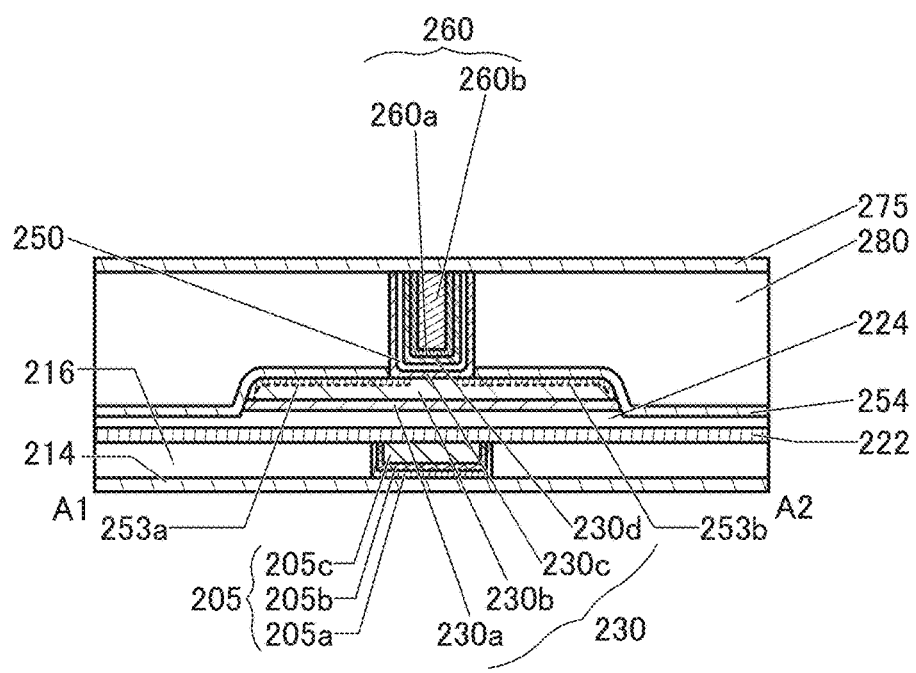

In FIG. 35 to FIG. 37, (A) in each drawing is a top view. Furthermore, (B) in each drawing is a cross-sectional view of a portion indicated by the dashed-dotted line A1-A2 in (A), and is a cross-sectional view in the channel length direction of the transistor 200A. Moreover, (C) in each drawing is a cross-sectional view of a portion indicated by the dashed-dotted line A3-A4 in (A), and is a cross-sectional view in the channel width direction of the transistor 200A. Note that for simplification of the drawing, some components are not illustrated in the top view of (A) in each drawing.

The steps up to the formation of the opening 263 are similar to those in the manufacturing method described in <Method 2-1 for manufacturing semiconductor device>. Thus, the method for manufacturing the semiconductor device in FIG. 27 to FIG. 32 can be referred to.

Next, the oxide film 230C is formed to fill the opening 263. Then, the dopant 258 is added to the oxide film 230C (see FIG. 35). The dopant 258 is preferably oxygen. Addition of oxygen to the oxide film 230C can reduce oxygen vacancies in the oxide 230a, the oxide 230b, and the oxide 230c. The description of the dopant 257 can be referred to for a method for adding the dopant 258; thus, the detailed description is omitted.

Next, the insulating layer to be the insulator 250, the oxide film to be the oxide 230d, and the conductive film to be the conductor 260 (the conductor 260a and the conductor 260b) are formed over the oxide film 230C.

Next, the oxide film 230C, the insulating layer to be the insulator 250, the oxide film to be the oxide 230d, and the conductive film to be the conductor 260 are polished by CMP treatment until the insulator 280 is exposed, whereby the oxide 230c, the insulator 250, the oxide 230d, and the conductor 260 (the conductor 260a and the conductor 260b) are formed. Then, the dopant 259 is added to the insulator 280 (see FIG. 36). The dopant 259 is preferably oxygen. When oxygen is added to the insulator 280, oxygen can be supplied to the oxide 230a, the oxide 230b, and the oxide 230c through the insulator 280 and thus oxygen vacancies in the oxide 230a, the oxide 230b, and the oxide 230c can be reduced. The description of the dopant 257 can be referred to for the method for adding the dopant 259; thus, the detailed description is omitted.

Next, the insulating film 275 is formed over the insulator 280 (see FIG. 37). The insulating film 275 can be formed by a sputtering method, a CVD method, an MBE method, a PLD method, an ALD method, or the like. An aluminum oxide film is preferably formed as the insulating film 275 by a sputtering method, for example. When an aluminum oxide film is formed by a sputtering method, hydrogen contained in the insulator 280 can be inhibited from diffusing into the oxide 230 in some cases.

Next, heat treatment may be performed. The heat treatment is performed at 100° C. or higher and 400° C. or lower, and is performed at 350° C. for four hours, for example. Through the heat treatment, oxygen contained in the insulating film 275 is supplied to the insulator 280 and oxygen can be supplied to the oxide 230a, the oxide 230b, and the oxide 230c through the insulator 280, so that oxygen vacancies in the oxide 230a, the oxide 230b, and the oxide 230c can be reduced. In addition, the moisture concentration and hydrogen concentration in the insulator 280 can be reduced.

Next, the insulating film 275 is removed by CMP treatment to expose the insulator 280, the oxide 230c, the insulator 250, the oxide 230d, the conductor 260a, and the conductor 260b.

Next, the insulating film to be the insulator 274 is formed over the insulator 280. An insulator to be the insulator 281 may be formed over the insulator 274 (see FIG. 34).

Next, openings reaching the layer 253a and the layer 253b are formed in the insulator 254, the insulator 244, the insulator 280, the insulator 274, and the insulator 281.

Next, the insulating film to be the insulator 241 is formed and the insulating film is subjected to anisotropic etching, so that the insulator 241 is formed.

Next, the conductive film to be the conductor 240a and the conductor 240b is formed. Then, CMP treatment is performed to remove part of the conductive film to be the conductor 240a and the conductor 240b, so that the insulator 281 is exposed. As a result, the conductive film remains only in the openings, so that the conductor 240a and the conductor 240b having flat top surfaces can be formed (see FIG. 9).

Through the above process, the semiconductor device including the transistor 200A illustrated in FIG. 9 can be manufactured. As illustrated in FIG. 35 to FIG. 37, with the use of the method for manufacturing the semiconductor device described in this embodiment, the transistor 200A can be manufactured.

<Method 3-1 for Manufacturing Semiconductor Device>

A method for manufacturing a semiconductor device including the transistor 200B of one embodiment of the present invention, which is illustrated in FIG. 13, will be described with reference to FIG. 38 to FIG. 46.

In FIG. 38 to FIG. 46, (A) in each drawing is a top view. Furthermore, (B) in each drawing is a cross-sectional view of a portion indicated by the dashed-dotted line A1-A2 in (A), and is a cross-sectional view in the channel length direction of the transistor 200B. Moreover, (C) in each drawing is a cross-sectional view of a portion indicated by the dashed-dotted line A3-A4 in (A), and is a cross-sectional view in the channel width direction of the transistor 200B. Note that for simplification of the drawing, some components are not illustrated in the top view of (A) in each drawing.

Figure 38A:
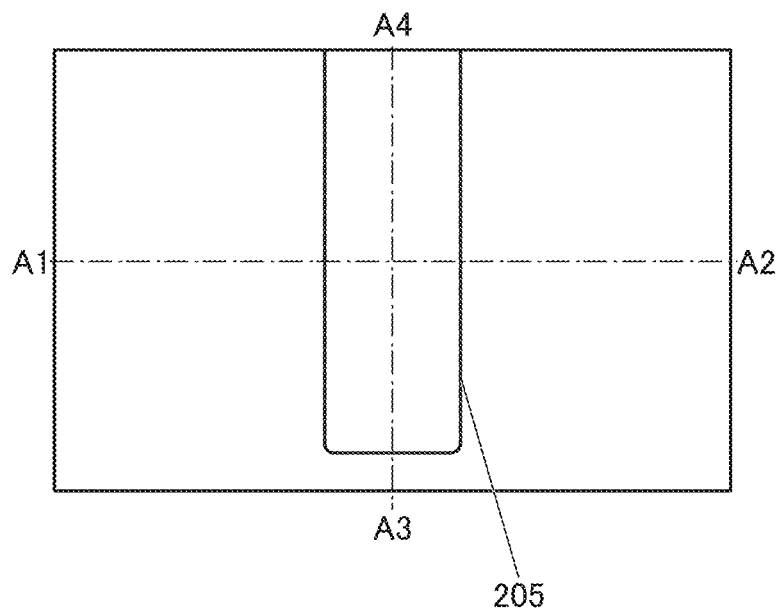
FIGS. 38A-38C A top view and cross-sectional views illustrating a method for manufacturing a semiconductor device of one embodiment of the present invention.
Figure 38C:
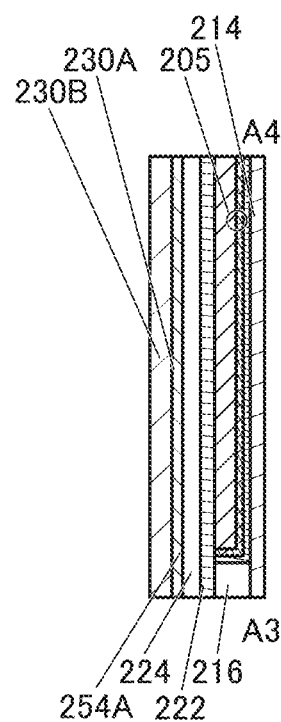
Figure 38B:
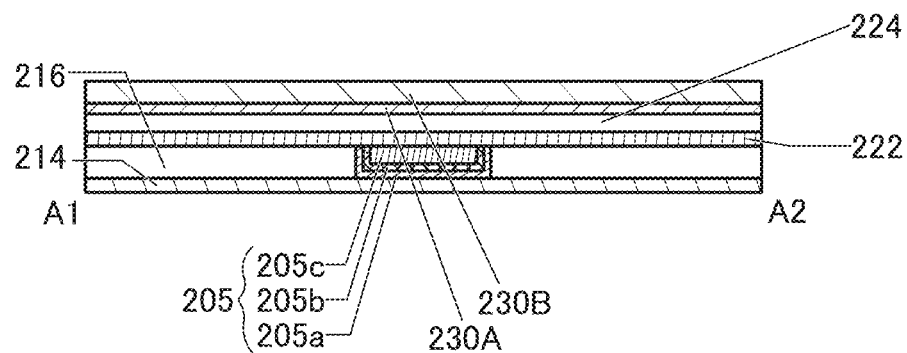

The steps up to the formation of the oxide film 230B are similar to those in the manufacturing method described in <Method 1-1 for manufacturing semiconductor device> (see FIG. 38). Thus, the description of <Method 1-1 for manufacturing semiconductor device> can be referred to, and the detailed description is omitted.

Next, heat treatment may be performed. Through the heat treatment, impurities such as water and hydrogen in the oxide film 230A and the oxide film 230B can be removed, for example.

Next, the oxide film 230A and the oxide film 230B are processed into island shapes to form the oxide 230a and the oxide 230b. Note that in this step, the thickness of the insulator 224 in a region that does not overlap with the oxide 230a is reduced in some cases (see FIG. 39).

Note that the oxide film 230A and the oxide film 230B are processed by a lithography method. In addition, a dry etching method or a wet etching method can be used for the processing.

Processing by a dry etching method is suitable for microfabrication.

Cleaning is performed to remove impurities or the like in the processing of the oxide film 230A and the oxide film 230B. Examples of the cleaning method include wet cleaning using a cleaning solution or the like, plasma treatment using plasma, and cleaning by heat treatment, and any of these cleanings may be performed in appropriate combination.

Then, heat treatment may be performed. As the conditions for the heat treatment, the conditions for the above heat treatment can be used. Alternatively, heat treatment is preferably performed before the formation of the insulating film 254A. The heat treatment is performed at higher than or equal to 100° C. and lower than or equal to 400° C., and is performed at 200° C., for example. Alternatively, the heat treatment is preferably performed at the same temperature as the deposition temperature of the insulating film 254A.

Next, the insulating film 254A is formed to cover the oxide 230a and the oxide 230b (see FIG. 39). The insulating film 254A can be formed by a sputtering method, a CVD method, an MBE method, a PLD method, an ALD method, or the like.

As the insulating film 254A, an insulating film having a function of inhibiting diffusion of oxygen and impurities such as hydrogen is preferably used. For example, an aluminum oxide film is preferably formed by a sputtering method. When an aluminum oxide film is formed by a sputtering method using a gas containing oxygen, oxygen can be injected into the insulator 224. That is, the insulator 224 can contain excess oxygen. Alternatively, for the insulating film 254A, hafnium oxide, an oxide containing aluminum and hafnium (hafnium aluminate), an insulator containing aluminum nitride, aluminum titanium nitride, titanium nitride, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used.

Alternatively, aluminum oxide may be formed for the insulating film 254A while the substrate is heated at high temperatures. The substrate heating temperature during the formation of the insulating film 254A is higher than or equal to 200° C., preferably higher than or equal to 250° C., further preferably higher than or equal to 350° C.

The insulating film 254A may have a stacked-layer structure.

Next, the dummy gate film to be the dummy gate layer 262A is formed over the insulating film 254A.

The dummy gate film to be the dummy gate layer 262A can be formed by a sputtering method, a CVD method, an MBE method, a PLD method, an ALD method, or the like. For example, an insulator, a semiconductor, or a conductor can be used. Specifically, silicon such as polysilicon, microcrystalline silicon, or amorphous silicon, or a metal film of aluminum, titanium, tungsten, or the like is used, for example. Alternatively, a film containing carbon, SOG (Spin On Glass), a resin film, or the like may be formed by a coating method.

In addition, the dummy gate film to be the dummy gate layer 262A can be a multilayer film using different kinds of films.

Next, the dummy gate film to be the dummy gate layer 262A is etched by a lithography method, so that the dummy gate layer 262A is formed (see FIG. 39). The dummy gate layer 262A is formed to at least partly overlap with the conductor 205 and the oxide 230.

Figure 40A:
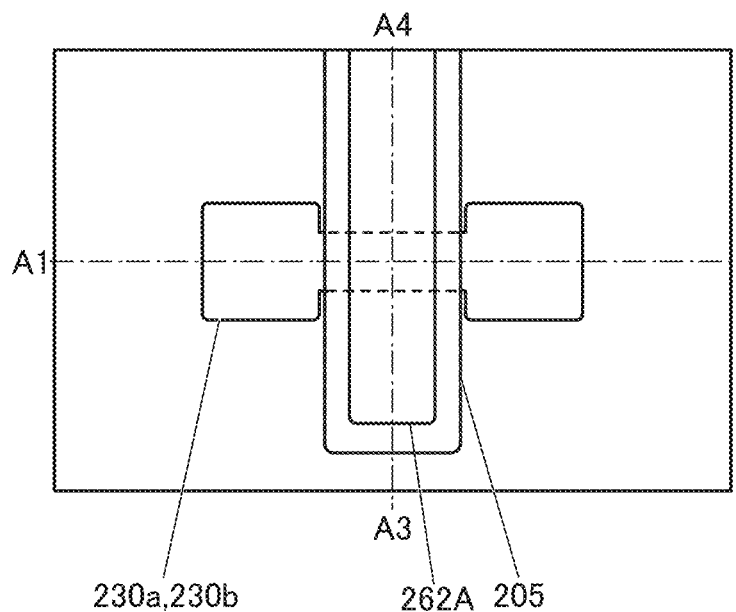
FIGS. 40A-40C A top view and cross-sectional views illustrating a method for manufacturing a semiconductor device of one embodiment of the present invention.
Figure 40C:
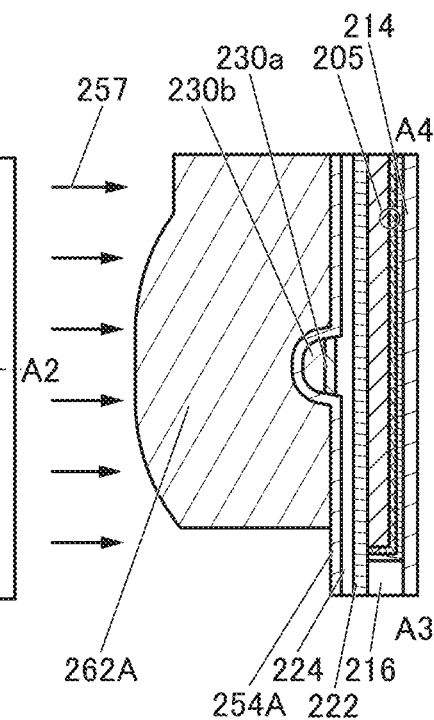
Figure 40B:
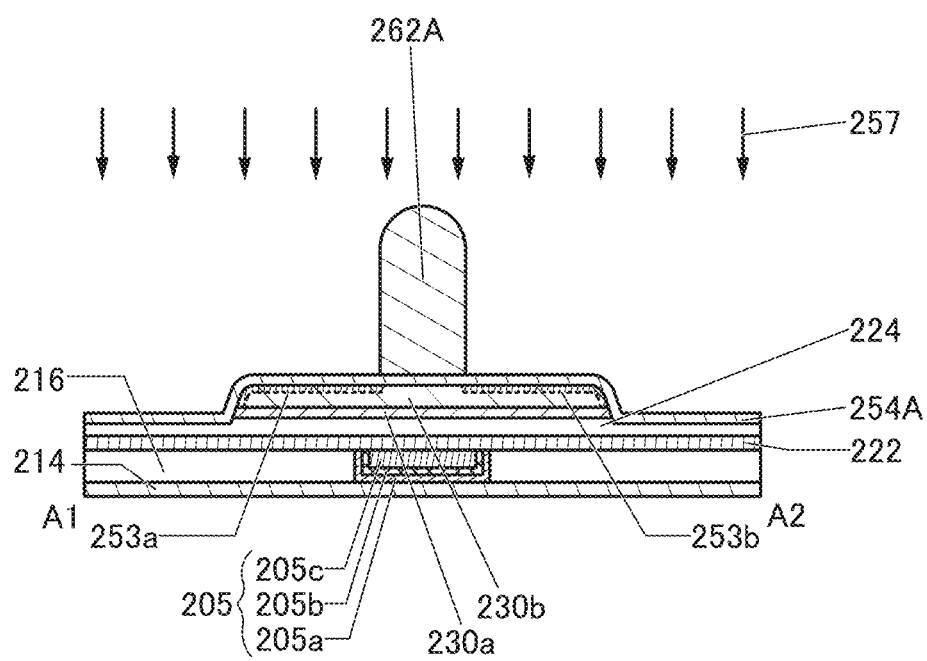

Next, the dopant 257 is added to the oxide 230b with the use of the dummy gate layer 262A as a mask (see FIG. 40). Accordingly, the layer 253a and the layer 253b including the dopant 257 are formed in regions of the oxide 230b that do not overlap with the dummy gate layer 262A. Note that FIG. 40 shows a situation where the dopant 257 is diffused into and added to a region of the oxide 230b that overlaps with the dummy gate layer 262A. Thus, parts of the layer 253a and the layer 253b are also formed in regions overlapping with the dummy gate layer 262A. In this manner, the distance between the layer 253a and the layer 253b, i.e., the channel length, can be controlled by the length of the dummy gate layer 262A in the channel length direction.

The description of <Method 2-1 for manufacturing semiconductor device> can be referred to for the method for adding the dopant 257 and an element that can be used as the dopant 257; thus, the detailed description is omitted.

Although the dopant 257 is added substantially perpendicular to the top surface of the insulator 214 in FIG. 40, one embodiment of the present invention is not limited thereto. The dopant 257 may be added obliquely to the top surface of the insulator 214. The addition of the dopant obliquely to the top surface of the insulator 214 facilitates the formation of the layer 253a and the layer 253b in part of a region overlapping with the dummy gate layer 262A.

In the manufacturing method in this embodiment, the dopant 257 is added to the oxide 230 through the insulating film 254A. With this manufacturing method, the dopant 257 is also added to the insulating film 254A. In other words, both the oxide 230 and the insulating film 254A include the element contained in the dopant 257. In the case where the insulating film 254A contains excess oxygen, the dopant 257 can inhibit diffusion of excess oxygen to the outside in some cases.

The layer 253 is formed as described above, so that the conductor 260 formed in a later step can be positioned between the layer 253a and the layer 253b in a self-aligned manner.

Next, an insulating film 279A is formed over the insulating film 254A and the dummy gate layer 262A (see FIG. 41). The insulating film 279A can be formed by a sputtering method, a CVD method, an MBE method, a PLD method, an ALD method, or the like.

Figure 42A:
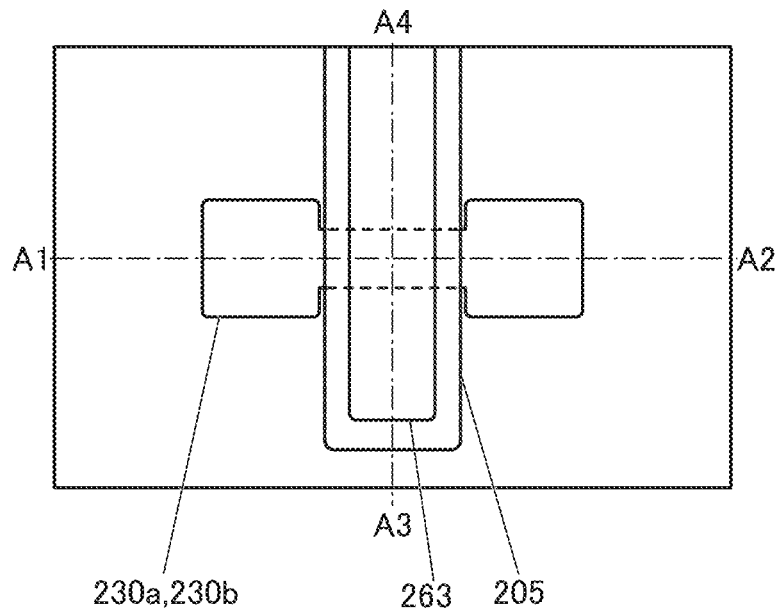
FIGS. 42A-42C A top view and cross-sectional views illustrating a method for manufacturing a semiconductor device of one embodiment of the present invention.
Figure 42C:
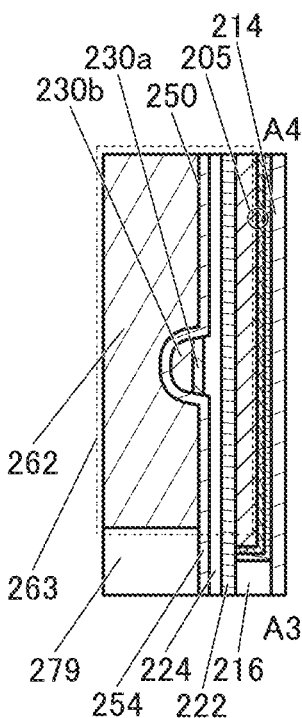

Next, the insulating film 279A and the dummy gate layer 262A are partly removed until part of the dummy gate layer 262A is exposed, so that an insulator 279 and the dummy gate 262 are formed (see FIG. 42). CMP treatment is preferably used to form the insulator 279 and the dummy gate 262.

Figure 42B:
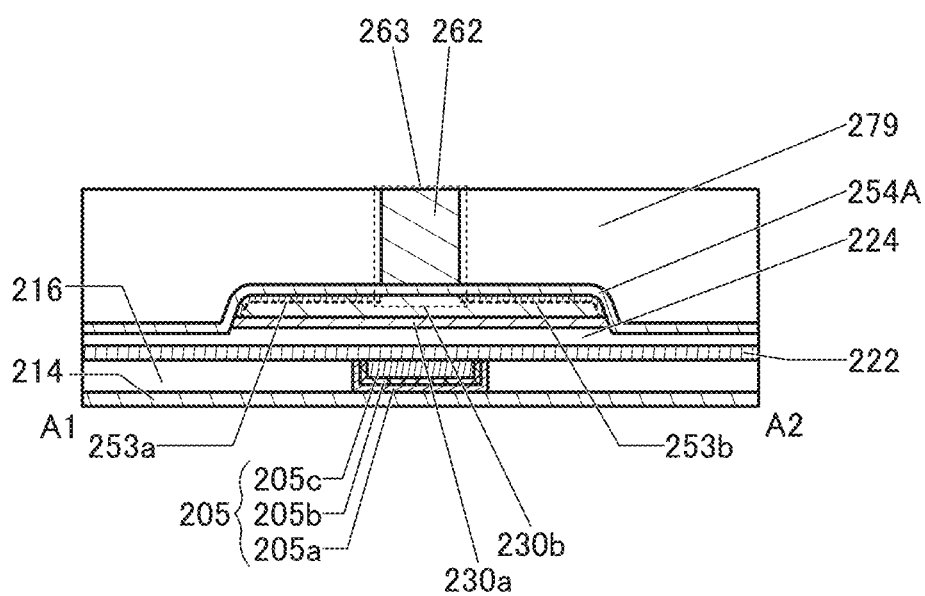

As described above, when the dummy gate layer 262A has a two-layer structure of a conductive film and a resin film formed over the conductive film, for example, the conductive film sometimes functions as a stopper film for CMP treatment in a CMP process. Alternatively, the end point of the CMP treatment can be detected with the conductive film in some cases, so that variations in the height of the dummy gate 262 can be reduced in some cases. As illustrated in FIG. 42(B), the top surface of the dummy gate 262 is substantially aligned with the top surface of the insulator 279.

Figure 43A:
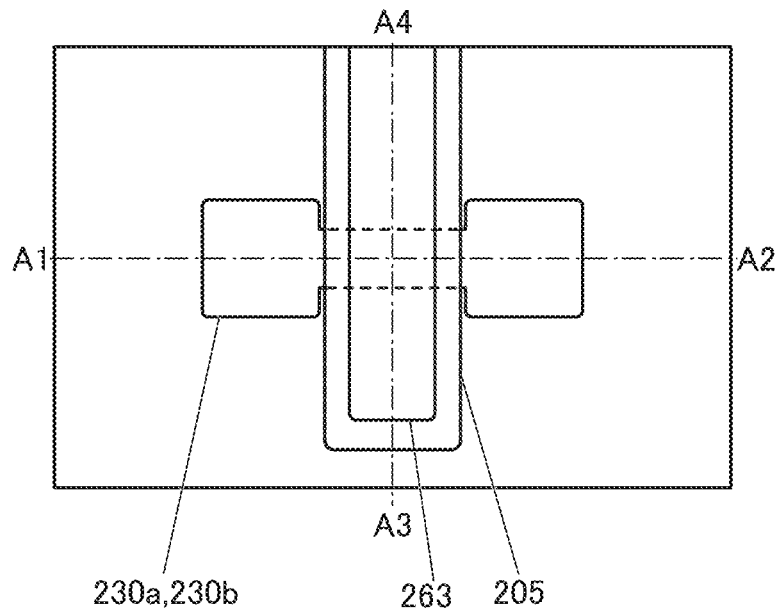
FIGS. 43A-43C A top view and cross-sectional views illustrating a method for manufacturing a semiconductor device of one embodiment of the present invention.
Figure 43C:
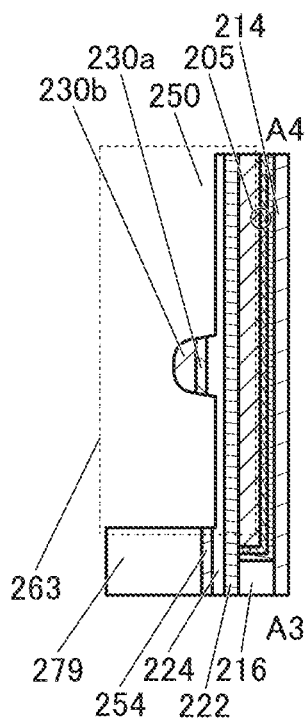
Figure 43B:
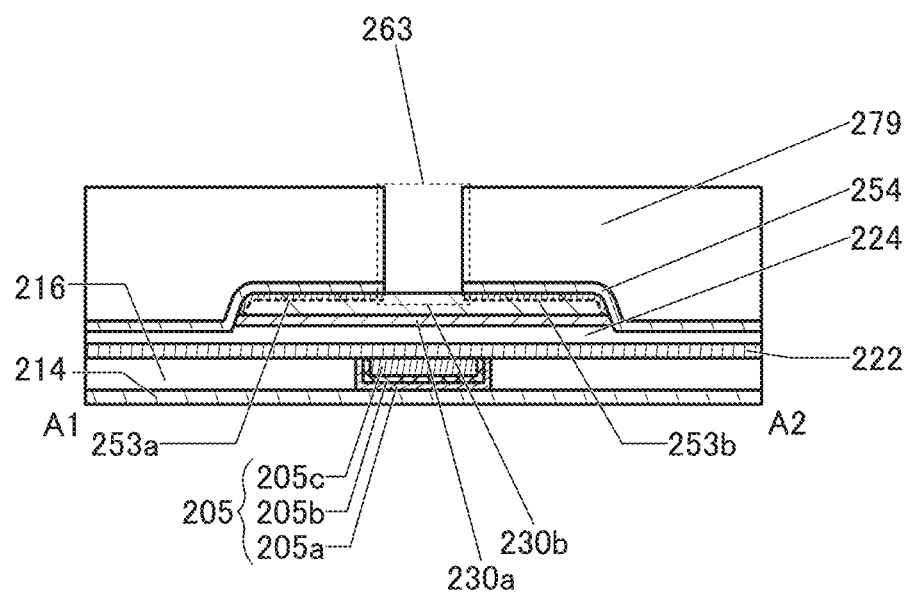
Figure 45A:
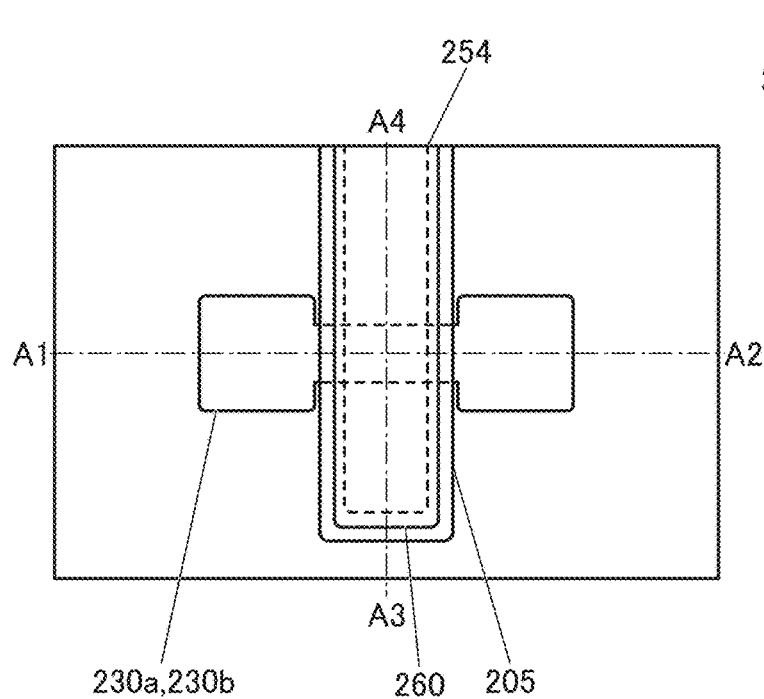
FIGS. 45A-45C A top view and cross-sectional views illustrating a method for manufacturing a semiconductor device of one embodiment of the present invention.
Figure 45C:
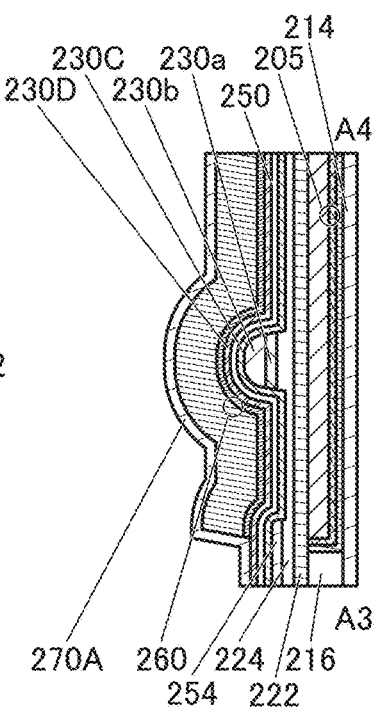
Figure 45B:
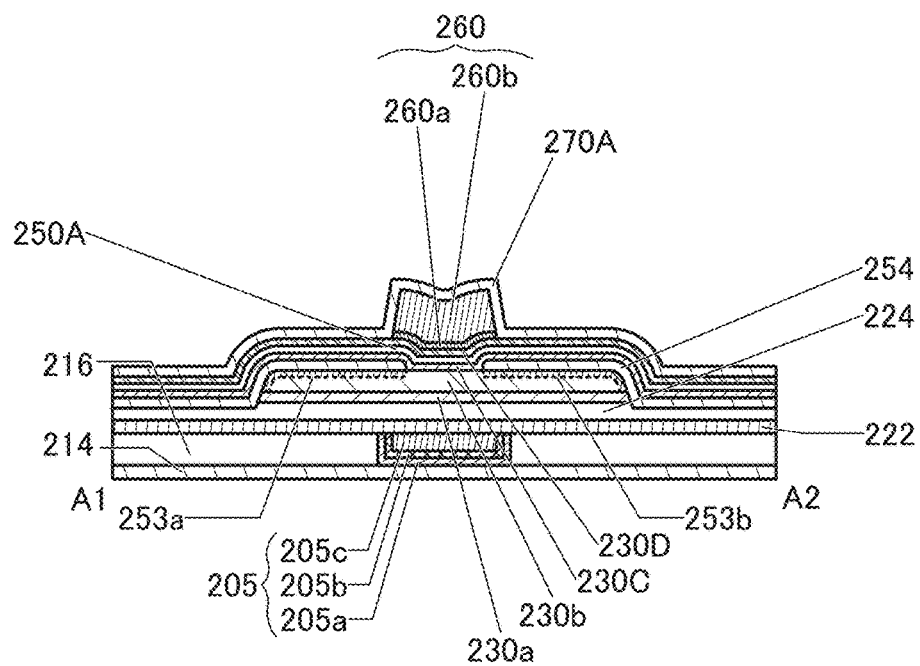

Next, the dummy gate 262 and part of the insulating film 254A overlapping with the dummy gate 262 are removed to form the opening 263 (see FIG. 43). The dummy gate 262 and the insulating film 254A can be removed by wet etching, dry etching, ashing, or the like. Alternatively, a plurality of the above treatments may be performed in appropriate combination. For example, wet etching treatment is performed after ashing treatment. By removal of part of the insulating film 254A, the insulator 254 is formed. By removal of the dummy gate 262 and the insulating film 254A, part of the surface of the oxide 230b is exposed through the opening 263.

Next, the insulator 279 is removed. The insulator 279 can be removed by wet etching, dry etching, or the like.

Next, heat treatment is preferably performed before the formation of the oxide film 230C. The heat treatment is performed at higher than or equal to 100° C. and lower than or equal to 400° C., and is performed at 200° C., for example. Alternatively, the heat treatment is preferably performed at the same temperature as the deposition temperature of the oxide film 230C. Here, the deposition temperature is not limited to the substrate temperature during the deposition, and includes the set temperature of the deposition apparatus. For example, in the case where the oxide film 230C is formed at 300° C., the heat treatment is preferably performed at 300° C. The heat treatment is preferably performed under reduced pressure, and for example, may be performed in a vacuum atmosphere. A vacuum atmosphere is kept by evacuation with a turbomolecular pump or the like. The pressure in a vacuum atmosphere of the treatment chamber is lower than or equal to $1\times10^{-2}$ Pa, preferably lower than or equal to $1\times10^{-3}$ Pa.

Next, the oxide film 230C is formed over the insulator 254 and the oxide 230b. In addition, the oxide film 230C is preferably formed successively without being exposed to the air after the above heat treatment. For example, it is preferable that the heat treatment and the deposition treatment be successively performed in different chambers by using a multi-chamber type deposition apparatus or the like.

The oxide film 230C can be formed by a sputtering method, a CVD method, an MBE method, a PLD method, an ALD method, or the like. The oxide film 230C to be the oxide 230c is formed by a deposition method similar to that for the oxide film 230A or the oxide film 230B in accordance with characteristics required for the oxide 230c. An In—Ga—Zn oxide or an oxide that does not contain In can be used for the oxide film 230C. As the oxide that does not contain In, a Ga—Zn oxide, gallium oxide, or the like can be used. For the oxide film 230C, a stacked-layer structure of an In—Ga—Zn oxide and an oxide that does not contain In may be used.

The oxide film 230C may have a stacked-layer structure of a first oxide film and a second oxide film over the first oxide film. The first oxide film may be formed using a target similar to the target used for forming the oxide film 230B, and the second oxide film may be formed using a target similar to the target used for forming the oxide film 230A.

The oxide film 230C is preferably formed while the substrate is heated. In that case, the substrate temperature is set to higher than or equal to 300° C., so that oxygen vacancies in the oxide 230a, the oxide 230b, and the oxide film 230C can be reduced. For example, the oxide film 230C may be formed at the same temperature as the deposition temperature of the insulating film 250A described later. Furthermore, the oxide film 230C is formed while the substrate is heated in this manner, whereby the crystallinity of the oxide 230a, the oxide 230b, and the oxide film 230C can be improved.

In particular, at the time of forming the oxide film 230C, part of oxygen contained in the sputtering gas is supplied to the oxide 230a and the oxide 230b in some cases. Therefore, the proportion of oxygen contained in the sputtering gas for the oxide film 230C is higher than or equal to 70%, preferably higher than or equal to 80%, further preferably 100%. In addition, when the oxide film is formed while the substrate is heated, the crystallinity of the oxide film can be improved.

Next, heat treatment is preferably performed before the formation of the insulating film 250A. The heat treatment is performed at higher than or equal to 100° C. and lower than or equal to 400° C., and is performed at 200° C., for example. Alternatively, the heat treatment is preferably performed at the same temperature as the deposition temperature of the insulating film 250A. Here, the deposition temperature is not limited to the substrate temperature during the deposition, and includes the set temperature of the deposition apparatus. For example, in the case where the insulating film 250A is formed at 350° C., the heat treatment is preferably performed at 350° C. The heat treatment is preferably performed under reduced pressure, and for example, may be performed in a vacuum atmosphere. A vacuum atmosphere is kept by evacuation with a turbomolecular pump or the like. The pressure in a vacuum atmosphere of the treatment chamber is lower than or equal to $1\times10^{-2}$ Pa, preferably lower than or equal to $1\times10^{-3}$ Pa.

Next, the insulating film 250A is formed. The insulating film 250A can be formed by a sputtering method, a CVD method, an MBE method, a PLD method, an ALD method, or the like. For the insulating film 250A, silicon oxide, hafnium oxide, gallium oxide, or the like is preferably formed by an ALD method. For example, a stacked-layer film of silicon oxide and gallium oxide over the silicon oxide is used as the insulating film 250A. Note that the deposition temperature at the time of forming the insulating film 250A is preferably higher than or equal to 300° C. and lower than 450° C., further preferably higher than or equal to 300° C. and lower than 400° C., particularly preferably approximately 350° C. For example, when the insulating film 250A is formed at 350° C., an insulator having few impurities can be formed.

Note that oxygen is excited by microwaves to generate high-density oxygen plasma, and the insulating film 250A is exposed to the oxygen plasma, so that oxygen can be introduced into the insulating film 250A.

Furthermore, heat treatment may be performed. For the heat treatment, the conditions for the above heat treatment can be used. The heat treatment can reduce the moisture concentration and hydrogen concentration in the insulating film 250A.

Next, the oxide film 230D is formed. In addition, after the above heat treatment, the formation of the oxide film 230D is preferably performed successively without exposure to the air. For example, it is preferable that the heat treatment and the deposition treatment be successively performed in different chambers by using a multi-chamber deposition apparatus or the like.

The description of the oxide film 230C can be referred to for the formation of the oxide film 230D; thus, the detailed description is omitted. The oxide film 230D may be formed using a target similar to the target used for forming the oxide film 230C.

The oxide film 230D is preferably formed while the substrate is heated. In that case, the substrate temperature is set to higher than or equal to 300° C., so that oxygen vacancies in the oxide 230a, the oxide 230b, the oxide film 230C, and the oxide film 230D can be reduced. When the oxide film is formed while the substrate is heated, the crystallinity of the oxide 230a, the oxide 230b, the oxide film 230C, and the oxide film 230D can be improved.

In particular, at the time of forming the oxide film 230D, part of oxygen contained in the sputtering gas is supplied to the oxide 230a, the oxide 230b, and the oxide film 230C through the insulating film 250A in some cases. Therefore, the proportion of oxygen contained in the sputtering gas for the oxide film 230D is higher than or equal to 70%, preferably higher than or equal to 80%, further preferably 100%. In addition, when the oxide film is formed while the substrate is heated, the crystallinity of the oxide film can be improved.

Next, the conductive film 260A and the conductive film 260B are formed. The conductive film 260A and the conductive film 260B can be formed by a sputtering method, a CVD method, an MBE method, a PLD method, an ALD method, or the like. A CVD method is preferably used, for example. In this embodiment, the conductive film 260A is formed by an ALD method, and the conductive film 260B is formed by a CVD method (see FIG. 44).

Next, the conductive film 260A and the conductive film 260B are processed to form the conductor 260 (the conductor 260a and the conductor 260b).

Next, an insulating film 270A to be the insulator 270 is formed to cover the conductor 260 and the oxide film 230D. An insulating film having a function of inhibiting diffusion of oxygen and impurities such as hydrogen, like a material used for the insulator 254, is preferably used as the insulating film 270A. As the insulating film 270A, for example, aluminum oxide is preferably formed by an ALD method. Alternatively, as the insulating film 270A, aluminum oxide may be formed by a sputtering method (see FIG. 45).

Figure 46A:
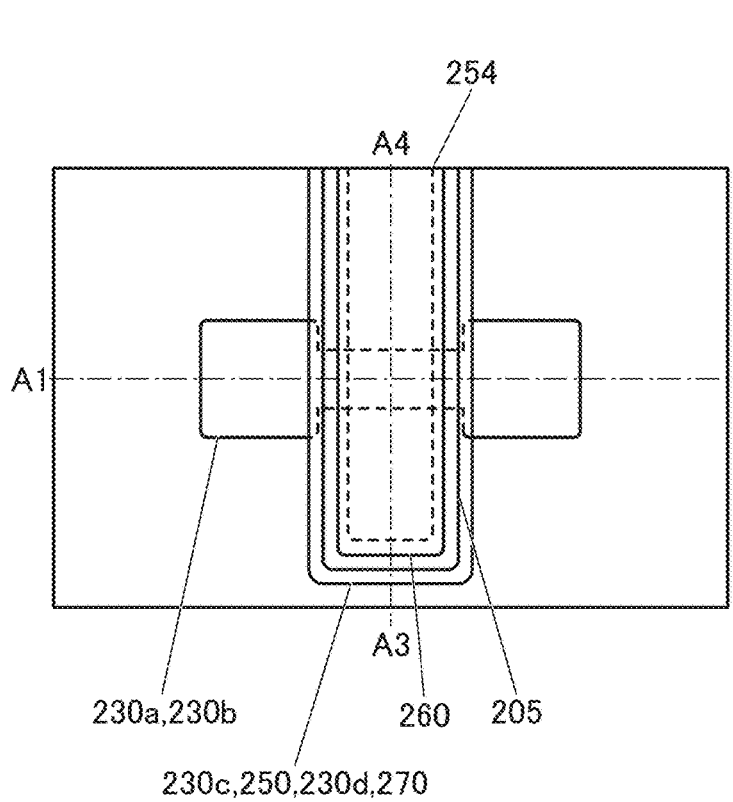
FIGS. 46A-46C A top view and cross-sectional views illustrating a method for manufacturing a semiconductor device of one embodiment of the present invention.
Figure 46C:
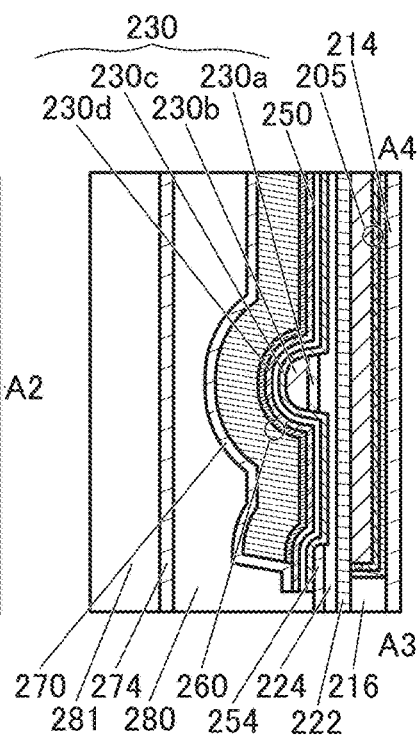
Figure 46B:
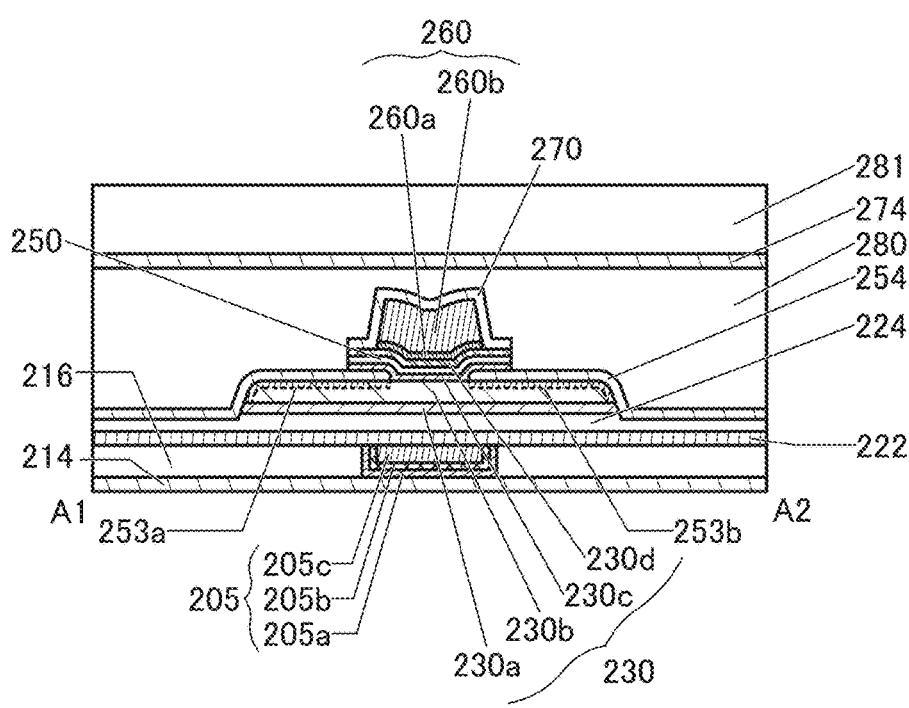

Next, the insulator 270, the oxide film 230D, the insulating film 250A, and the oxide film 230C are processed to form the insulator 270, the oxide 230d, the insulator 250, and the oxide 230c (see FIG. 46). The processing of the insulating film 250A and the oxide film 230C and the processing of the conductive film 260A and the conductive film 260B may be successively performed. In that case, a side end portion of the conductor 260, a side end portion of the insulator 250, and a side end portion of the oxide 230c are positioned on the same plane in some cases. Alternatively, a mask may be separately provided after the processing of the conductive film 260A and the conductive film 260B, and the insulator 270, the oxide film 230D, the insulating film 250A, and the oxide film 230C may be processed such that the insulator 270, the oxide 230d, the insulator 250, and the oxide 230c cover the conductor 260 as in the top view in FIG. 46(A).

Next, heat treatment may be performed. For the heat treatment, the conditions for the above heat treatment can be used. The heat treatment can reduce the moisture concentration and hydrogen concentration in the insulator 280. Alternatively, heat treatment is preferably performed before the formation of the insulating film to be the insulator 274. The heat treatment is performed at higher than or equal to 100° C. and lower than or equal to 400° C., and is performed at 200° C., for example. Alternatively, the heat treatment is preferably performed at the same temperature as the deposition temperature of the insulating film. Here, the deposition temperature is not limited to the substrate temperature during the deposition, and includes the set temperature of the deposition apparatus. For example, in the case where the insulating film is formed at 250° C., the heat treatment is preferably performed at 250° C. The heat treatment is preferably performed under reduced pressure, and for example, may be performed in a vacuum atmosphere. A vacuum atmosphere is kept by evacuation with a turbomolecular pump or the like. The pressure in a vacuum atmosphere of the treatment chamber is lower than or equal to $1\times10^{-2}$ Pa, preferably lower than or equal to $1\times10^{-3}$ Pa.

Next, the insulator 280 is formed over the insulator 270. The insulator 280 can be formed by a sputtering method, a CVD method, an MBE method, a PLD method, an ALD method, or the like.

Next, an insulating film to be the insulator 274 is formed over the insulator 280 (see FIG. 46). The insulating film to be the insulator 274 can be formed by a sputtering method, a CVD method, an MBE method, a PLD method, an ALD method, or the like. An aluminum oxide film is preferably formed as the insulating film to be the insulator 274 by a sputtering method, for example. When the aluminum oxide film is formed by a sputtering method, oxygen can be supplied to the insulator 280 at the time of forming the insulator 274 in some cases. In addition, diffusion of oxygen contained in the insulator 280 to the insulator 281 side can be inhibited in some cases. Furthermore, diffusion of hydrogen contained in the insulator 281 to the oxide 230 side can be inhibited in some cases.

Next, heat treatment may be performed. For the heat treatment, the conditions for the above heat treatment can be used. The heat treatment can reduce the moisture concentration and hydrogen concentration in the insulator 280 and the insulator 274.

Next, the insulating film to be the insulator 281 may be formed over the insulator 274. The insulating film to be the insulator 281 can be formed by a sputtering method, a CVD method, an MBE method, a PLD method, an ALD method, or the like (see FIG. 46).

Next, openings reaching the layer 253a and the layer 253b are formed in the insulator 254, the insulator 280, the insulator 274, and the insulator 281. The openings are formed by a lithography method.

Next, the insulating film to be the insulator 241 is formed and the insulating film is subjected to anisotropic etching, so that the insulator 241 is formed. The insulating film can be formed by a sputtering method, a CVD method, an MBE method, a PLD method, an ALD method, or the like. As the insulating film to be the insulator 241, an insulating film having a function of inhibiting the passage of oxygen is preferably used. For example, an aluminum oxide film is preferably formed by an ALD method. Alternatively, a silicon nitride film may be formed by an ALD method or a CVD method. In the case where a silicon nitride film is formed by an ALD method, a precursor containing silicon and halogen or a precursor of aminosilanes can be used. As the precursor containing silicon and halogen, $SiCl_4$, $SiH_2Cl_2$, $Si_2Cl_6$, $Si_3Cl_8$, or the like can be used. As the precursor of aminosilanes, monovalent, divalent, or trivalent aminosilanes can be used. As a nitriding gas, ammonia or hydrazine can be used. For the anisotropic etching, a dry etching method or the like may be employed, for example. When the sidewall portions of the openings have such a structure, the passage of oxygen from the outside can be inhibited and oxidation of the conductor 240a and the conductor 240b to be formed next can be prevented. Furthermore, impurities such as water and hydrogen can be prevented from diffusing from the conductor 240a and the conductor 240b to the outside.

Next, the conductive film to be the conductor 240a and the conductor 240b is formed. The conductive film to be the conductor 240a and the conductor 240b desirably has a stacked-layer structure including a conductor having a function of inhibiting diffusion of impurities such as water and hydrogen. For example, a stacked layer of tantalum nitride, titanium nitride, or the like and tungsten, molybdenum, copper, or the like can be employed. The conductive film to be the conductor 240 can be formed by a sputtering method, a CVD method, an MBE method, a PLD method, an ALD method, or the like.

Next, CMP treatment is performed to remove part of the conductive film to be the conductor 240a and the conductor 240b, so that the insulator 281 is exposed. As a result, the conductive film remains only in the openings, so that the conductor 240a and the conductor 240b having flat top surfaces can be formed (see FIG. 13). Note that the insulator 281 is partly removed by the CMP treatment in some cases.

Through the above process, the semiconductor device including the transistor 200B illustrated in FIG. 13 can be manufactured. As illustrated in FIG. 38 to FIG. 46, with the use of the method for manufacturing the semiconductor device described in this embodiment, the transistor 200B can be manufactured.

<Method 3-2 for Manufacturing Semiconductor Device>

A method for manufacturing the semiconductor device including the transistor 200B of one embodiment of the present invention, which is different from the method described in the above <Method 3-1 for manufacturing semiconductor device>, is described with reference to FIG. 47 to FIG. 49.

Figure 47A:
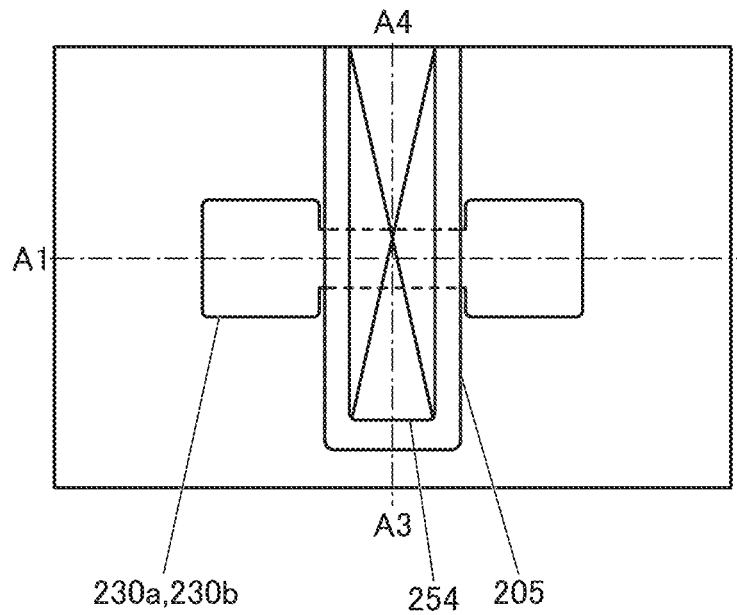
FIGS. 47A-47C A top view and cross-sectional views illustrating a method for manufacturing a semiconductor device of one embodiment of the present invention.
Figure 47C:
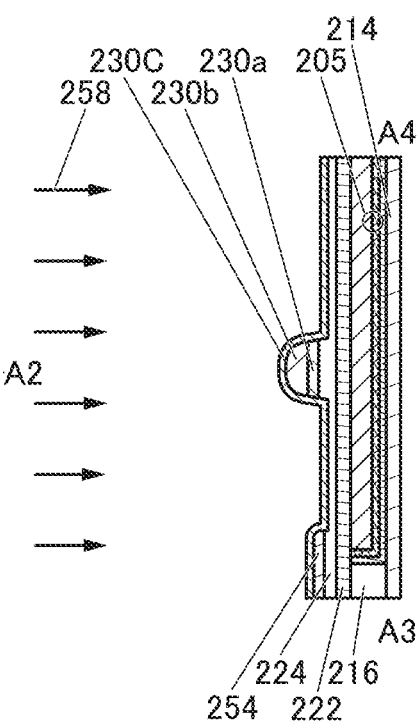
Figure 47B:
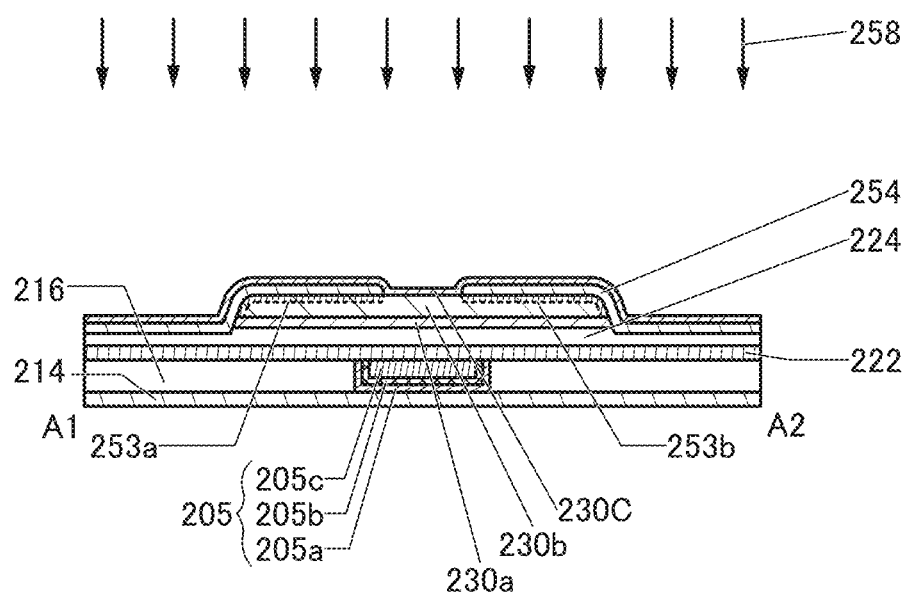
Figure 48A:
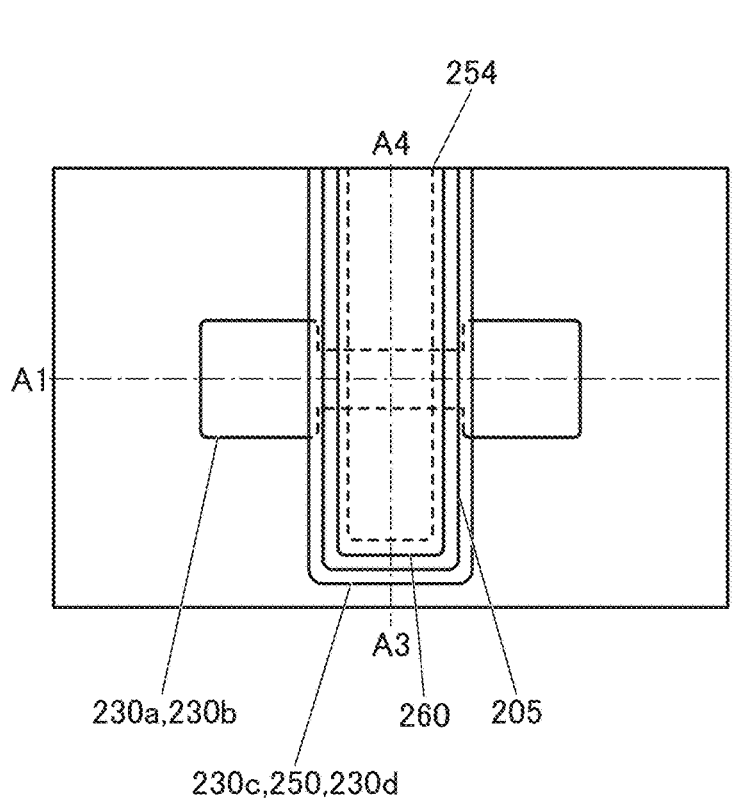
FIGS. 48A-48C A top view and cross-sectional views illustrating a method for manufacturing a semiconductor device of one embodiment of the present invention.
Figure 48C:
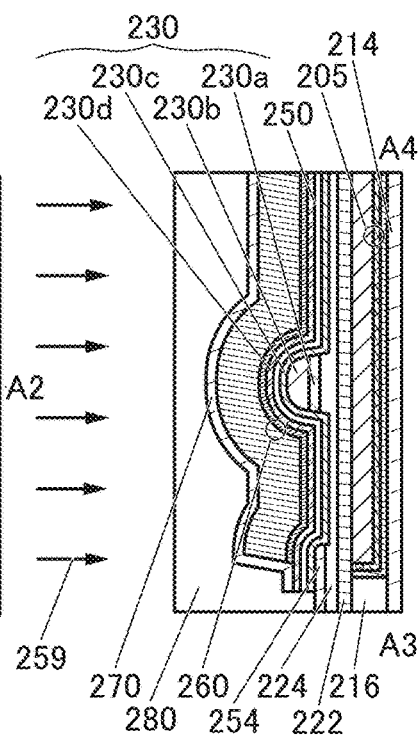
Figure 48B:
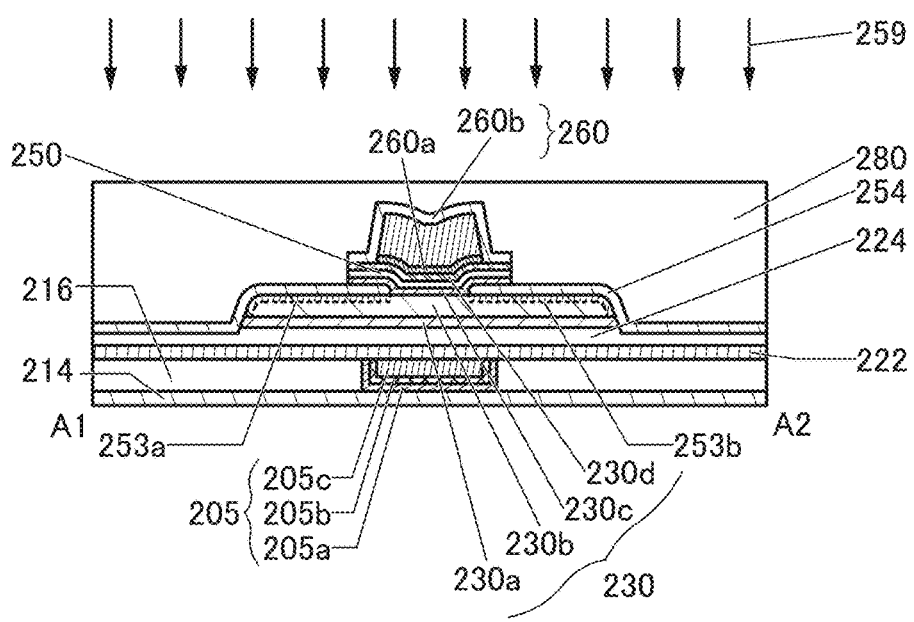
Figure 49A:
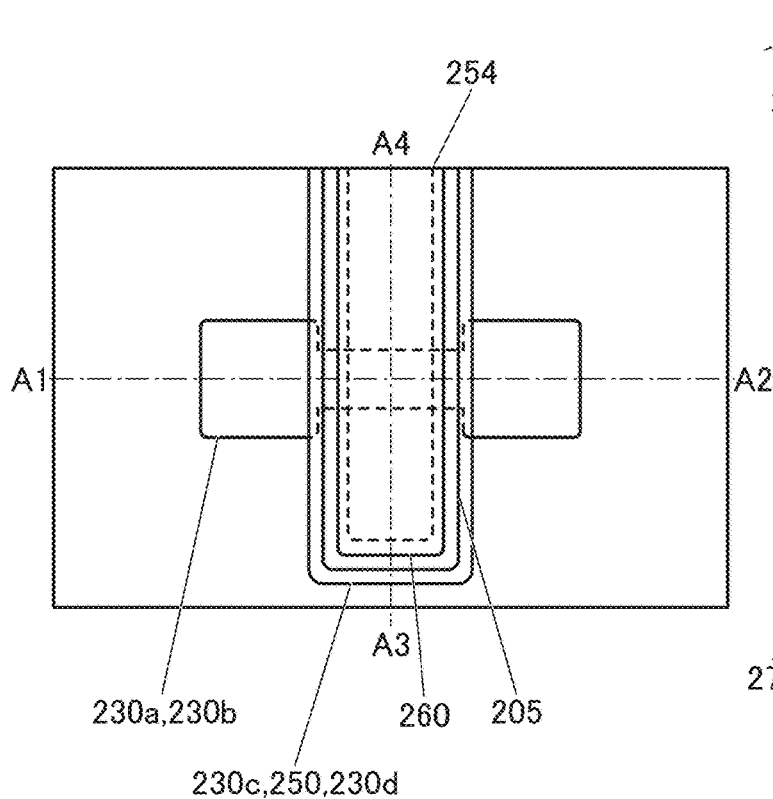
FIGS. 49A-49C A top view and cross-sectional views illustrating a method for manufacturing a semiconductor device of one embodiment of the present invention.
Figure 49C:
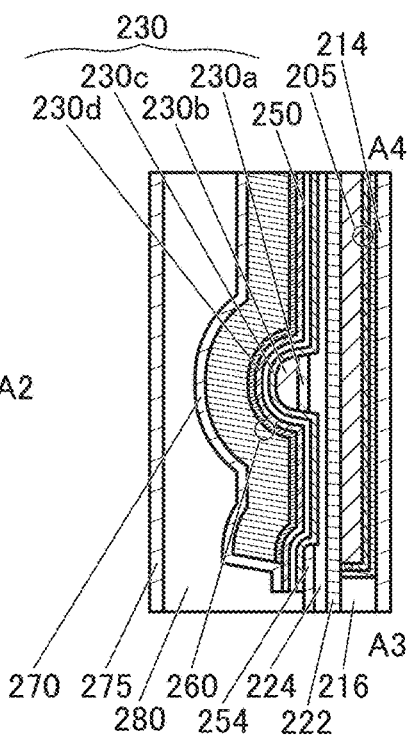
Figure 49B:
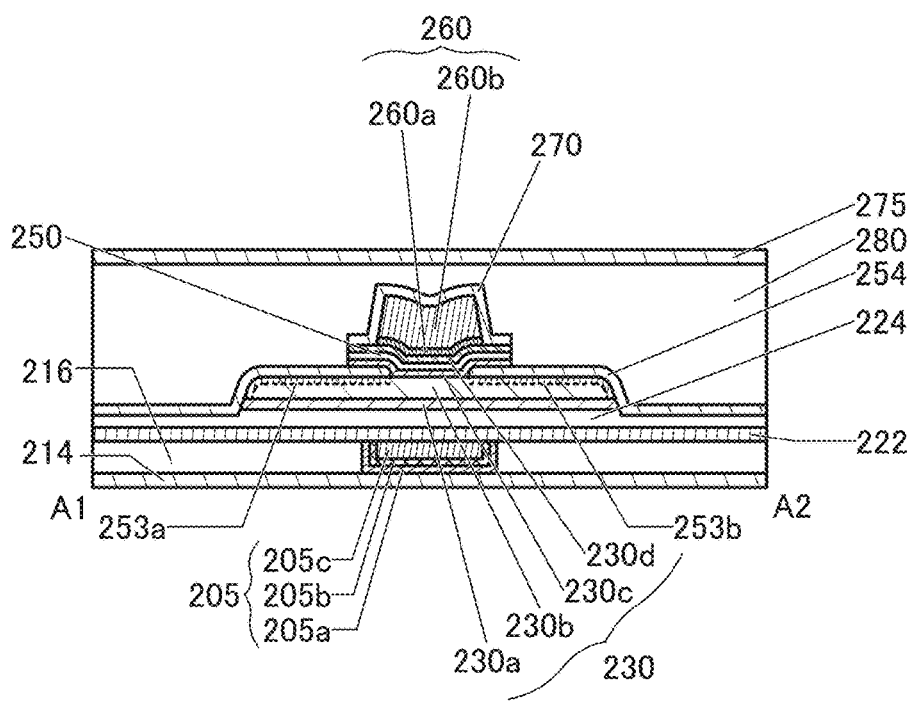

In FIG. 47 to FIG. 49, (A) in each drawing is a top view. Furthermore, (B) in each drawing is a cross-sectional view of a portion indicated by the dashed-dotted line A1-A2 in (A), and is a cross-sectional view in the channel length direction of the transistor 200B. Moreover, (C) in each drawing is a cross-sectional view of a portion indicated by the dashed-dotted line A3-A4 in (A), and is a cross-sectional view in the channel width direction of the transistor 200B. Note that for simplification of the drawing, some components are not illustrated in the top view of (A) in each drawing.

The steps up to the formation of the opening 263 are similar to those in the manufacturing method described in <Method 3-1 for manufacturing semiconductor device>. Thus, the method for manufacturing the semiconductor device in FIG. 38 to FIG. 43 can be referred to.

Next, the insulator 279 is removed. The insulator 279 can be removed by wet etching, dry etching, or the like.

Next, heat treatment is preferably performed before the formation of the oxide film 230C.

Next, the oxide film 230C is formed over the insulator 254 and the oxide film 230b. Then, the dopant 258 is added to the oxide film 230C (see FIG. 47). The dopant 258 is preferably oxygen. Addition of oxygen to the oxide film 230C can reduce oxygen vacancies in the oxide 230a, the oxide 230b, and the oxide 230c. The description of the dopant 257 can be referred to for the method for adding the dopant 258; thus, the detailed description is omitted.

Next, the insulating film 250A, the oxide film 230D, the conductive film 260A, and the conductive film 260B are formed over the oxide film 230C. Then, the conductive film 260A and the conductive film 260B are processed to form the conductor 260a and the conductor 260b. Next, the insulating film 270A is formed. Then, the insulator 270A, the oxide film 230D, the insulating film 250A, and the oxide film 230C are processed to form the insulator 270, the oxide 230d, the insulator 250, and the oxide 230c (see FIG. 44 and FIG. 45). The above description can be referred to for the formation of the insulator 270, the conductor 260, the oxide 230d, the insulator 250, and the oxide 230c; thus, the detailed description is omitted.

Next, the insulator 280 is formed over the insulator 254, the insulator 270, the conductor 260, the oxide 230d, the insulator 250, and the oxide 230c. Then, the dopant 259 is added to the insulator 280 (see FIG. 48). The dopant 259 is preferably oxygen. When oxygen is added to the insulator 280, oxygen can be supplied to the oxide 230a, the oxide 230b, and the oxide 230c through the insulator 280 and thus oxygen vacancies in the oxide 230a, the oxide 230b, and the oxide 230c can be reduced. The description of the dopant 257 can be referred to for the method for adding the dopant 259; thus, the detailed description is omitted.

Next, the insulating film 275 is formed over the insulator 280 (see FIG. 49). The insulating film 275 can be formed by a sputtering method, a CVD method, an MBE method, a PLD method, an ALD method, or the like. An aluminum oxide film is preferably formed as the insulating film 275 by a sputtering method, for example. When an aluminum oxide film is formed by a sputtering method, hydrogen contained in the insulator 280 can be inhibited from diffusing into the oxide 230 in some cases.

Next, heat treatment may be performed. The heat treatment is performed at 100° C. or higher and 400° C. or lower, and is performed at 350° C. for four hours, for example. Through the heat treatment, oxygen contained in the insulating film 275 is supplied to the insulator 280 and oxygen can be supplied to the oxide 230a, the oxide 230b, and the oxide 230c through the insulator 280, so that oxygen vacancies in the oxide 230a, the oxide 230b, and the oxide 230c can be reduced. In addition, the moisture concentration and hydrogen concentration in the insulator 280 can be reduced.

Next, the insulating film 275 is removed by CMP treatment to expose the insulator 280, the oxide 230c, the insulator 250, the oxide 230d, the conductor 260a, and the conductor 260b.

Next, the insulating film to be the insulator 274 is formed over the insulator 280. The insulating film to be the insulator 281 may be formed over the insulator 274 (see FIG. 46).

Next, openings reaching the layer 253a and the layer 253b are formed in the insulator 254, the insulator 244, the insulator 280, the insulator 274, and the insulator 281.

Next, the insulating film to be the insulator 241 is formed and the insulating film is subjected to anisotropic etching, so that the insulator 241 is formed.

Next, the conductive film to be the conductor 240a and the conductor 240b is formed. Then, CMP treatment is performed to remove part of the conductive film to be the conductor 240a and the conductor 240b, so that the insulator 281 is exposed. As a result, the conductive film remains only in the openings, so that the conductor 240a and the conductor 240b having flat top surfaces can be formed (see FIG. 13).

Through the above process, the semiconductor device including the transistor 200B illustrated in FIG. 13 can be manufactured. As illustrated in FIG. 47 to FIG. 49, with the use of the method for manufacturing the semiconductor device described in this embodiment, the transistor 200B can be manufactured.

<Method 4 for Manufacturing Semiconductor Device>

A method for manufacturing a semiconductor device including the transistor 200C of one embodiment of the present invention, which is illustrated in FIG. 16, will be described with reference to FIG. 50 to FIG. 54.

In FIG. 50 to FIG. 54, (A) in each drawing is a top view. Furthermore, (B) in each drawing is a cross-sectional view of a portion indicated by the dashed-dotted line A1-A2 in (A), and is a cross-sectional view in the channel length direction of the transistor 200C. Moreover, (C) in each drawing is a cross-sectional view of a portion indicated by the dashed-dotted line A3-A4 in (A), and is a cross-sectional view in the channel width direction of the transistor 200C.

Note that for simplification of the drawing, some components are not illustrated in the top view of (A) in each drawing.

The steps up to the formation of the oxide film 230B are similar to those in the manufacturing method described in <Method 1-1 for manufacturing semiconductor device> (see FIG. 17). Thus, the description of <Method 1-1 for manufacturing semiconductor device> can be referred to, and the detailed description is omitted.

Next, a conductive film to be the conductive film 242B is formed. The conductive film 242B can be formed by a sputtering method, a CVD method, an MBE method, a PLD method, an ALD method, or the like.

Next, the oxide film 230A, the oxide film 230B, and the conductive film to be the conductive film 242B are processed into island shapes, so that the oxide 230a, the oxide 230b, and the conductive film 242B are formed. Note that in this step, the thickness of the insulator 224 in a region that does not overlap with the oxide 230a is reduced in some cases (see FIG. 50).

Next, the insulating film 254A is formed to cover the oxide 230a, the oxide 230b, and the conductive film 242B (see FIG. 50). The insulating film 254A can be formed by a sputtering method, a CVD method, an MBE method, a PLD method, an ALD method, or the like.

Figure 51A:
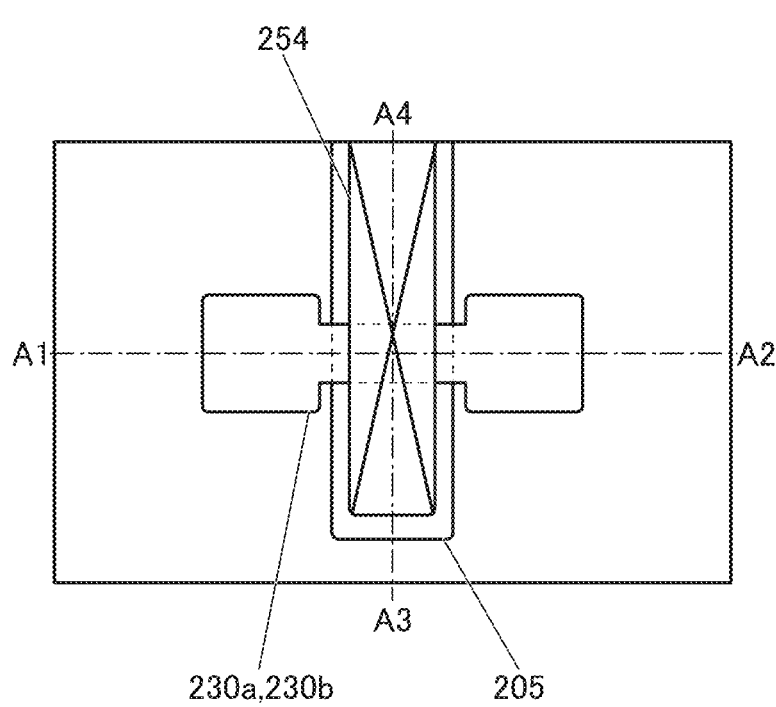
FIGS. 51A-51C A top view and cross-sectional views illustrating a method for manufacturing a semiconductor device of one embodiment of the present invention.
Figure 51C:
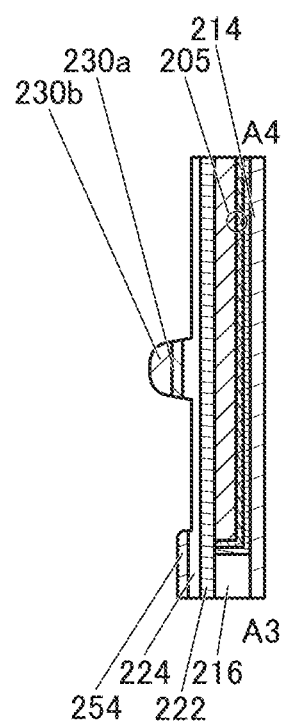
Figure 51B:
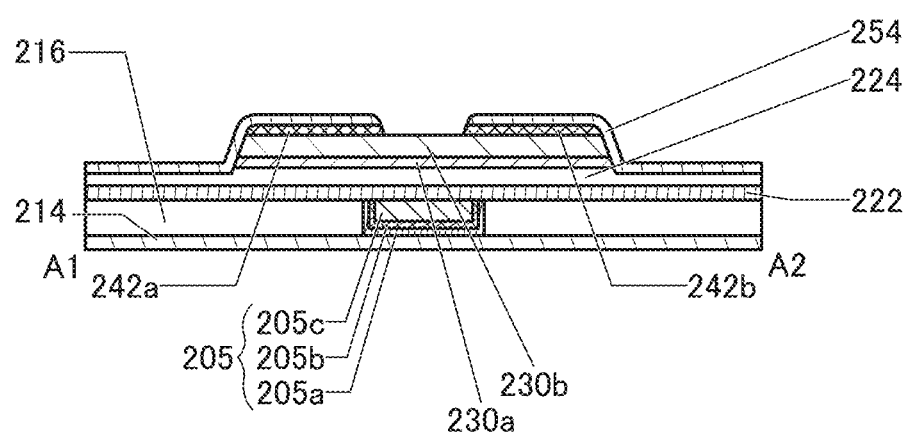
Figure 52A:
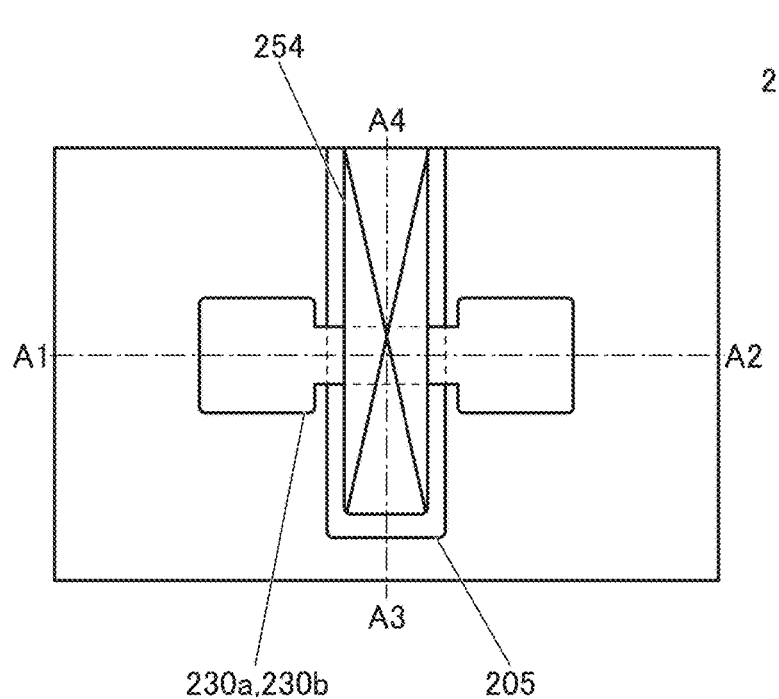
FIGS. 52A-52C A top view and cross-sectional views illustrating a method for manufacturing a semiconductor device of one embodiment of the present invention.
Figure 52C:
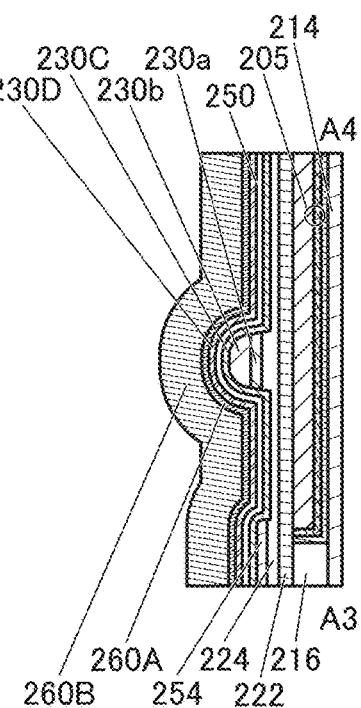
Figure 52B:
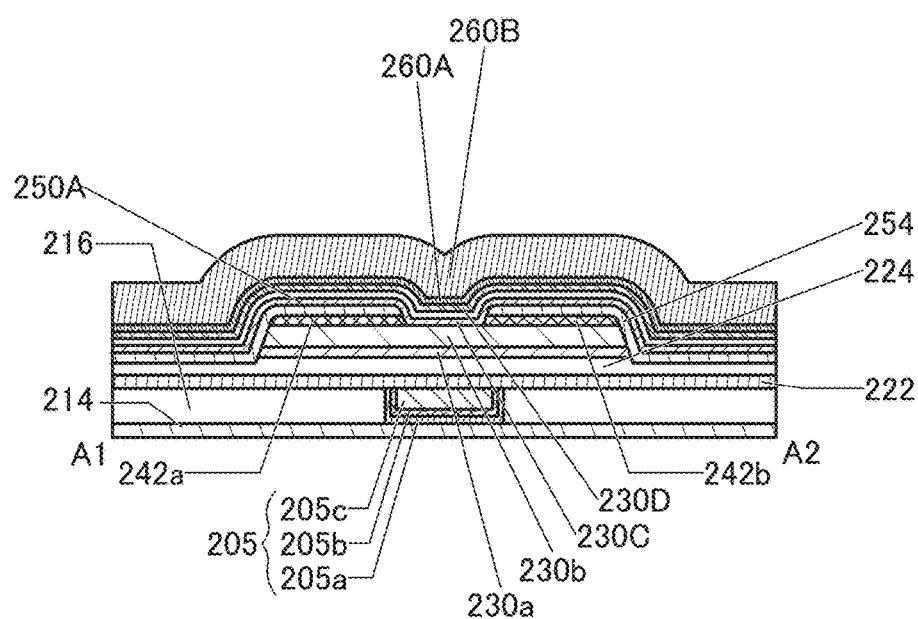
Figure 53A:
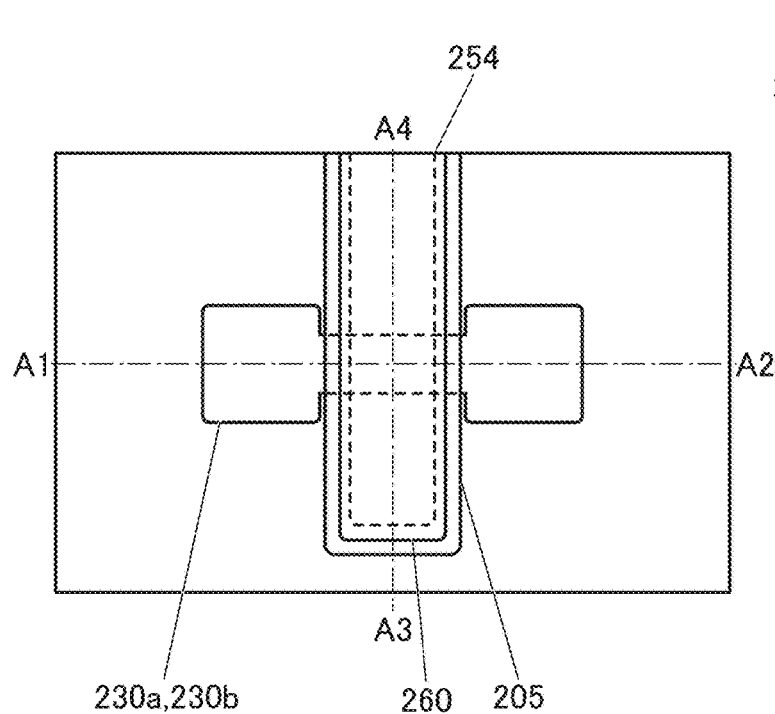
FIGS. 53A-53C A top view and cross-sectional views illustrating a method for manufacturing a semiconductor device of one embodiment of the present invention.
Figure 53C:
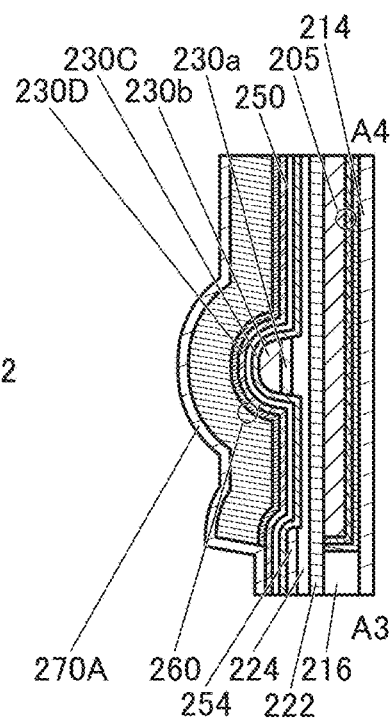
Figure 53B:
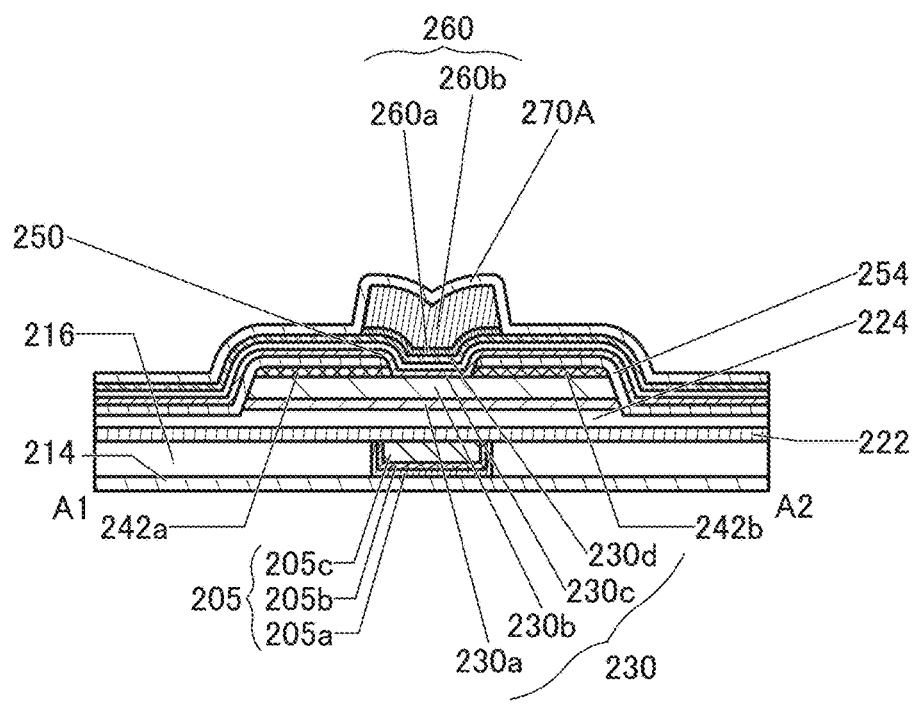

Next, the insulating film 254A and the conductive film 242B are processed to form the insulator 254, the conductor 242a, and the conductor 242b (see FIG. 51).

Next, heat treatment is preferably performed before the formation of the oxide film 230C.

Next, the oxide film 230C is formed over the insulator 254 and the oxide 230b. The insulating film 250A, the oxide film 230D, the conductive film 260A, and the conductive film 260B are formed over the oxide film 230C (see FIG. 52). The above description can be referred to for the formation of the oxide film 230C, the insulating film 250A, the oxide film 230D, the conductive film 260A, and the conductive film 260B; thus, the detailed description is omitted.

Next, the conductive film 260A and the conductive film 260B are processed to form the conductor 260a and the conductor 260b. Then, the insulating film 270A is formed. Then, the insulating film 270A, the oxide film 230D, the insulating film 250A, and the oxide film 230C are processed to form the insulator 270, the oxide 230d, the insulator 250, and the oxide 230c (see FIG. 53). The above description can be referred to for the formation of the insulator 270, the conductor 260, the oxide 230d, the insulator 250, and the oxide 230c; thus, the detailed description is omitted.

Next, heat treatment may be performed.

Next, the insulator 280 is formed over the insulator 270.

Figure 54A:
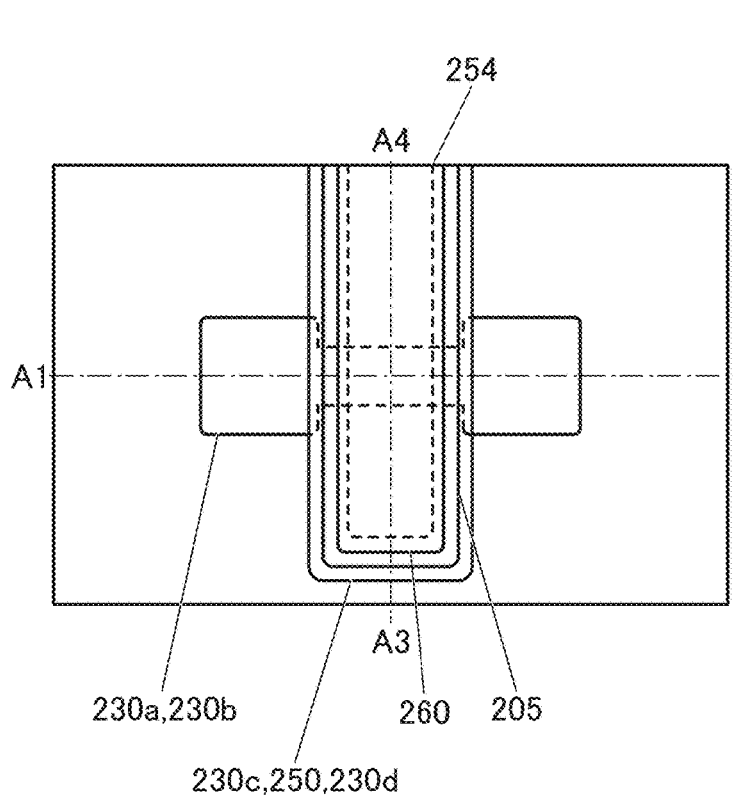
FIGS. 54A-54C A top view and cross-sectional views illustrating a method for manufacturing a semiconductor device of one embodiment of the present invention.
Figure 54C:
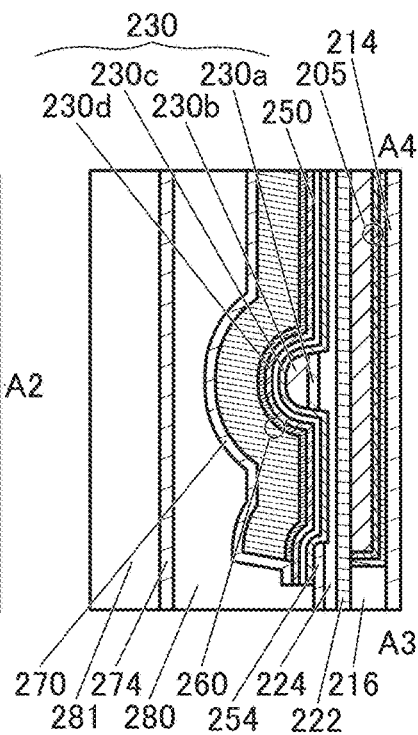
Figure 54B:
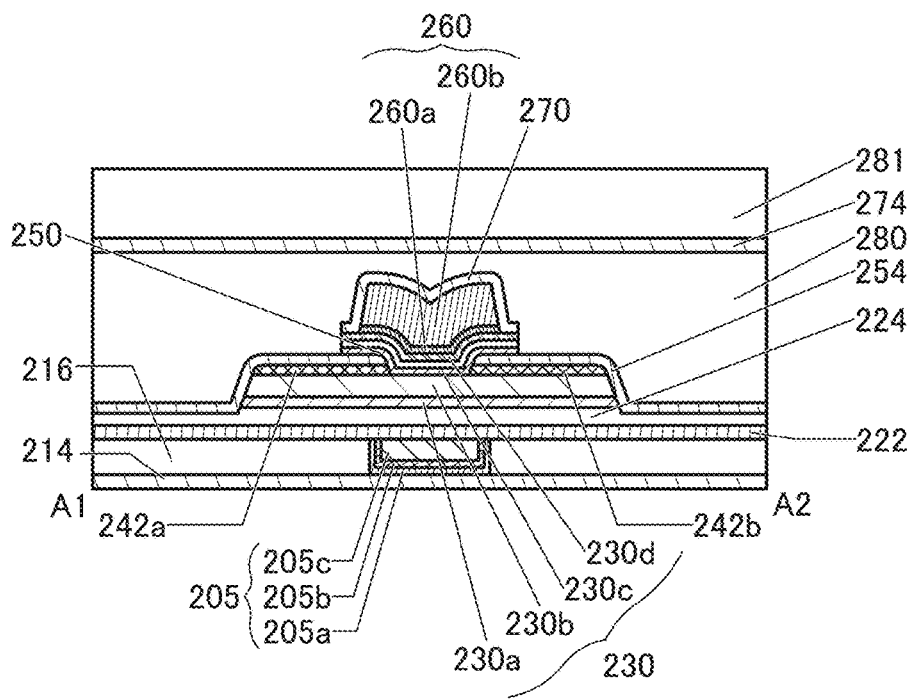

Next, the insulating film to be the insulator 274 is formed over the insulator 280 (see FIG. 54).

Next, heat treatment may be performed.

Next, the insulating film to be the insulator 281 may be formed over the insulator 274 (see FIG. 54).

Next, openings reaching the conductor 242a and the conductor 242b are formed in the insulator 254, the insulator 280, the insulator 274, and the insulator 281. The openings are formed by a lithography method.

Next, the insulator 241 is formed. Then, the conductor 240a and the conductor 240b can be formed (see FIG. 16).

Through the above process, the semiconductor device including the transistor 200C illustrated in FIG. 16 can be manufactured. As illustrated in FIG. 50 to FIG. 54, with the use of the method for manufacturing the semiconductor device described in this embodiment, the transistor 200C can be manufactured.

According to one embodiment of the present invention, a semiconductor device with high on-state current can be provided. Alternatively, according to one embodiment of the present invention, a semiconductor device with excellent frequency characteristics can be provided. Alternatively, according to one embodiment of the present invention, a highly reliable semiconductor device can be provided. Alternatively, according to one embodiment of the present invention, a semiconductor device that can be scaled down or highly integrated can be provided. Alternatively, according to one embodiment of the present invention, a semiconductor device with excellent electrical characteristics can be provided. Alternatively, according to one embodiment of the present invention, a semiconductor device with low off-state current can be provided. Alternatively, according to one embodiment of the present invention, a semiconductor device with reduced power consumption can be provided. Alternatively, according to one embodiment of the present invention, a semiconductor device with high productivity can be provided.

The structure, method, and the like described above in this embodiment can be used in combination as appropriate with the structures, methods, and the like described in the other embodiments.

Embodiment 3

In this embodiment, one embodiment of a semiconductor device will be described with reference to FIG. 55 to FIG. 60.

[Memory Device 1]

Figure 55:
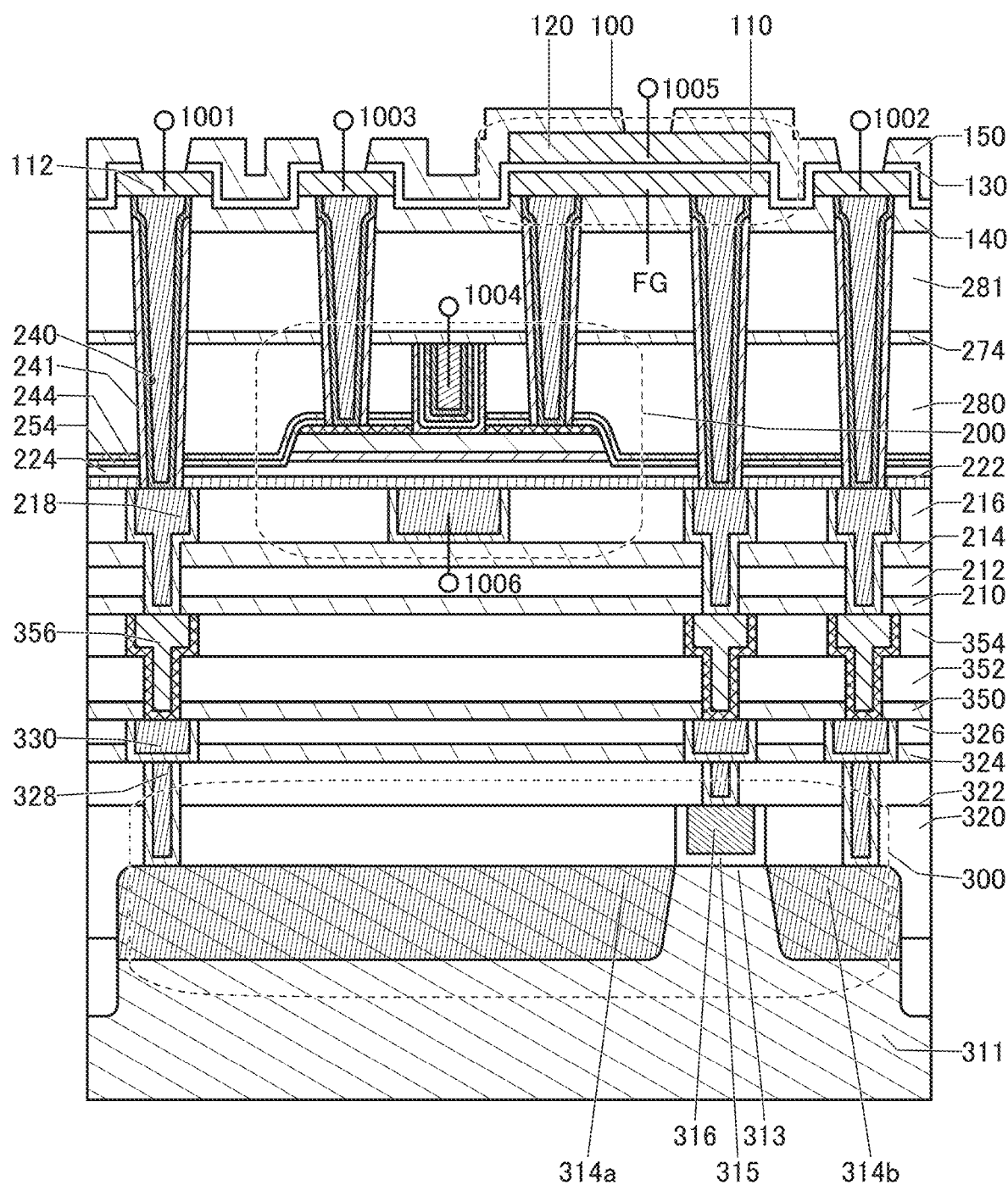
FIG. 55 A cross-sectional view illustrating a structure of a memory device of one embodiment of the present invention.
Figure 56:
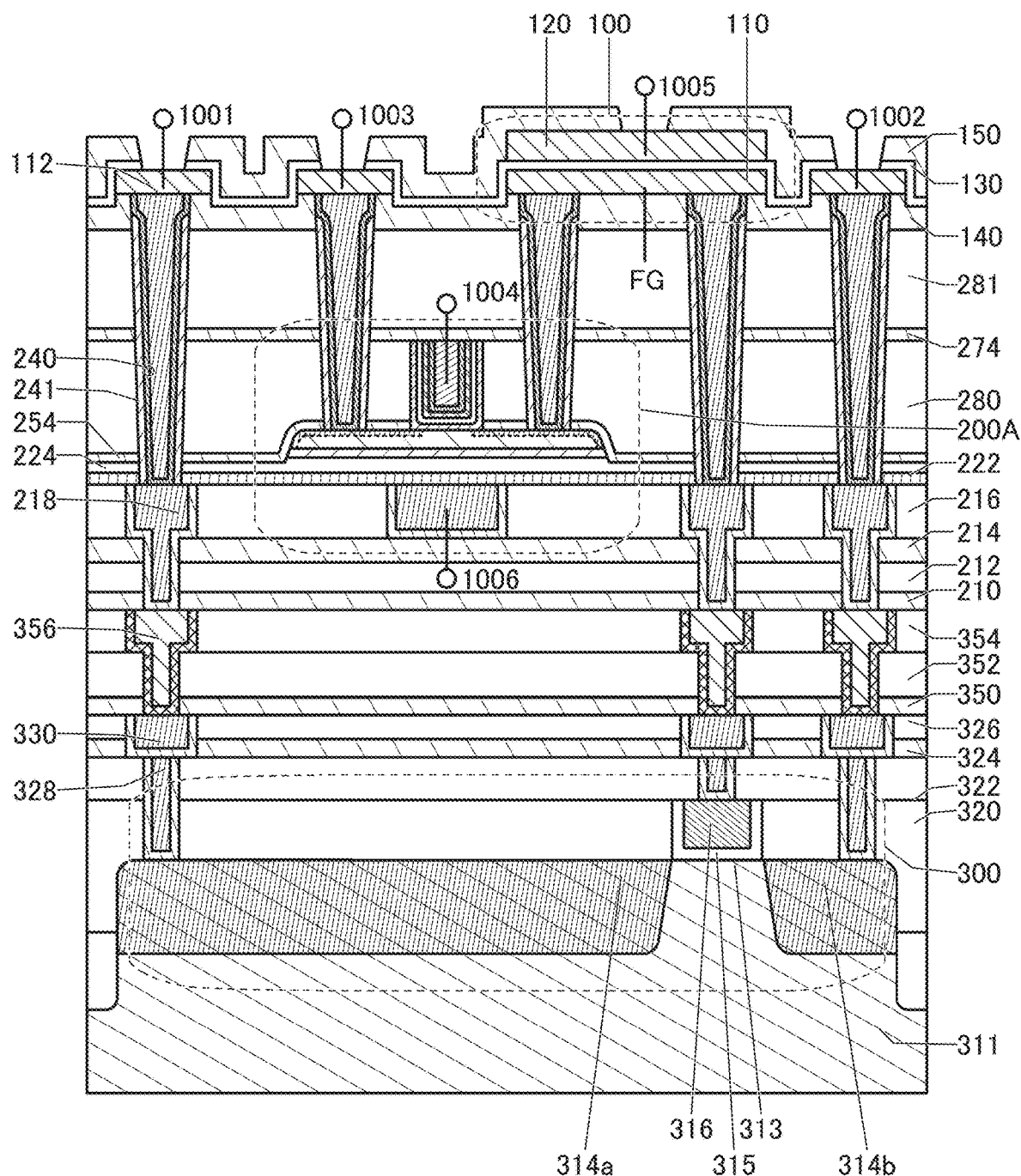
FIG. 56 A cross-sectional view illustrating a structure of a memory device of one embodiment of the present invention.
Figure 57:
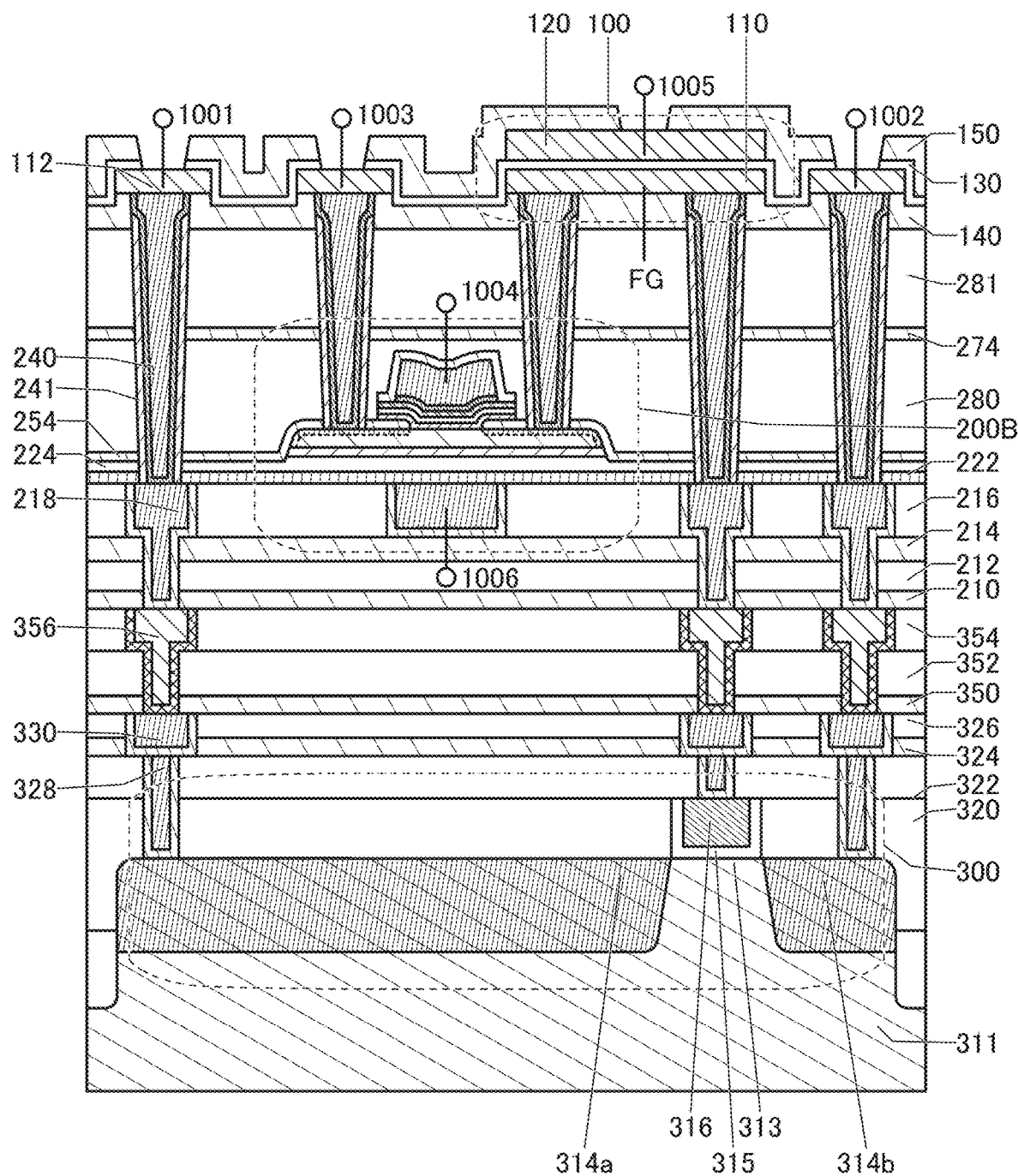
FIG. 57 A cross-sectional view illustrating a structure of a memory device of one embodiment of the present invention.

FIG. 55 to FIG. 57 each illustrate an example of a semiconductor device (memory device) using the transistor of one embodiment of the present invention.

In a semiconductor device of one embodiment of the present invention illustrated in FIG. 55, the transistor 200 is provided above a transistor 300, and a capacitor 100 is provided above the transistor 300 and the transistor 200. Note that the transistor 200 described in the foregoing embodiment, for example, can be used as the transistor 200.

The transistor 200 is a transistor in which a channel is formed in a semiconductor layer including an oxide semiconductor. Since the off-state current of the transistor 200 is low, a memory device including the transistor 200 can retain stored data for a long time. In other words, such a memory device does not require refresh operation or has extremely low frequency of the refresh operation, which leads to a sufficient reduction in power consumption of the memory device.

In the semiconductor device illustrated in FIG. 55, a wiring 1001 is electrically connected to a source of the transistor 300, and a wiring 1002 is electrically connected to a drain of the transistor 300. A wiring 1003 is electrically connected to one of a source and a drain of the transistor 200, a wiring 1004 is electrically connected to a first gate of the transistor 200, and a wiring 1006 is electrically connected to a second gate of the transistor 200. A gate of the transistor 300 and the other of the source and the drain of the transistor 200 are electrically connected to one electrode of the capacitor 100, and a wiring 1005 is electrically connected to the other electrode of the capacitor 100.

When the memory devices illustrated in FIG. 55 are arranged in a matrix, a memory cell array can be formed.

<Transistor 300>

The transistor 300 is provided over a substrate 311 and includes a conductor 316 functioning as a gate electrode, an insulator 315 functioning as a gate insulator, a semiconductor region 313 that is part of the substrate 311, and a low-resistance region 314a and a low-resistance region 314b functioning as a source region and a drain region. The transistor 300 may be a p-channel transistor or an n-channel transistor.

Here, in the transistor 300 illustrated in FIG. 55, the semiconductor region 313 (part of the substrate 311) in which a channel is formed has a convex shape. In addition, the conductor 316 is provided to cover a side surface and a top surface of the semiconductor region 313 with the insulator 315 therebetween. Note that a material adjusting a work function may be used for the conductor 316. Such a transistor 300 is also referred to as a FIN-type transistor because it utilizes a convex portion of a semiconductor substrate. Note that an insulator functioning as a mask for forming the convex portion may be included in contact with an upper portion of the convex portion. Although the case where the convex portion is formed by processing part of the semiconductor substrate is described here, a semiconductor film having a convex shape may be formed by processing an SOI substrate.

Note that the transistor 300 illustrated in FIG. 55 is an example and the structure is not limited thereto; a transistor appropriate for a circuit configuration or a driving method is used.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric.

For example, a conductor 112 and the conductor 110 over the conductor 240 can be formed at the same time. Note that the conductor 112 has a function of a plug or a wiring that is electrically connected to the capacitor 100, the transistor 200, or the transistor 300.

Although the conductor 112 and the conductor 110 each having a single-layer structure are illustrated in FIG. 55, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The insulator 130 can be provided to have stacked layers or a single layer using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, it is preferable to use a stacked-layer structure of a material with high dielectric strength, such as silicon oxynitride, and a high dielectric constant (high-k) material for the insulator 130. In the capacitor 100 having such a structure, sufficient capacitance can be secured owing to a high dielectric constant (high-k) insulator, and dielectric strength can be improved owing to an insulator with high dielectric strength, so that the electrostatic breakdown of the capacitor 100 can be inhibited.

Note that examples of the insulator of a high dielectric constant (high-k) material (material with a high dielectric constant) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Meanwhile, examples of the material with high dielectric strength (material with a low dielectric constant) include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

<Wiring Layer>

Wiring layers provided with an interlayer film, a wiring, a plug, and the like may be provided between the components. In addition, a plurality of wiring layers can be provided in accordance with design. Here, a plurality of conductors having functions of plugs or wirings are collectively denoted by the same reference numeral in some cases. Furthermore, in this specification and the like, a wiring and a plug electrically connected to the wiring may be a single component. That is, part of a conductor functions as a wiring in some cases, and part of a conductor functions as a plug in other cases.

For example, an insulator 320, an insulator 322, an insulator 324, and an insulator 326 are sequentially stacked over the transistor 300 as interlayer films. In addition, a conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as a plug or a wiring.

The insulators functioning as interlayer films may function as planarization films that cover uneven shapes thereunder. For example, the top surface of the insulator 322 may be planarized by planarization treatment using a chemical mechanical polishing (CMP) method or the like to improve planarity.

A wiring layer may be provided over the insulator 326 and the conductor 330. For example, in FIG. 55, an insulator 350, an insulator 352, and an insulator 354 are sequentially stacked. Furthermore, a conductor 356 is formed in the insulator 350, the insulator 352, and the insulator 354. The conductor 356 functions as a plug or a wiring.

Similarly, a conductor 218, a conductor included in the transistor 200 (the conductor 205), and the like are embedded in an insulator 210, an insulator 212, the insulator 214, and the insulator 216. Note that the conductor 218 has a function of a plug or a wiring that is electrically connected to the capacitor 100 or the transistor 300. In addition, an insulator 150 is provided over the conductor 120 and the insulator 130.

Examples of an insulator that can be used as an interlayer film include an insulating oxide, an insulating nitride, an insulating oxynitride, an insulating nitride oxide, an insulating metal oxide, an insulating metal oxynitride, and an insulating metal nitride oxide.

For example, when a material having a low dielectric constant is used for the insulator functioning as an interlayer film, parasitic capacitance generated between wirings can be reduced. Thus, a material is preferably selected depending on the function of an insulator.

For example, for the insulator 150, the insulator 212, the insulator 352, the insulator 354, or the like, an insulator having a low dielectric constant is preferably used. For example, the insulator preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low dielectric constant. Examples of the resin include polyester, polyolefin, polyamide (nylon, aramid, or the like), polyimide, polycarbonate, and acrylic.

It is preferable that one or both of the insulator 130 and the insulator 150 provided over the conductor 112 or the conductor 120 have a resistivity higher than or equal to $1.0\times10^{12}$ Ωcm and lower than or equal to $1.0\times10^{15}$ Ωcm, preferably higher than or equal to $5.0\times10^{12}$ Ωcm and lower than or equal to $1.0\times10^{14}$ Ωcm, further preferably higher than or equal to $1.0\times10^{13}$ Ωcm and lower than or equal to $5.0\times10^{13}$ Ωcm. It is preferable to use an insulator having resistivity described above for one or both of the insulator 130 and the insulator 150 because the insulator can disperse electric charge accumulated in the transistor 200, the transistor 300, the capacitor 100, and wirings such as the conductor 112 and the conductor 120 and can inhibit poor characteristics and electrostatic breakdown of the transistor and a memory device including the transistor due to the electric charge, while maintaining the insulating property. For such an insulator, silicon nitride or silicon nitride oxide can be used.

As the insulator having resistivity described above, an insulator 140 may be provided under the conductor 112. In that case, the insulator 140 is formed over the insulator 281; an opening portion is formed in the insulator 140, the insulator 281, the insulator 274, the insulator 280, the insulator 244, the insulator 254, and the like; and the insulator 241 is formed or the conductor 240 that is electrically connected to the transistor 200, the conductor 218, and the like is formed in the opening portion. The insulator 140 can be formed using a material similar to that for the insulator 130 or the insulator 150.

When a transistor using an oxide semiconductor is surrounded by an insulator having a function of inhibiting the passage of oxygen and impurities such as hydrogen, the electrical characteristics of the transistor can be stable. Thus, an insulator having a function of inhibiting the passage of oxygen and impurities such as hydrogen is used as the insulator 210, the insulator 350, and the like.

The insulator having a function of inhibiting the passage of oxygen and impurities such as hydrogen can have, for example, a single-layer structure or a stacked-layer structure of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride can be used.

The conductor that can be used for a wiring or a plug can be formed using a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. A semiconductor having high electric conductivity, typified by polycrystalline silicon containing an impurity element such as phosphorus, or silicide such as nickel silicide may be used.

For example, for the conductor 328, the conductor 330, the conductor 356, the conductor 218, the conductor 112, or the like, a single layer or stacked layers of a conductive material such as a metal material, an alloy material, a metal nitride material, or a metal oxide material that is formed using the above material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

<<Wiring or Plug in Layer Provided with Oxide Semiconductor>>

In the case where an oxide semiconductor is used for the transistor 200, an insulator including an excess-oxygen region is provided in the vicinity of the oxide semiconductor in some cases. In that case, an insulator having a barrier property is preferably provided between the insulator including an excess-oxygen region and a conductor provided in the insulator including an excess-oxygen region.

For example, the insulator 241 is preferably provided between the insulator 224 and the conductor 240 in FIG. 55. In particular, the insulator 241 is preferably provided in contact with the insulator 222 and the insulator 254 between which the insulator 224 including an excess-oxygen region is positioned. Since the insulator 241 is provided in contact with the insulator 222 and the insulator 254, the insulator 224 can be sealed by the insulators having barrier properties. Furthermore, it is also preferable that the insulator 241 be in contact with parts of the insulator 280 and the insulator 281. When the insulator 241 extends to the insulator 280 and the insulator 281, diffusion of oxygen and impurities can be further inhibited.

That is, when the insulator 241 is provided, absorption of excess oxygen contained in the insulator 224 by the conductor 240 can be inhibited. In addition, when the insulator 241 is included, diffusion of hydrogen, which is an impurity, into the transistor 200 through the conductor 240 can be inhibited.

Note that an insulating material having a function of inhibiting diffusion of oxygen and impurities such as water and hydrogen is preferably used for the insulator 241. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide; silicon nitride oxide; silicon nitride; or the like.

A semiconductor device with a structure different from that of the semiconductor device illustrated in FIG. 55 will be described.

In a semiconductor device of one embodiment of the present invention illustrated in FIG. 56, the transistor 200A is provided above the transistor 300, and the capacitor 100 is provided above the transistor 300 and the transistor 200A. The transistor 200A described in the foregoing embodiment, for example, can be used as the transistor 200A. In a semiconductor device of one embodiment of the present invention illustrated in FIG. 57, the transistor 200B is provided above the transistor 300, and the capacitor 100 is provided above the transistor 300 and the transistor 200B. The transistor 200B described in the foregoing embodiment, for example, can be used as the transistor 200B. The above description can be referred to for the structure of the semiconductor device (memory device); thus, the detailed description is omitted.

The above is the description of the structure example. With the use of this structure, changes in electrical characteristics can be inhibited and reliability can be improved in a semiconductor device using a transistor including an oxide semiconductor. Alternatively, a transistor including an oxide semiconductor and having high on-state current can be provided. Alternatively, a transistor including an oxide semiconductor and having low off-state current can be provided. Alternatively, a semiconductor device with low power consumption can be provided.

[Memory Device 2]

Figure 58:
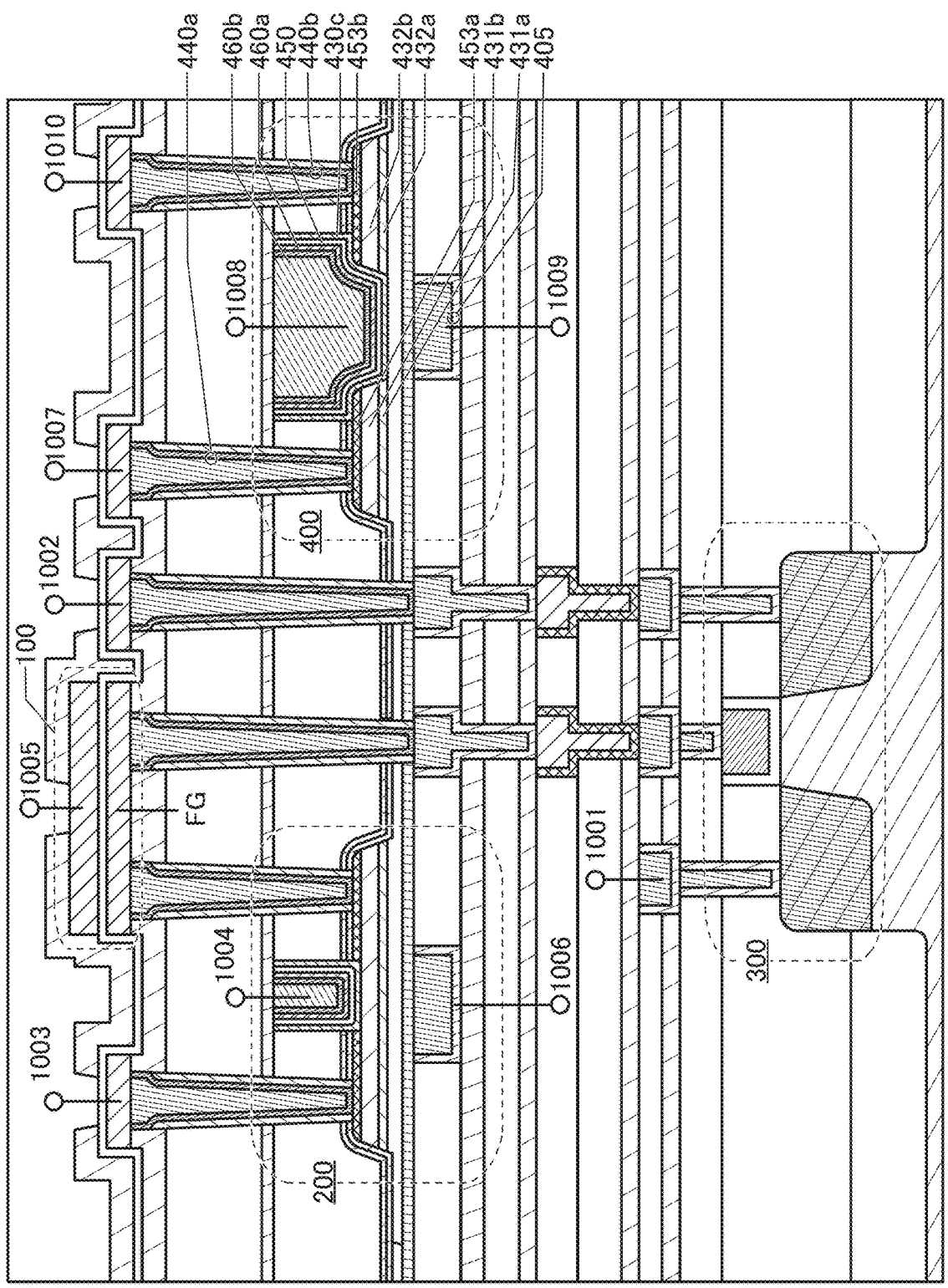
FIG. 58 A cross-sectional view illustrating a structure of a memory device of one embodiment of the present invention.
Figure 59:
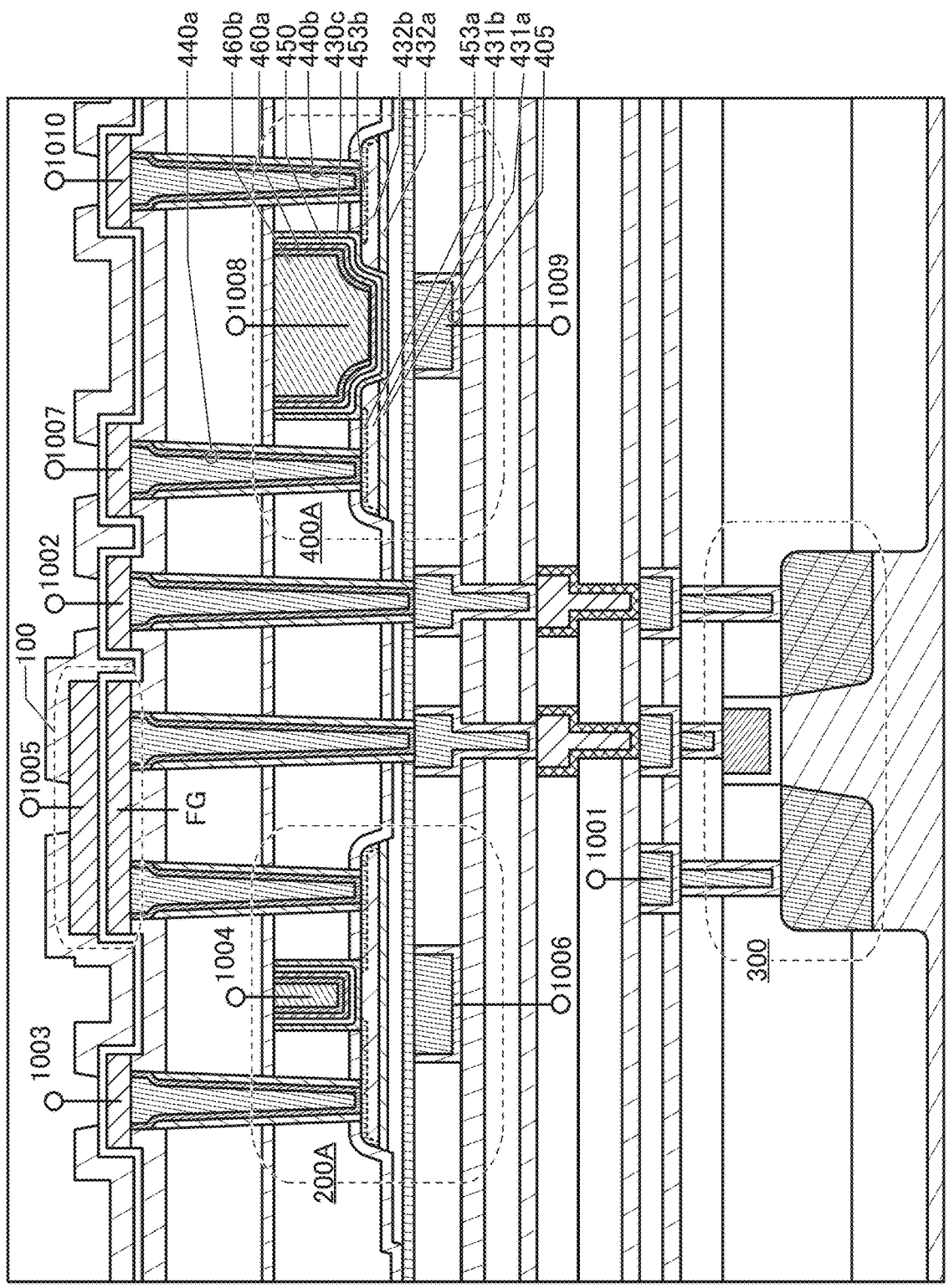
FIG. 59 A cross-sectional view illustrating a structure of a memory device of one embodiment of the present invention.
Figure 60:
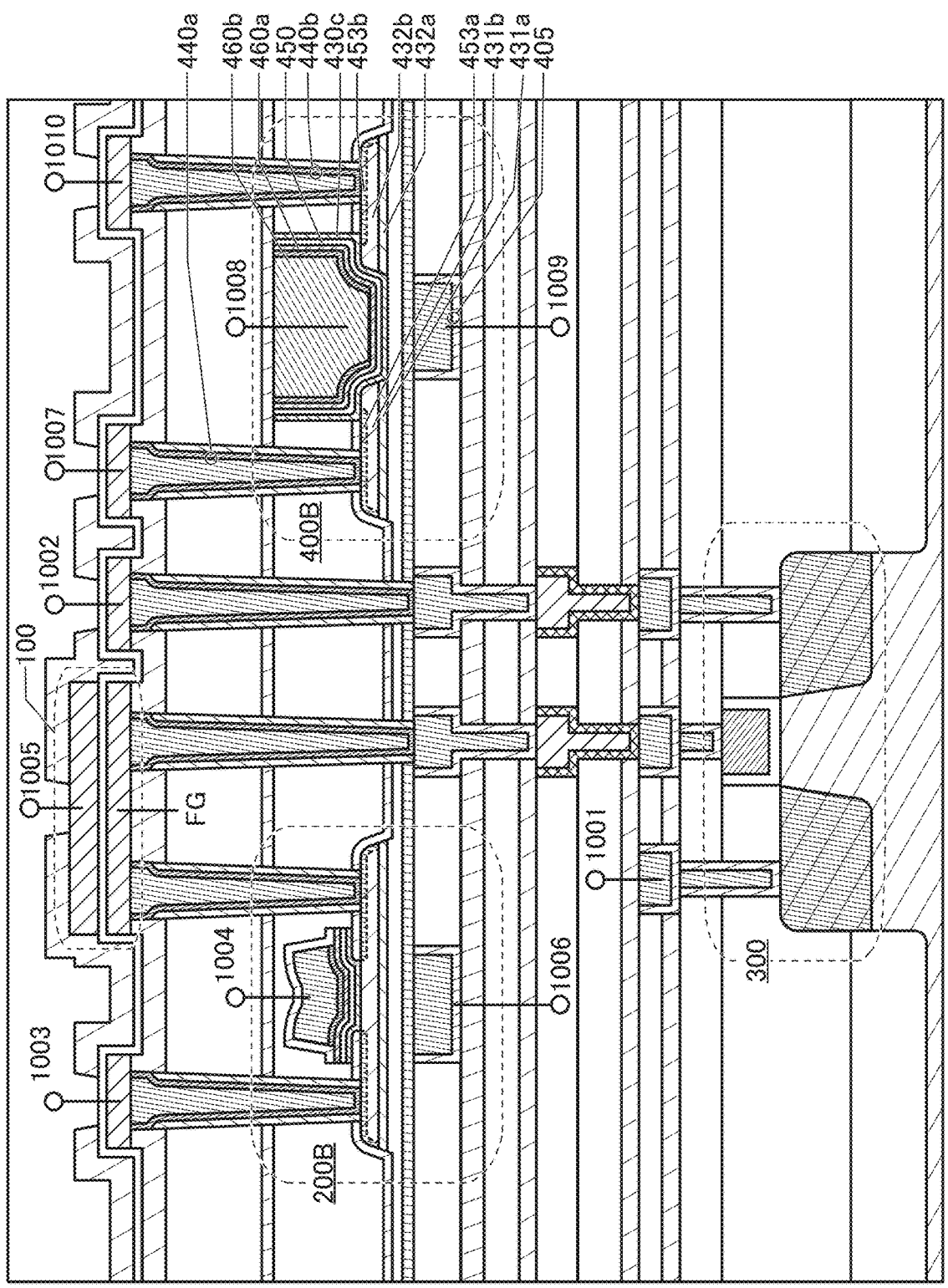
FIG. 60 A cross-sectional view illustrating a structure of a memory device of one embodiment of the present invention.

FIG. 58 to FIG. 60 each illustrate an example of a memory device using a semiconductor device of one embodiment of the present invention.

The memory device illustrated in FIG. 58 includes a transistor 400 in addition to the semiconductor device including the transistor 200, the transistor 300, and the capacitor 100 illustrated in FIG. 55.

The transistor 400 can control a second gate voltage of the transistor 200. For example, a first gate and a second gate of the transistor 400 are diode-connected to a source thereof, and the source of the transistor 400 is connected to the second gate of the transistor 200. When a negative potential of the second gate of the transistor 200 is retained in this structure, the first gate-source voltage and the second gate-source voltage of the transistor 400 are 0 V. In the transistor 400, a drain current at the time when the second gate voltage and the first gate voltage are 0 V is extremely low; thus, the negative potential of the second gate of the transistor 200 can be maintained for a long time even without power supply to the transistor 200 and the transistor 400. Accordingly, the memory device including the transistor 200 and the transistor 400 can retain stored data for a long time.

Hence, in FIG. 58, the wiring 1001 is electrically connected to the source of the transistor 300, and the wiring 1002 is electrically connected to the drain of the transistor 300. The wiring 1003 is electrically connected to one of the source and the drain of the transistor 200, the wiring 1004 is electrically connected to the gate of the transistor 200, and the wiring 1006 is electrically connected to a back gate of the transistor 200. A gate of the transistor 300 and the other of the source and the drain of the transistor 200 are electrically connected to one electrode of the capacitor 100, and the wiring 1005 is electrically connected to the other electrode of the capacitor 100. A wiring 1007 is electrically connected to the source of the transistor 400, a wiring 1008 is electrically connected to a gate of the transistor 400, a wiring 1009 is electrically connected to a back gate of the transistor 400, and a wiring 1010 is electrically connected to the drain of the transistor 400. Here, the wiring 1006, the wiring 1007, the wiring 1008, and the wiring 1009 are electrically connected to each other.

When the memory devices illustrated in FIG. 58 are arranged in a matrix like the memory devices illustrated in FIG. 55, a memory cell array can be formed. Note that one transistor 400 can control the second gate voltages of a plurality of transistors 200. Thus, the number of transistors 400 is preferably smaller than the number of transistors 200.

<Transistor 400>

The transistor 400 and the transistor 200 are formed in the same layer and thus can be fabricated in parallel. The transistor 400 includes a conductor 460 (a conductor 460a and a conductor 460b) functioning as a first gate electrode, a conductor 405 functioning as a second gate electrode, the insulator 222, the insulator 224, and an insulator 450 functioning as gate insulating layers, an oxide 430c including a channel formation region, a layer 453a, an oxide 431a, and an oxide 431b functioning as one of a source and a drain, a layer 453b, an oxide 432a, and an oxide 432b functioning as the other of the source and the drain, and a conductor 440 (a conductor 440a and a conductor 440b).

In the transistor 400, the conductor 405 is in the same layer as the conductor 205. The oxide 431a and the oxide 432a are in the same layer as the oxide 230a, and the oxide 431b and the oxide 432b are in the same layer as the oxide 230b. The conductor 453a and the conductor 453b are in the same layer as the conductor 242. The oxide 430c is in the same layer as the oxide 230c. The insulator 450 is in the same layer as the insulator 250. The conductor 460 is in the same layer as the conductor 260.

Note that the components formed in the same layer can be formed at the same time. For example, the oxide 430c can be formed by processing an oxide film to be the oxide 230c.

In the oxide 430c functioning as an active layer of the transistor 400, oxygen vacancies and impurities such as hydrogen and water are reduced, as in the oxide 230 or the like. Accordingly, the threshold voltage of the transistor 400 can be higher than 0 V, an off-state current can be reduced, and the drain current at the time when the second gate voltage and the first gate voltage are 0 V can be extremely low.

<<Dicing Line>>

A dicing line (also referred to as a scribe line, a dividing line, or a cutting line in some cases) that is provided when a large-sized substrate is divided into semiconductor elements so that a plurality of semiconductor devices are obtained in a chip form will be described below. Examples of a dividing method include the case where a groove (a dicing line) for separating the semiconductor elements is formed on the substrate, and then the substrate is cut along the dicing line to divide (split) it into a plurality of semiconductor devices.

Here, for example, as illustrated in FIG. 58, it is preferable that a region in which the insulator 254 and the insulator 222 are in contact with each other be the dicing line. That is, an opening is provided in the insulator 224 near the region to be the dicing line that is provided in the outer edge of the transistor 400 and the memory cell including a plurality of transistors 200. The insulator 254 is provided to cover the side surface of the insulator 224.

That is, in the opening provided in the insulator 224, the insulator 222 is in contact with the insulator 254. For example, in this instance, the insulator 222 and the insulator 254 may be formed using the same material and the same method. When the insulator 222 and the insulator 254 are formed using the same material and the same method, the adhesion can be increased. For example, aluminum oxide is preferably used.

With this structure, the insulator 224, the transistor 200, and the transistor 400 can be enclosed with the insulator 222 and the insulator 254. Since the insulator 222 and the insulator 254 have a function of inhibiting diffusion of oxygen, hydrogen, and water even when the substrate is divided into circuit regions each of which is provided with the semiconductor elements in this embodiment to form a plurality of chips, entry and diffusion of impurities such as hydrogen and water from the direction of a side surface of the divided substrate to the transistor 200 or the transistor 400 can be prevented.

Furthermore, with this structure, excess oxygen in the insulator 224 can be prevented from diffusing to the outside of the insulator 254 and the insulator 222. Accordingly, excess oxygen in the insulator 224 is efficiently supplied to the oxide where the channel of the transistor 200 or the transistor 400 is formed. Such oxygen can reduce oxygen vacancies in the oxide where the channel of the transistor 200 or the transistor 400 is formed. Thus, the oxide where the channel of the transistor 200 or the transistor 400 is formed can be an oxide semiconductor having a low density of defect states and stable characteristics. That is, variations in the electrical characteristics of the transistor 200 or the transistor 400 can be reduced and the reliability can be improved.

The memory device illustrated in FIG. 59 includes a transistor 400A in addition to the semiconductor device including the transistor 200A, the transistor 300, and the capacitor 100 illustrated in FIG. 56. The transistor 400A and the transistor 200A are formed in the same layer and thus can be fabricated in parallel.

The memory device illustrated in FIG. 60 includes a transistor 400B in addition to the semiconductor device including the transistor 200B, the transistor 300, and the capacitor 100 illustrated in FIG. 57. The transistor 400B and the transistor 200B are formed in the same layer and thus can be fabricated in parallel. The above description can be referred to for the structure of the memory device; thus, the detailed description is omitted.

This embodiment can be implemented in combination with any of the structures described in the other embodiments and the like, as appropriate.

Embodiment 4

In this embodiment, a memory device of one embodiment of the present invention including a transistor using an oxide as a semiconductor (hereinafter, referred to as an OS transistor in some cases) and a capacitor (hereinafter, referred to as an OS memory device in some cases) will be described with reference to FIG. 61 and FIG. 62. The OS memory device is a memory device including at least a capacitor and an OS transistor that controls charge and discharge of the capacitor. Since the off-state current of the OS transistor is extremely low, the OS memory device has excellent retention characteristics and can function as a nonvolatile memory.

<Structure Example of Memory Device>

Figure 61A:
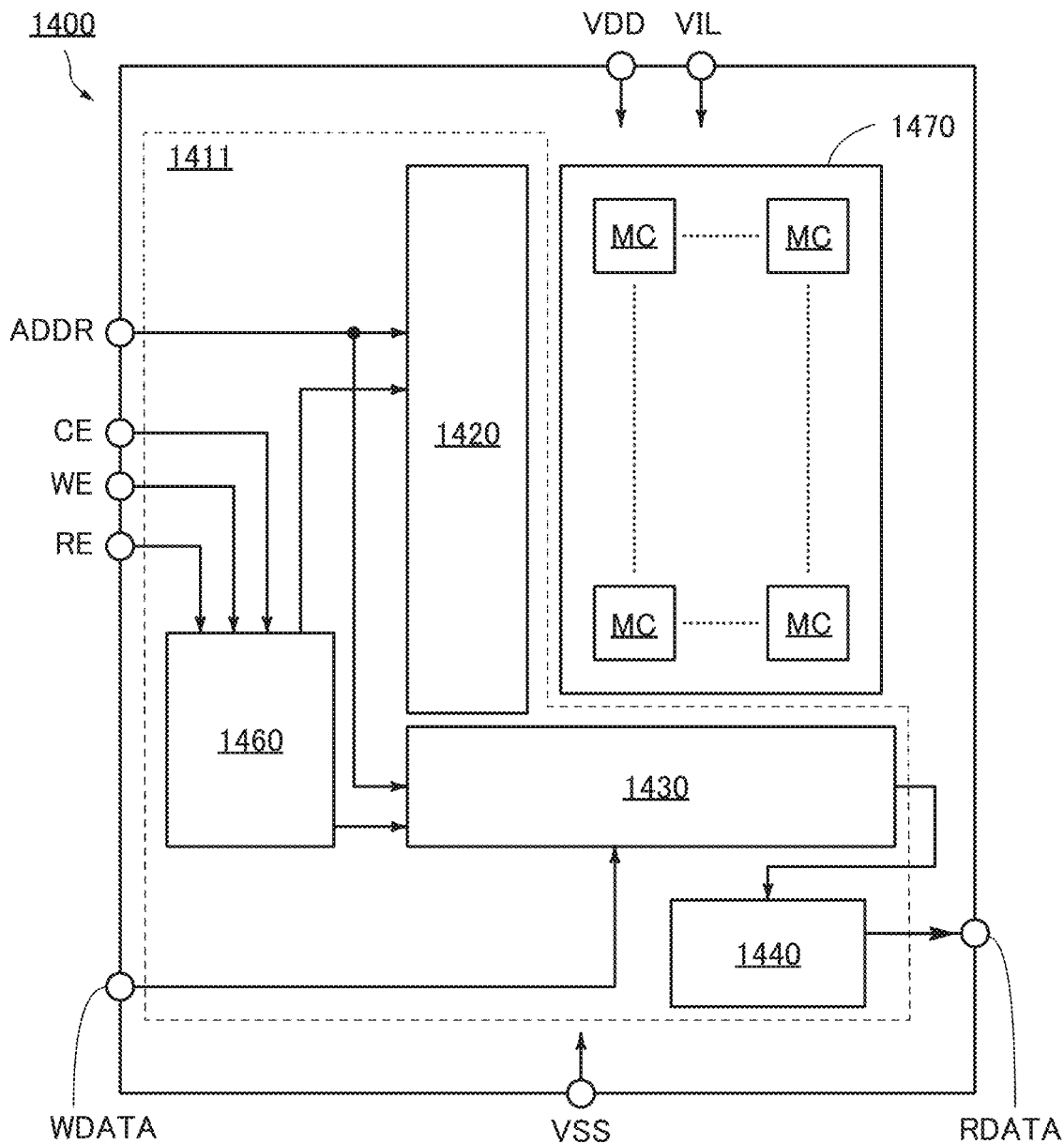
FIGS. 61A-61B Block diagrams illustrating a structure example of a memory device of one embodiment of the present invention.

FIG. 61(A) illustrates a structure example of an OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to memory cells included in the memory cell array 1470, which will be described in detail later. The amplified data signal is output to the outside of the memory device 1400 as a data signal RDATA through the output circuit 1440. The row circuit 1420 includes, for example, a row decoder, a word line driver circuit, and the like, and can select a row to be accessed.

As power supply voltages, a low power supply voltage (VSS), a high power supply voltage (VDD) for the peripheral circuit 1411, and a high power supply voltage (VIL) for the memory cell array 1470 are supplied to the memory device 1400 from the outside. In addition, control signals (CE, WE, and RE), an address signal ADDR, and a data signal WDATA are input to the memory device 1400 from the outside. The address signal ADDR is input to the row decoder and the column decoder, and WDATA is input to the write circuit.

The control logic circuit 1460 processes the signals (CE, WE, and RE) input from the outside, and generates control signals for the row decoder and the column decoder. CE denotes a chip enable signal, WE denotes a write enable signal, and RE denotes a read enable signal. Signals processed by the control logic circuit 1460 are not limited thereto, and other control signals are input as necessary.

The memory cell array 1470 includes a plurality of memory cells MC and a plurality of wirings arranged in a matrix. Note that the number of wirings that connect the memory cell array 1470 and the row circuit 1420 depends on the structure of the memory cell MC, the number of memory cells MC included in one column, and the like. Furthermore, the number of wirings that connect the memory cell array 1470 and the column circuit 1430 depends on the structure of the memory cell MC, the number of memory cells MC included in one row, and the like.

Figure 61B:
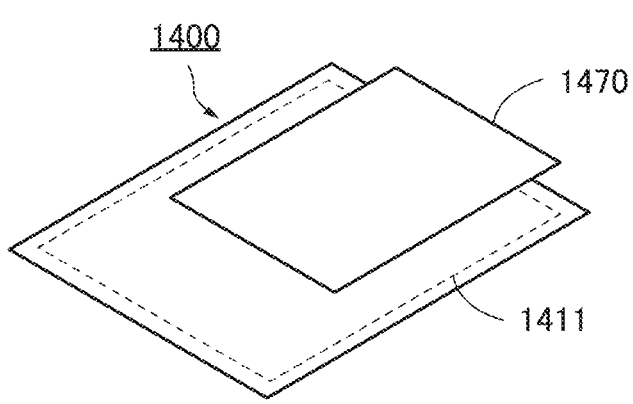

Note that FIG. 61(A) illustrates an example in which the peripheral circuit 1411 and the memory cell array 1470 are formed on the same plane; however, this embodiment is not limited thereto. For example, as illustrated in FIG. 61(B), the memory cell array 1470 may be provided to overlap part of the peripheral circuit 1411. For example, a structure may be employed in which the sense amplifier is provided below the memory cell array 1470 so that they overlap with each other.

FIG. 62 illustrates structure examples of memory cells applicable to the memory cell MC.

[DOSRAM]

Figure 62A:
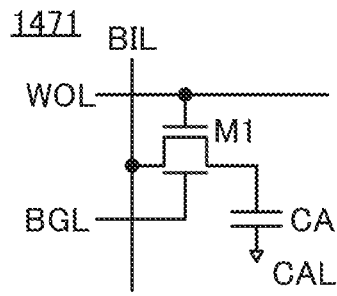
FIGS. 62A-62H Circuit diagrams each illustrating a structure example of a memory device of one embodiment of the present invention.
Figure 62B:
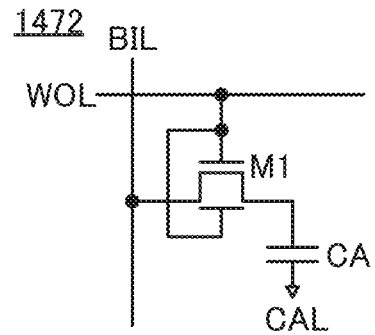
Figure 62C:
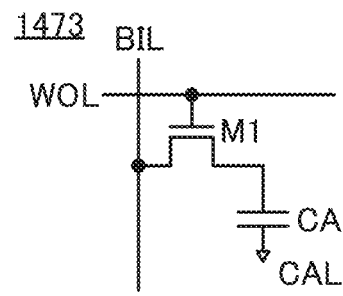
Figure 62D:
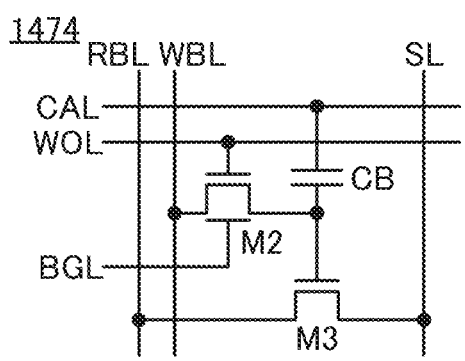
Figure 62E:
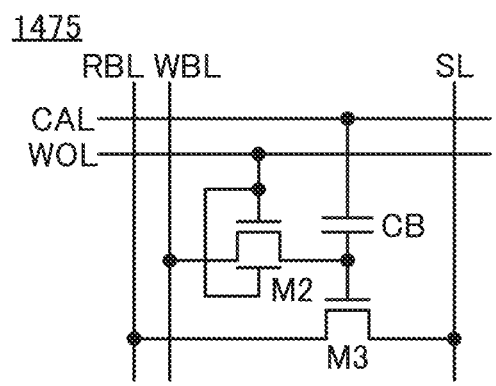
Figure 62F:
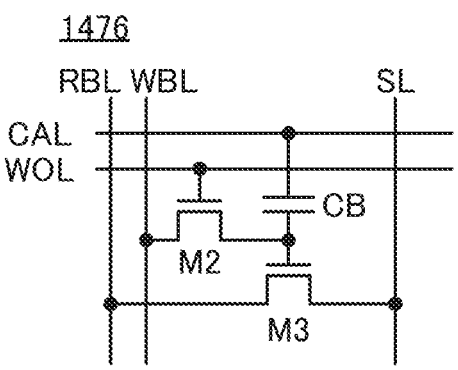
Figure 62G:
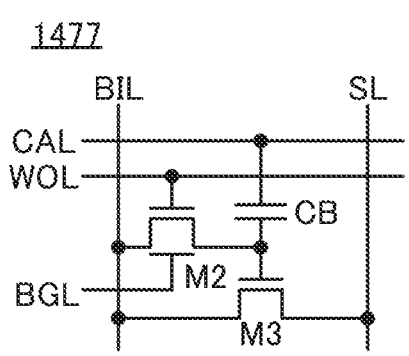

FIG. 62(A) to FIG. 62(C) each illustrate a circuit structure example of a DRAM memory cell. In this specification and the like, a DRAM using a memory cell including one OS transistor and one capacitor is sometimes referred to as a DOSRAM (Dynamic Oxide Semiconductor Random Access Memory). A memory cell 1471 illustrated in FIG. 62(A) includes a transistor M1 and a capacitor CA. Note that the transistor M1 includes a gate (also referred to as a front gate in some cases) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In data writing and reading, a low-level potential is preferably applied to the wiring CAL. The wiring BGL functions as a wiring for applying a potential to the back gate of the transistor M1. By application of a given potential to the wiring BGL, the threshold voltage of the transistor M1 can be increased or decreased.

The memory cell MC is not limited to the memory cell 1471, and the circuit structure can be changed. For example, as in a memory cell 1472 illustrated in FIG. 62(B), a structure may be employed in which the back gate of the transistor M1 is connected not to the wiring BGL but to the wiring WOL in the memory cell MC. Alternatively, for example, like a memory cell 1473 illustrated in FIG. 62(C), the memory cell MC may be a memory cell including a single-gate transistor, that is, the transistor M1 that does not include a back gate.

In the case where the semiconductor device described in the above embodiment is used in the memory cell 1471 or the like, the transistor 200 can be used as the transistor M1, and the capacitor 100 can be used as the capacitor CA. The use of an OS transistor as the transistor M1 enables the leakage current of the transistor M1 to be extremely low. That is, written data can be retained for a long time with the use of the transistor M1; thus, the frequency of refresh of the memory cell can be reduced. Alternatively, the refresh operation of the memory cell can be omitted. In addition, the extremely low leakage current allows multi-level data or analog data to be retained in the memory cell 1471, the memory cell 1472, or the memory cell 1473.

In the DOSRAM, when the sense amplifier is provided below the memory cell array 1470 so that they overlap with each other as described above, the bit line can be shortened. This reduces bit line capacitance, which reduces the storage capacitance of the memory cell.

[NOSRAM]

FIG. 62(D) to FIG. 62(H) each illustrate a circuit structure example of a gain-cell memory cell including two transistors and one capacitor. A memory cell 1474 illustrated in FIG. 62(D) includes a transistor M2, a transistor M3, and a capacitor CB. Note that the transistor M2 includes a front gate (simply referred to as a gate in some cases) and a back gate. In this specification and the like, a memory device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. The gate of the transistor M2 is connected to the wiring WOL. The back gate of the transistor M2 is connected to the wiring BGL. A second terminal of the capacitor CB is connected to the wiring CAL. A first terminal of the transistor M3 is connected to the wiring RBL, a second terminal of the transistor M3 is connected to a wiring SL, and a gate of the transistor M3 is connected to the first terminal of the capacitor CB.

The wiring WBL functions as a write bit line. The wiring RBL functions as a read bit line. The wiring WOL functions as a word line. The wiring CAL functions as a wiring for applying a predetermined potential to the second terminal of the capacitor CB. In data writing, data retention, and data reading, a low-level potential is preferably applied to the wiring CAL. The wiring BGL functions as a wiring for applying a potential to the back gate of the transistor M2. By application of a given potential to the wiring BGL, the threshold voltage of the transistor M2 can be increased or decreased.

The memory cell MC is not limited to the memory cell 1474, and the circuit structure can be changed as appropriate. For example, as in a memory cell 1475 illustrated in FIG. 62(E), a structure may be employed in which the back gate of the transistor M2 is connected not to the wiring BGL but to the wiring WOL in the memory cell MC. Alternatively, for example, like a memory cell 1476 illustrated in FIG. 62(F), the memory cell MC may be a memory cell including a single-gate transistor, that is, the transistor M2 that does not include a back gate. Alternatively, for example, like a memory cell 1477 illustrated in FIG. 62(G), the memory cell MC may have a structure in which the wiring WBL and the wiring RBL are combined into one wiring BIL.

In the case where the semiconductor device described in the above embodiment is used in the memory cell 1474 or the like, the transistor 200 can be used as the transistor M2, the transistor 300 can be used as the transistor M3, and the capacitor 100 can be used as the capacitor CB. The use of an OS transistor as the transistor M2 enables the leakage current of the transistor M2 to be extremely low. Consequently, written data can be retained for a long time with the use of the transistor M2; thus, the frequency of refresh of the memory cell can be reduced. Alternatively, the refresh operation of the memory cell can be omitted. In addition, the extremely low leakage current allows multi-level data or analog data to be retained in the memory cell 1474. The same applies to the memory cells 1475 to 1477.

Note that the transistor M3 may be a transistor containing silicon in a channel formation region (hereinafter, referred to as a Si transistor in some cases). The conductivity type of the Si transistor may be either an n-channel type or a p-channel type. A Si transistor has higher field-effect mobility than an OS transistor in some cases. Therefore, a Si transistor may be used as the transistor M3 functioning as a read transistor. Furthermore, the use of a Si transistor as the transistor M3 enables the transistor M2 to be stacked over the transistor M3, in which case the area occupied by the memory cell can be reduced and high integration of the memory device can be achieved.

Alternatively, the transistor M3 may be an OS transistor. When OS transistors are used as the transistors M2 and M3, the circuit of the memory cell array 1470 can be formed using only n-channel transistors.

Figure 62H:
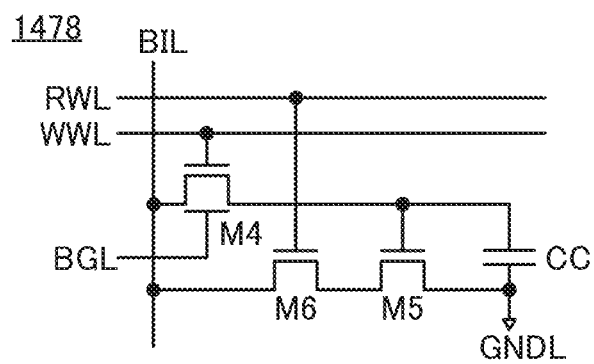

FIG. 62(H) illustrates an example of a gain-cell memory cell including three transistors and one capacitor. A memory cell 1478 illustrated in FIG. 62(H) includes transistors M4 to M6 and a capacitor CC. The capacitor CC is provided as appropriate. The memory cell 1478 is electrically connected to wirings BIL, RWL, WWL, BGL, and GNDL. The wiring GNDL is a wiring for supplying a low-level potential. Note that the memory cell 1478 may be electrically connected to the wirings RBL and WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not necessarily include the back gate.

Note that each of the transistors M5 and M6 may be an n-channel Si transistor or a p-channel Si transistor. Alternatively, the transistors M4 to M6 may be OS transistors, in which case the circuit of the memory cell array 1470 can be formed using only n-channel transistors.

In the case where the semiconductor device described in the above embodiment is used in the memory cell 1478, the transistor 200 can be used as the transistor M4, the transistor 300 can be used as the transistors M5 and M6, and the capacitor 100 can be used as the capacitor CC. The use of an OS transistor as the transistor M4 enables the leakage current of the transistor M4 to be extremely low.

Note that the structures of the peripheral circuit 1411, the memory cell array 1470, and the like described in this embodiment are not limited to those described above. The arrangement and functions of these circuits and the wirings, circuit components, and the like connected to the circuits can be changed, removed, or added as needed.

The structure described in this embodiment can be used in an appropriate combination with the structures described in the other embodiments and the like.

Embodiment 5

In this embodiment, an example of a chip 1200 on which the semiconductor device of one embodiment of the present invention is mounted will be described with reference to FIG. 63. A plurality of circuits (systems) are mounted on the chip 1200. A technique for integrating a plurality of circuits (systems) into one chip is referred to as system on chip (SoC) in some cases.

Figure 63A:
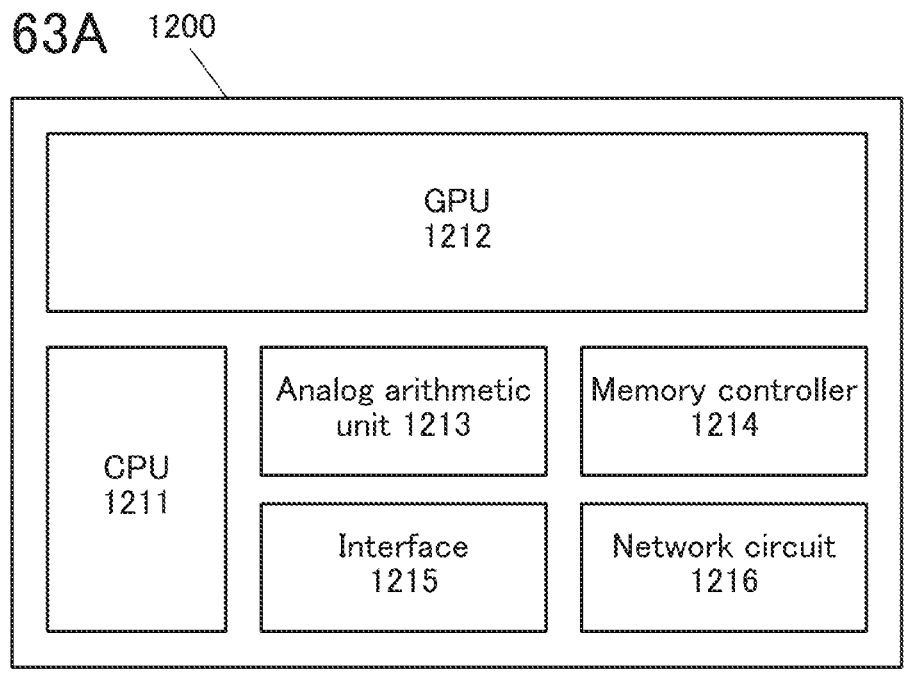
FIGS. 63A-63B Schematic views of a semiconductor device of one embodiment of the present invention.

As illustrated in FIG. 63(A), the chip 1200 includes a CPU (Central Processing Unit) 1211, a GPU (Graphics Processing Unit) 1212, one or more analog arithmetic units 1213, one or more memory controllers 1214, one or more interfaces 1215, one or more network circuits 1216, and the like.

Figure 63B:
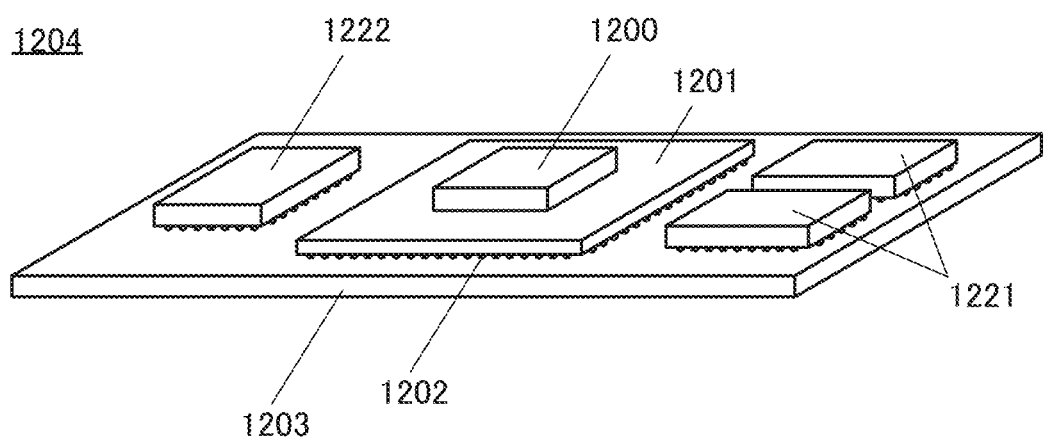

A bump (not illustrated) is provided on the chip 1200, and as illustrated in FIG. 63(B), the chip 1200 is connected to a first surface of a printed circuit board (PCB) 1201. A plurality of bumps 1202 are provided on the rear surface of the first surface of the PCB 1201, and the PCB 1201 is connected to a motherboard 1203.

Memory devices such as a DRAM 1221 and a flash memory 1222 may be provided on the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. The GPU 1212 preferably includes a plurality of GPU cores. The CPU 1211 and the GPU 1212 may each include a memory for temporarily storing data. Alternatively, a common memory for the CPU 1211 and the GPU 1212 may be provided in the chip 1200. The NOSRAM or the DOSRAM described above can be used as the memory. The GPU 1212 is suitable for parallel computation of a large number of data and thus can be used for image processing or product-sum operation. When an image processing circuit or a product-sum operation circuit using an oxide semiconductor of one embodiment of the present invention is provided in the GPU 1212, image processing and product-sum operation can be performed with low power consumption.

Since the CPU 1211 and the GPU 1212 are provided in the same chip, a wiring between the CPU 1211 and the GPU 1212 can be shortened, and data transfer from the CPU 1211 to the GPU 1212, data transfer between the memories included in the CPU 1211 and the GPU 1212, and transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition Multimedia Interface), or the like can be used.

The network circuit 1216 includes a network circuit such as a LAN (Local Area Network). The network circuit 1216 may further include a circuit for network security.

The circuits (systems) can be formed in the chip 1200 through the same manufacturing process. Therefore, even when the number of circuits needed for the chip 1200 increases, there is no need to increase the number of manufacturing processes; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 using SoC technology, and thus can have a small size. In addition, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can execute arithmetic operation in a deep neural network (DNN), a convolutional neural network (CNN), a recurrent neural network (RNN), an autoencorder, a deep Boltzmann machine (DBM), a deep belief network (DBN), or the like; thus, the chip 1200 can be used as an AI chip or the GPU module 1204 can be used as an AI system module.

The structure described in this embodiment can be used in an appropriate combination with the structures described in the other embodiments.

Embodiment 6

In this embodiment, application examples of the memory device using the semiconductor device described in the above embodiment will be described. The semiconductor device described in the above embodiment can be used for, for example, memory devices in a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is used for a variety of removable memory devices such as memory cards (e.g., SD cards), USB memories, and SSDs (solid state drives). FIG. 64 schematically illustrates some structure examples of removable memory devices. The semiconductor device described in the above embodiment is processed into a packaged memory chip and used in a variety of storage devices and removable memories, for example.

Figure 64A:
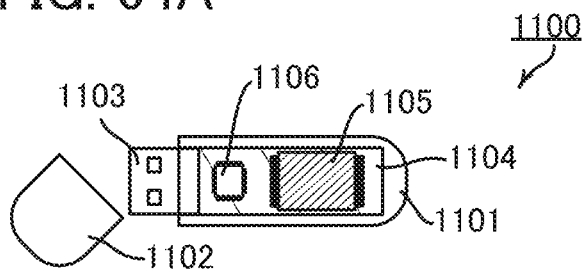
FIGS. 64A-64E Schematic views of memory devices of one embodiment of the present invention.

FIG. 64(A) is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like on the substrate 1104.

Figure 64B:
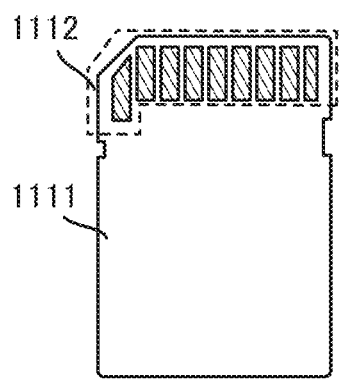
Figure 64C:
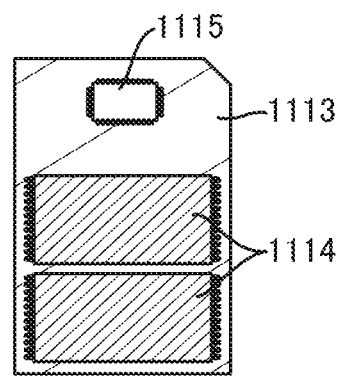

FIG. 64(B) is an external schematic view of an SD card, and FIG. 64(C) is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the rear surface side of the substrate 1113, the capacity of the SD card 1110 can be increased. In addition, a wireless chip with a radio communication function may be provided on the substrate 1113. With such a wireless chip, data can be read from and written in the memory chip 1114 by radio communication between a host device and the SD card 1110.

The semiconductor device described in the above embodiment can be incorporated in the memory chip 1114 or the like on the substrate 1113.

Figure 64D:
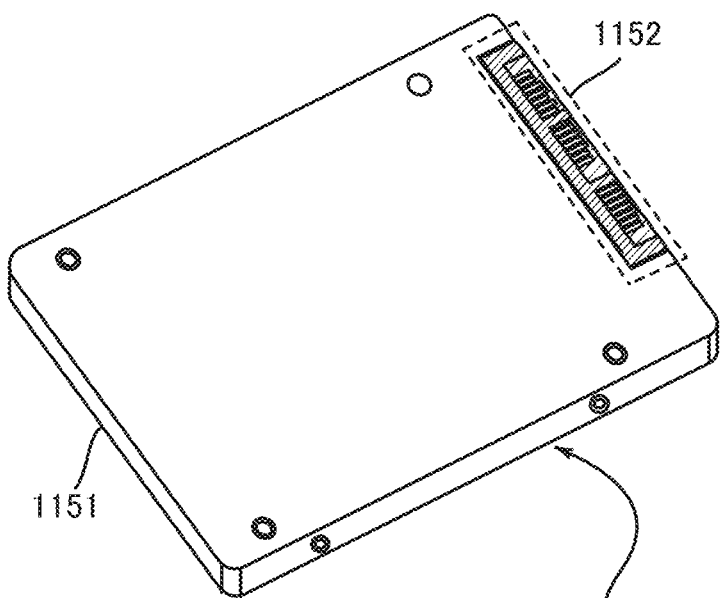
Figure 64E:
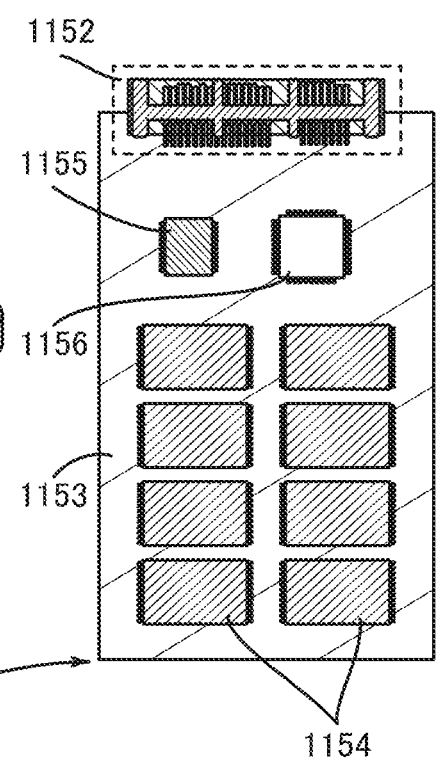

FIG. 64(D) is an external schematic view of an SSD, and FIG. 64(E) is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the rear surface side of the substrate 1153, the capacity of the SSD 1150 can be increased. The semiconductor device described in the above embodiment can be incorporated in the memory chip 1154 or the like on the substrate 1153.

This embodiment can be implemented in combination with any of the structures described in the other embodiments and the like, as appropriate.

Embodiment 7

The semiconductor device of one embodiment of the present invention can be used for a processor such as a CPU or a GPU or a chip. FIG. 65 illustrates specific examples of electronic devices including a processor such as a CPU or a GPU or a chip of one embodiment of the present invention.
<Electronic Device and System>

The GPU or the chip of one embodiment of the present invention can be incorporated into a variety of electronic devices. Examples of electronic devices include a digital camera, a digital video camera, a digital photo frame, a mobile phone, a portable game machine, a portable information terminal, and an audio reproducing device in addition to electronic devices provided with a relatively large screen, such as a television device, a desktop or laptop personal computer, a monitor for a computer and the like, digital signage, and a large game machine like a pachinko machine. When the integrated circuit or the chip of one embodiment of the present invention is provided in an electronic device, the electronic device can include artificial intelligence.

The electronic device of one embodiment of the present invention may include an antenna. When a signal is received by the antenna, the electronic device can display a video, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, power, radioactive rays, flow rate, humidity, gradient, oscillation, smell, or infrared rays).

The electronic device of one embodiment of the present invention can have a variety of functions. For example, the electronic device can have a function of displaying a variety of data (a still image, a moving image, a text image, and the like) on a display portion, a touch panel function, a function of displaying a calendar, date, time, and the like, a function of executing a variety of software (programs), a wireless communication function, and a function of reading out a program or data stored in a recording medium. FIG. 65 illustrates examples of electronic devices.

[Mobile Phone]

Figure 65A:
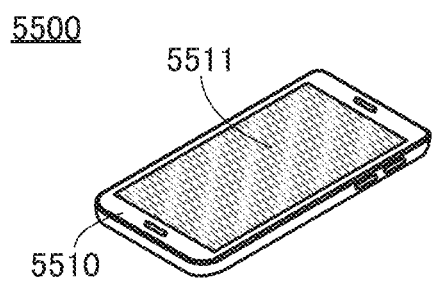

FIG. 65(A) illustrates a mobile phone (smartphone), which is a type of information terminal. An information terminal 5500 includes a housing 5510 and a display portion 5511. As input interfaces, a touch panel is provided in the display portion 5511 and a button is provided in the housing 5510.

The information terminal 5500 can execute an application utilizing artificial intelligence, with the use of the chip of one embodiment of the present invention. Examples of the application utilizing artificial intelligence include an application for interpreting a conversation and displaying its content on the display portion 5511; an application for recognizing letters, figures, and the like input to the touch panel of the display portion 5511 by a user and displaying them on the display portion 5511; and an application for biometric authentication using fingerprints, voice prints, or the like.

[Information Terminal 1]

Figure 65B:
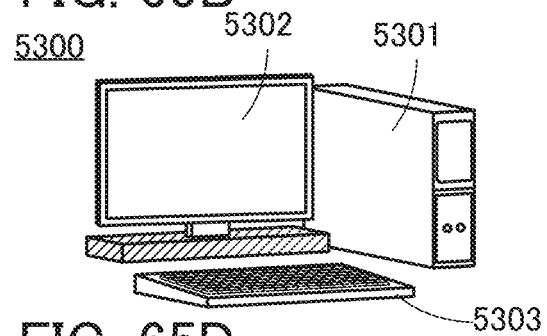

FIG. 65(B) illustrates a desktop information terminal 5300. The desktop information terminal 5300 includes a main body 5301 of the information terminal, a display 5302, and a keyboard 5303.

Like the information terminal 5500 described above, the desktop information terminal 5300 can execute an application utilizing artificial intelligence, with the use of the chip of one embodiment of the present invention. Examples of the application utilizing artificial intelligence include design-support software, text correction software, and software for automatic menu generation. Furthermore, with the use of the desktop information terminal 5300, novel artificial intelligence can be developed.

Note that in the above description, a smartphone and a desktop information terminal are illustrated as examples of the electronic devices in FIG. 65(A) and FIG. 65(B); alternatively, an information terminal other than a smartphone and a desktop information terminal can be used. Examples of an information terminal other than a smartphone and a desktop information terminal include a PDA (Personal Digital Assistant), a laptop information terminal, and a workstation.

[Electrical Appliance]

Figure 65C:
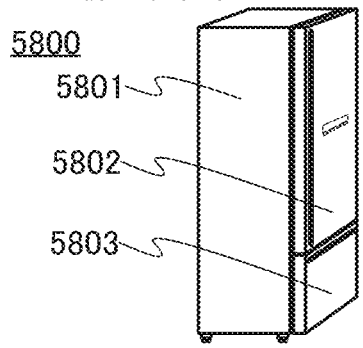

FIG. 65(C) illustrates an electric refrigerator-freezer 5800 as an example of an electrical appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting the temperature to be appropriate for the foods stored in the electric refrigerator-freezer 5800, and the like.

Although the electric refrigerator-freezer is described here as an example of an electrical appliance, other examples of an electrical appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

Figure 65D:
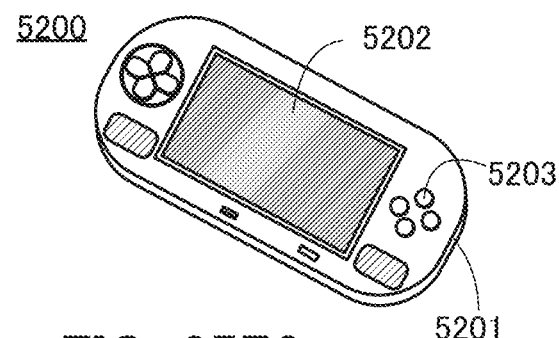
Figure 65D:
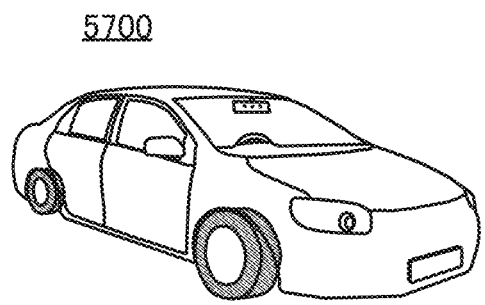
Figure 65D:
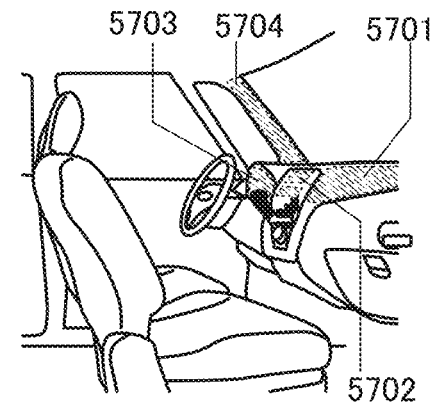

FIG. 65(D) illustrates a portable game machine 5200 as an example of a game machine. The portable game machine includes a housing 5201, a display portion 5202, a button 5203, and the like.

With the use of the GPU or the chip of one embodiment of the present invention in the portable game machine 5200, the portable game machine 5200 with low power consumption can be obtained. Moreover, heat generation from a circuit can be reduced owing to low power consumption; thus, the influence of heat generation on the circuit, the peripheral circuit, and the module can be reduced.

Furthermore, when the GPU or the chip of one embodiment of the present invention is used in the portable game machine 5200, the portable game machine 5200 including artificial intelligence can be obtained.

In general, the progress of a game, the actions and words of game characters, and expressions of a phenomenon and the like in the game are programmed in the game; however, the use of artificial intelligence in the portable game machine 5200 enables expressions not limited by the game program. For example, questions posed by the player, the progress of the game, time, and actions and words of game characters can be changed for various expressions.

When a game requiring a plurality of players is played on the portable game machine 5200, the artificial intelligence can create a virtual game player; thus, the game can be played alone with the game player created by the artificial intelligence as an opponent.

Although the portable game machine is illustrated as an example of a game machine in FIG. 65(D), the game machine using the GPU or the chip of one embodiment of the present invention is not limited thereto. Examples of the game machine using the GPU or the chip of one embodiment of the present invention include a home stationary game machine, an arcade game machine installed in entertainment facilities (a game center, an amusement park, and the like), and a throwing machine for batting practice installed in sports facilities.

[Moving Vehicle]

The GPU or the chip of one embodiment of the present invention can be used in an automobile, which is a moving vehicle, and around a driver's seat in the automobile.

FIG. 65(E1) illustrates an automobile 5700 as an example of a moving vehicle, and FIG. 65(E2) is a diagram illustrating the periphery of a windshield inside the automobile. FIG. 65(E2) illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, a mileage, a fuel meter, a gearshift indicator, air-condition setting, and the like. The content, layout, or the like of the display on the display panels can be changed as appropriate to suit the user's preference, so that the design quality can be increased. The display panel 5701 to the display panel 5703 can also be used as lighting devices.

The display panel 5704 can compensate for the view obstructed by the pillar (a blind spot) by showing an image taken by an imaging device (not illustrated) provided for the automobile 5700. That is, displaying an image taken by the imaging device provided on the outside of the automobile 5700 leads to compensation for the blind spot and enhancement of safety. In addition, showing an image for compensating for the area that cannot be seen makes it possible to confirm the safety more naturally and comfortably. The display panel 5704 can also be used as a lighting device.

Since the GPU or the chip of one embodiment of the present invention can be used as a component of artificial intelligence, the chip can be used in an automatic driving system of the automobile 5700, for example. The chip can also be used for a system for navigation, risk prediction, or the like. The display panel 5701 to the display panel 5704 may display information regarding navigation, risk prediction, or the like.

Although an automobile is described above as an example of a moving vehicle, a moving vehicle is not limited to an automobile. Examples of a moving vehicle include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

[Broadcasting System]

The GPU or the chip of one embodiment of the present invention can be used in a broadcasting system.

Figure 65F:
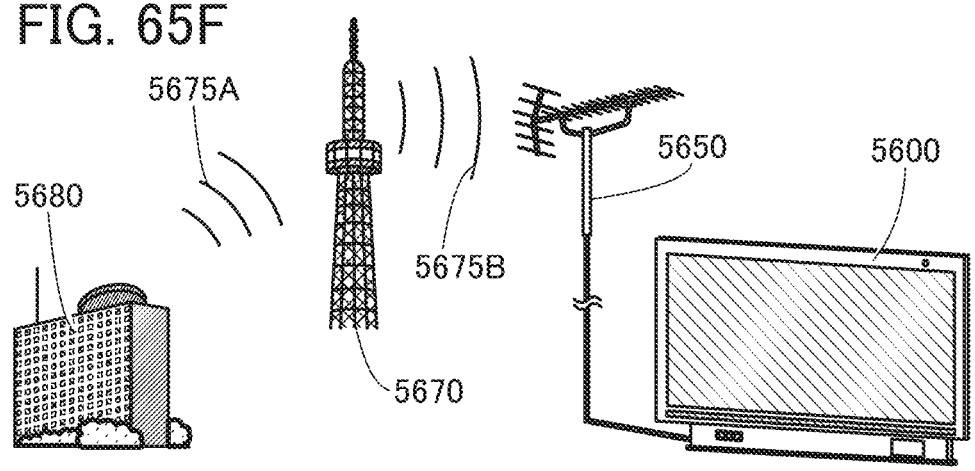

FIG. 65(F) schematically illustrates data transmission in a broadcasting system. Specifically, FIG. 65(F) illustrates a path in which a radio wave (a broadcast signal) transmitted from a broadcast station 5680 is delivered to a television receiver (TV) 5600 of each household. The TV 5600 includes a receiving device (not illustrated), and the broadcast signal received by an antenna 5650 is transmitted to the TV 5600 through the receiving device.

Although a UHF (Ultra High Frequency) antenna is illustrated as the antenna 5650 in FIG. 65(F), a BS/110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 65(F) and may be satellite broadcasting using an artificial satellite, data broadcasting using an optical line, or the like.

The above-described broadcasting system may utilize artificial intelligence by using the chip of one embodiment of the present invention. When the broadcast data is transmitted from the broadcast station 5680 to the TV 5600 of each household, the broadcast data is compressed by an encoder. When the antenna 5650 receives the compressed broadcast data, the compressed broadcast data is decompressed by a decoder of the receiving device in the TV 5600. With the use of artificial intelligence, for example, a display pattern included in an image to be displayed can be recognized in motion compensation prediction, which is one of the compressing methods for the encoder. In-frame prediction utilizing artificial intelligence, for example, can also be performed. For another example, when the broadcast data with low resolution is received and displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K, 8K) broadcasting, which needs a large amount of broadcast data.

As an application of artificial intelligence in the TV 5600, a recording device including artificial intelligence may be provided in the TV 5600, for example. With such a structure, the artificial intelligence in the recording device can learn the user's preference, so that TV programs that suit the user's preference can be recorded automatically.

The electronic devices, the functions of the electronic devices, the application examples of artificial intelligence, their effects, and the like described in this embodiment can be combined as appropriate with the description of another electronic device.

This embodiment can be implemented in combination with any of the structures described in the other embodiments and the like, as appropriate.

[Example]

In this example, the ease of oxygen diffusion to oxide films with different compositions was examined.

[Fabrication of Sample]

First, an approximately 100-nm-thick thermal oxide film was formed over a single crystal silicon wafer. The thermal oxide film was formed by oxidation of a surface of the single crystal silicon wafer at a temperature of 950° C. in an oxygen atmosphere containing HCl at 3 vol %.

Then, an approximately 300-nm-thick silicon oxide film was formed by a sputtering method over the thermal oxide film. Here, the silicon oxide film was formed using an oxygen gas containing $^{18}O$ as a deposition gas.

Then, an approximately 50-nm-thick oxide film was formed by a sputtering method over the silicon oxide film. In the formation of the oxide film, an In—Ga—Zn oxide target was used, the substrate temperature was set to 200° C., and an oxygen gas was used as a deposition gas. Such deposition conditions enable an oxide film having crystallinity with c-axis alignment to be formed.

Here, two kinds of samples, Sample A1 formed using a target with In:Ga:Zn=1:3:4 [atomic ratio] as a sputtering target and Sample A2 formed using a target with In:Ga:Zn=4:2:4.1 [atomic ratio] as a sputtering target, were fabricated.

Then, heat treatment was performed at 400° C. in a nitrogen atmosphere for one hour to diffuse part of oxygen (in particular, $^{18}O$) contained in the silicon oxide film to the oxide film side. In the heat treatment, the temperature was raised from 40° C. to 400° C. at a rate of 7.2° C./min and the temperature was decreased from 400° C. to 40° C. at a rate of 3.6° C./min.

Through the above steps, Sample A1 and Sample A2 including the oxide films with different compositions were obtained.

[Evaluation]

Next, profiles of $^{18}O$ in the depth direction of the oxide films of Sample A1 and Sample A2 were measured by secondary ion mass spectrometry (SIMS), and diffusion coefficients D of $^{18}O$ were calculated from the results. Note that the diffusion coefficients D were calculated in consideration of the thermal budget of the heat treatment.

Figure 66A:
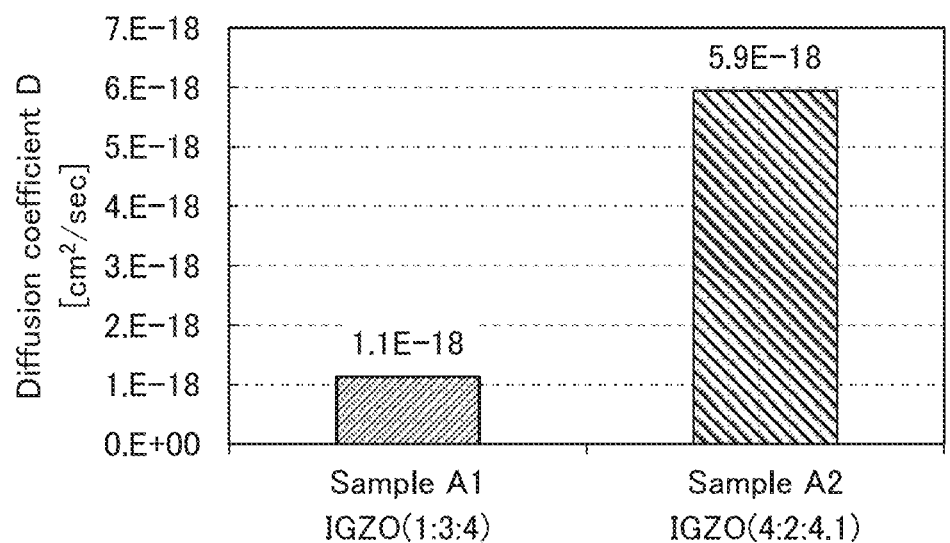
FIGS. 66A-66B Calculation results of diffusion coefficients and diffusion lengths of $^{18}O$ in metal oxide films in Example.

FIG. 66(A) shows the calculated diffusion coefficients D of $^{18}O$ in the oxide films of Sample A1 and Sample A2. The results reveal that Sample A2 is more likely to diffuse oxygen than Sample A1.

Figure 66B:
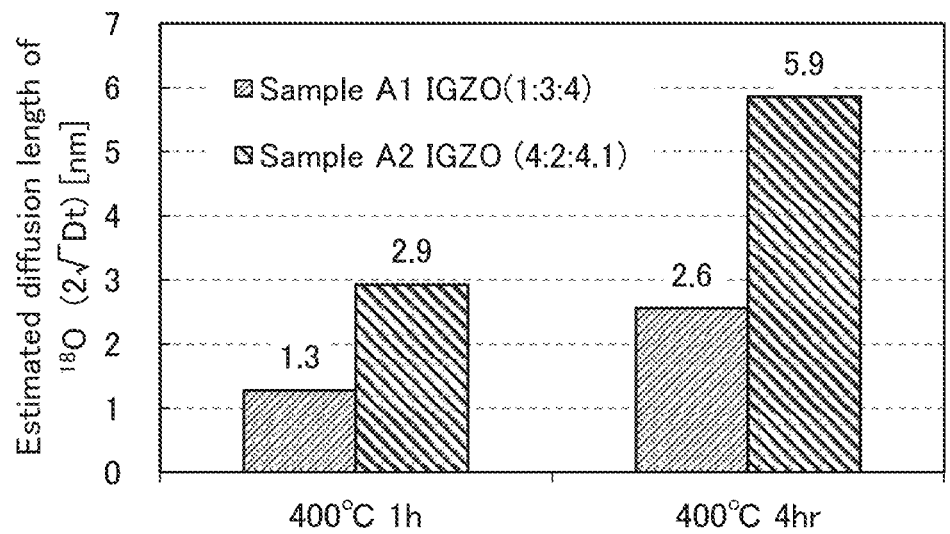

FIG. 66(B) shows the estimation results of the diffusion lengths of $^{18}O$ in the oxide films calculated from FIG. 66(A). Note that the diffusion lengths were estimated at 400° C. regardless of a temperature rising period and a temperature decreasing period in the heat treatment. FIG. 66(B) shows the case where the heat treatment was performed for one hour and the case where the heat treatment was performed for four hours. FIG. 66(B) reveals that the diffusion lengths in Sample A2 are longer than or equal to twice those in Sample A1.

The above results demonstrate that the ease of oxygen diffusion to the oxide films can be controlled by making the compositions different from each other even when the same deposition conditions are employed. The compositions and the deposition conditions of the oxide films can be selected as appropriate depending on the purpose.

REFERENCE NUMERALS

200: transistor, 200A: transistor, 200B: transistor, 200C: transistor, 205: conductor, 210: insulator, 212: insulator, 214: insulator, 216: insulator, 218: conductor, 222: insulator, 224: insulator, 230: oxide, 230a: oxide, 230A: oxide film, 230b: oxide, 230B: oxide film, 230c: oxide, 230C: oxide film, 231: region, 231b: region, 232: region, 232b: region, 234: region, 240: conductor, 240a: conductor, 240b: conductor, 241: insulator, 241a: insulator, 241b: insulator, 244: insulator, 244B: insulator, 250: insulator, 250A: insulating film, 252: layer, 252b: layer, 254: insulator, 254: insulator, 254A: insulating film, 258: dopant, 259: dopant, 260: conductor, 260a: conductor, 260b: conductor, 262: dummy gate, 262A: dummy gate layer, 263: opening, 274: insulator, 280: insulator, 280A: insulating film, 281: insulator

The invention claimed is:

1. A semiconductor device comprising:
   a first oxide comprising a first crystal region, a second oxide comprising a second crystal region, a third oxide, a first insulator between the first oxide and the second oxide, and a first conductor,
   wherein the first oxide is in contact with a bottom surface of the first conductor,
   wherein the first insulator is in contact with a bottom surface of the first oxide,
   wherein the second oxide is in contact with a bottom surface of the first insulator,
   wherein the third oxide is in contact with a bottom surface of the second oxide,
   wherein a c-axis of the first crystal region is substantially perpendicular to the bottom surface of the first oxide, and
   wherein a c-axis of the second crystal region is substantially perpendicular to a top surface of the second oxide.

2. The semiconductor device according to claim 1, wherein the third oxide comprises a first region, and a second region and a third region between which the first region is sandwiched,
   wherein the first region comprises a region overlapping with the first conductor, and
   wherein the second region and the third region comprise one or more elements selected from phosphorus, boron, aluminum, and magnesium.

3. The semiconductor device according to claim 1, further comprising:
   a second conductor and a third conductor,
   wherein the second conductor and the third conductor are positioned over the third oxide and function as a source electrode and a drain electrode, respectively.

4. The semiconductor device according to claim 1,
   wherein the first conductor functions as a gate electrode, and
   wherein the first insulator functions as a gate insulator.

5. The semiconductor device according to claim 1,
   wherein the first oxide functions as a gate electrode or a gate insulator.

6. A semiconductor device comprising:
   a first oxide comprising a first crystal region, a second oxide, a third oxide, an insulator between the first oxide and the second oxide, and a first conductor, wherein the first oxide is in contact with a side surface and a bottom surface of the first conductor, wherein the insulator is in contact with a side surface and a bottom surface of the first oxide, wherein the second oxide is in contact with a side surface and a bottom surface of the insulator, wherein the third oxide is in contact with a bottom surface of the second oxide, and wherein a c-axis of the first crystal region is substantially perpendicular to the bottom surface of the first oxide.

7. The semiconductor device according to claim 6, wherein the third oxide comprises a first region, and a second region and a third region between which the first region is sandwiched, wherein the first region comprises a region overlapping with the first conductor, and wherein the second region and the third region comprise one or more elements selected from phosphorus, boron, aluminum, and magnesium.

8. The semiconductor device according to claim 6, further comprising:

a second conductor and a third conductor, wherein the second conductor and the third conductor are positioned over the third oxide and function as a source electrode and a drain electrode, respectively.

9. The semiconductor device according to claim 6, wherein the second oxide comprises a second crystal region, and wherein a c-axis of the second crystal region is substantially perpendicular to a top surface of the second oxide.

10. The semiconductor device according to claim 9, wherein the third oxide comprises a third crystal region, and wherein a direction of the c-axis of the second crystal region is different from a direction of a c-axis of the third crystal region.

11. The semiconductor device according to claim 10, wherein a direction of the c-axis of the first crystal region is different from the direction of the c-axis of the third crystal region.

12. The semiconductor device according to claim 6, wherein the first conductor functions as a gate electrode, and wherein the insulator functions as a gate insulator.

13. The semiconductor device according to claim 6, wherein the first oxide functions as a gate electrode or a gate insulator.

* * * * *